(12) United States Patent
Martinson et al.

(10) Patent No.: US 12,339,557 B2
(45) Date of Patent: Jun. 24, 2025

(54) CONFIGURATION ASSOCIATED WITH MEDIA DISPLAY OF A FACILITY

(71) Applicant: View, Inc., Milpitas, CA (US)

(72) Inventors: Robert Michael Martinson, Palo Alto, CA (US); Chee Yung Chan, Cupertino, CA (US); Nitesh Trikha, Pleasanton, CA (US); Vinh N. Nguyen, Lathrop, CA (US); Matthew Burton Sheffield, San Ramon, CA (US); Anthony Young, San Jose, CA (US); Todd Daniel Antes, San Jose, CA (US); Sridhar Karthik Kailasam, Fremont, CA (US)

(73) Assignee: View, Inc., San Jose, CA (US)

( * ) Notice: Subject to any disclaimer, the term of this patent is extended or adjusted under 35 U.S.C. 154(b) by 59 days.

(21) Appl. No.: 18/028,293

(22) PCT Filed: Sep. 29, 2021

(86) PCT No.: PCT/US2021/052595
§ 371 (c)(1),
(2) Date: Mar. 24, 2023

(87) PCT Pub. No.: WO2022/072461
PCT Pub. Date: Apr. 7, 2022

(65) Prior Publication Data
US 2023/0350260 A1 Nov. 2, 2023

Related U.S. Application Data

(63) Continuation of application No. 17/081,809, filed on Oct. 27, 2020, now Pat. No. 11,460,749, which is a (Continued)

(51) Int. Cl.
*G02F 1/163* (2006.01)
*B32B 17/10* (2006.01)
(Continued)

(52) U.S. Cl.
CPC ........ *G02F 1/163* (2013.01); *B32B 17/10513* (2013.01); *E06B 9/24* (2013.01);
(Continued)

(58) Field of Classification Search
CPC .. G02F 1/163; G02F 1/15; G02F 1/155; H02J 50/80; H02J 50/20; G09F 19/227;
(Continued)

(56) References Cited

U.S. PATENT DOCUMENTS

| 4,129,861 A | 12/1978 | Giglia |
| 4,231,135 A | 11/1980 | Fradin |

(Continued)

FOREIGN PATENT DOCUMENTS

| CA | 2968665 A1 | 6/2016 |
| CH | 556612 A | 11/1974 |

(Continued)

OTHER PUBLICATIONS

CAN in Automation (Cia): Pdo protocol, 2016; can-cia.org, http://www.can-cia.org/can-knowledge/canopen/pdo-protocol. Retrived from https ://web .archive .org/web/20161028171403/http : 1/www .can-cia .org/can-knowledge/canopen/pdo-protocol on Feb. 8, 2023, Year: 2016.

(Continued)

*Primary Examiner* — William Choi
(74) *Attorney, Agent, or Firm* — Weaver Austin Villeneuve & Sampson LLP; Brian D. Griedel

(57) ABSTRACT

Disclosed herein are systems, apparatuses, methods, and non-transitory computer readable media related to a display construct coupled to a structure (e.g., a vision window such as a tintable window). The structure can be a supportive structure such as a fixture. The display construct is configured to facilitate media display and is at least partially transparent. An interactive installation software tool and (Continued)

process aligns a digital configuration of the display construct and/or touch screen functionality of the display construct, with its physical configuration in a matrix of display constructs.

17 Claims, 66 Drawing Sheets

Related U.S. Application Data continuation of application No. 16/608,159, filed as application No. PCT/US2018/029406 on Apr. 25, 2018, now Pat. No. 11,300,849, application No. 18/028,293 is a continuation of application No. 17/083,128, filed on Oct. 28, 2020, now abandoned, which is a continuation of application No. 16/664,089, filed on Oct. 25, 2019, now Pat. No. 11,294,254, which is a continuation-in-part of application No. PCT/US2019/030467, filed on May 2, 2019, said application No. 16/664,089 is a continuation-in-part of application No. PCT/US2018/029460, filed on Apr. 25, 2018, application No. 18/028,293 is a continuation-in-part of application No. 17/083,128, filed on Oct. 28, 2020, now abandoned, and a continuation-in-part of application No. 17/081,809, filed on Oct. 27, 2020, now Pat. No. 11,460,749.

(60) Provisional application No. 63/085,254, filed on Sep. 30, 2020, provisional application No. 62/506,514, filed on May 15, 2017, provisional application No. 62/607,618, filed on Dec. 19, 2017, provisional application No. 62/523,606, filed on Jun. 22, 2017, provisional application No. 62/507,704, filed on May 17, 2017, provisional application No. 62/490,457, filed on Apr. 26, 2017, provisional application No. 62/666,033, filed on May 2, 2018, provisional application No. 63/115,842, filed on Nov. 19, 2020, provisional application No. 63/135,021, filed on Jan. 8, 2021, provisional application No. 63/154,352, filed on Feb. 26, 2021, provisional application No. 63/170,245, filed on Apr. 2, 2021, provisional application No. 63/211,400, filed on Jun. 16, 2021, provisional application No. 63/212,483, filed on Jun. 18, 2021, provisional application No. 63/246,770, filed on Sep. 21, 2021, provisional application No. 63/247,684, filed on Sep. 23, 2021.

(51) Int. Cl.

| | |
|---|---|
| *E06B 9/24* | (2006.01) |
| *G02F 1/15* | (2019.01) |
| *G02F 1/155* | (2006.01) |
| *G05B 15/02* | (2006.01) |
| *G05B 19/042* | (2006.01) |
| *G06F 3/041* | (2006.01) |
| *G06F 3/044* | (2006.01) |
| *G06F 3/14* | (2006.01) |
| *G09F 19/22* | (2006.01) |
| *G09G 3/38* | (2006.01) |
| *H02J 50/20* | (2016.01) |
| *H02J 50/80* | (2016.01) |
| *H10K 50/80* | (2023.01) |
| *H10K 59/65* | (2023.01) |
| *G09G 3/34* | (2006.01) |
| *H04K 3/00* | (2006.01) |

(52) U.S. Cl.
CPC ........... *G02F 1/15* (2013.01); *G02F 1/155* (2013.01); *G05B 15/02* (2013.01); *G05B 19/042* (2013.01); *G05B 19/0426* (2013.01); *G06F 3/0412* (2013.01); *G06F 3/044* (2013.01); *G06F 3/1446* (2013.01); *G09F 19/227* (2021.05); *G09G 3/38* (2013.01); *H02J 50/20* (2016.02); *H02J 50/80* (2016.02); *H10K 50/80* (2023.02); *H10K 59/65* (2023.02); *B32B 2419/00* (2013.01); *E06B 2009/2417* (2013.01); *E06B 2009/2464* (2013.01); *G05B 2219/25011* (2013.01); *G05B 2219/25252* (2013.01); *G05B 2219/2614* (2013.01); *G05B 2219/2628* (2013.01); *G05B 2219/2642* (2013.01); *G09G 3/3433* (2013.01); *G09G 2300/02* (2013.01); *G09G 2300/023* (2013.01); *G09G 2300/026* (2013.01); *G09G 2300/04* (2013.01); *G09G 2370/02* (2013.01); *G09G 2370/06* (2013.01); *G09G 2370/16* (2013.01); *H04K 3/45* (2013.01)

(58) Field of Classification Search
CPC .. H10K 50/80; H10K 59/65; B32B 17/10513; B32B 2419/00; E06B 9/24; E06B 2009/2417; E06B 2009/2464; G05B 15/02; G05B 19/042; G05B 19/0426; G05B 2219/25011; G05B 2219/25252; G05B 2219/2614; G05B 2219/2628; G05B 2219/2642; G06F 3/0412; G06F 3/044; G06F 3/1446; G09G 3/38; G09G 3/3433; G09G 2300/02; G09G 2300/023; G09G 2300/026; G09G 2300/04; G09G 2370/02; G09G 2370/06; G09G 2370/16; H04K 3/45
USPC ........................................................ 700/275
See application file for complete search history.

(56) References Cited

U.S. PATENT DOCUMENTS

| | | |
|---|---|---|
| 5,406,762 A | 4/1995 | Buard |
| 5,416,617 A | 5/1995 | Loiseaux et al. |
| D364,234 S | 11/1995 | Caley |
| D375,446 S | 11/1996 | Nelson |
| 5,684,619 A | 11/1997 | Shabrang et al. |
| 5,754,329 A | 5/1998 | Coleman |
| 5,847,858 A | 12/1998 | Krings et al. |
| D411,434 S | 6/1999 | Russell |
| 6,389,644 B1 | 5/2002 | Russo |
| 6,481,851 B1 | 11/2002 | McNelley et al. |
| 6,588,250 B2 | 7/2003 | Schell |
| 6,795,226 B2 | 9/2004 | Agrawal et al. |
| D541,623 S | 5/2007 | Hord et al. |
| 7,347,608 B2 | 3/2008 | Emde |
| D623,041 S | 9/2010 | Ayrest |
| D628,409 S | 12/2010 | Anzai |
| 8,022,977 B2 | 9/2011 | Kanade et al. |
| 8,213,074 B1 | 7/2012 | Shrivastava et al. |
| 8,218,224 B2 | 7/2012 | Kwak et al. |
| 8,363,178 B2 | 1/2013 | Chung et al. |
| D679,418 S | 4/2013 | Nolan et al. |
| 8,584,319 B1 | 11/2013 | Ludin et al. |
| D700,717 S | 3/2014 | Campacci |
| 8,686,984 B2 | 4/2014 | Hummel et al. |
| 8,705,162 B2 | 4/2014 | Brown et al. |
| 8,800,221 B1 | 8/2014 | Header |
| 9,261,751 B2 | 2/2016 | Pradhan et al. |
| 9,341,912 B2 | 5/2016 | Shrivastava et al. |
| D764,075 S | 8/2016 | Honda |
| 9,412,290 B2 | 8/2016 | Jack et al. |
| 9,442,338 B2 | 9/2016 | Uhm et al. |

(56) References Cited

U.S. PATENT DOCUMENTS

| | | |
|---|---|---|
| 9,454,055 B2 | 9/2016 | Brown et al. |
| 9,470,947 B2 | 10/2016 | Nagel et al. |
| 9,483,083 B1 | 11/2016 | Zaloom |
| 9,551,913 B2 | 1/2017 | Kim et al. |
| 9,690,174 B2 | 6/2017 | Wang |
| D792,190 S | 7/2017 | Lewis et al. |
| 9,709,869 B2 | 7/2017 | Baumann et al. |
| 9,740,074 B2 | 8/2017 | Agrawal et al. |
| 9,778,533 B2 | 10/2017 | Bertolini |
| 9,791,701 B2 | 10/2017 | Ato et al. |
| 9,898,912 B1 | 2/2018 | Jordan, II et al. |
| 9,917,867 B2 | 3/2018 | Sallam |
| D818,340 S | 5/2018 | Smalls |
| 9,965,865 B1 | 5/2018 | Agrawal et al. |
| 10,048,561 B2 | 8/2018 | Brown |
| 10,049,402 B1 | 8/2018 | Miranda |
| 10,067,344 B2 | 9/2018 | Kilcher et al. |
| D834,917 S | 12/2018 | Alberti et al. |
| 10,190,349 B1 | 1/2019 | Jacobson et al. |
| 10,191,318 B2 | 1/2019 | Park et al. |
| 10,288,971 B2 | 5/2019 | Phillips et al. |
| 10,322,680 B2 | 6/2019 | Terashima et al. |
| 10,359,681 B2 | 7/2019 | Brown |
| 10,379,265 B2 | 8/2019 | Brown |
| 10,394,070 B2 | 8/2019 | Park et al. |
| 10,400,509 B2 | 9/2019 | Fasi et al. |
| 10,416,520 B2 | 9/2019 | Jovanovic |
| 10,460,636 B2 | 10/2019 | Salmimaa et al. |
| 10,488,837 B2 | 11/2019 | Cirino |
| 10,591,798 B1 | 3/2020 | Nagel et al. |
| D881,614 S | 4/2020 | Wilke |
| D888,530 S | 6/2020 | Smalls |
| D888,531 S | 6/2020 | Smalls |
| D888,532 S | 6/2020 | Smalls |
| 10,699,604 B2 | 6/2020 | Hicks et al. |
| D894,713 S | 9/2020 | Hall |
| D898,545 S | 10/2020 | Becker |
| D902,687 S | 11/2020 | Van Cronenburg |
| 10,824,040 B2 | 11/2020 | Agrawal et al. |
| 10,917,259 B1 | 2/2021 | Chein et al. |
| 10,921,675 B2 | 2/2021 | Barnum et al. |
| 10,923,226 B2 | 2/2021 | Macary et al. |
| 10,954,677 B1 | 3/2021 | Scanlin |
| 10,968,688 B1 | 4/2021 | Bedford |
| 10,982,487 B2 | 4/2021 | Ramirez |
| 11,182,970 B1 | 11/2021 | Kathol |
| D939,321 S | 12/2021 | Leimkuehler et al. |
| 11,229,301 B2 | 1/2022 | Schwarz et al. |
| 11,231,633 B2 | 1/2022 | Trikha et al. |
| 11,300,849 B2 | 4/2022 | Trikha et al. |
| 11,335,232 B2 | 5/2022 | Huang et al. |
| D959,031 S | 7/2022 | Wagner |
| 11,454,854 B2 | 9/2022 | Trikha et al. |
| 11,460,749 B2 | 10/2022 | Trikha et al. |
| 11,467,464 B2 | 10/2022 | Trikha et al. |
| 11,493,819 B2 | 11/2022 | Trikha et al. |
| 11,513,412 B2 | 11/2022 | Trikha et al. |
| 11,747,696 B2 | 9/2023 | Trikha et al. |
| 11,747,698 B2 | 9/2023 | Trikha et al. |
| 11,868,019 B2 | 1/2024 | Trikha et al. |
| 11,886,089 B2 | 1/2024 | Trikha et al. |
| 11,892,738 B2 | 2/2024 | Trikha et al. |
| 2002/0149829 A1 | 10/2002 | Mochizuka et al. |
| 2003/0196297 A1 | 10/2003 | Gerali et al. |
| 2004/0158494 A1 | 8/2004 | Suthar |
| 2005/0198777 A1 | 9/2005 | Mabe |
| 2006/0026798 A1 | 2/2006 | Gerali |
| 2006/0077126 A1 | 4/2006 | Kothari |
| 2006/0279518 A1 | 12/2006 | Jang et al. |
| 2007/0008603 A1 | 1/2007 | Sotzing et al. |
| 2007/0097482 A1 | 5/2007 | Park et al. |
| 2007/0188676 A1 | 8/2007 | Choi et al. |
| 2008/0088821 A1 | 4/2008 | Hurvitz et al. |
| 2008/0182506 A1 | 7/2008 | Jackson et al. |
| 2008/0198584 A1 | 8/2008 | Fouraux et al. |
| 2008/0239192 A1 | 10/2008 | Oohira |
| 2008/0259416 A1 | 10/2008 | Peters et al. |
| 2008/0277486 A1 | 11/2008 | Seem et al. |
| 2009/0217485 A1 | 9/2009 | Springer |
| 2009/0230263 A1 | 9/2009 | Burge |
| 2009/0231662 A1 | 9/2009 | Sorensson et al. |
| 2010/0218010 A1 | 8/2010 | Musti et al. |
| 2010/0243427 A1 | 9/2010 | Kozlowski et al. |
| 2010/0245973 A1 | 9/2010 | Wang et al. |
| 2011/0164317 A1 | 7/2011 | Vergohl et al. |
| 2011/0299149 A1 | 12/2011 | Park et al. |
| 2012/0268369 A1 | 10/2012 | Kikkeri |
| 2012/0275008 A1 | 11/2012 | Pradhan et al. |
| 2013/0057937 A1 | 3/2013 | Berman et al. |
| 2013/0099447 A1 | 4/2013 | Patton |
| 2013/0157493 A1 | 6/2013 | Brown |
| 2013/0241299 A1 | 9/2013 | Snyker et al. |
| 2013/0242370 A1 | 9/2013 | Wang |
| 2013/0271813 A1 | 10/2013 | Brown |
| 2013/0271814 A1 | 10/2013 | Brown |
| 2013/0278989 A1 | 10/2013 | Lam et al. |
| 2013/0319756 A1 | 12/2013 | Snyker et al. |
| 2013/0335350 A1 | 12/2013 | Choi |
| 2014/0001977 A1 | 1/2014 | Zacharchuk et al. |
| 2014/0021903 A1 | 1/2014 | Seiling |
| 2014/0098007 A1 | 4/2014 | Delpier et al. |
| 2014/0144083 A1 | 5/2014 | Artwohl et al. |
| 2014/0168745 A1 | 6/2014 | Satou et al. |
| 2014/0177028 A1 | 6/2014 | Shrivastava et al. |
| 2014/0236323 A1 | 8/2014 | Brown et al. |
| 2014/0259931 A1 | 9/2014 | Plummer |
| 2014/0267384 A1 | 9/2014 | Kwon et al. |
| 2014/0300945 A1 | 10/2014 | Parker |
| 2014/0320950 A1 | 10/2014 | Saxe et al. |
| 2014/0331598 A1 | 11/2014 | White |
| 2014/0333899 A1 | 11/2014 | Smithwick |
| 2014/0368899 A1 | 12/2014 | Greer |
| 2015/0032264 A1 | 1/2015 | Emmons et al. |
| 2015/0092259 A1 | 4/2015 | Greer et al. |
| 2015/0116811 A1 | 4/2015 | Shrivastava et al. |
| 2015/0160525 A1 | 6/2015 | Shi |
| 2015/0195644 A1 | 7/2015 | Wilson et al. |
| 2015/0219975 A1 | 8/2015 | Phillips et al. |
| 2015/0325167 A1 | 11/2015 | Eom |
| 2015/0327304 A1 | 11/2015 | Tinnakornsrisuphap et al. |
| 2015/0331295 A1 | 11/2015 | Takahashi et al. |
| 2015/0338713 A1 | 11/2015 | Brown |
| 2015/0355521 A1 | 12/2015 | Alton et al. |
| 2015/0368967 A1 | 12/2015 | Lundy et al. |
| 2016/0024827 A1 | 1/2016 | Lambright et al. |
| 2016/0026060 A1 | 1/2016 | Koo et al. |
| 2016/0027391 A1 | 1/2016 | Gibson et al. |
| 2016/0054633 A1 | 2/2016 | Brown et al. |
| 2016/0054634 A1 | 2/2016 | Brown et al. |
| 2016/0071183 A1 | 3/2016 | Joshi et al. |
| 2016/0109778 A1 | 4/2016 | Shrivastava et al. |
| 2016/0133222 A1 | 5/2016 | Paxson |
| 2016/0154290 A1 | 6/2016 | Brown et al. |
| 2016/0170402 A1 | 6/2016 | Lindström |
| 2016/0203403 A1 | 7/2016 | Nagel et al. |
| 2016/0225832 A1 | 8/2016 | Kwon et al. |
| 2016/0255279 A1 | 9/2016 | Sudo |
| 2016/0261837 A1 | 9/2016 | Thompson et al. |
| 2016/0318525 A1 | 11/2016 | Lardy |
| 2016/0330042 A1 | 11/2016 | Andersen |
| 2016/0363831 A1 | 12/2016 | Ash et al. |
| 2016/0372083 A1 | 12/2016 | Taite et al. |
| 2017/0044057 A1 | 2/2017 | Rozbicki et al. |
| 2017/0052289 A1 | 2/2017 | Boissevain et al. |
| 2017/0068414 A1 | 3/2017 | Plumb |
| 2017/0075183 A1 | 3/2017 | Brown |
| 2017/0075323 A1 | 3/2017 | Shrivastava et al. |
| 2017/0082903 A1 | 3/2017 | Vigano et al. |
| 2017/0085834 A1 | 3/2017 | Kim et al. |
| 2017/0102907 A1 | 4/2017 | Kuo et al. |
| 2017/0122802 A1 | 5/2017 | Brown et al. |
| 2017/0132976 A1 | 5/2017 | Yang et al. |
| 2017/0139301 A1 | 5/2017 | Messere et al. |
| 2017/0146884 A1 | 5/2017 | Vigano et al. |

(56) References Cited

U.S. PATENT DOCUMENTS

| | | |
|---|---|---|
| 2017/0157466 A1 | 6/2017 | Korpela et al. |
| 2017/0170776 A1 | 6/2017 | Janowski |
| 2017/0197494 A1 | 7/2017 | Li |
| 2017/0200424 A1 | 7/2017 | Xu et al. |
| 2017/0212399 A1 | 7/2017 | Tarng et al. |
| 2017/0213503 A1 | 7/2017 | Zhang et al. |
| 2017/0221425 A1 | 8/2017 | Lu et al. |
| 2017/0223312 A1 | 8/2017 | McNelley et al. |
| 2017/0234067 A1 | 8/2017 | Fasi et al. |
| 2017/0248564 A1 | 8/2017 | Miyajima |
| 2017/0253801 A1 | 9/2017 | Bae et al. |
| 2017/0264865 A1 | 9/2017 | Huangfu |
| 2017/0277342 A1 | 9/2017 | Hong et al. |
| 2017/0297498 A1 | 10/2017 | Larson et al. |
| 2017/0309215 A1 | 10/2017 | Perdices-Gonzalez et al. |
| 2017/0310956 A1 | 10/2017 | Perdices-Gonzalez et al. |
| 2017/0322760 A1 | 11/2017 | Soh et al. |
| 2017/0328121 A1 | 11/2017 | Purdy et al. |
| 2017/0336692 A1 | 11/2017 | Park et al. |
| 2017/0347129 A1 | 11/2017 | Levi et al. |
| 2018/0004059 A1 | 1/2018 | Jovanovic |
| 2018/0011383 A1 | 1/2018 | Higashihara et al. |
| 2018/0025679 A1 | 1/2018 | Park et al. |
| 2018/0106098 A1 | 4/2018 | Unveren et al. |
| 2018/0129172 A1 | 5/2018 | Shrivastava et al. |
| 2018/0130455 A1 | 5/2018 | Plummer et al. |
| 2018/0144696 A1 | 5/2018 | Zhang et al. |
| 2018/0144712 A1 | 5/2018 | Threlkel et al. |
| 2018/0157141 A1 | 6/2018 | Brown et al. |
| 2018/0188627 A1 | 7/2018 | Vigano et al. |
| 2018/0217429 A1 | 8/2018 | Busch |
| 2018/0231860 A1 | 8/2018 | Podbelski et al. |
| 2018/0252423 A1 | 9/2018 | Hieke et al. |
| 2018/0259804 A1 | 9/2018 | Bae et al. |
| 2018/0270542 A1 | 9/2018 | Ramalingam et al. |
| 2018/0284555 A1 | 10/2018 | Klawuhn et al. |
| 2018/0347258 A1 | 12/2018 | Wexler |
| 2019/0004386 A1 | 1/2019 | Bergh et al. |
| 2019/0011798 A9 | 1/2019 | Brown et al. |
| 2019/0025661 A9 | 1/2019 | Brown et al. |
| 2019/0134940 A1 | 5/2019 | Inoue et al. |
| 2019/0221148 A1 | 7/2019 | Pradhan et al. |
| 2019/0243206 A1 | 8/2019 | Brown et al. |
| 2019/0267933 A1 | 8/2019 | Janowski |
| 2019/0294018 A1 | 9/2019 | Shrivastava et al. |
| 2019/0303086 A1 | 10/2019 | Nagayama et al. |
| 2019/0317458 A1 | 10/2019 | Shrivastava et al. |
| 2019/0346417 A1 | 11/2019 | Benefield |
| 2019/0356508 A1 | 11/2019 | Trikha et al. |
| 2020/0022072 A1 | 1/2020 | Cho et al. |
| 2020/0033163 A1 | 1/2020 | Agarwal et al. |
| 2020/0045261 A1 | 2/2020 | Lim et al. |
| 2020/0056423 A1 | 2/2020 | Bjergaard et al. |
| 2020/0057421 A1 | 2/2020 | Trikha et al. |
| 2020/0073193 A1 | 3/2020 | Pradhan et al. |
| 2020/0096775 A1 | 3/2020 | Franklin et al. |
| 2020/0103068 A1 | 4/2020 | Ahn |
| 2020/0103841 A1 | 4/2020 | Pillai et al. |
| 2020/0104090 A1 | 4/2020 | Kim et al. |
| 2020/0133615 A1 | 4/2020 | Kim et al. |
| 2020/0150508 A1 | 5/2020 | Patterson et al. |
| 2020/0150602 A1 | 5/2020 | Trikha et al. |
| 2020/0256118 A1 | 8/2020 | Hicks et al. |
| 2020/0259237 A1 | 8/2020 | Shrivastava et al. |
| 2020/0260556 A1 | 8/2020 | Rozbicki et al. |
| 2020/0319765 A1 | 10/2020 | Badr et al. |
| 2021/0021788 A1 | 1/2021 | McNelley et al. |
| 2021/0041759 A1 | 2/2021 | Trikha et al. |
| 2021/0063836 A1 | 3/2021 | Patterson et al. |
| 2021/0126063 A1 | 4/2021 | Vanderveen et al. |
| 2021/0132458 A1 | 5/2021 | Trikha et al. |
| 2021/0191218 A1 | 6/2021 | Trikha et al. |
| 2021/0210053 A1 | 7/2021 | Ng et al. |
| 2021/0325753 A1 | 10/2021 | Trikha et al. |
| 2021/0383804 A1 | 12/2021 | Makker et al. |
| 2021/0390953 A1 | 12/2021 | Makker et al. |
| 2021/0405493 A1 | 12/2021 | Tinianov et al. |
| 2022/0137474 A1 | 5/2022 | Trikha et al. |
| 2022/0137475 A1 | 5/2022 | Trikha et al. |
| 2022/0137476 A1 | 5/2022 | Trikha et al. |
| 2022/0179274 A1 | 6/2022 | Trikha et al. |
| 2022/0179275 A1 | 6/2022 | Patterson et al. |
| 2022/0413351 A1 | 12/2022 | Trikha et al. |
| 2023/0065864 A1 | 3/2023 | Trikha et al. |
| 2023/0070288 A1 | 3/2023 | Trikha et al. |
| 2023/0077008 A1 | 3/2023 | Trikha et al. |
| 2023/0096768 A1 | 3/2023 | Trikha et al. |
| 2023/0288770 A1 | 9/2023 | Gupta et al. |
| 2023/0324952 A1 | 10/2023 | Martinson et al. |
| 2023/0393443 A1 | 12/2023 | Marquez et al. |
| 2024/0085754 A1 | 3/2024 | Martinson et al. |
| 2024/0085755 A1 | 3/2024 | Trikha et al. |
| 2024/0094590 A1 | 3/2024 | Trikha et al. |
| 2024/0242717 A1 | 7/2024 | Makker et al. |

FOREIGN PATENT DOCUMENTS

| | | |
|---|---|---|
| CN | 102388340 A | 3/2012 |
| CN | 103003739 A | 3/2013 |
| CN | 103168269 A | 6/2013 |
| CN | 103207493 A | 7/2013 |
| CN | 103266828 A | 8/2013 |
| CN | 103701694 A | 4/2014 |
| CN | 104885002 A | 9/2015 |
| CN | 205264276 U | 5/2016 |
| CN | 105676556 A | 6/2016 |
| CN | 106125442 A | 11/2016 |
| CN | 106364442 A | 2/2017 |
| CN | 205992531 U | 3/2017 |
| CN | 106575064 A | 4/2017 |
| CN | 207409225 U | 5/2018 |
| CN | 108388058 A | 8/2018 |
| CN | 208537871 U | 2/2019 |
| CN | 209044229 U | 6/2019 |
| CN | 110515425 A | 11/2019 |
| CN | 110543057 A | 12/2019 |
| EP | 2837205 A1 | 2/2015 |
| EP | 3015915 A1 | 5/2016 |
| EP | 2837205 B1 | 2/2017 |
| EP | 3352053 A1 | 7/2018 |
| GB | 6147609 | 7/2021 |
| GB | 6147618 | 7/2021 |
| JP | H0611477 A | 1/1994 |
| JP | H06242044 A | 9/1994 |
| JP | H06308073 A | 11/1994 |
| JP | 2008293024 A | 12/2008 |
| JP | 2019502145 A | 1/2019 |
| JP | 2019520552 A | 7/2019 |
| KR | 20060069742 A | 6/2006 |
| KR | 20070024837 A | 3/2007 |
| KR | 20080043487 A | 5/2008 |
| KR | 20110003698 A | 1/2011 |
| KR | 20120092921 A | 8/2012 |
| KR | 101254602 B1 | 4/2013 |
| KR | 101346862 B1 | 1/2014 |
| KR | 20140004175 A | 1/2014 |
| KR | 101471443 B1 | 12/2014 |
| KR | 20150060051 A | 6/2015 |
| KR | 20150136981 A | 12/2015 |
| KR | 20160012564 A | 2/2016 |
| KR | 20160105005 A | 9/2016 |
| KR | 20170022132 A | 3/2017 |
| KR | 20170087931 A | 7/2017 |
| KR | 20170095892 A | 8/2017 |
| KR | 20170121858 A | 11/2017 |
| KR | 101799323 B1 | 12/2017 |
| KR | 20190077583 A | 7/2019 |
| TW | 201348828 A | 12/2013 |
| TW | 201621138 A | 6/2016 |
| WO | WO-02054086 A1 | 7/2002 |
| WO | WO-2013159778 A1 | 10/2013 |
| WO | WO-2015120045 A1 | 8/2015 |
| WO | WO-2015134789 A1 | 9/2015 |
| WO | WO-2016086017 A1 | 6/2016 |

(56) References Cited

FOREIGN PATENT DOCUMENTS

| | | |
|---|---|---|
| WO | WO-2016094139 A1 | 6/2016 |
| WO | WO-2016153467 A1 | 9/2016 |
| WO | WO-2016183059 A1 | 11/2016 |
| WO | WO-2017007841 A1 | 1/2017 |
| WO | WO-2017035650 A1 | 3/2017 |
| WO | WO-2017062592 A1 | 4/2017 |
| WO | WO-2017075059 A1 | 5/2017 |
| WO | WO-2017137904 A1 | 8/2017 |
| WO | WO-2017155833 A1 | 9/2017 |
| WO | WO-2017180734 A1 | 10/2017 |
| WO | WO-2017189618 A1 | 11/2017 |
| WO | WO-2017192881 A1 | 11/2017 |
| WO | WO-2018063919 A1 | 4/2018 |
| WO | WO-2018098089 A1 | 5/2018 |
| WO | WO-2018102103 A1 | 6/2018 |
| WO | WO-2018200702 A1 | 11/2018 |
| WO | WO-2018200740 A2 | 11/2018 |
| WO | WO-2018200752 A1 | 11/2018 |
| WO | WO-2019040809 A1 | 2/2019 |
| WO | WO-2020146766 A1 | 7/2020 |
| WO | WO-2021067505 A1 | 4/2021 |
| WO | WO-2021154915 A1 | 8/2021 |
| WO | WO-2021211798 A1 | 10/2021 |

OTHER PUBLICATIONS

Chinese Office Action dated Nov. 1, 2022 in CN Application No. CN201880035570 with English translation.
CN Office Action dated Feb. 9, 2023, in Application No. CN201880035614.X with English translation.
CN Office Action dated Mar. 8, 2022, in Application No. CN201880035614.X with English translation.
CN Office Action dated Oct. 24, 2022, in Application No. CN201880035614.X with English translation.
EP Office Action dated Feb. 6, 2023 in Application No. EP20797262.1.
European Extended Search Report dated Nov. 11, 2020 in EP Application No. 18791268.8.
European Extended Search Report dated Nov. 12, 2020 in EP Application No. 18791669.7.
"Halio Rooftop Sensor Kit (Model SR500)," Product Data Sheet, Kinestral Technologies, 2020, 4 pp.
IN Office Action dated Jan. 24, 2022 in Application No. IN201937044699.
IN Office action dated Sep. 28, 2021, in IN Application No. IN201937045203.
International Preliminary Report on Patentability dated Apr. 13, 2023 in PCT Application No. No. PCT/US2021/052587.
International Preliminary Report on Patentability dated Apr. 13, 2023 in PCT Application No. No. PCT/US2021/052595.
International Preliminary Report on Patentability dated Aug. 11, 2022 in PCT Application No. PCT/US2021/015378.
International Preliminary Report on Patentability dated Feb. 9, 2023 in PCT Application No. PCT/US2021/043143.
International Preliminary Report on Patentability dated Nov. 7, 2019 in PCT Application No. PCT/US2018/029406.
International Preliminary Report on Patentability dated Nov. 7, 2019 in PCT Application No. PCT/US2018/029476.
International Search Report and Written Opinion dated Jun. 23, 2021 in PCT Application No. PCT/US2021/015378.
International Search Report and Written Opinion dated Mar. 8, 2022 in PCT Application No. PCT/US2021/052587.
International Search Report and Written Opinion dated Mar. 15, 2021 in PCT Application No. PCT/US2020/053641.
International Search Report and Written Opinion dated Mar. 15, 2022 in PCT Application No. PCT/US2021/052595.
International Search Report and Written Opinion dated Nov. 10, 2021 in PCT Application No. PCT/US2021/043143.
International Search Report and Written Opinion dated Oct. 15, 2018 in PCT Application No. PCT/US2018/029406.
International Search Report and Written Opinion dated Sep. 1, 2022, in Application No. PCT/US2022/024812.
Joseph, J., "Xiaomi shows off near perfect Under Screen Camera Technology," Gizchina.com, Aug. 28, 2020, 7 pp., "title=Link: https://www.gizmochina.com/2020/08/28/xiaomi-perfected-third-gen-under-screen-camera-technology-prototype/>">https://www.gizmochina.com/2020/08/28/xiaomi-perfected-third-gen-under-screen-camera-technology-prototype/ , retrieved Apr. 21, 2021.
KR Office Action dated Sep. 27, 2022, in Application No. KR10-2022-7014814 with English Translation.
KR Office Action dated Mar. 31, 2023, in Application No. KR10-2022-7014814 with English translation.
Lululemon athletica, "Mirror", The Mirror Gym product brochure, known Dec. 8, 2020, 9 pp, >https://shop.lululemon.com/story/mirror-home-gym , retrieved Jan. 29, 2021.
PCT Application No. PCT/US2021/052587 filed Sep. 29, 2021.
PCT Application No. PCT/US2021/052595 filed Sep. 29, 2021.
PCT Application No. PCT/US2021/052597 filed Sep. 29, 2021.
PCT International Search Report and Written Opinion (ISA:KIPO) dated Aug. 13, 2018 for PCT Application No. PCT/US2018/029476.
Porter, J., "LG developing sliding doors made of transparent OLED displays," The Verge, Dec. 7, 2020, 2 pp, "title=Link: https://www.theverge.com/2020/12/7/22158335/lg-assa-abloy-automatic-sliding-doors-transparent-oled-displays>">https://www.theverge.com/2020/12/7/22158335/lg-assa-abloy-automatic-sliding-doors-transparent-oled-displays , retrieved Dec. 8, 2020.
Science News, "New technique could help spot snooping drones", Jan. 23, 2018, 2 pp, "title=Link: https://www.sciencenews.org/article/new-technique-could-help-spot-snooping-drones>">https://www.sciencenews.org/article/new-technique-could-help-spot-snooping-drones retrieved Jan. 24, 2018.
TW Office Action dated Feb. 24, 2022, in Application No. TW107114102 with English Translation.
TW Office Action dated May 4, 2023 in Application No. TW20180114105.
TW Office Action dated Oct. 31, 2022, in Application No. TW107114102 with English Translation.
TW Office Action dated Sep. 13, 2022 in Application No. TW20180114105 with English translation.
U.S. Corrected Notice of Allowance dated Aug. 10, 2022 in U.S. Appl. No. 17/578,196.
U.S. Corrected Notice of Allowance dated Aug. 31, 2022 in U.S. Appl. No. 17/578,226.
U.S. Non-Final office Action dated Sep. 14, 2022 in U.S. Appl. No. 16/950,774.
U.S. Notice of Allowance dated Aug. 3, 2022 in U.S. Appl. No. 17/578,218.
U.S. Notice of Allowance dated Aug. 4, 2022 in U.S. Appl. No. 17/578,226.
U.S. Notice of Allowance dated Aug. 11, 2022 in U.S. Appl. No. 17/578,234.
U.S. Restriction Requirement dated May 12, 2022 in U.S. Appl. No. 16/950,774.
U.S. Advisory Action dated Dec. 23, 2022 in U.S. Appl. No. 17/232,598.
U.S. Advisory Action dated Feb. 3, 2023 in U.S. Appl. No. 16/608,157.
U.S Advisory Action dated Jan. 14, 2022 in U.S. Appl. No. 16/608,159.
U.S. Appl. No. 63/057,120, Inventors Gupta et al., filed Jul. 27, 2020.
U.S. Appl. No. 63/078,805, Inventors Gupta et al., filed Sep. 15, 2020.
U.S. Co-pending Application dated Nov. 11, 2022 in U.S. Appl. No. 17/985,726.
US Corrected Notice of Allowability dated Sep. 22, 2021, in U.S. Appl. No. 17/338,562.
U.S. Corrected Notice of Allowance dated Oct. 24, 2022 in U.S. Appl. No. 17/578,234.
U.S. Final office Action dated Nov. 23, 2022 in U.S. Appl. No. 16/608,157.
U.S. Final Office Action dated Apr. 6, 2023 in U.S. Appl. No. 16/950,774.

(56) References Cited

OTHER PUBLICATIONS

US Final Office Action dated Aug. 19, 2021 in US Appl. No. 16/608,159.
U.S. Final Rejection dated Oct. 18, 2022, in U.S. Appl. No. 17/232,598.
U.S. Non Final office action dated Mar. 28, 2022, in U.S. Appl. No. 17/578,196.
U.S. Non Final office action dated Mar. 28, 2022, in U.S. Appl. No. 17/578,226.
U.S. Non-Final Office Action dated Apr. 14, 2023 in U.S. Appl. No. 29/652,916.
U.S. Non-Final Office Action dated Apr. 25, 2023 in U.S. Appl. No. 17/985,720.
U.S. Non-Final Office Action dated Feb. 15, 2023 in U.S. Appl. No. 17/083,128.
U.S. Non-Final office Action dated Jan. 27, 2023 in U.S. Appl. No. 17/985,743.
U.S. Non-Final Office Action dated Jul. 15, 2022, in U.S. Appl. No. 16/608,157.
U.S. Non-Final Office Action dated Mar. 3, 2023 in U.S. Appl. No. 16/608,157.
U.S. Non-Final Office Action dated Mar. 29, 2022, in U.S. Appl. No. 17/578,234.
U.S. Notice of Allowance dated Apr. 11, 2023 in U.S. Appl. No. 17/232,598.
U.S. Notice of Allowance dated Apr. 25, 2023 in U.S. Appl. No. 17/985,726.
U.S. Notice of Allowance dated Apr. 26, 2023 in U.S. Appl. No. 17/232,598.
U.S. Notice of Allowance dated Aug. 1, 2022 in U.S. Appl. No. 17/578,196.
U.S. Notice of Allowance dated Feb. 9, 2023 in U.S. Appl. No. 17/232,598.
U.S. Notice of Allowance dated Feb. 14, 2022 in U.S. Appl. No. 16/608,159.
U.S. Notice of Allowance dated Jun. 13, 2022, in U.S. Appl. No. 17/081,809.
U.S. Notice of Allowance dated May 18, 2022, in U.S. Appl. No. 17/081,809.
US Notice of Allowance dated Sep. 3, 2021, in U.S. Appl. No. 17/338,562.
US Office Action dated Apr. 1, 2022 in U.S. Appl. No. 17/578,218.
U.S. Office Action dated Apr. 4, 2022, in U.S. Appl. No. 16/608,157.
US Office Action dated Jan. 19, 2021 in U.S. Appl. No. 16/608,159.
U.S. Appl. No. 17/338,562, inventors Trikha et al., filed Jun. 3, 2021.
U.S. Appl. No. 63/135,021, inventors Martinson et al., filed Jan. 8, 2021.
U.S. Appl. No. 63/181,648, inventors Makker et al., filed Apr. 29, 2021.
U.S. Appl. No. 63/211,400, inventors Martinson et al., filed Jun. 16, 2021.
U.S. Appl. No. 63/085,254, Inventors Young et al., filed Sep. 30, 2020.
U.S. Appl. No. 63/115,842, Inventors Martinson et al., filed Nov. 19, 2020.
U.S. Appl. No. 63/154,352, Inventors Martinson et al., filed Feb. 26, 2021.
U.S. Appl. No. 63/170,245, Inventors Martinson et al., filed Apr. 2, 2021.
U.S. Appl. No. 63/212,483, inventors Martinson et al., filed Jun. 18, 2021.
U.S. Appl. No. 63/246,770, Inventors Martinson et al., filed Sep. 21, 2021.
U.S. Appl. No. 63/247,684, Inventors Martinson et al., filed Sep. 23, 2021.
U.S. Appl. No. 63/214,741, inventors Marquez et al., filed Jun. 24, 2021.
U.S. Appl. No. 17/899,019, inventors Trikha et al., filed Aug. 30, 2022.
U.S. Appl. No. 18/028,292, inventors Martinson et al., filed Mar. 24, 2023.
U.S. Appl. No. 18/034,328, inventors Marquez et al., filed Apr. 27, 2023.
U.S. Appl. No. 29/652,916, inventors Martinson et al., filed Jan. 8, 2021.
US Preliminary Amendment dated Dec. 31, 2019 in U.S. Appl. No. 16/608,159.
US Preliminary Amendment dated Mar. 31, 2020 in U.S. Appl. No. 16/608,157.
U.S. Restriction Requirement dated Dec. 12, 2022 in U.S. Appl. No. 29/652,916.
CA Office Action dated Aug. 13, 2024 in CA Application No. 3062818.
CA Office Action dated Feb. 9, 2024 in CA Application No. 3173471.
CA Office Action dated Feb. 13, 2024 in CA Application No. 3173667.
CA Office Action dated Oct. 11, 2023 in CA Application No. CA3062818.
CN Office Action dated Jan. 13, 2024 in CN Application No. 202080078084.4, with English Translation.
CN Office Action dated Jul. 29, 2023, in Application No. CN201880035570.0 with English Translation.
CN Office Action dated May 15, 2024 in CN Application No. 202080078084.4, with English Translation.
EP Extended European Search report dated Jan. 30, 2024 in EP Application No. 23218327.7.
IN Office Action dated Oct. 31, 2022 in Application No. IN202238012864.
International Preliminary Report on Patentability dated Apr. 13, 2023 in PCT Application No. No. PCT/US2021/052597.
International Preliminary Report on Patentability dated Aug. 10, 2023, in PCT Application No. PCT/US2022/014135.
International Preliminary Report on Patentability dated May 19, 2023 in PCT Application No. PCT/US2021/057678.
International Preliminary Report on Patentability dated Oct. 26, 2023, in Application No. PCT/US2022/024812.
International Search Report and Written Opinion dated Apr. 19, 2022 in PCT Application No. PCT/U S2021 /0576 78.
International Search Report and Written Opinion dated Jan. 20, 2022 in PCT Application No. PCT/US2021/052597.
International Search Report and Written Opinion dated May 4, 2022, in PCT Application No. PCT/US2022/014135.
JP Office Action dated Feb. 7, 2024 in JP Application No. 2022-520878, with English Translation.
JP Office Action dated Jul. 26, 2023 in Application No. JP2022-520878 with English translation.
JP Office Action dated Mar. 9, 2023 in Application No. JP2022-520878 with English translation.
JP Office Action dated Oct. 6, 2022 in Application No. JP2022-520878 with English translation.
TW Notice of Allowances dated Jul. 19, 2024 in TW Application No. 112127320 with English translation.
TW Office Action dated Apr. 29, 2024 in TW Application No. 112127320, with English translation.
TW Office Action dated May 4, 2023 in Application No. TW20180114105 with English translation.
TW Office Action dated Oct. 18, 2023 in TW Application No. 112127320 with English Translation.
U.S Advisory Action dated Jun. 9, 2023 in U.S. Appl. No. 16/950,774.
U.S. Corrected Notice of Allowance dated Sep. 18, 2023, in U.S. Appl. No. 16/608,157.
U.S. Corrected Notice of Allowance dated Sep. 25, 2023, in U.S. Appl. No. 16/608,157.
U.S. Non-Final Office Action dated Feb. 23, 2024 in U.S. Appl. No. 17/313,760.
U.S. Non-Final Office Action dated Jul. 24, 2023, in U.S. Appl. No. 16/950,774.
U.S. Non-Final Office Action dated Jun. 12, 2024 in U.S. Appl. No. 17/300,303.
U.S. Notice of Allowance dated Dec. 7, 2023 in U.S. Appl. No. 17/985,720.

(56) References Cited

OTHER PUBLICATIONS

U.S. Notice of Allowance dated Jul. 2, 2024 in U.S. Appl. No. 18/514,589.
U.S. Notice of Allowance dated Jun. 9, 2023 in U.S. Appl. No. 17/985,743.
U.S. Notice of Allowance dated Jun. 22, 2023, in U.S. Appl. No. 17/985,726.
U.S. Notice of Allowance dated Jun. 23, 2023, in U.S. Appl. No. 17/985,743.
U.S. Notice of Allowance dated Oct. 17, 2023 in U.S. Appl. No. 17/985,720.
U.S. Notice of Allowance dated Sep. 12, 2023 in U.S. Appl. No. 16/608,157.
U.S. Appl. No. 18/028,297, inventors Martinson et al., filed Mar. 24, 2023.
U.S. Restriction Requirement dated Jul. 25, 2024 in U.S. Appl. No. 18/492,495.
EP Partial Supplementary European Search report dated Sep. 12, 2024 in EP Application No. 21876368.8.
U.S. Non-Final Office Action dated Oct. 11, 2024 in U.S. Appl. No. 18/492,495.
U.S. Non-Final Office Action dated Sep. 24, 2024 in U.S. Appl. No. 17/679,027.
U.S. Non-Final Office Action dated Sep. 26, 2024 in U.S. Appl. No. 18/555,129.
U.S. Restriction requirement dated Sep. 5, 2024 in U.S. Appl. No. 17/759,709.

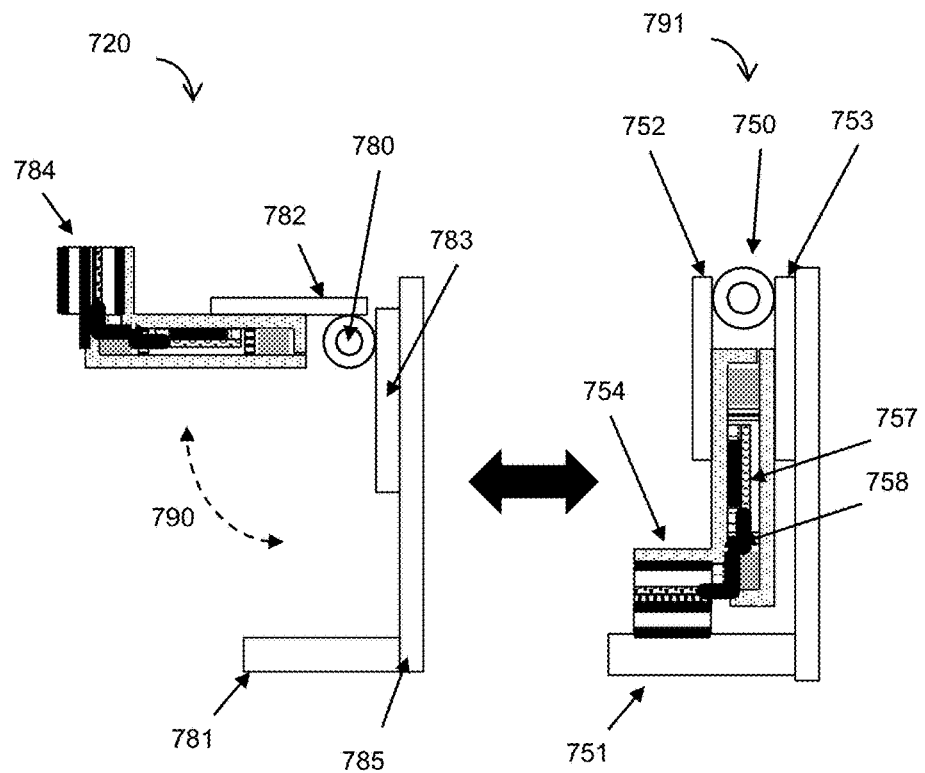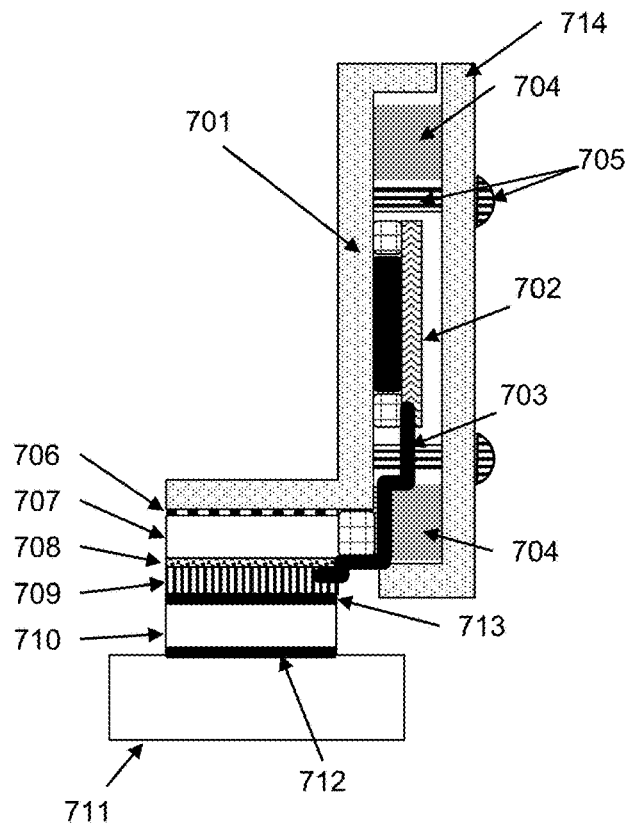
Figure 7

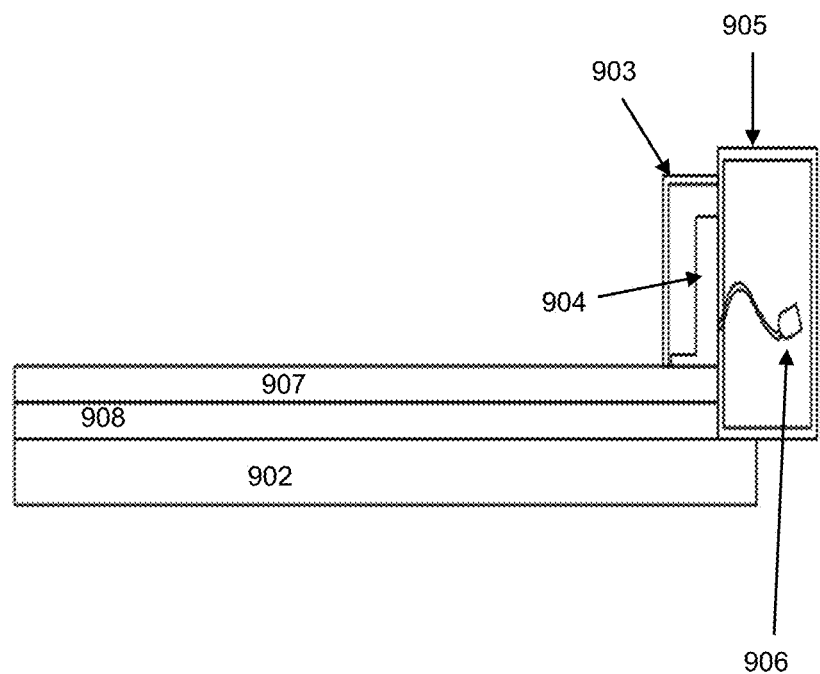
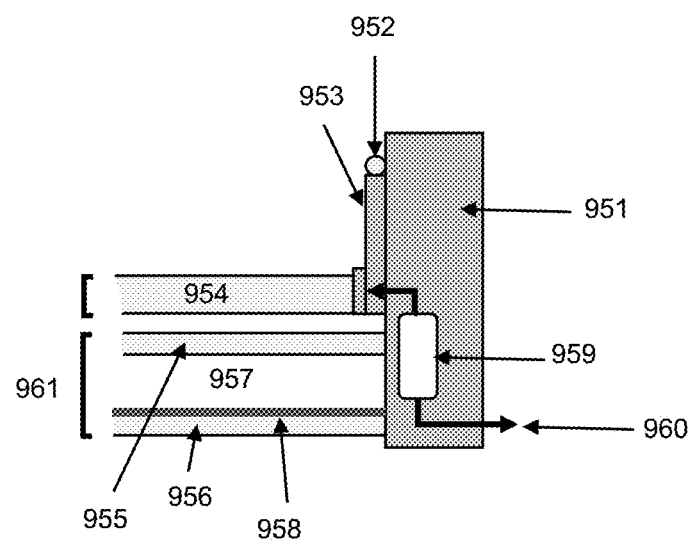
Figure 9

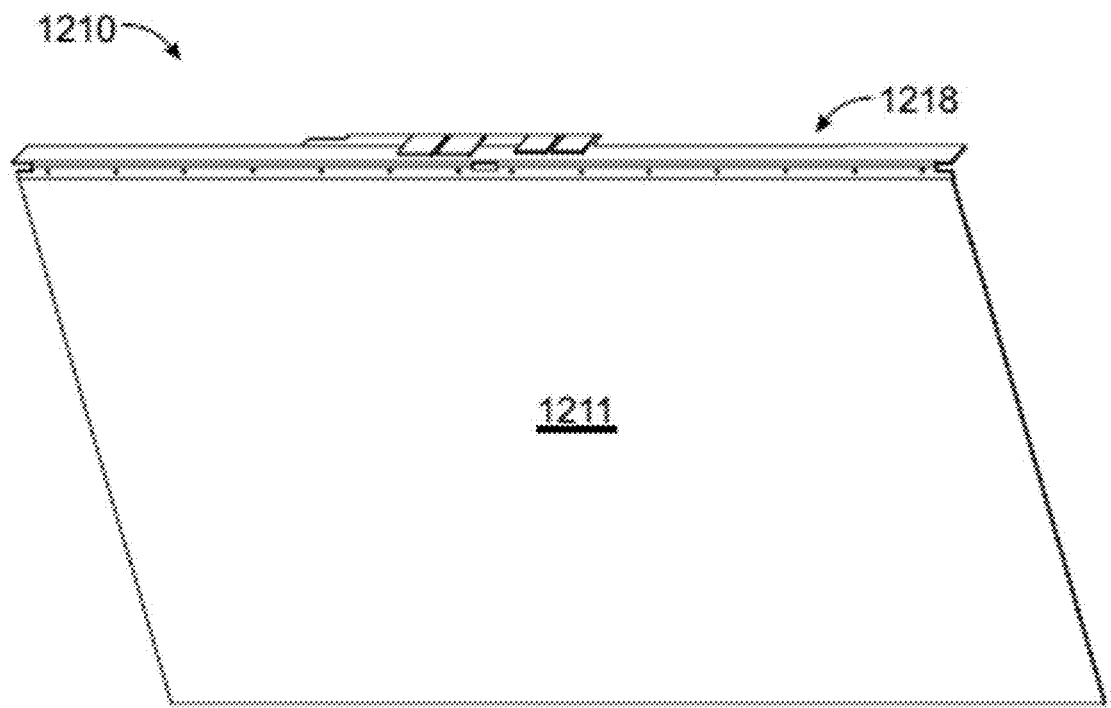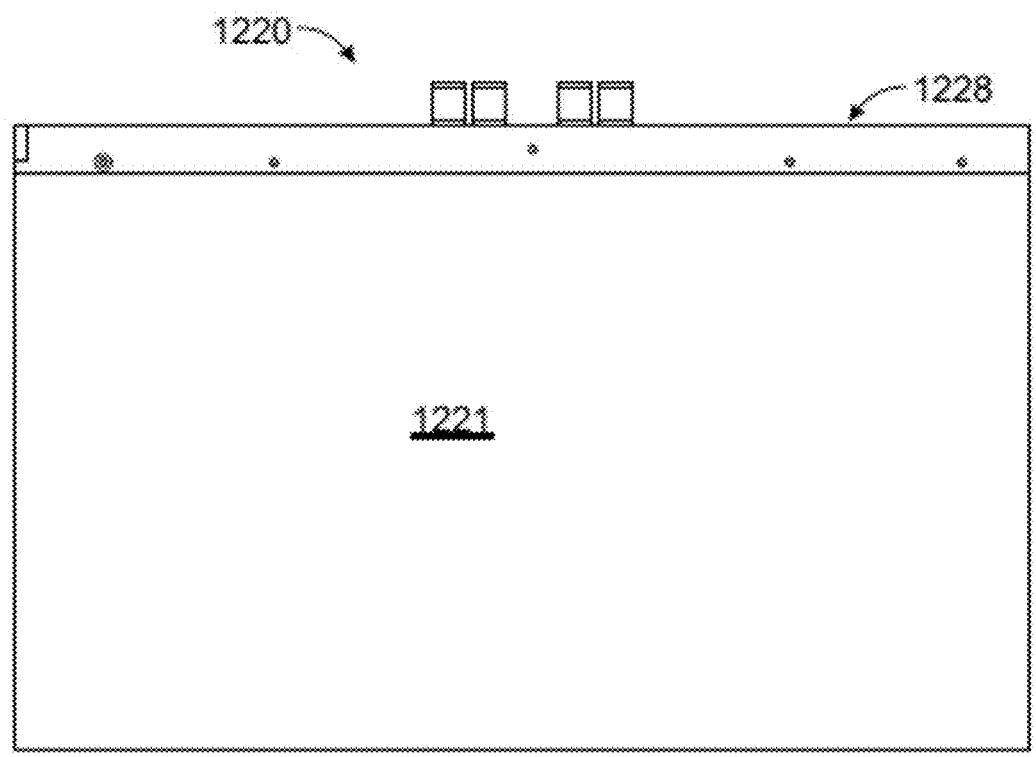
Figure 12

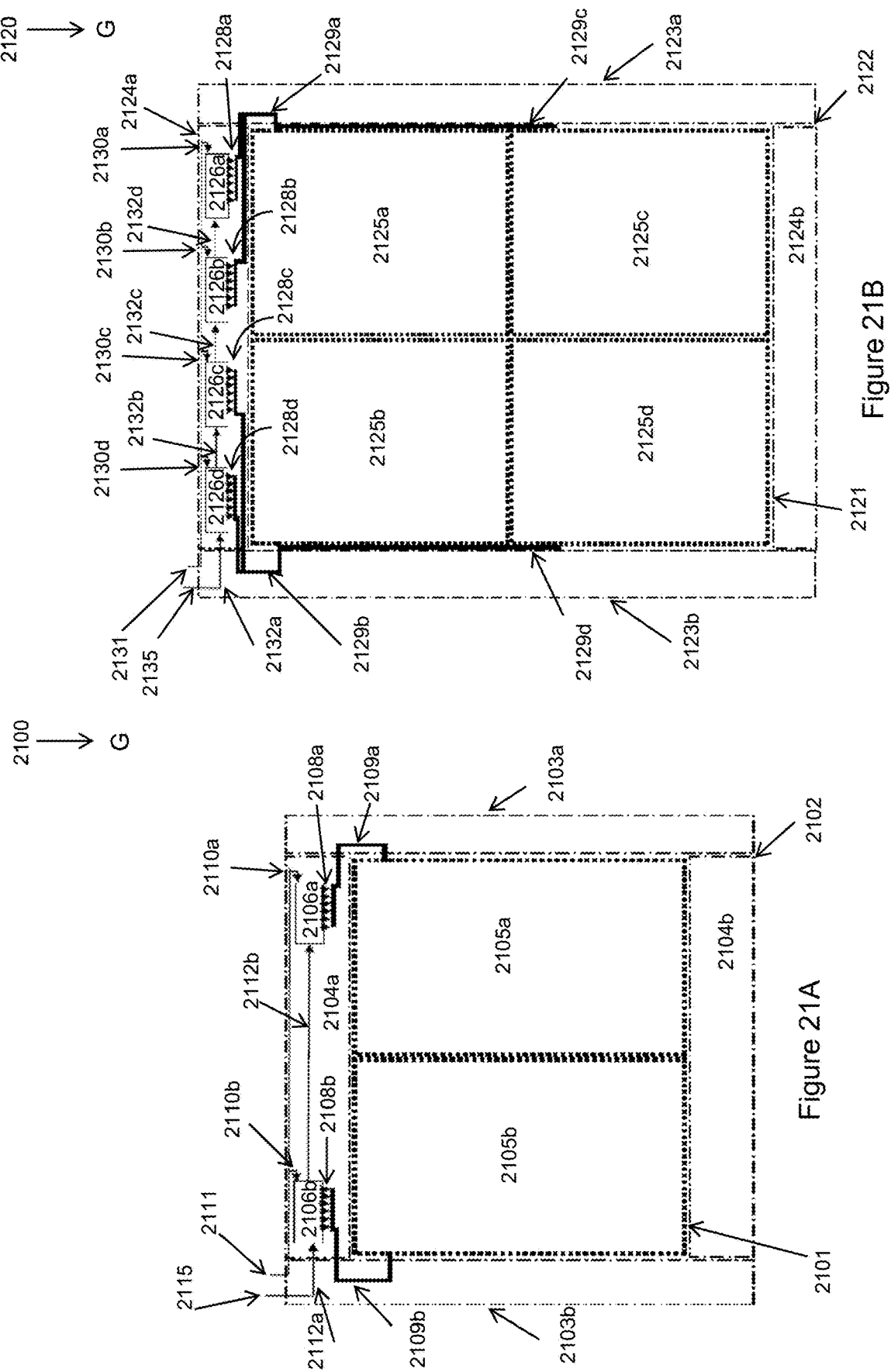

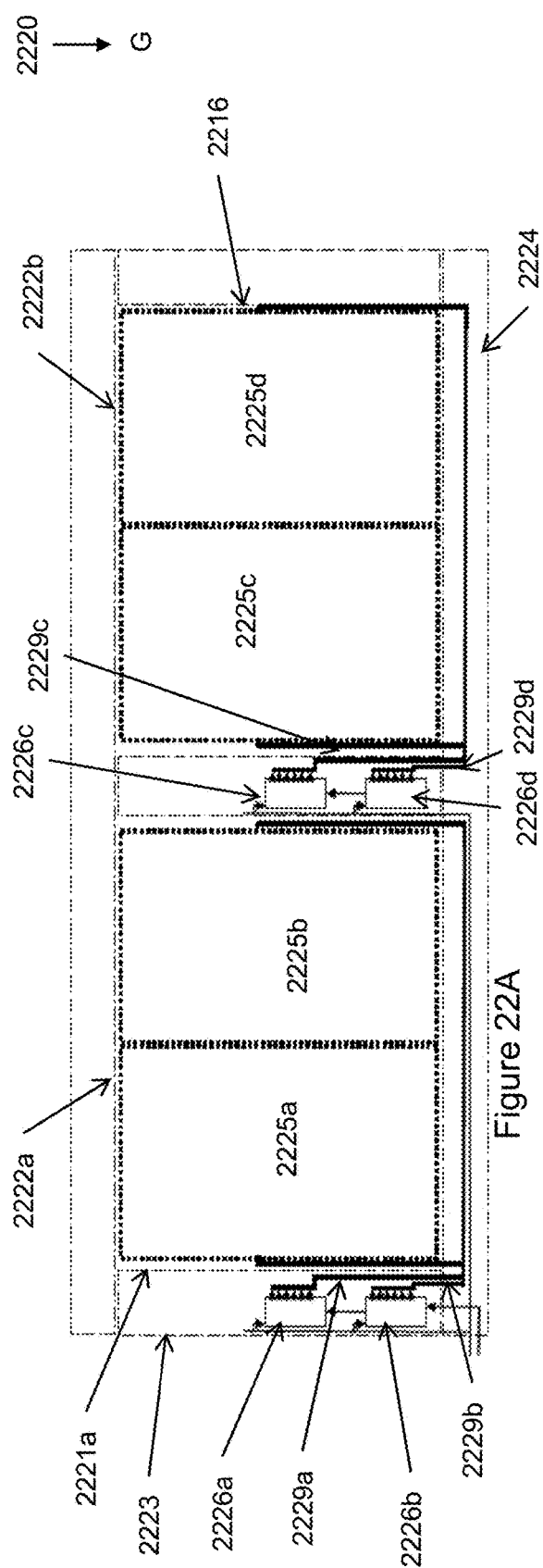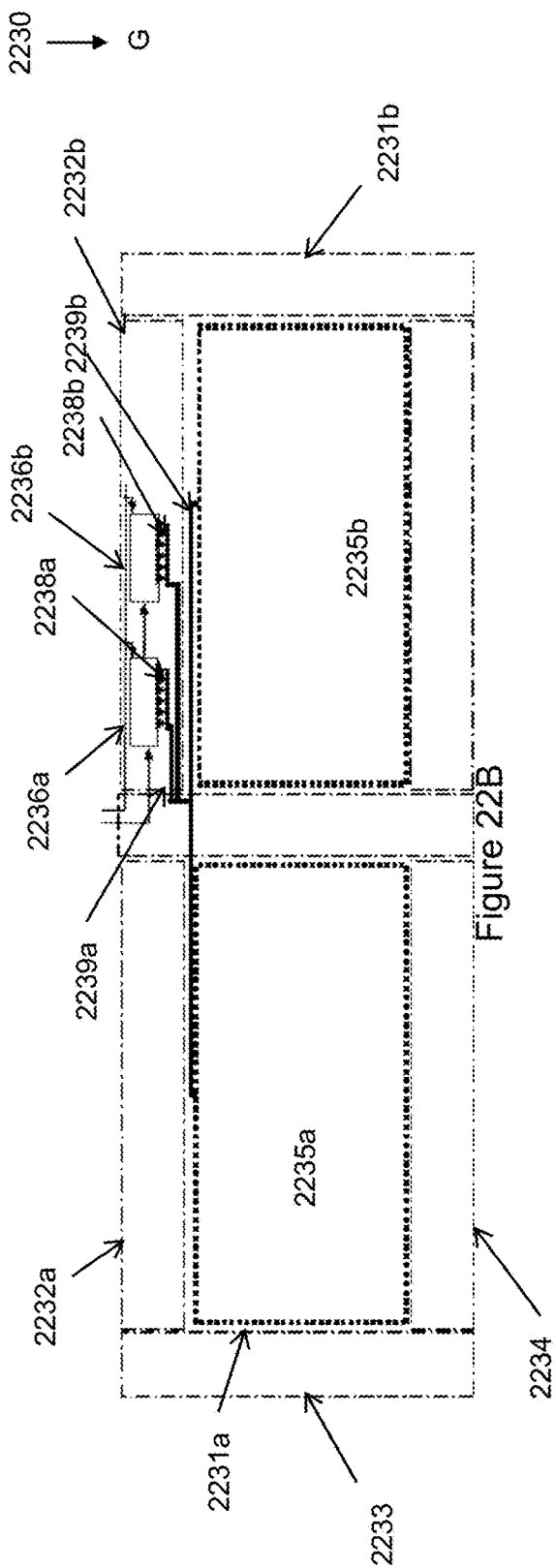
Figure 22A
Figure 22B

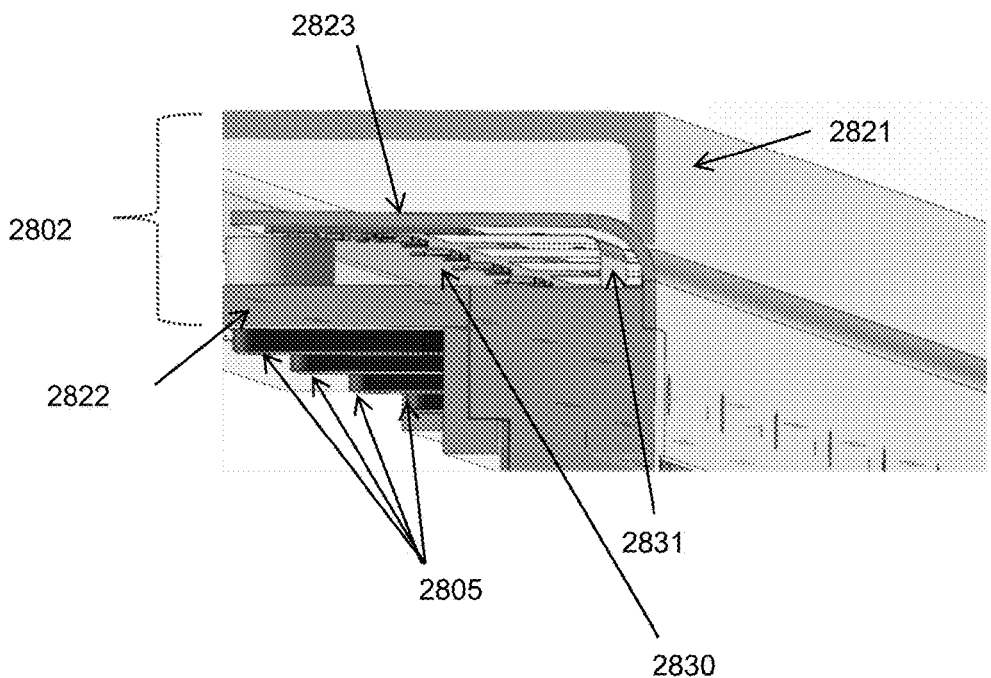
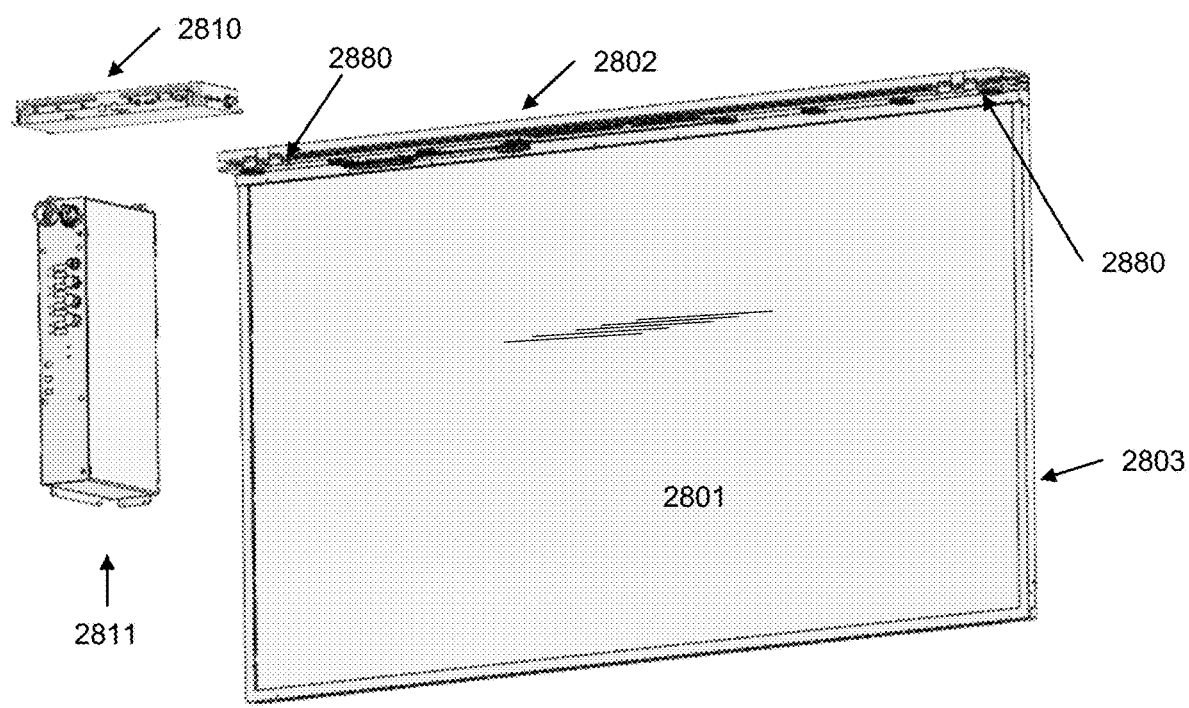
Figure 28

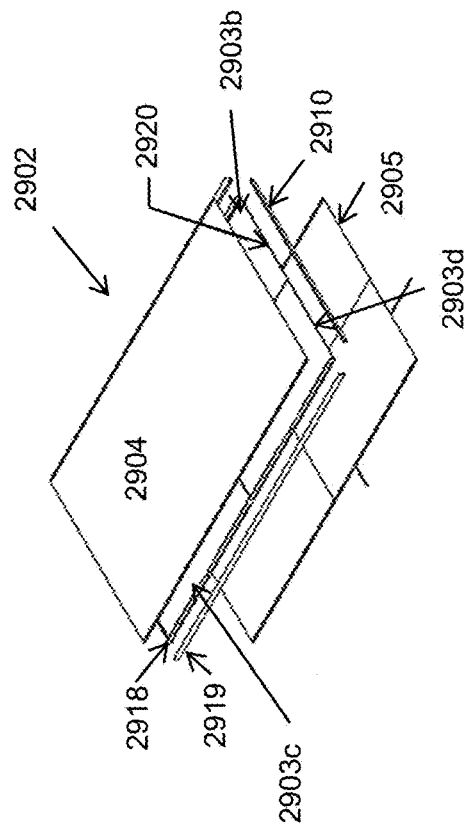
Figure 29A
Figure 29C
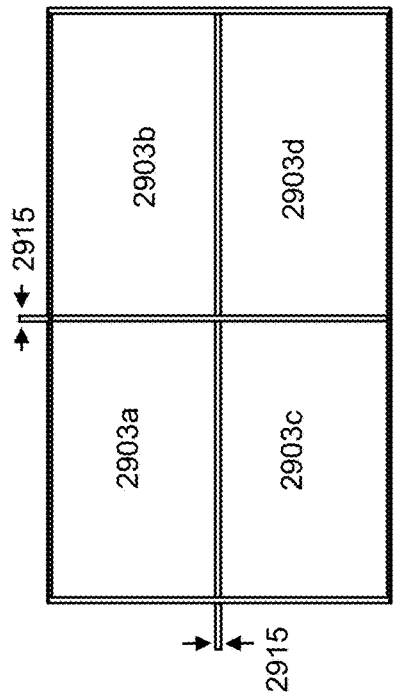
Figure 29D
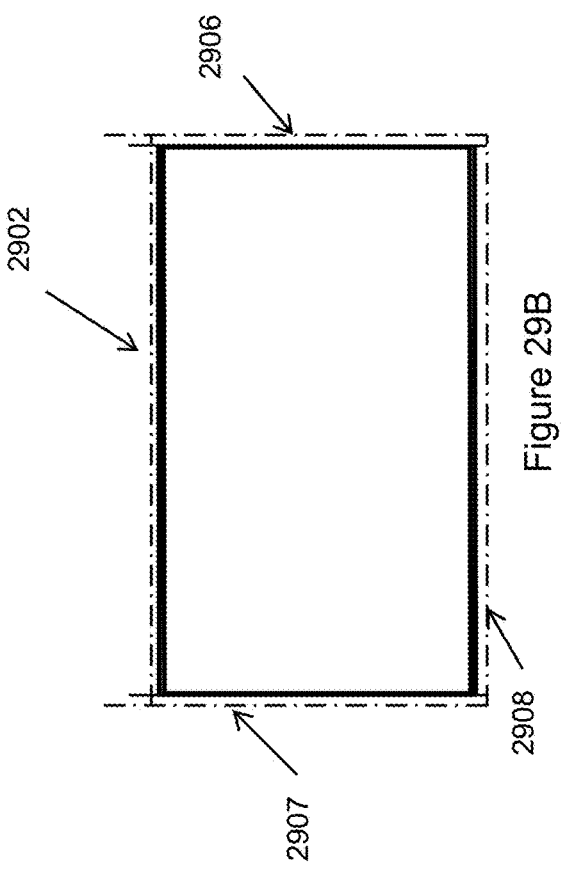
Figure 29B

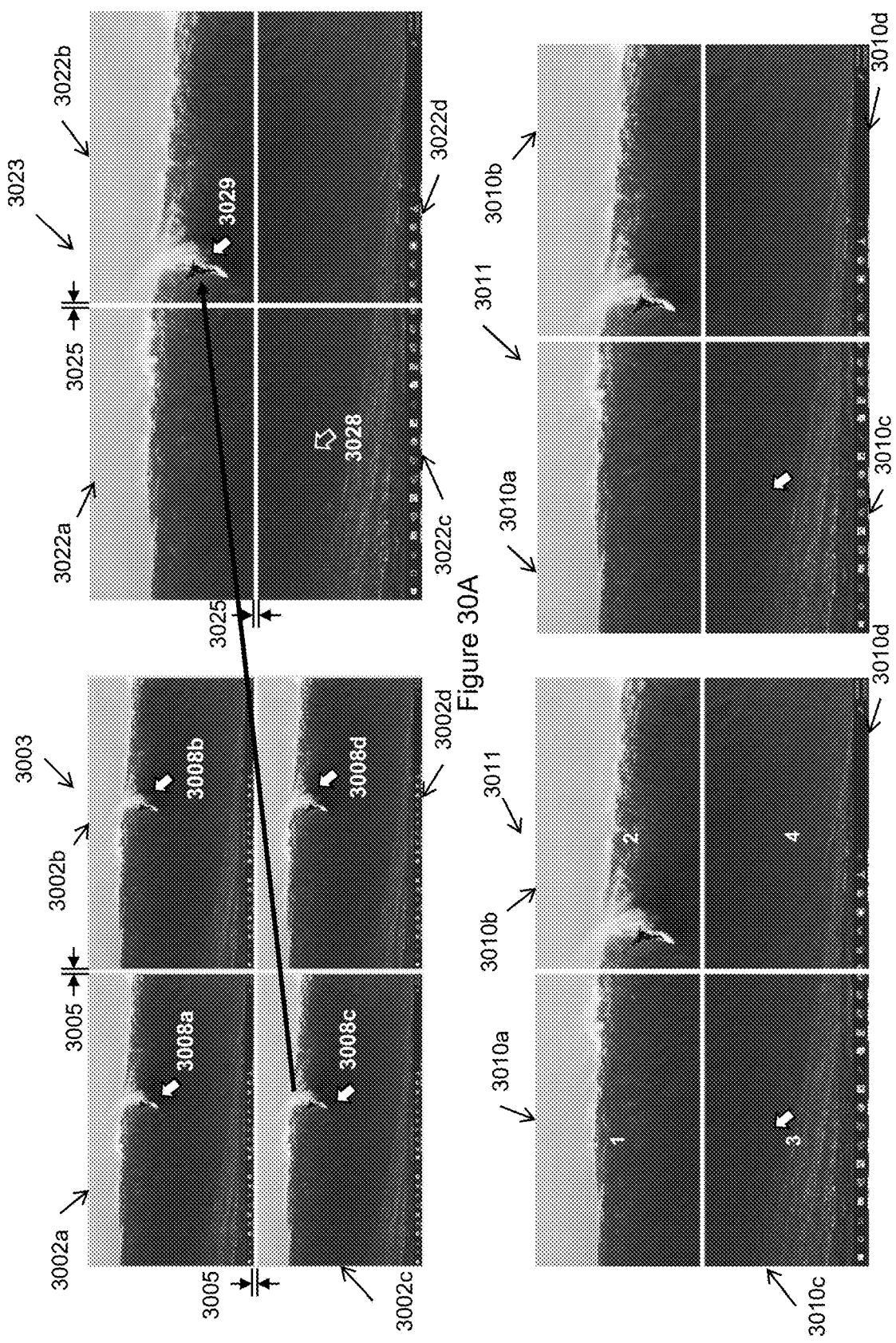

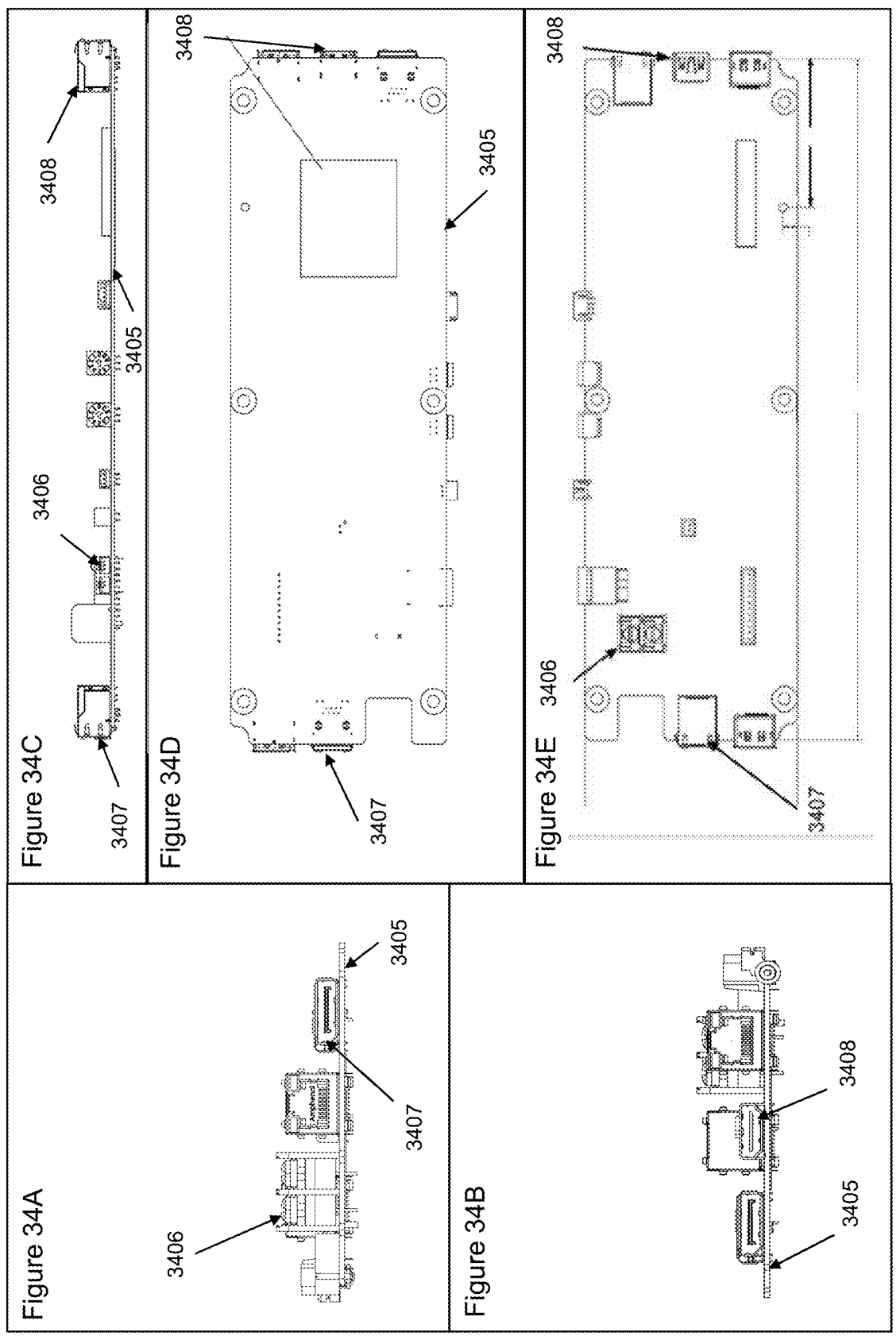

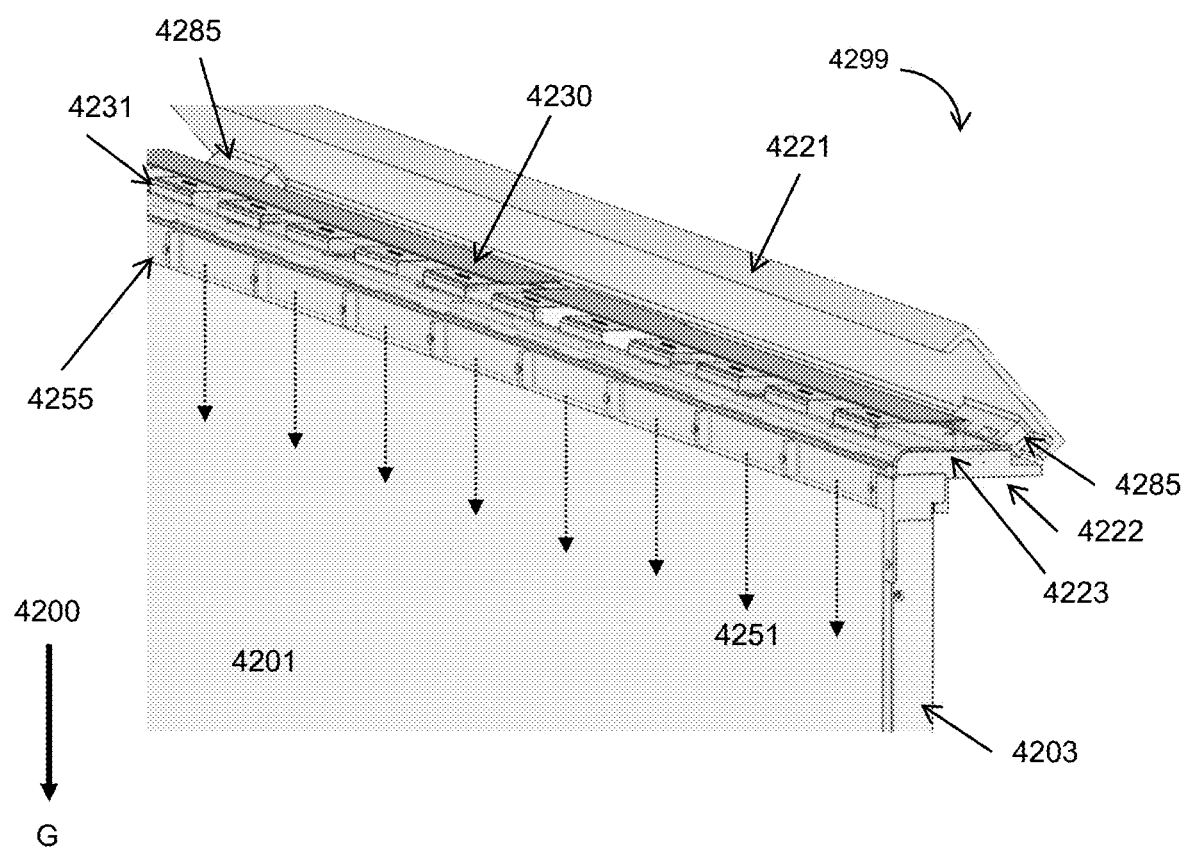
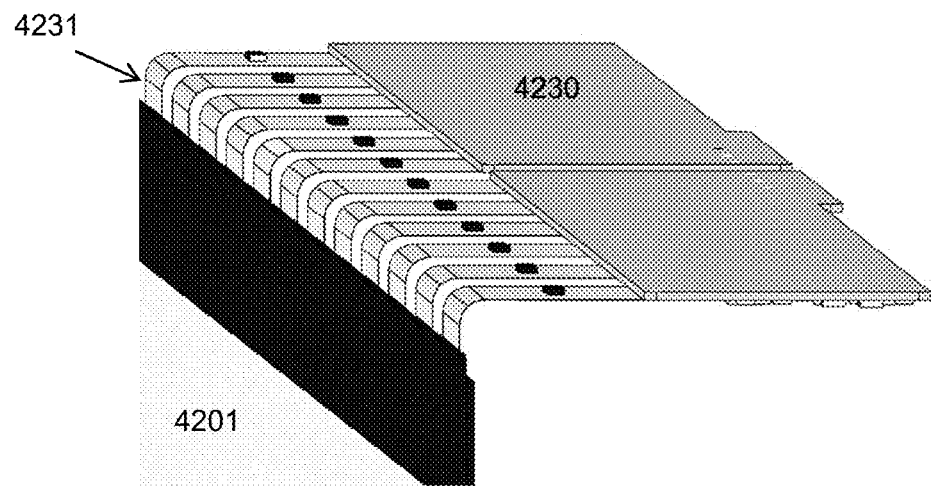
Figure 42

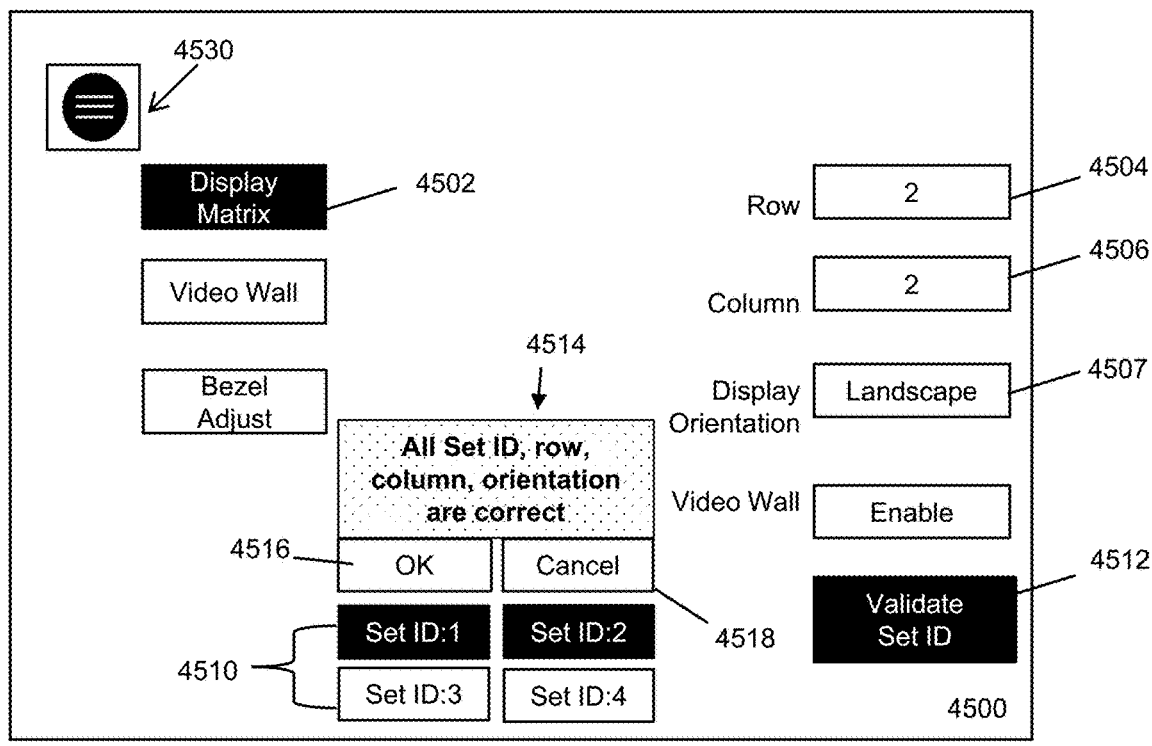
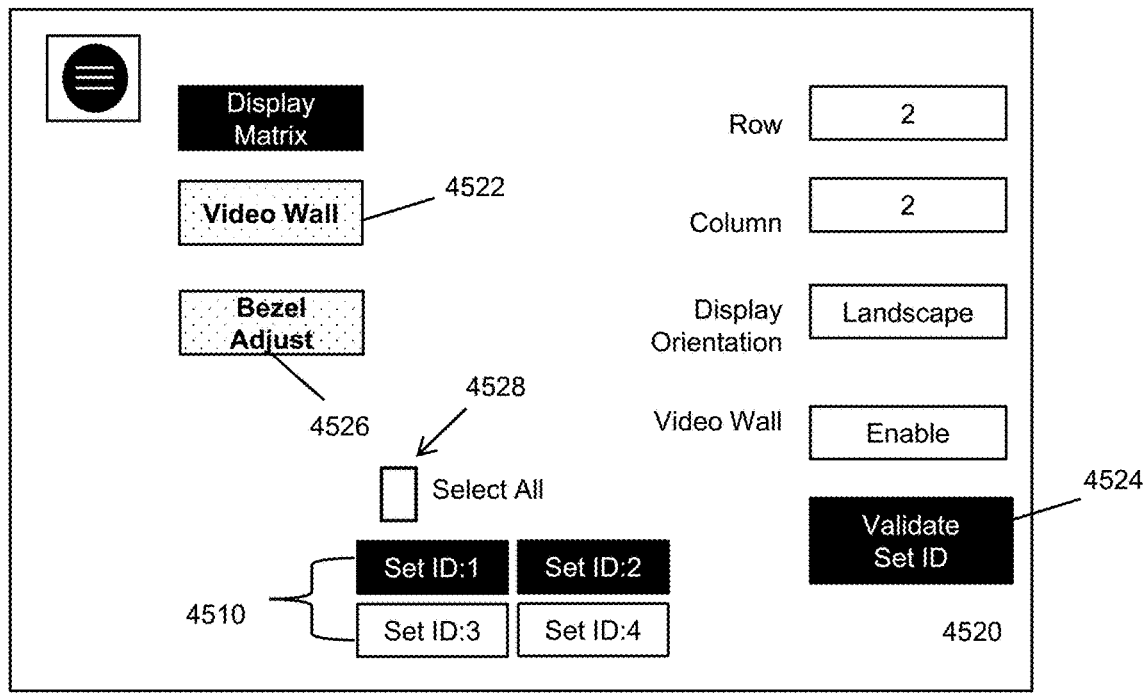
Figure 45

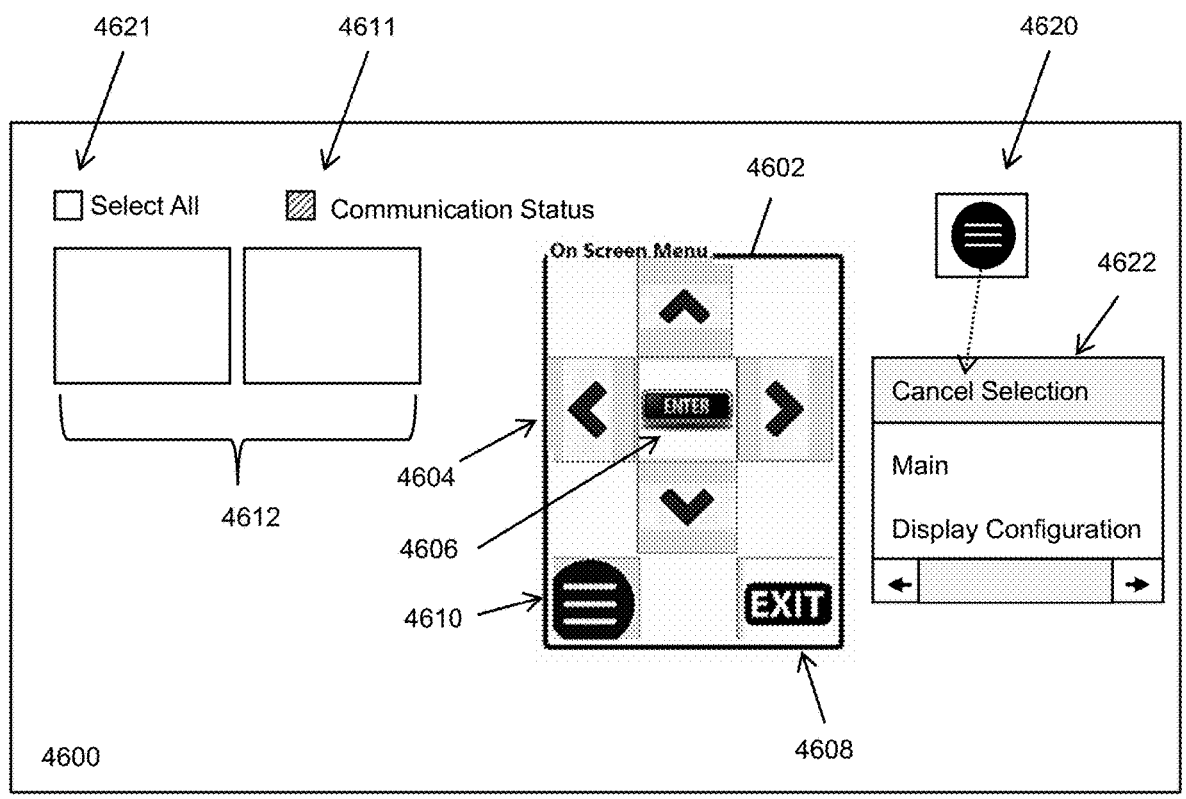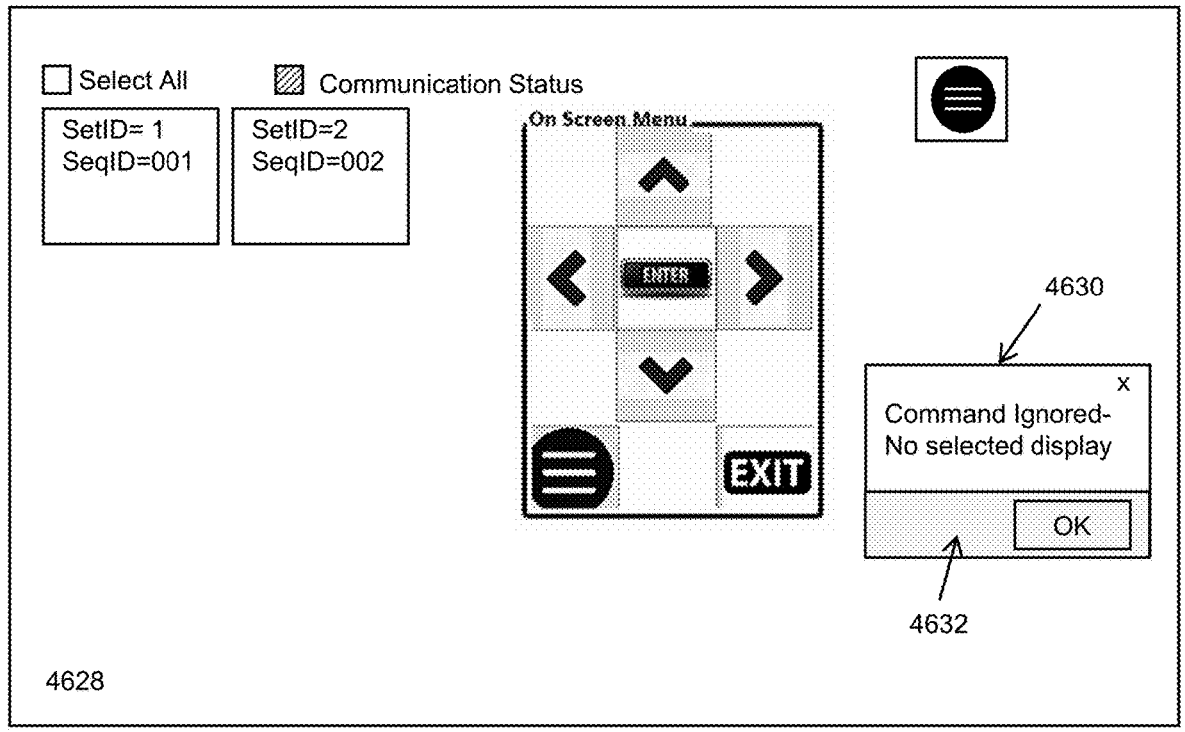
Figure 46

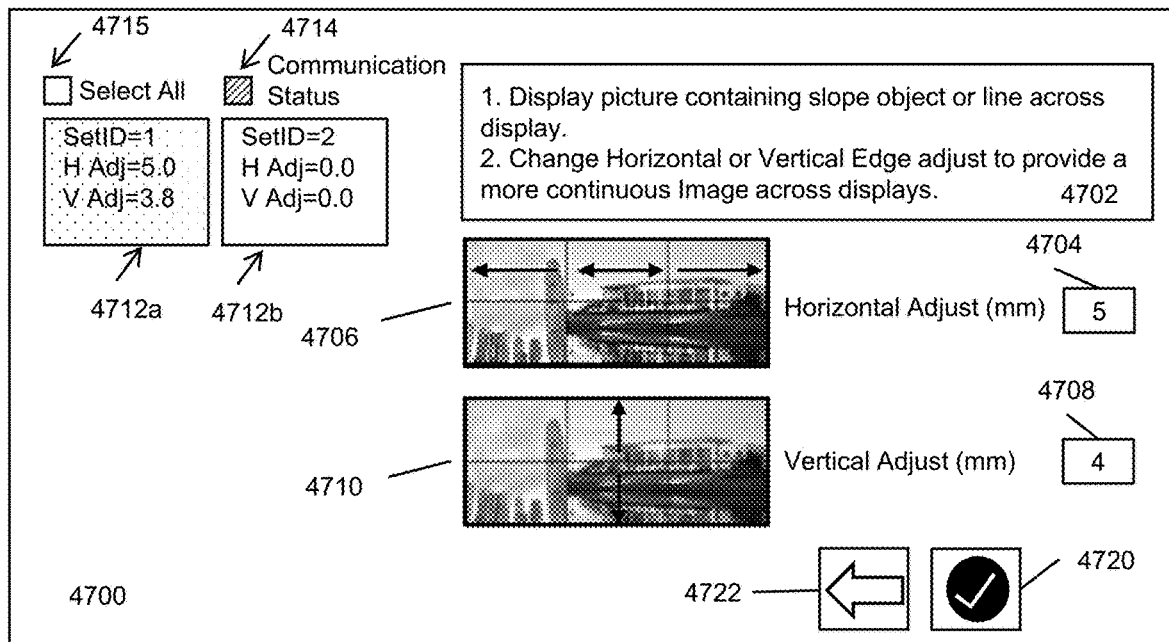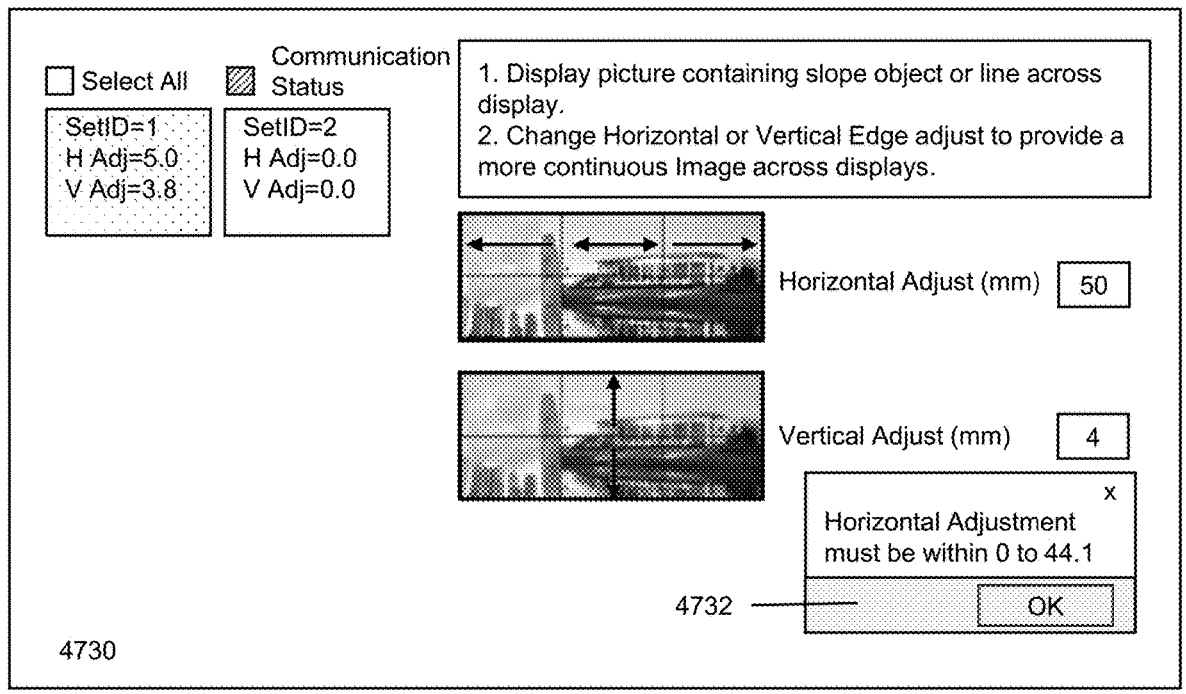
Figure 47

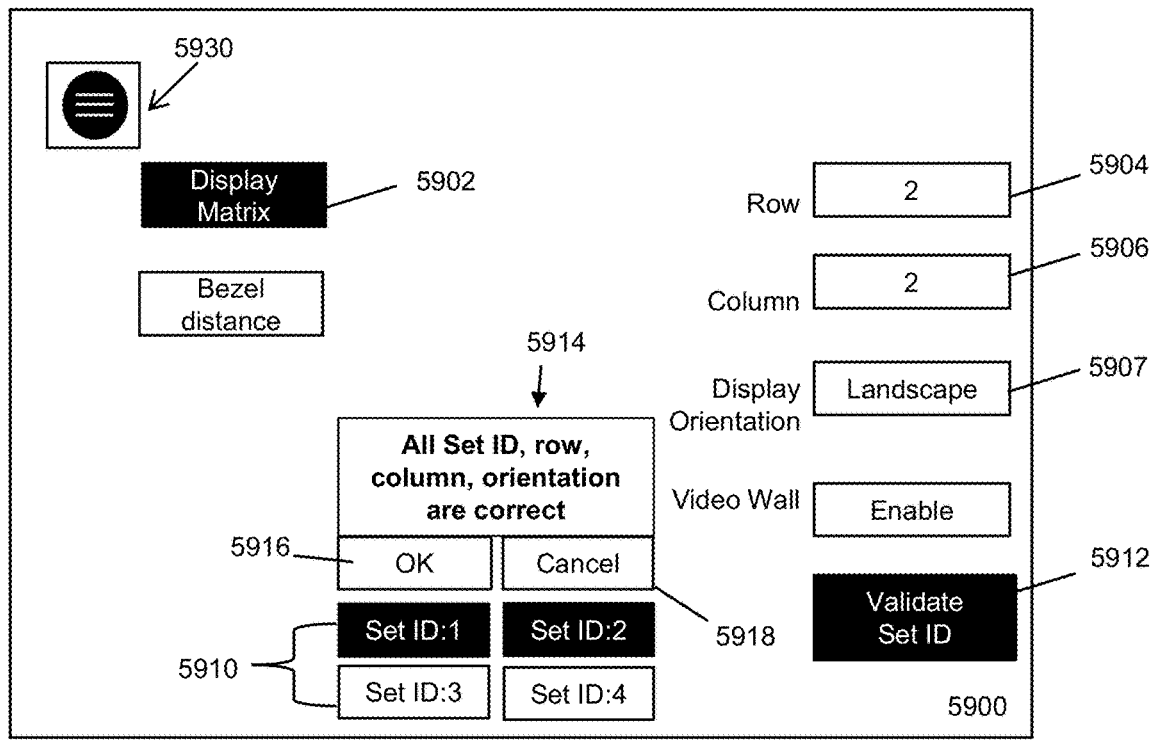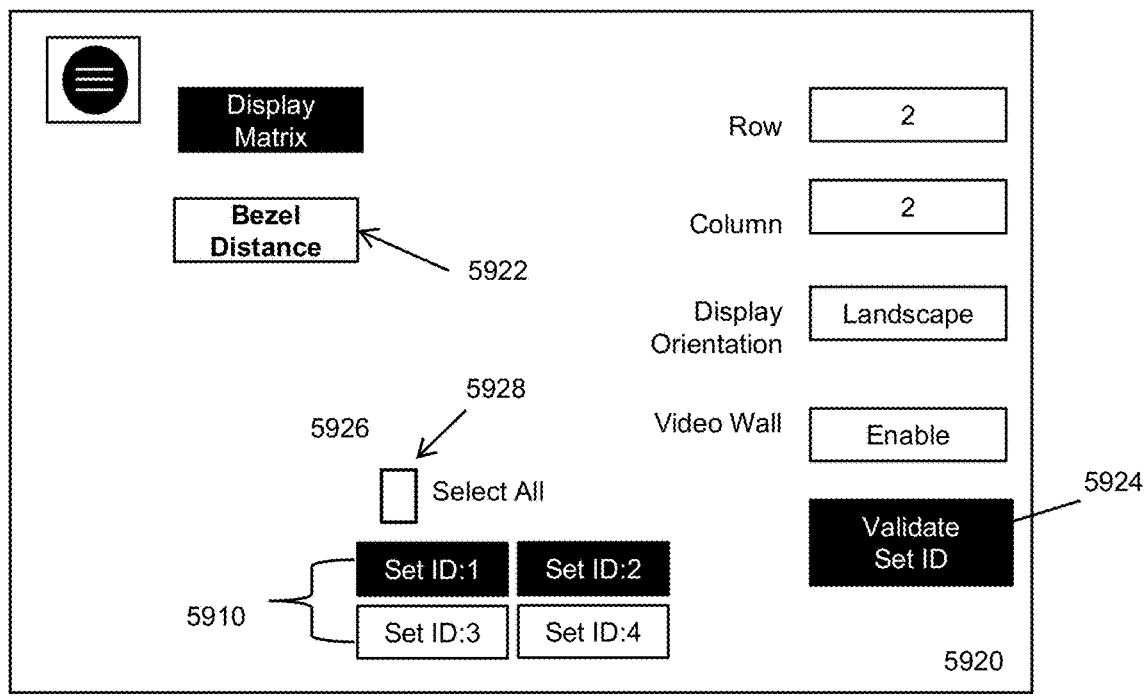
Figure 59

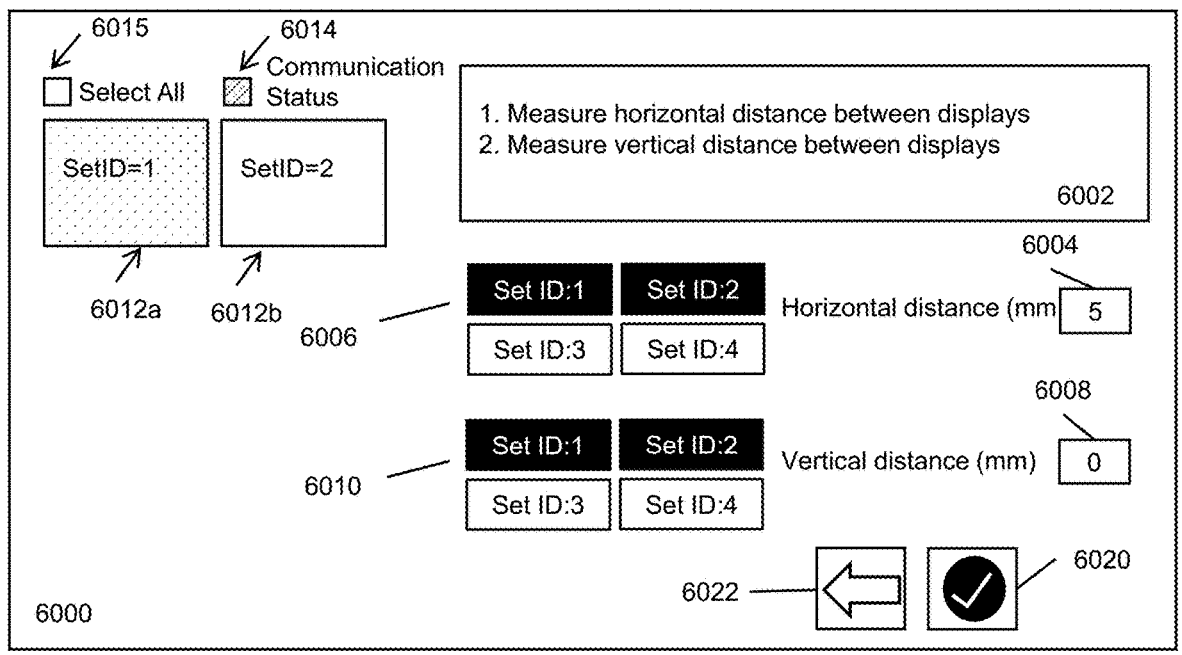
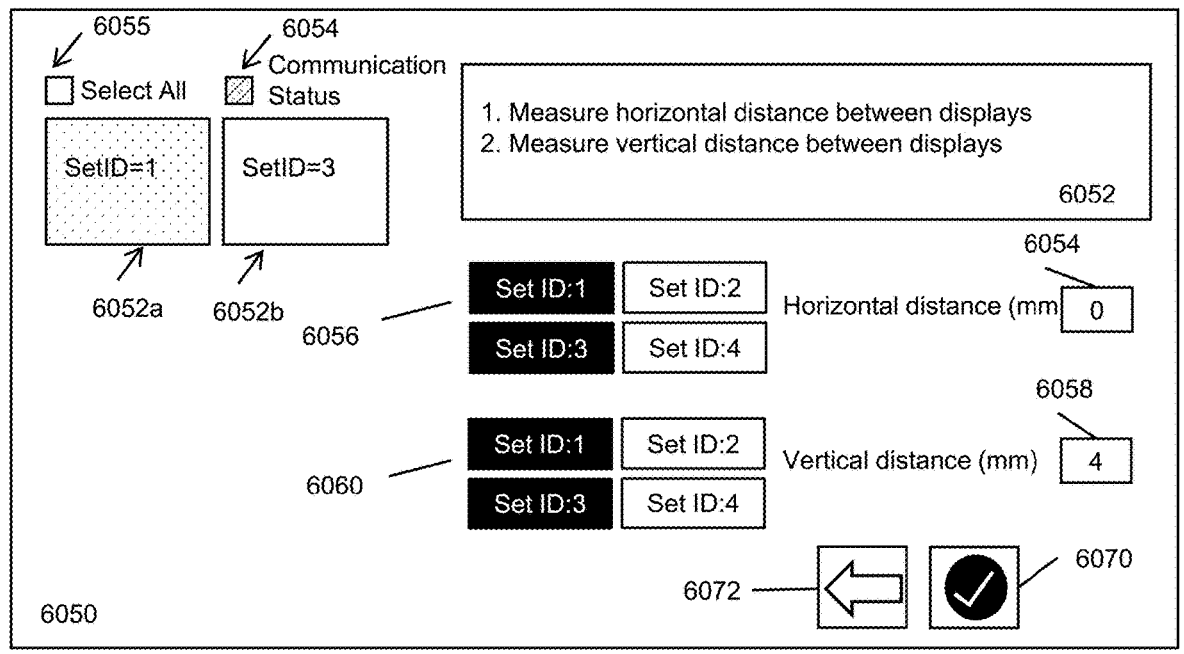
Figure 60

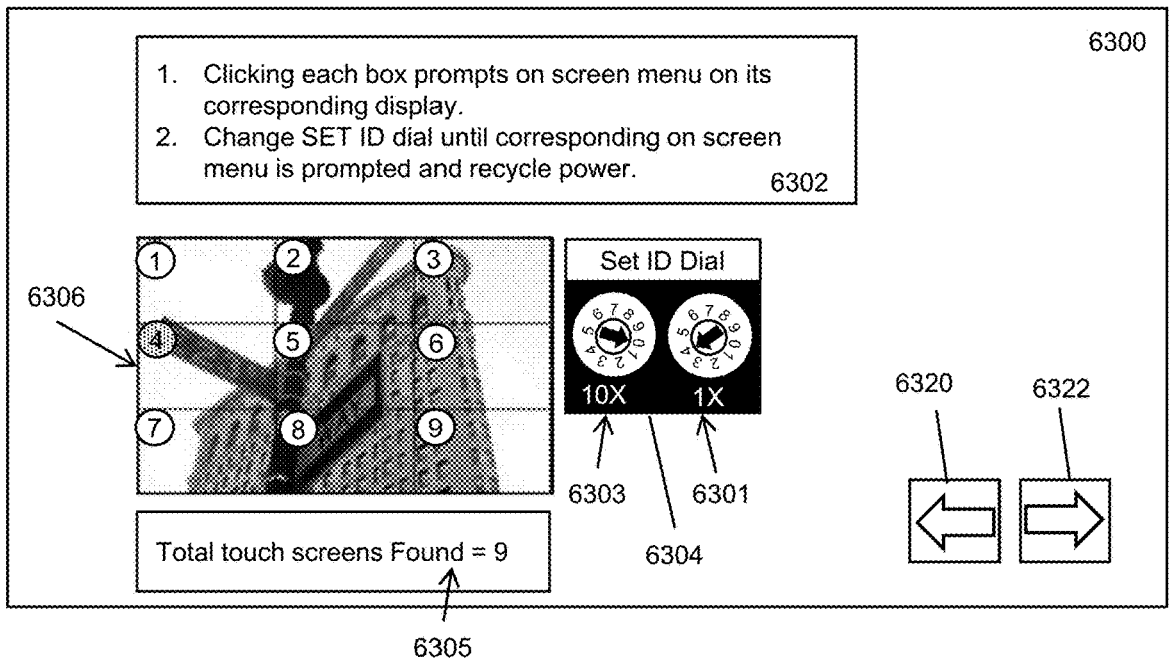
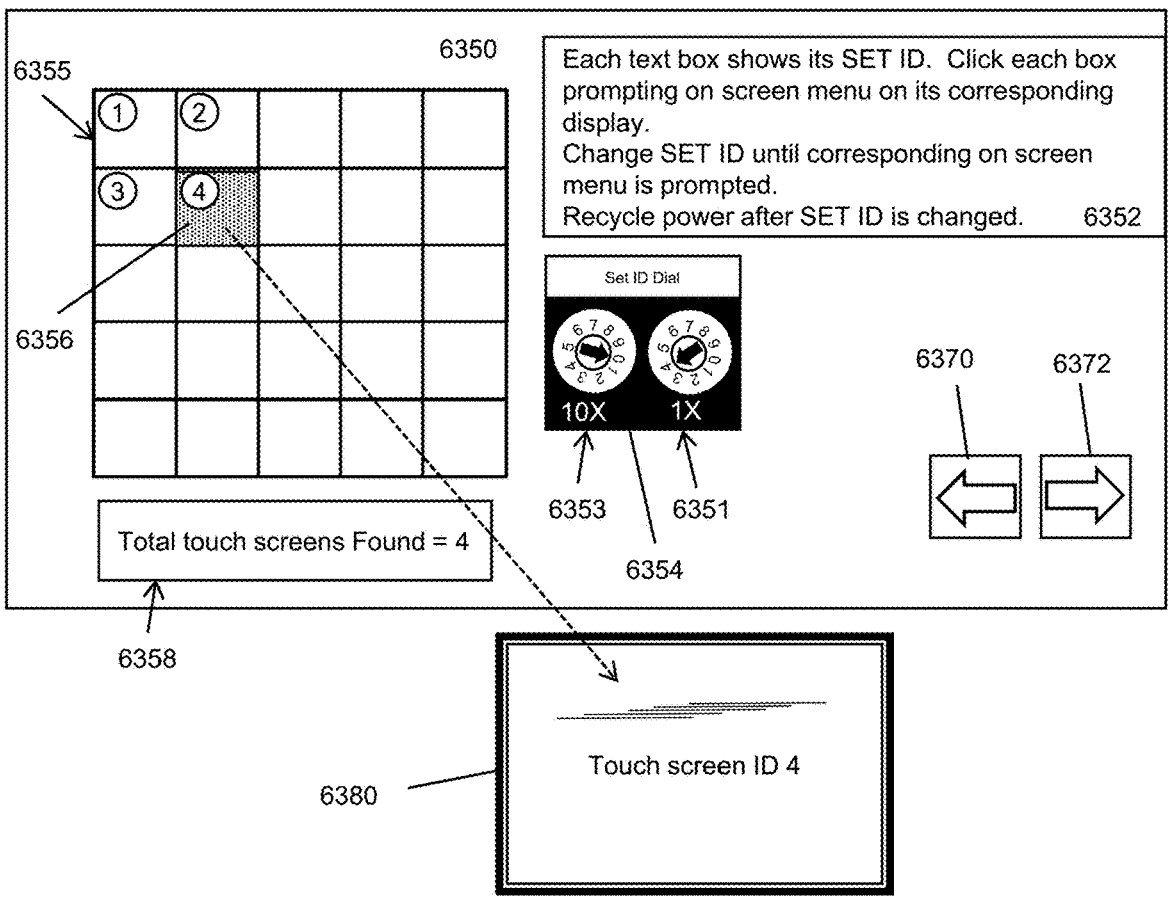
Figure 63

CONFIGURATION ASSOCIATED WITH MEDIA DISPLAY OF A FACILITY

PRIORITY APPLICATIONS

An Application Data Sheet is filed concurrently with this specification as part of the present application. Each application that the present application claims benefit of or priority to as identified in the concurrently filed Application Data Sheet is incorporated herein by reference in its entirety and for all purposes.

BACKGROUND

Various facilities (e.g., buildings) have windows installed, e.g., in their facades. The windows provide a way to view an environment external to the facility. In some facilities, the window may take a substantial portion of a facility facade. Users may request utilization of the window surface area to view various media (e.g., for entertainment purposes, to process data, and/or to conduct a video conference). At times, a user may want to optimize usage of interior space to visualize the media (e.g., by using the window surface). The media may be electronic media and/or optical media. A user may request viewing the media with minimal impact on visibility through the window. The media may be displayed via a display that is at least partially transparent. At times viewing the media may require a tinted (e.g., darker) backdrop. At times, the user may want to shade its interior surrounding. At times, the lifetime of the media display, (e.g., an OLED display) may be damaged over time, e.g., by Ultra-Violet (UV) irradiation, heat, and atmosphere constituents. Such harm may reduce prolonged use of the media display. At times a user may want to augment external view with overlays, augmented reality, and/or lighting. The present inventions offer a solution to this and other problems.

During commissioning and/or setup of media display constructs, it has been necessary to handle a broad range of configurations or reconfigurations leading to time consuming and/or complex tasks that may be prone to human error. The display constructs can be installed and utilized in different configurations with respect to aspect placement (e.g., portrait or landscape), position of a fastener (e.g., bracket) edge (determining a direction of the pixel wiring arrangement to the projecting entities of the display construct), number of display constructs grouped together in a display matrix (e.g., utilized as a video wall) and their arrangement (rows and columns of display constructs in the matrix), interconnection layout of displays in a matrix (e.g., serial or parallel), assignment of identifications (IDs) among displays in a matrix, and gap sizes between immediately adjacent displays (to compensate when showing images spanning multiple displays). Given the design and approach to the installation and desired content, the configuration of the system requires setting the key configurations so that the content, menus, and startup images are displayed in a normal (e.g., logical) orientation to the viewer. This has been done by manually configuring each display, e.g., by using a handheld IR emitting remote control to navigate through a series of menus to set each configuration by a series of up/down, right/left and enter button pushes. Such task can be a time consuming (»10 min per display even when the correct inputs are known) and/or confusing task (and thus prone to human errors). The display construct matrix setup may require care to not end up sending IR commands to neighboring display controllers that each use the same remote controller.

SUMMARY

In an aspect disclosed herein is a display construct that is coupled with a window (e.g., a viewing window such as a tintable window). The viewing window may include an integrated glass unit. The display construct may include one or more glass panes. The display may comprise a display matrix. The display matrix may comprise a light emitting diode (LED), e.g., that is at least partially transparent. The display may comprise liquid crystal display (LCD).

In an aspect, the installation, configuration, and/or reconfiguration processes for the display constructs are facilitated, e.g., so that an average user (e.g., installer such as a Low Voltage Electrician (LVE)) can successfully install, configure, and/or reconfigure a display construct (e.g., in a matrix of display constructs) in the least amount of time, effort, and/or maximum accuracy. A portable circuitry (e.g., cellular phone, tablet or laptop) may be used to communicate with the display construct(s) (e.g., the associated display interface, set top box (STB), and/or E-boxes) over a local network of a facility in which the display construct is installed. A more streamlined approach comprises a smart install application (APP) (e.g., a software application that can be implemented using a non-transitory computer readable medium) which guides and/or prompts the installer through a series of standard, easy to understand, intuitive, and/or unambiguous questions, e.g., to understand and verify configurations of the display constructs. The APP may coordinate projection of various images on the physical display construct(s) during its operation, e.g., to verify correct (e.g., logical) configuration, to facilitate media projection by the display construct(s) in their intended (e.g., logical) manner, e.g., with respect to a viewer.

In another aspect, a method for controlling one or more media displays, comprises: aligning a real configuration of one or more display constructs with a virtual setting of the one or more display constructs at least in part by: (A) receiving a user input of one or more real characteristics of the one or more display constructs that pertain to the real configuration; and (B) updating the virtual setting to facilitate control of the one or more display constructs.

In some embodiments, the virtual setting is utilized by at least one controller configured to control the one or more display constructs. In some embodiments, the at least one controller is (I) included in a control system configured to control at least one device of the building other than the one or more display constructs, (II) operatively coupled to a network disposed at least in part in an envelope of a building in which the display constructs are disposed and/or (III) operatively coupled to a network configured for transmission of power and communication on a cable. In some embodiments, a display construct of the one or more display constructs is operatively coupled to a tintable window. In some embodiments, the one or more real characteristics comprise (I) vertical or horizontal placement of a fundamental length scale of a display construct of the one or more display constructs, (II) alignment of projected media by the display construct relative to the horizon and/or to a gravitational center, (III) identification of a fastener of a display construct of the one or more display constructs, or (IV) identification number of the display construct. In some embodiments, the identification number is comprised of a network address recognized by a control system that includes at least one controller configured to control the one or more display constructs. In some embodiments, the control system is configured to control a facility in which the one or more display constructs are disposed. In some embodiments, the virtual setting is a digital setting. In some embodiments, receiving the user input is through an application disposed on a mobile circuitry. In some embodiments, the mobile circuitry comprises a tablet, a smart phone, and/or a laptop, which is coupled to at least one controller configured to control the one or more display constructs. In some embodiments, the one or more display constructs comprises a matrix of display constructs, and wherein the one or more real characteristics comprise (I) a distance between two immediately adjacent display constructs in the display matrix, or (II) manner of any coordination of media displayed by the matrix of display constructs. In some embodiments, the two immediately adjacent display constructs are two display constructs devoid of any intermediate display construct disposed therebetween. In some embodiments, the two immediately adjacent display constructs are separated by a framing portion. In some embodiments, the two immediately adjacent display constructs are separated by a mullion or by a transom. In some embodiments, the manner of any coordination of media displayed by the matrix of display constructs comprises a lack of coordination. In some embodiments, the manner of any coordination of media displayed by the matrix of display constructs comprises simultaneous streaming of the same media on the display constructs in the matrix, wherein the media is displayed by each display in the matrix. In some embodiments, the manner of any coordination of media displayed by the matrix of display constructs comprises simultaneous streaming of a media on the display constructs in the matrix, wherein each display construct in the matrix displays a portion of the media. In some embodiments, each display construct in the matrix displays a portion of the media such that the matrix of display constructs displays an entire depiction of the media streamed (e.g., as in a video wall). In some embodiments, the method further comprises operatively coupling to a portable Circuitry having a user interface to at least one controller for interacting with the one or more display constructs, which at least one controller is configured to control the one or more display constructs. In some embodiments, the user interface includes a simulated keypad of a Wireless remote control associated with the one or more display constructs. In some embodiments, the method further comprises prompting a user to specify (i) a number of display constructs and/or (ii) an arrangement of display constructs, in the matrix of display constructs, at least in part by using the user interface. In some embodiments, the user is prompted to specify the arrangement of display constructs as a number of rows and/or a number of columns in the matrix of display constructs. In some embodiments, the method further comprises prompting the user to specify (i) configuration settings for an individual display construct in the matrix of display constructs, or (II) a selected group of display constructs in the matrix of display constructs. In some embodiments, the specified configuration settings comprise a portrait orientation and a landscape orientation. In some embodiments, the specified configuration settings comprise an identification setting (Set ID) used by the at least one controller for addressing the display constructs. In some embodiments, the specified configuration settings comprise an High Definition Multimedia Interface (HDMI) media type and/or a Display Port media type. In some embodiments, the specified configuration settings comprise an interconnection configuration of distribution of display signals to the display constructs that includes a parallel interconnection and/or a serial interconnection. In some embodiments, the specified configuration settings comprise a fastener edge of a display construct operatively coupled to a tintable window and/or to a framing. In some embodiments, the specified configuration settings comprise a designation for operating the matrix of display constructs as a display wall. In some embodiments, the specified configuration settings comprise a designation for operating the matrix of display constructs as a video wall. In some embodiments, the specified configuration settings comprise a distance for offsetting portions of respective images projected by adjacent display constructs in the video wall. In some embodiments, the method further comprises projecting test images from the matrix of display constructs for validation of the specified configuration settings.

In another aspect, an apparatus for controlling one or more media displays, comprises at least one controller comprising a first circuitry, which at least one controller is configured to: (a) operatively couple to one or more display constructs and to a second circuitry configured to accept user input; and (b) align, or direct alignment of, a real configuration of the one or more display constructs with a virtual setting of the one or more display constructs at least in part by being configured to: (A) receive from the second circuitry a user input of one or more real characteristics of the one or more display constructs that pertain to the real configuration, and (B) update, or direct update of, the virtual settings to facilitate control of the one or more display constructs.

In some embodiments, the at least one controller is (I) included in a control system configured to control at least one device of the building other than the one or more display constructs, (II) operatively coupled to a network disposed at least in part in an envelope of a building in which the display constructs are disposed and/or (III) operatively coupled to a network configured for transmission of power and communication on a cable. In some embodiments, a display construct of the one or more display constructs is operatively coupled to a tintable window. In some embodiments, the at least one controller is configured to align, or direct alignment of, the one or more real characteristics as (I) vertical or horizontal placement of a fundamental length scale of a display construct of the one or more display constructs, (II) alignment of projected media by the display construct relative to the horizon and/or to a gravitational center, (III) identification of a fastener of a display construct of the one or more display constructs, or (IV) identification number of the display construct. In some embodiments, the identification number is comprised of a network address recognized by a control system that includes, or is operatively coupled to, the at least one controller. In some embodiments, the at least one controller is operatively coupled to, or is included in, a control system configured to control a facility in which the one or more display constructs are disposed. In some embodiments, the virtual setting is a digital setting. In some embodiments, the at least one controller is configured to receive the user input through an application disposed on a mobile circuitry. In some embodiments, the mobile circuitry comprises a tablet, a smart phone, and/or a laptop, which is coupled to the at least one controller. In some embodiments, the at least one controller is configured to couple, or direct coupling of, the mobile circuitry to the at least one controller using a wireless network protocol. In some embodiments, the wireless network protocol is compatible with local area network (LAN), metropolitan area networks (MAN), wide area networks (WAN), personal area network (PAN), and/or internet access protocols. In some embodiments, the wireless network protocol comprises WiFi type network protocol, or a network protocol compatible with Ultra High Frequency (UHF) radio wave (e.g., Bluetooth) technology. In some embodiments, the at least one controller is configured to couple, or direct the coupling of, the mobile circuitry to the at least one controller using an Ethernet and/or Bluetooth connection. In some embodiments, the at least one controller is included in a hierarchical network of controllers. In some embodiments, the at least one controller is configured to operatively couple to a network configure to provide power and communication, which network is configured for at least fourth (4G) or at least fifth (5G) generation cellular communication. In some embodiments, the power and communication are transmitted on the same cable. In some embodiments, the at least one controller is configured for media and/or video transmission using coaxial cables, optical wires, and/or twisted wires. In some embodiments, the at least one controller is included in, or is operatively coupled to, a control system configured to facilitate adjustment of an internal environment of a facility in which the one or more display constructs are disposed. In some embodiments, the at least one controller is included in, or is operatively coupled to, a control system that controls at least one apparatus in a facility in which the one or more display constructs are disposed. In some embodiments, the at least one apparatus comprises a lighting device, a tintable window, a sensor, an emitter, a media display, a dispenser, a processor, a power source, a security system, a fire alarm system, a sound media, an antenna, a radar, a controller, a heater, a cooler, a vent, or a heating ventilation and air conditioning system (HVAC). In some embodiments, the one or more display constructs comprises a matrix of display constructs, and wherein the at least one controller is configured to align, or direct alignment of, the one or more real characteristics as comprising (I) a distance between two immediately adjacent display constructs in the display matrix, or (II) manner of any coordination of media displayed by the matrix of display constructs. In some embodiments, the two immediately adjacent display constructs refer to two display constructs that are devoid of an intermediate display construct disposed therebetween. In some embodiments, the two immediately adjacent display constructs are separated by a framing portion. In some embodiments, the two immediately adjacent display constructs are separated by a mullion or by a transom. In some embodiments, the at least one controller is configured such that the manner of any coordination of media displayed by the matrix of display constructs comprises a lack of coordination. In some embodiments, the at least one controller is configured such that the manner of any coordination of media displayed, or directed to be displayed, by the matrix of display constructs comprises simultaneous streaming of the same media on the display constructs in the matrix, wherein the media is displayed by each display in the matrix. In some embodiments, the at least one controller is configured such that the manner of any coordination of media displayed, or directed to be displayed, by the matrix of display constructs comprises simultaneous streaming of a media on the display constructs in the matrix, wherein each display construct in the matrix displays a portion of the media. In some embodiments, the at least one controller is configured to display, or direct the displaying of, a portion of the media on each display construct in the matrix such that the matrix of display constructs displays an entire depiction of the media streamed (e.g., as in a video wall). In some embodiments, the at least one controller is configured to operatively couple to a portable circuitry having a user interface to the at least one controller for interacting with the one or more display constructs. In some embodiments, the user interface includes a simulated keypad of a wireless remote control associated with the one or more display constructs. In some embodiments, the at least one controller is configured to prompt, or direct prompting of, a user to specify (i) a number of display constructs and/or (ii) an arrangement of display constructs, in the matrix of display constructs, at least in part by using the user interface. In some embodiments, the at least one controller is configured to prompt, or direct prompting of, the user to specify the arrangement of display constructs as a number of rows and/or a number of columns in the matrix of display constructs. In some embodiments, the at least one controller is configured to prompt, or direct prompting of, the user to specify (i) configuration settings for an individual display construct in the matrix of display constructs, or (II) a selected group of display constructs in the matrix of display constructs. In some embodiments, the specified configuration settings comprise a portrait orientation and a landscape orientation. In some embodiments, the specified configuration settings comprise an identification setting (Set ID) used by the at least one controller for addressing the display constructs. In some embodiments, the specified configuration settings comprise a High Definition Multimedia Interface (HDMI) media type and/or a Display Port media. In some embodiments, the specified configuration settings comprise an interconnection configuration of distribution of display signals to the display constructs that includes a parallel interconnection and/or a serial interconnection. In some embodiments, the specified configuration settings comprise a fastener edge of a display construct operatively coupled to a tintable window and/or framing. In some embodiments, the specified configuration settings comprise a designation for operating the matrix of display constructs as a display wall. In some embodiments, the specified configuration settings comprise a designation for operating the matrix of display constructs as a video wall. In some embodiments, the specified configuration settings comprise a distance for offsetting portions of respective images projected by adjacent display constructs in the video wall. In some embodiments, the at least one controller is configured to project, or direct projection of, test images from the matrix of display constructs for validation of the specified configuration settings.

In another aspect, a non-transitory computer readable medium for controlling one or more media displays, the non-transitory computer readable medium, when read by one or more processors operatively coupled to one or more display constructs, is configured to execute operations comprising aligning, or directing alignment of, a real configuration of one or more display constructs with a virtual setting of the one or more display constructs at least in part by: (A) receiving a user input of one or more real characteristics of the one or more display constructs that pertain to the real configuration, and (B) updating, or directing update of, the virtual settings to facilitate control of the one or more display constructs.

In some embodiments, the one or more processors are (I) included in, or operatively coupled to, a control system configured to control at least one device of the building other than the one or more display constructs, (II) operatively coupled to a network disposed at least in part in an envelope of a building in which the display constructs are disposed and/or (III) operatively coupled to a network configured for transmission of power and communication on a cable. In some embodiments, a display construct of the one or more display constructs is operatively coupled to a tintable window. In some embodiments, the operations comprise aligning, or directing alignment of, the one or more real characteristics as (I) vertical or horizontal placement of a fundamental length scale of a display construct of the one or more display constructs, (II) alignment of projected media by the display construct relative to the horizon and/or to a gravitational center, (III) identification of a fastener of a display construct of the one or more display constructs, or (IV) identification number of the display construct. In some embodiments, the identification number is comprised of a network address recognized by a control system that includes, or is operatively coupled to, the one or more processors. In some embodiments, the virtual setting is a digital setting. In some embodiments, the operations comprise receiving the user input is through an application disposed on a mobile circuitry. In some embodiments, wherein the mobile circuitry comprises a tablet, a smart phone, and/or a laptop which is coupled to the one or more processors. In some embodiments, the operations comprise coupling, or directing coupling of, the mobile circuitry to the one or more processors using a wireless network protocol. In some embodiments, the wireless network protocol is compatible with local area network (LAN), metropolitan area networks (MAN), wide area networks (WAN), personal area network (PAN), and/or internet access protocols. In some embodiments, the wireless network protocol comprises WiFi type network protocol, or a network protocol compatible with Ultra High Frequency (UHF) radio wave (e.g., Bluetooth) technology. In some embodiments, the operations comprise coupling, or directing coupling of, the mobile circuitry to the one or more processors by using an Ethernet and/or Bluetooth connection. In some embodiments, the one or more processors are included in, or are operatively coupled to, a hierarchical network of controllers. In some embodiments, the one or more processors are operatively coupled to a network configured to provide power and communication, which network is configured for at least fourth (4G) or at least fifth (5G) generation cellular communication. In some embodiments, the power and communication are transmitted on the same cable. In some embodiments, the one or more processors are operatively coupled to a network configured for media and/or video transmission using coaxial cables, optical wires, and/or twisted wires. In some embodiments, the one or more processors are configured to be operatively coupled to, or be included in, a control system configured to facilitate adjustment of an internal environment of a facility in which the one or more display constructs are disposed. In some embodiments, the one or more processors are configured to be operatively coupled to, or be included in, a control system a control system that controls at least one apparatus in a facility in which the one or more display constructs are disposed. In some embodiments, the at least one apparatus comprises a lighting device, a tintable window, a sensor, an emitter, a media display, a dispenser, a processor, a power source, a security system, a fire alarm system, a sound media, an antenna, a radar, a controller, a heater, a cooler, a vent, or a heating ventilation and air conditioning system (HVAC). In some embodiments, the one or more display constructs comprise a matrix of display constructs, and wherein the operations comprise aligning the one or more real characteristics as (I) a distance between two immediately adjacent display constructs in the display matrix, or (II) manner of any coordination of media displayed by the matrix of display constructs. In some embodiments, the two immediately adjacent display constructs refer to two display constructs that are devoid of an intermediate display construct disposed therebetween. In some embodiments, the two immediately adjacent display constructs are separated by a framing portion. In some embodiments, the two immediately adjacent display constructs are separated by a mullion or by a transom. In some embodiments, the manner of any coordination of media displayed by the matrix of display constructs comprises a lack of coordination. In some embodiments, the manner of any coordination of media displayed by the matrix of display constructs comprise simultaneous streaming of the same media on the display constructs in the matrix, wherein the media is displayed by each display in the matrix. In some embodiments, the manner of any coordination of media displayed by the matrix of display constructs comprise simultaneous streaming of a media on the display constructs in the matrix, wherein each display construct in the matrix displays a portion of the media. In some embodiments, the operations comprise each display construct in the matrix displaying a portion of the media such that the matrix of display constructs displays an entire depiction of the media streamed (e.g., as in a video wall). In some embodiments, the operations further comprise operatively coupling, or directing operative couple, to a portable circuitry having a user interface to the one or more processors for interacting with the one or more display constructs. In some embodiments, the user interface includes a simulated keypad of a wireless remote control associated with the one or more display constructs. In some embodiments, the operations comprise prompting, or directing prompting of, a user to specify (i) a number of display constructs and/or (ii) an arrangement of display constructs, in the matrix of display constructs, at least in part by using the user interface. In some embodiments, the operations further comprise prompting, or directing prompting of, the user to specify the arrangement of display constructs as a number of rows and/or a number of columns in the matrix of display constructs. In some embodiments, the operations further comprise prompting, or directing prompting of, the user to specify (i) configuration settings for an individual display construct in the matrix of display constructs, or (II) a selected group of display constructs in the matrix of display constructs. In some embodiments, the specified configuration settings comprise a portrait orientation and a landscape orientation. In some embodiments, the specified configuration settings comprise an identification setting (Set ID) used by the one or more processors for addressing the display constructs. In some embodiments, the specified configuration settings comprise a High Definition Multimedia Interface (HDMI) media type and/or a Display Port media. In some embodiments, the specified configuration settings comprise an interconnection configuration of distribution of display signals to the display constructs that includes a parallel interconnection and/or a serial interconnection. In some embodiments, the specified configuration settings comprise a fastener edge of a display construct operatively coupled to a tintable window and/or framing. In some embodiments, the specified configuration settings comprise a designation for operating the matrix of display constructs as a display wall. In some embodiments, the specified configuration settings comprise a designation for operating the matrix of display constructs as a video wall. In some embodiments, the specified configuration settings comprise a distance for offsetting portions of respective images projected by adjacent display constructs in the video wall. In some embodiments, the operations further comprise projecting, or directing projection of, test images from the matrix of display constructs to validate the specified configuration settings.

In another aspect, an apparatus for controlling media display touch screens, comprises at least one controller, which at least one controller is configured to: (a) operatively couple to touch screen sensor and emitter arrays of a display matrix; (b) configure, or direct configuration of, the touch screen sensor and emitter arrays having virtual coordinates, each of the touch screen sensor and emitter arrays associated with each media display in the display matrix having media displays of (i) similar dimensions and (ii) similar array of emitting entities, the media displays arranged in one or more rows and in one or more columns to form the display matrix, the at least one controller configured to configure, or direct configuration of, the touch screen sensor and emitter arrays at least in part by the at least one controller being configured to: (A) divide, or direct division of, a vertical component of the array of the emitting entities, by a vertical number of the one or more rows of the media displays in the display matrix, to obtain a vertical division product, wherein the vertical component of the array of the emitting entities is of (I) a single media display or (II) all media displays in a column of media displays in the display matrix; (B) divide, or direct division of, a horizontal component of the array of the emitting entities, by a horizontal number of the one or more columns of the media displays in the display matrix, to obtain a horizontal division product, wherein the horizontal component of the array of the emitting entities is of (III) a single media display or (IV) all media displays in a row of media displays in the display matrix; and (C) assign, or direct assignment of, a virtual coordinate of the virtual coordinates at least in part by including the vertical division product and/or the horizontal division product.

In some embodiments, the at least one controller is configured to (A) divide, or direct division of, a vertical component of the array of the emitting entities, by a vertical number of the one or more rows of the media displays in the display matrix, to obtain a vertical division product, wherein the vertical component of the array of the emitting entities is of (I) a single media display; and (B) divide, or direct division of, a horizontal component of the array of the emitting entities, by a horizontal number of the one or more columns of the media displays in the display matrix, to obtain a horizontal division product, wherein the horizontal component of the array of the emitting entities is of (III) a single media display. In some embodiments, the at least one controller is configured to (A) divide, or direct division of, a vertical component of the array of the emitting entities, by a vertical number of the one or more rows of the media displays in the display matrix, to obtain a vertical division product, wherein the vertical component of the array of the emitting entities is of (II) all media displays in a column of media displays in the display matrix; and (B) divide, or direct division of, a horizontal component of the array of the emitting entities, by a horizontal number of the one or more columns of the media displays in the display matrix, to obtain a horizontal division product, wherein the horizontal component of the array of the emitting entities is of (IV) all media displays in a row of media displays in the display matrix. In some embodiments, the at least one controller is configured to include, or direct inclusion of, the vertical division product in the assignment, or directing assignment of, the virtual coordinate of the virtual coordinates when the display matrix comprises more than one row of media displays. In some embodiments, configured to comprises designed, arranged, built, shaped, or structured. In some embodiments, the at least one controller comprises circuitry, and optionally wherein the circuitry is included in one or more processors. In some embodiments, the at least one controller is configured to include, or direct inclusion of, the horizontal division product in the assignment, or directing assignment of, the virtual coordinate of the virtual coordinates when the display matrix comprises more than one column of media displays. In some embodiments, the at least one controller is configured to receive through an input of a user a number of (a) columns of the one or more columns and/or (b) rows of the one or more rows. In some embodiments, the at least one controller is configured to receive the input of the user through a circuitry operatively coupled to the at least one controller; optionally wherein the circuitry is stationary or mobile; optionally wherein the at least one controller comprises a first circuitry; and optionally wherein the user provides the input thorough a second circuitry. In some embodiments, the at least one controller is configured to configure, or direct configuration of, the touch screen sensor and emitter arrays at least in part by the at least one controller being configured to receive (e.g., through user input or sensor input), o, or direct receiving of, a number of rows of the media displays in the display matrix. In some embodiments, the at least one controller is configured to configure, or direct configuration of, the touch screen sensor and emitter arrays at least in part by the at least one controller being configured to receive (e.g., through user input or sensor input), o, or direct receiving of, a number of columns of the media displays in the display matrix. In some embodiments, the at least one controller is configured to configure, or direct configuration of, the touch screen sensor and emitter arrays at least in part by the at least one controller being configured to receive, or direct receiving of, a set identification (ID) for each media display of the display matrix, which set ID defines a relative location of each media display in the display matrix. In some embodiments, the at least one controller is configured to configure, or direct configuration of, the touch screen sensor and emitter arrays at least in part by the at least one controller being configured to receive (e.g., through user input or sensor input), o, or direct receiving of, a relative location of a fastening edge for each media display in the display matrix, which fastening edge defines an orientation of the respective media display with respect to (i) each other (ii) a mullion of the display matrix, (iii) a transom of the display matrix, (iv) a horizon, (v) a gravitational vector, (vi) a floor of the facility, (vii) a ceiling of the facility, (viii) a wall of the facility, or (ix) any combination thereof, wherein the display matrix is of the facility. In some embodiments, the at least one controller is configured to configure, or direct configuration of, the touch screen sensor and emitter arrays at least in part by the at least one controller being configured to receive (e.g., through user input or sensor input), o, or direct receiving of, a relative orientation of each media display in the display matrix, which relative orientation of the media display comprises landscape or portrait orientation with respect to (i) each other (ii) a mullion of the display matrix, (iii) a transom of the display matrix, (iv) a horizon, (v) a gravitational vector, (vi) a floor of the facility, (vii) a ceiling of the facility, (viii) a wall of the facility, or (ix) any combination thereof, wherein the display matrix is of the facility. In some embodiments, the at least one controller is configured to configure, or direct configuration of, the touch screen sensor and emitter arrays at least in part by the at least one controller being configured to adjust, or direct adjustment of, the vertical division product based at least in part on vertical gap distances between immediately adjacent rows of the one or more rows of the media displays in the matrix. In some embodiments, the at least one controller is configured to configure, or direction configuration of, the touch screen sensor and emitter arrays at least in part by the at least one controller being configured to translate, or direction translation of, the vertical gap distances into virtual emitting entities units, which virtual emitting entities units are used to adjust the vertical division product. In some embodiments, the at least one controller is configured to configure, or direct configuration of, the touch screen sensor and emitter arrays at least in part by the at least one controller being configured to adjust, or direct adjustment of, the horizontal division product based at least in part on horizontal gap distances between immediately adjacent columns of the one or more columns of the media displays in the matrix. In some embodiments, the at least one controller is configured to configure, or direction configuration of, the touch screen sensor and emitter arrays at least in part by the at least one controller being configured to translate, or direct translation of, the horizontal gap distances into virtual emitting entities units, which virtual emitting entities units are used to adjust the horizontal division product. In some embodiments, the at least one controller is configured to configure, or direct configuration of, the touch screen sensor and emitter arrays at least in part by the at least one controller being configured to adjust, or direct adjustment of, the horizontal division product based at least in part on horizontal gap distances between immediately adjacent touch screen sensor and emitter arrays. In some embodiments, the at least one controller is configured to configure, or direction configuration of, the touch screen sensor and emitter arrays at least in part by the at least one controller being configured to translate, or direct translation of, the horizontal gap distances of the immediately adjacent touch screen sensor and emitter arrays into virtual emitting entities units, which virtual emitting entities units are used to adjust the horizontal division product. In some embodiments, the at least one controller is configured to configure, or direct configuration of, the touch screen sensor and emitter arrays at least in part by the at least one controller being configured to adjust, or direct adjustment of, the vertical division product based at least in part on vertical gap distances between immediately adjacent touch screen sensor and emitter arrays. In some embodiments, the at least one controller is configured to configure, or direction configuration of, the touch screen sensor and emitter arrays at least in part by the at least one controller being configured to translate, or direct translation of, the vertical gap distances of the immediately adjacent touch screen sensor and emitter arrays into virtual emitting entities units, which virtual emitting entities units are used to adjust the vertical division product. In some embodiments, the at least one controller is configured to configure, or direct configuration of, the touch screen sensor and emitter arrays at least in part by the at least one controller being configured to project, or direct projection of, media as a video wall. In some embodiments, the at least one controller is configured to configure, or direct configuration of, the touch screen sensor and emitter arrays at least in part by the at least one controller being configured to display, or direct displaying of, an entire depiction of multimedia on the display matrix. In some embodiments, the at least one controller is configured to operatively couple, or direct operative coupling of, the one or more media displays to a device ensemble disposed in a facility of the one or more media displays. In some embodiments, the at least one controller is configured to operatively couple to a device ensemble disposed in a facility of the one or more media displays. In some embodiments, the at least one controller is configured to control the device ensemble having components comprising (i) sensors, (ii) a sensor and an emitter, or (iii) a sensor and a transceiver, which components are enclosed in a housing. In some embodiments, the at least one controller is configured to control, or direct control of the device ensemble that is configured to (i) facilitate environmental control of the facility, (ii) facilitate personnel and/or asset location in the facility, (iii) facilitate controlling one or more other devices of the facility, and/or (iv) facilitate facility management. In some embodiments, the device ensemble is disposed in a fixture, or attached to a fixture of a facility of the display matrix. In some embodiments, the device ensemble comprises a geolocation chip and/or an accelerometer; and optionally wherein the geolocation chip comprises radio frequency based geolocation technology; and optionally wherein the radio frequency comprises ultrawide band radiation. In some embodiments, the one or more media displays is operatively coupled to a network facilitating control of other functions of a facility of the one or more media displays. In some embodiments, the one or more media displays is operatively coupled to a network having a cable configured to transmit both communication and power. In some embodiments, the one or more media displays is operatively coupled to a network configured to transmit cellular communication abiding by a communication protocol comprising: a fourth generation (4G) or a fifth generation (5G) communication protocol. In some embodiments, the one or more media displays is operatively coupled to a network configured to transmit: cellular communication, control communication, still picture communication, moving picture communication, sensor data, other media communication and/or other data communication. In some embodiments, the one or more media displays t is operatively coupled to o a network configured to transmit one or more protocols comprising at least one data communication protocol for automatic control of subsystems. In some embodiments, the one or more media displays is operatively coupled to a network configured to transmit infrared (IR) signal, and/or radio frequency (RF) signal. In some embodiments, the one or more media displays is operatively coupled to a network configured to operatively couple to a power source and configured for power transmission, wherein the power source optionally comprises a main power source, a backup power generator, or an uninterrupted power source (UPS). In some embodiments, the one or more media displays is operatively coupled to a network configured to transmit a signal indicating energy and/or power consumption, wherein the power consumption optionally includes power consumption by (i) a heating system, (i) a cooling system, and/or (iii) lighting, and optionally wherein the signal facilitates monitoring power consumption of individual rooms or a group of rooms. In some embodiments, the one or more media displays is operatively coupled to a network configured to utilize at least one wireless protocol that (i) utilizes radio frequency signals and/or (ii) facilitates communication with one or more sensors. In some embodiments, the radio frequency comprises ultrawideband radiation. In some embodiments, the at least one controller is included in, or is operatively coupled to, a control system of a facility of the one or more media displays. In some embodiments, the facility of the one or more media displays comprises a facility associated with the one or more media displays, or a facility in which the one or more media displays are disposed. In some embodiments, the control system comprises distributed controllers having a hierarchical structure. In some embodiments, the control system comprises distributed controllers having at least three levels of hierarchy. In some embodiments, the at least one controller comprises a controller disposed externally to the facility. In some embodiments, the at least one controller comprises a controller disposed in a cloud. In some embodiments, the control system is configured to (i) control an environment of the facility, (ii) locate personnel and/or assets of the facility, (iii) control one or more other devices of the facility, and/or (iv) manage the facility.

In another aspect, a method for controlling media display touch screens, the method comprises one or more operations of any disclosed above.

In another aspect, a non-transitory computer readable program instructions for controlling media display touch screens, the program instructions, when read by one or more processors operatively coupled to touch screen arrays of media displays arranged in a media display matrix, cause the one or more processors to execute one or more operations disclosed above.

In another aspect, a non-transitory computer readable program instructions for controlling media display touch screens, the program instructions, when read by one or more processors operatively coupled to touch screen arrays of a display matrix, cause the one or more processors to execute operations comprises: configuring, or directing configuration of, the touch screen sensor and emitter arrays having virtual coordinates, each of the touch screen sensor and emitter arrays associated with each media display in the display matrix having media displays of (i) similar dimensions and (ii) similar array of emitting entities, the media displays arranged in one or more rows and in one or more columns to form the display matrix, the operations further comprise configuring, or directing configuration of, the touch screen sensor and emitter arrays at least in part by: (A) dividing, or directing division of, a vertical component of the array of the emitting entities, by a vertical number of the one or more rows of the media displays in the display matrix, to obtain a vertical division product, wherein the vertical component of the array of the emitting entities is of (I) a single media display or (II) all media displays in a column of media displays in the display matrix; (B) dividing, or directing division of, a horizontal component of the array of the emitting entities, by a horizontal number of the one or more columns of the media displays in the display matrix, to obtain a horizontal division product, wherein the horizontal component of the array of the emitting entities is of (III) a single media display or (IV) all media displays in a row of media displays in the display matrix; and (C) assigning, or directing assignment of, a virtual coordinate of the virtual coordinates at least in part by including the vertical division product and/or the horizontal division product.

A system for controlling media display touch screens, the system comprises a network operatively coupled to touch screen arrays of media displays arranged in a media display matrix, the network configured to transmit one or more operations disclosed above.

In some embodiments, the network is configured to transmit the one or more signals at least in part by being configured to abide by one or more protocols associated with the signals.

In another aspect, a system for controlling media display touch screens, the system comprises a network operatively coupled to touch screen arrays of media displays arranged in a media display matrix, the network configured to: transmit configuration of the touch screen sensor and emitter arrays having virtual coordinates, each of the touch screen sensor and emitter arrays associated with each media display in the display matrix having media displays of (i) similar dimensions and (ii) similar array of emitting entities, the media displays arranged in one or more rows and in one or more columns to form the display matrix, the network is configured to further configured to: (A) transmit division of a vertical component of the array of the emitting entities, by a vertical number of the one or more rows of the media displays in the display matrix, to obtain a vertical division product, wherein the vertical component of the array of the emitting entities is of (I) a single media display or (II) all media displays in a column of media displays in the display matrix, wherein the division of the vertical component and the vertical division product are utilized at least in part in configuration of the touch screen sensor and emitter arrays; (B) dividing, or directing division of, a horizontal component of the array of the emitting entities, by a horizontal number of the one or more columns of the media displays in the display matrix, to obtain a horizontal division product, wherein the horizontal component of the array of the emitting entities is of (III) a single media display or (IV) all media displays in a row of media displays in the display matrix, wherein the division of the horizontal component and the horizontal division product are utilized at least in part in configuration of the touch screen sensor and emitter arrays; and (C) transmit assignment of a virtual coordinate of the virtual coordinates, the assignment is determined at least in part by including the vertical division product and/or the horizontal division product.

In another aspect, a method for controlling media display touch screens, the method comprises: configuring touch screen sensor and emitter arrays having virtual coordinates, each of the touch screen sensor and emitter arrays is associated with each media display in a display matrix having media displays of similar dimensions and similar array of emitting entities, the media displays arranged in one or more rows and in one or more columns to form the display matrix, the configuration of the touch screen sensor and emitter arrays comprises: (A) dividing a vertical component of the array of the emitting entities, by a vertical number of the one or more rows of the media displays in the display matrix, to obtain a vertical division product, wherein the vertical component of the array of the emitting entities is of (I) a single media display or (II) all media displays in a column of media displays in the display matrix; (B) dividing a horizontal component of the array of the emitting entities, by a horizontal number of the one or more columns of the media displays in the display matrix, to obtain a horizontal division product, wherein the horizontal component of the array of the emitting entities is of (III) a single media display or (IV) all media displays in a row of media displays in the display matrix; and (C) assigning a virtual coordinate of the virtual coordinates at least in part by including the vertical division product and/or the horizontal division product.

In another aspect, an apparatus for controlling media display touch screens, the apparatus comprises: at least one controller configured to: (a) operatively couple to touch screen sensor and emitter arrays of media displays that form a display matrix; (b) detect, or direct detection of, a location of a user stimulation of one or more of the touch screen sensor and emitter arrays, which location of stimulation of the one or more of the touch screen sensor and emitter arrays is (i) at least partially based on a defined coordinate system for the touch screen sensor and emitter arrays that is derived at least in part by aligning a real configuration of each of the media displays each having a touch screen sensor and emitter array of the touch screen sensor and emitter arrays, with a virtual setting of each of the touch screen sensor and emitter arrays, and (ii) is at least partially based on each of the media displays displaying a portion of a media such that the display matrix displays an entire depiction of the media; and (c) use, or direct usage of, the defined coordinate system to translate the location of the user stimulation to a touch location in the media being displayed on the display matrix of the media displays.

In some embodiments, the at least one controller is configured to receive through an input of a user a number of (a) columns of the media displays in the display matrix and/or (b) rows of the media displays in the display matrix. In some embodiments, the at least one controller is configured to receive the input of the user through a circuitry operatively coupled to the at least one controller; optionally wherein the circuitry is stationary or mobile; optionally wherein the at least one controller comprises a first circuitry; and optionally wherein the user provides the input thorough a second circuitry. In some embodiments, the at least one controller is configured to (A) divide, or direct division of, a vertical component of an array of one media display of the media displays, by a vertical number of one or more rows of the media displays in the display matrix, to obtain a vertical division product; and (B) assign, or direct assignment of, a virtual coordinate of the defined coordinate system at least in part by including the vertical division product. In some embodiments, the at least one controller is configured to (A) divide, or direct division of, a horizontal component of an array of one media display of the media displays, by a horizontal number of one or more columns of the media displays in the display matrix, to obtain a horizontal division product; and (B) assign, or direct assignment of, a virtual coordinate of the defined coordinate system at least in part by including the horizontal division product. In some embodiments, the at least one controller is configured to (A) include, or direct inclusion of, the vertical division product in the assignment of the virtual coordinate of the defined coordinate system when the display matrix comprises more than one row of the media displays. In some embodiments, the at least one controller is configured to include, or direct inclusion of, the horizontal division product in the assignment of the virtual coordinate of the defined coordinate system when the display matrix comprises more than one column of media displays. In some embodiments, the at least one controller is configured to adjust, or direct adjustment of, the vertical division product based at least in part on vertical gap distances between immediately adjacent rows of the one or more rows of the media displays in the display matrix. In some embodiments, the at least one controller is configured to translate, or direct translation of, the vertical gap distances into virtual emitting entities units, which virtual emitting entities units are used to adjust the vertical division product. In some embodiments, the at least one controller is configured to adjust, or direct adjustment of, the horizontal division product based at least in part on horizontal gap distances between immediately adjacent columns of the one or more columns of the media displays in the display matrix. In some embodiments, the at least one controller is configured to translate, or direct translation of, the horizontal gap distances into virtual emitting entities units, which virtual emitting entities units are used to adjust the horizontal division product. In some embodiments, the at least one controller is configured to adjust, or direct adjustment of, the horizontal division product based at least in part on horizontal gap distances between immediately adjacent touch screen sensor and emitter arrays. In some embodiments, the at least one controller is configured to translate, or direct translation of, the horizontal gap distances of the immediately adjacent touch screen sensor and emitter arrays into virtual emitting entities units, which virtual emitting entities units are used to adjust the horizontal division product. In some embodiments, the at least one controller is configured to adjust, or direct adjustment of, the vertical division product based at least in part on vertical gap distances between immediately adjacent touch screen sensor and emitter arrays. In some embodiments, the at least one controller is configured to translate, or direct translation of, the vertical gap distances of the immediately adjacent touch screen sensor and emitter arrays into virtual emitting entities units, which virtual emitting entities units are used to adjust the vertical division product. In some embodiments, the at least one controller is configured to (A) divide, or direct division of, a horizontal component of an array of one media display of the media displays, by a horizontal number of one or more rows of the media displays in the display matrix, to obtain a horizontal division product; and (B) assign, or direct assignment of, a virtual coordinate of the defined coordinate system at least in part by including the horizontal division product. In some embodiments, the at least one controller is configured to operatively couple to a device ensemble disposed in a facility of the media displays. In some embodiments, the at least one controller is configured to control the device ensemble, which includes components comprising (i) sensors, (ii) n a sensor and an emitter, or (iii) a sensor and a transceiver, which components are enclosed in a housing. In some embodiments, the at least one controller is configured to operatively couple, or direct operative coupling of, the one or more media displays to a device ensemble disposed in a facility of the one or more media displays. In some embodiments, the device ensemble is disposed in a fixture, or attached to a fixture of a facility of the display matrix. In some embodiments, the device ensemble comprises a geolocation chip and/or an accelerometer; and optionally wherein the geolocation chip comprises radio frequency based geolocation technology; and optionally wherein the radio frequency comprises ultrawide band radiation. In some embodiments, the at least one controller is configured to control, or direct control of, the device ensemble that is configured to (i) facilitate environmental control of the facility, (ii) facilitate personnel and/or asset location in the facility, (iii) facilitate controlling one or more other devices of the facility, and/or (iv) facilitate facility management. In some embodiments, the at least one controller is configured to (i) control, or direct control of, an environmental of the facility, (ii) locate, or direct location of, at least one personnel and/or at least one asset in the facility, (iii) control, or direct control of, one or more other devices of the facility, and/or (iv) manage, or direct management of, the facility. In some embodiments, the at least one controller is configured to operatively couple to a network facilitating control of other functions of a facility of the media displays. In some embodiments, the at least one controller is configured to operatively couple to a network having a cable configured to transmit both communication and power. In some embodiments, the at least one controller is configured to operatively couple to a network configured to transmit cellular communication abiding by a communication protocol comprising fourth generation (4G) or a fifth generation (5G) communication protocol. In some embodiments, the at least one controller is configured to operatively couple to a network configured to transmit: cellular communication, control communication, still picture communication, moving picture communication, sensor data, other media communication and/or other data communication. In some embodiments, the at least one controller is configured to operatively couple to a network configured to transmit one or more protocols comprising at least one data communication protocol for automatic control of subsystems. In some embodiments, the at least one controller is configured to operatively couple to a network configured to transmit infrared (IR) signal, and/or radio frequency (RF) signal. In some embodiments, the at least one controller is configured to transmit, or direct transmission of, the radio frequency that comprises ultrawideband radiation. In some embodiments, the at least one controller is configured to operatively couple to a network (A) configured to operatively couple to a power source and (B) configured for power transmission, wherein the power source optionally comprises a main power source, a backup power generator, or an uninterrupted power source (UPS). In some embodiments, the at least one controller is configured to operatively couple to a network configured to transmit a signal indicating energy and/or power consumption, optionally wherein the power consumption includes power consumption by a heating system, a cooling system, and/or lighting, and optionally wherein the signal facilitates monitoring power consumption of individual rooms or a group of rooms. In some embodiments, the at least one controller is configured to operatively couple to a network configured to utilize at least one wireless protocol that (i) utilizes radio frequency signals and/or (ii) facilitates communication with one or more sensors. In some embodiments, the at least one controller is configured to transmit, or direct transmission of, the radio frequency, which optionally comprises ultrawideband radiation. In some embodiments, the at least one controller is configured to operatively couple, or is included in, a control system of a facility of the media displays. In some embodiments, the facility of the media displays comprises a facility associated with the media displays, or a facility in which the media displays are disposed. In some embodiments, the control system comprises distributed controllers having a hierarchical structure. In some embodiments, the control system comprises distributed controllers having at least three levels of hierarchy. In some embodiments, one or more controllers of the control system are disposed external to the facility. In some embodiments, one or more controllers of the control system are disposed in a cloud. In some embodiments, the control system is configured to (i) control, or direct control of, an environment of the facility, (ii) locate, or direct location of, personnel and/or assets of the facility, (iii) control, or direct control of, one or more other devices of the facility, and/or (iv) manage, or direct management of, the facility. In some embodiments, the at least one controller comprises circuitry, and optionally wherein the circuitry is included in one or more processors. In some embodiments, the at least one controller is configured to configure, or direct configuration of, the touch screen sensor and emitter arrays at least in part by the at least one controller being configured to receive (e.g., through user input or sensor input), o, or direct receiving of, a set identification (ID) for each media display of the display matrix, which set ID defines a relative location of each media display in the display matrix. In some embodiments, the at least one controller is configured to configure, or direct configuration of, the touch screen sensor and emitter arrays at least in part by the at least one controller being configured to receive (e.g., through user input or sensor input), or direct receiving of, a relative location of a fastening edge for each media display in the display matrix, which fastening edge defines an orientation of the respective media display with respect to (i) each other (ii) a mullion of the display matrix, (iii) a transom of the display matrix, (iv) a horizon, (v) a gravitational vector, (vi) a floor of the facility, (vii) a ceiling of the facility, (viii) a wall of the facility, or (ix) any combination thereof, wherein the display matrix is of the facility. In some embodiments, the at least one controller is configured to configure, or direct configuration of, the touch screen sensor and emitter arrays at least in part by the at least one controller being configured to receive (e.g., through user input or sensor input), o, or direct receiving of, a relative orientation of each media display in the display matrix, which relative orientation of the media display comprises landscape or portrait orientation with respect to (i) each other (ii) a mullion of the display matrix, (iii) a transom of the display matrix, (iv) a horizon, (v) a gravitational vector, (vi) a floor of the facility, (vii) a ceiling of the facility, (viii) a wall of the facility, or (ix) any combination thereof, wherein the display matrix is of the facility.

In another aspect, a method for controlling media display touch screens, the method comprises one or more operations of any disclosed above.

In another aspect, a method for controlling media display touch screens, the method comprises: (a) detecting a location of a user stimulation of one or more of touch screen sensor and emitter arrays, which location of stimulation of the one or more of the touch screen sensor and emitter arrays is (i) at least partially based on a defined coordinate system for the touch screen sensor and emitter arrays that is derived at least in part by aligning a real configuration of each of the media displays each having a touch screen sensor and emitter array of the touch screen sensor and emitter arrays, with a virtual setting of each of the touch screen sensor and emitter arrays, and (ii) is at least partially based on each of the media displays displaying a portion of a media such that the display matrix displays an entire depiction of the media; and (b) using the defined coordinate system to translate the location of the user stimulation to a touch location in the media being displayed on the display matrix of the media displays.

In another aspect, a non-transitory computer readable program instructions for controlling media display touch screens, the program instructions, when read by one or more processors operatively coupled to operatively couple to touch screen sensor and emitter arrays of media displays that form a display matrix, cause the one or more processors to execute one or more operations disclosed above.

In another aspect, a non-transitory computer readable program instructions for controlling media display touch screens, the program instructions, when read by one or more processors operatively coupled to operatively couple to touch screen sensor and emitter arrays of media displays that form a display matrix, cause the one or more processors to execute operations comprises:

(a) detecting, or directing detection of, a location of a user stimulation of one or more of the touch screen sensor and emitter arrays, which location of stimulation of the one or more of the touch screen sensor and emitter arrays is (i) at least partially based on a defined coordinate system for the touch screen sensor and emitter arrays that is derived at least in part by aligning a real configuration of each of the media displays each having a touch screen sensor and emitter array of the touch screen sensor and emitter arrays, with a virtual setting of each of the touch screen sensor and emitter arrays, and (ii) is at least partially based on each of the media displays displaying a portion of a media such that the display matrix displays an entire depiction of the media; and (b) using, or directing usage of, the defined coordinate system to translate the location of the user stimulation to a touch location in the media being displayed on the display matrix of the media displays.

In another aspect, a system for controlling media display touch screens, the system comprises a network operatively coupled to touch screen arrays of media displays arranged in a media display matrix, the network configured to transmit one or more signals associated with one or more operations disclosed above.

In some embodiments, the network is configured to transmit the one or more signals at least in part by being configured to abide by one or more protocols associated with the signals.

In another aspect, a system for controlling media display touch screens, the system comprises a network operatively coupled to touch screen sensor and emitter arrays of media displays that form a display matrix, the network configured to: (a) transmit detection of a location of a user stimulation of one or more of the touch screen sensor and emitter arrays, which location of stimulation of the one or more of the touch screen sensor and emitter arrays is (i) at least partially based on a defined coordinate system for the touch screen sensor and emitter arrays that is derived at least in part by aligning a real configuration of each of the media displays each having a touch screen sensor and emitter array of the touch screen sensor and emitter arrays, with a virtual setting of each of the touch screen sensor and emitter arrays, and (ii) is at least partially based on each of the media displays displaying a portion of a media such that the display matrix displays an entire depiction of the media; and (b) transmit the defined coordinate system to translate the location of the user stimulation to a touch location in the media being displayed on the display matrix of the media displays.

In some embodiments, the network is a local network. In some embodiments, the network comprises a cable configured to transmit power and communication in a single cable. The communication can be one or more types of communication. The communication can comprise cellular communication abiding by at least a second generation (2G), third generation (3G), fourth generation (4G) or fifth generation (5G) cellular communication protocol. In some embodiments, the communication comprises media communication facilitating stills, music, or moving picture streams (e.g., movies or videos). In some embodiments, the communication comprises data communication (e.g., sensor data). In some embodiments, the communication comprises control communication, e.g., to control the one or more nodes operatively coupled to the networks. In some embodiments, the network comprises a first (e.g., cabling) network installed in the facility. In some embodiments, the network comprises a (e.g., cabling) network installed in an envelope of the facility (e.g., in an envelope of a building included in the facility).

In another aspect, the present disclosure provides systems, apparatuses (e.g., controllers), and/or non-transitory computer-readable medium or media (e.g., software) that implement any of the methods disclosed herein.

In another aspect, the present disclosure provides methods that use any of the systems, computer readable media, and/or apparatuses disclosed herein, e.g., for their intended purpose.

In another aspect, an apparatus comprises at least one controller that is programmed to direct a mechanism used to implement (e.g., effectuate) any of the method disclosed herein, which at least one controller is configured to operatively couple to the mechanism. In some embodiments, at least two operations (e.g., of the method) are directed/ executed by the same controller. In some embodiments, at less at two operations are directed/executed by different controllers.

In another aspect, an apparatus comprises at least one controller that is configured (e.g., programmed) to implement (e.g., effectuate) any of the methods disclosed herein. The at least one controller may implement any of the methods disclosed herein. In some embodiments, at least two operations (e.g., of the method) are directed/executed by the same controller. In some embodiments, at less at two operations are directed/executed by different controllers.

In some embodiments, one controller of the at least one controller is configured to perform two or more operations. In some embodiments, two different controllers of the at least one controller are configured to each perform a different operation.

In another aspect, a system comprises at least one controller that is programmed to direct operation of at least one another apparatus (or component thereof), and the apparatus (or component thereof), wherein the at least one controller is operatively coupled to the apparatus (or to the component thereof). The apparatus (or component thereof) may include any apparatus (or component thereof) disclosed herein. The at least one controller may be configured to direct any apparatus (or component thereof) disclosed herein. The at least one controller may be configured to operatively couple to any apparatus (or component thereof) disclosed herein. In some embodiments, at least two operations (e.g., of the apparatus) are directed by the same controller. In some embodiments, at less at two operations are directed by different controllers.

In another aspect, a computer software product (e.g., inscribed on one or more non-transitory medium) in which program instructions are stored, which instructions, when read by at least one processor (e.g., computer), cause the at least one processor to direct a mechanism disclosed herein to implement (e.g., effectuate) any of the method disclosed herein, wherein the at least one processor is configured to operatively couple to the mechanism. The mechanism can comprise any apparatus (or any component thereof) disclosed herein. In some embodiments, at least two operations (e.g., of the apparatus) are directed/executed by the same processor. In some embodiments, at less at two operations are directed/executed by different processors.

In another aspect, the present disclosure provides a non-transitory computer-readable program instructions (e.g., included in a program product comprising one or more non-transitory medium) comprising machine-executable code that, upon execution by one or more processors, implements any of the methods disclosed herein. In some embodiments, at least two operations (e.g., of the method) are directed/executed by the same processor. In some embodiments, at less at two operations are directed/executed by different processors.

In another aspect, the present disclosure provides a non-transitory computer-readable medium or media comprising machine-executable code that, upon execution by one or more processors, effectuates directions of the controller(s) (e.g., as disclosed herein). In some embodiments, at least two operations (e.g., of the controller) are directed/executed by the same processor. In some embodiments, at less at two operations are directed/executed by different processors.

In another aspect, the present disclosure provides a computer system comprising one or more computer processors and a non-transitory computer-readable medium or media coupled thereto. The non-transitory computer-readable medium comprises machine-executable code that, upon execution by the one or more processors, implements any of the methods disclosed herein and/or effectuates directions of the controller(s) disclosed herein.

In another aspect, the present disclosure provides a non-transitory computer readable program instructions that, when read by one or more processors, causes the one or more processors to execute any operation of the methods disclosed herein, any operation performed (or configured to be performed) by the apparatuses disclosed herein, and/or any operation directed (or configured to be directed) by the apparatuses disclosed herein.

In some embodiments, the program instructions are inscribed in a non-transitory computer readable medium or media. In some embodiments, at least two of the operations are executed by one of the one or more processors. In some embodiments, at least two of the operations are each executed by different processors of the one or more processors.

In another aspect, the present disclosure provides networks that are configured for transmission of any communication (e.g., signal) and/or (e.g., electrical) power facilitating any of the operations disclosed herein. The communication may comprise control communication, cellular communication, media communication, and/or data communication. The data communication may comprise sensor data communication and/or processed data communication. The networks may be configured to abide by one or more protocols facilitating such communication. For example, a communications protocol used by the network (e.g., with a BMS) can be a building automation and control networks protocol (BACnet). For example, a communication protocol may facilitate cellular communication abiding by at least a $2^{nd}$, $3^{rd}$, $4^{th}$, or $5^{th}$ generation cellular communication protocol.

The content of this summary section is provided as a simplified introduction to the disclosure and is not intended to be used to limit the scope of any invention disclosed herein or the scope of the appended claims.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

These and other features and embodiments will be described in more detail with reference to the drawings.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings or figures (also "Fig." and "Figs." herein), of which:

FIG. 7 schematically shows various fasteners and display construct assemblies;

FIG. 9 schematically shows various views of a display construct assembly;

FIG. 12 schematically shows various fasteners and display construct assemblies;

FIGS. 21A-B schematically show various windows and display constructs;

FIGS. 22A-B schematically show various windows and display constructs;

FIG. 28 schematically shows a display construct and associated components;

FIGS. 29A-D schematically show various display constructs;

FIGS. 30A-B schematically show various display constructs;

FIGS. 34A-E schematically show various views of a box comprising circuitry;

FIG. 42 schematically show various views of portion of a display constructs and associated components;

FIG. 45 schematically shows a pair of user interface screens of an APP;

FIG. 46 schematically shows a pair of user interface screens of an APP;

FIG. 47 schematically shows a pair of user interface screens of an APP;

FIG. 59 schematically shows a pair of user interface screens of an APP;

FIG. 60 schematically shows a pair of user interface screens of an APP;

FIG. 63 schematically shows a pair of user interface screens of an APP and a physical display construct scheme;

Figure 1A:
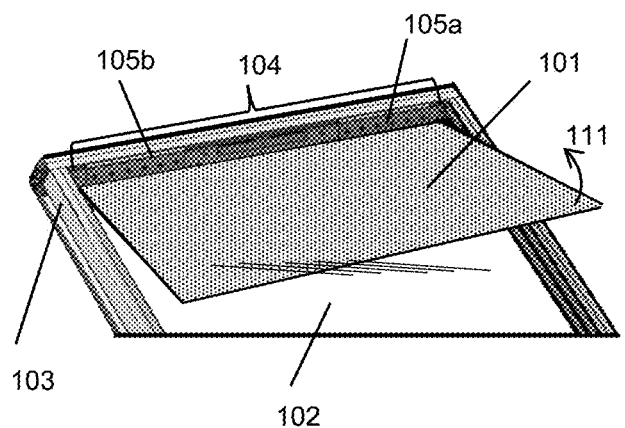
FIGS. 1A-1B show various windows and display constructs.

The figures and components therein may not be drawn to scale. Various components of the figures described herein may not be drawn to scale.

DETAILED DESCRIPTION

While various embodiments of the invention have been shown, and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein might be employed.

Terms such as "a," "an," and "the" are not intended to refer to only a singular entity but include the general class of which a specific example may be used for illustration. The terminology herein is used to describe specific embodiments of the invention(s), but their usage does not delimit the invention(s).

When ranges are mentioned, the ranges are meant to be inclusive, unless otherwise specified. For example, a range between value 1 and value 2 is meant to be inclusive and include value 1 and value 2. The inclusive range will span any value from about value 1 to about value 2. The term "adjacent" or "adjacent to," as used herein, includes "next to," "adjoining," "in contact with," and "in proximity to."

As used herein, including in the claims, the conjunction "and/or" in a phrase such as "including X, Y, and/or Z", refers to in inclusion of any combination or plurality of X, Y, and Z. For example, such phrase is meant to include X. For example, such phrase is meant to include Y. For example, such phrase is meant to include Z. For example, such phrase is meant to include X and Y. For example, such phrase is meant to include X and Z. For example, such phrase is meant to include Y and Z. For example, such phrase is meant to include a plurality of Xs. For example, such phrase is meant to include a plurality of Ys. For example, such phrase is meant to include a plurality of Zs. For example, such phrase is meant to include a plurality of Xs and a plurality of Ys. For example, such phrase is meant to include a plurality of Xs and a plurality of Zs. For example, such phrase is meant to include a plurality of Ys and a plurality of Zs. For example, such phrase is meant to include a plurality of Xs and Y. For example, such phrase is meant to include a plurality of Xs and Z. For example, such phrase is meant to include a plurality of Ys and Z. For example, such phrase is meant to include X and a plurality of Ys. For example, such phrase is meant to include X and a plurality of Zs. For example, such phrase is meant to include Y and a plurality of Zs. The conjunction "and/or" is meant to have the same effect as the phrase "X, Y, Z, or any combination or plurality thereof." The conjunction "and/or" is meant to have the same effect as the phrase "one or more X, Y, Z, and any combination thereof."

The term "operatively coupled" or "operatively connected" refers to a first element (e.g., mechanism) that is coupled (e.g., connected) to a second element, to allow the intended operation of the second and/or first element. The coupling may comprise physical or non-physical coupling. The non-physical coupling may comprise signal-induced coupling (e.g., wireless coupling). Coupled can include physical coupling (e.g., physically connected), or non-physical coupling (e.g., via wireless communication).

An element (e.g., mechanism) that is "configured to" perform a function includes a structural feature that causes the element to perform this function. A structural feature may include an electrical feature, such as a circuitry or a circuit element. A structural feature may include an actuator. A structural feature may include a circuitry (e.g., comprising electrical or optical circuitry). Electrical circuitry may comprise one or more wires. Optical circuitry may comprise at least one optical element (e.g., beam splitter, mirror, lens and/or optical fiber). A structural feature may include a mechanical feature. A mechanical feature may comprise a latch, a spring, a closure, a hinge, a chassis, a support, a fastener, or a cantilever, and so forth. Performing the function may comprise utilizing a logical feature. A logical feature may include programming instructions. Programming instructions may be executable by at least one processor. Programming instructions may be stored or encoded on a medium accessible by one or more processors. Additionally, in the following description, the phrases "operable to," "adapted to," "configured to," "designed to," "programmed to," or "capable of" may be used interchangeably where appropriate.

In some embodiments, a display construct that is coupled with a viewing (e.g., a tintable viewing) window. The viewing window may include an integrated glass unit. The display construct may include one or more glass panes. The display (e.g., display matrix) may comprise a light emitting diode (LED). The LED may comprise an organic material (e.g., organic light emitting diode abbreviated herein as "OLED"). The OLED may comprise a transparent organic light emitting diode display (abbreviated herein as "TOLED"), which TOLED is at least partially transparent. The display may have at its fundamental length scale 2000, 3000, 4000, 5000, 6000, 7000, or 8000 pixels. The display may have at its fundamental length scale any number of pixels between the aforementioned number of pixels (e.g., from about 2000 pixels to about 4000 pixels, from about 4000 pixels to about 8000 pixels, or from about 2000 pixels to about 8000 pixels). A fundamental length scale may comprise a diameter of a bounding circle, a length, a width, or a height. The fundamental length scale may be abbreviated herein as "FLS." The display construct may comprise a high resolution display. For example, the display construct may have a resolution of at least about 550, 576, 680, 720, 768, 1024, 1080, 1920, 1280, 2160, 3840, 4096, 4320, or 7680 pixels, by at least about 550, 576, 680, 720, 768, 1024, 1080, 1280, 1920, 2160, 3840, 4096, 4320, or 7680 pixels (at 30 Hz or at 60 Hz). The first number of pixels may designate the height of the display and the second pixels may designates the length of the display. For example, the display may be a high resolution display having a resolution of 1920×1080, 3840×2160, 4096×2160, or 7680×4320. The display may be a standard definition display, enhanced definition display, high definition display, or an ultra-high definition display. The display may be rectangular. The image projected by the display matrix may be refreshed at a frequency (e.g., at a refresh rate) of at least about 20 Hz, 30 Hz, 60 Hz, 70 Hz, 75 Hz, 80 Hz, 100 Hz, or 120 Hertz (Hz). The FLS of the display construct may be at least about 20", 25", 29", 30", 35", 40", 45", 49", 50", 55", 58" 60", 65", 80", 90" or 98 inches ("). The FLS of the display construct can be of any value between the aforementioned values (e.g., from about 20" to about 55", from about 55" to about 100", or from about 20" to about 100").

In some embodiments, at least a portion of a window surface in a facility is utilized to display the various media using the glass display construct. The display may be utilized for (e.g., at least partial) viewing an environment external to the window (e.g., outdoor environment), e.g., when the display is not operating. The display may be used to display media (e.g., as disclosed herein), to augment the external view with (e.g., optical) overlays, augmented reality, and/or lighting (e.g., the display may act as a light source). The media may be used for entertainment and non-entertainment purposes. The media may be used for work (e.g., data analysis, drafting, and/or video conferencing). The media may be manipulated (e.g., by utilizing the display construct). Utilizing the display construct can be direct or indirect. Indirect utilization of the media may be using an input device such as an electronic mouse, or a keyboard. The input device may be communicatively (e.g., wired and/or wirelessly) coupled to the media. Direct utilization may be by using the display construct as a touch screen using a user (e.g., finger) or a directing device (e.g., an electronic pen or stylus). The directing device may be made or, and/or coated with a low abrasive material (e.g., a polymer). The low abrasive material may be configured to facilitate (e.g., repeatedly) contacting the display construct with minimal damage (e.g., scratching) to the display construct. The low abrasive material may comprise a polymer or resin (e.g., plastic). The directing device may be passive or active. The active directing device may operatively couple to the display construct and/or network. The active directing device may comprise a circuitry. The active directing device may comprise a remote controller. The directing device may facilitate direction of operations related to media presented by the display construct. The directing device may facilitate (e.g., real time and/or in situ) interaction with the media presented by the display construct.

Embodiments described herein relate to vision windows with a tandem (e.g., transparent) display construct. In certain embodiments, the vision window is an electrochromic window. The electrochromic window may comprise a solid state and/or inorganic electrochromic (EC) device. The vision window may be in the form of an integrated glass unit (IGU). When the IGU includes an electrochromic (abbreviated herein as "EC") device, it may be termed an "EC IGU." The EC IGU can tint (e.g., darken) a room in which it is disposed and/or provide a tinted (e.g., darker) background as compared to a non-tinted IGU. The tinted IGU can provide a background preferable (e.g., necessary) for acceptable (e.g., good) contrast on the (e.g., transparent) display construct. In another example, windows with (e.g., transparent) display constructs can replace televisions (abbreviated herein as "TVs") in commercial and residential applications. Together, the (e.g., transparent) display construct and EC IGU can provide visual privacy glass function, e.g., because the display can augment the privacy provided by EC glass alone. Embodiments disclosed herein also describe particular methods, apparatus and systems for mounting display constructs (e.g., transparent display) to framing systems of vision windows.

FIG. 1A shows an example of a window 102 framed in a window frame 103 (partial view shown), and a fastener structure 104 comprising a first hinge 105a and a second hinge 105b, which hinges facilitate rotating display construct 101 about the hinge axis, e.g., in a direction of arrow 111. The window may be an electrochromic window. The window may be in the form of an EC IGU. In one embodiment, mounted to window frame (e.g., 103) is one or more display constructs (e.g., transparent display) (e.g., 101) that is transparent at least in part. In one embodiment, the one or more display constructs (e.g., transparent display) comprises T-OLED technology, but it should be understood that the present invention should not be limited by or to such technology. In one embodiment, one or more display constructs (e.g., transparent display) is mounted to frame (e.g., 103) via a fastener structure (e.g., 104). In one embodiment the fastener structure (also referred to herein as a "fastener") comprises a bracket. In one embodiment, the fastener structure comprises an L-bracket. In one embodiment, L-bracket comprises a length that approximates or equals a length of a side of window (e.g., and in the example shown in FIG. 1A, also the length of the fastener 104). In embodiments, the fundamental length scale (e.g., length) of a window is up to 60 feet ('), 50', 40', 30', 25', 20', 15', 10', 5' or 1'. The FLS of the window can be of any value between the aforementioned values (e.g., from 1' to 60', from 1' to 30', from 30' to 60', or from 10' to 40'). In embodiments, the fundamental length scale (e.g., length) of a window is at least about 50', 60', 80', or 100'. In one embodiment, the display construct (e.g., transparent display) encompasses an area that (e.g., substantially) matches a surface area of the lite (e.g., pane). The fastener structure may be mounted to the structure (e.g., frame portion such as a mullion) via a locking mechanism (e.g., snap lock) and/or via screw(s), e.g., may be configured for a slip and snap attachment. The fastener may comprise a mounting plate. The fastener may be configured to allow its associated cabling and/or wiring to reside in the supporting structure cavity (e.g., framing portion) without exerting pressure on the supporting structure (e.g., fixture). The supporting structure may comprise a clip (e.g., spring clip) to hold the fastener in place.

Figure 1B:
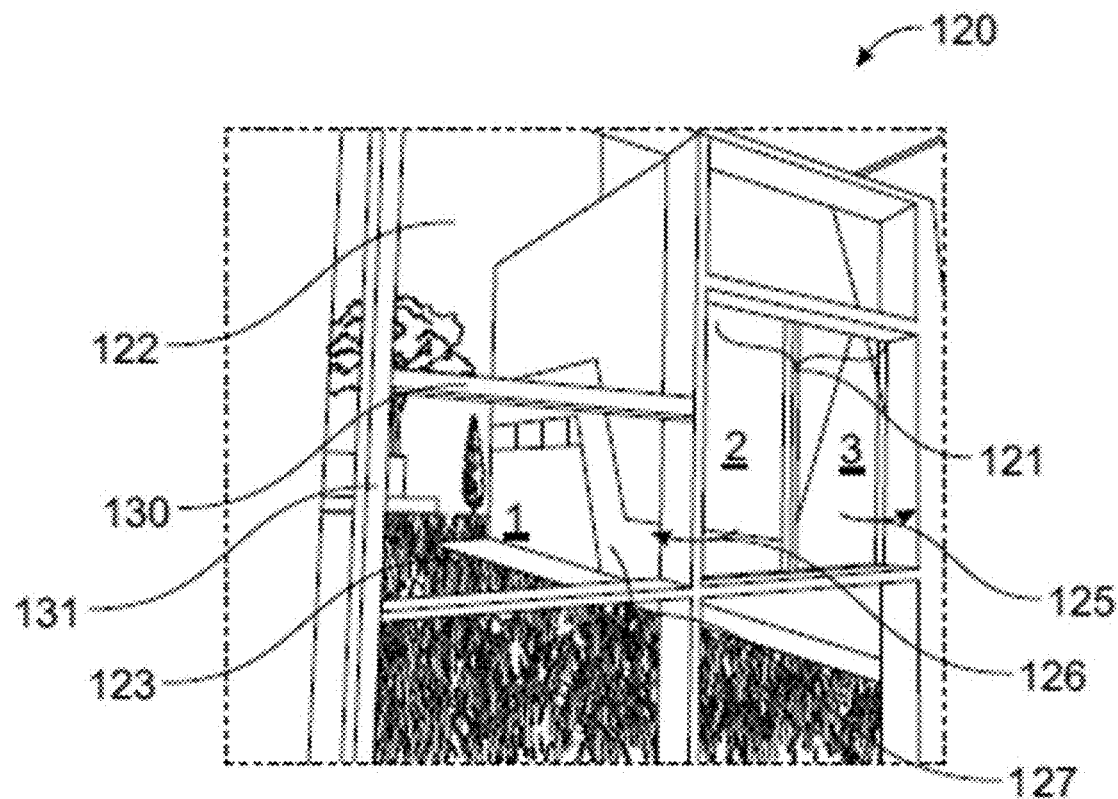

In particular embodiments, the area of the display approximates the vision area of a window (e.g., the area within the framing system of the window (e.g., see 1 in FIG. 1B)). In one embodiment, one or more display constructs (e.g., transparent display), together, (e.g., approximately and/or substantially) cover the vision area of a window (e.g., see 2 and 3 in FIG. 1b). In one embodiment, a transparent display encompasses an area that is about half of the vision area of a (e.g., tintable) window. In one embodiment, two or more displays are mounted over a single vision window (see 2 and 3 in FIG. 1b). The display construct can cover at least a portion of the (e.g., tintable) window. The display construct can cover at least about 10%, 20%, 30%, 40%, 50%, 60%, 70%, 80%, 90%, 95%, or 99% of the visible portion of the (e.g., tintable) window. The area occupied by the display construct can be the entire (100%) of the visible portion of the (e.g., tintable) window. The area occupied by the display construct can be any percentage of the visible portion of the (e.g., tintable) window between the aforementioned percentages (e.g., from about 10% to about 100%, from about 10% to about 50%, or from about 50% to about 100%). At times a plurality of display constructs can cover the (e.g., tintable) window. The display construct can be mounted in one or more layouts and/or configurations, e.g., to maximize design flexibility. A plurality of fasteners can be coupled (e.g., respectively) to the plurality of display constructs (e.g., to allow swiveling of the display constructs). FIG. 1B shows an example of various windows in a facade 120 of a building, which facade comprises windows 122, 123, and 121, and display constructs 1, 2, and 3. In the example shown in FIG. 1B, display construct 1 is transparent at least in part and is disposed over window 123 (e.g., display construct 1 is super positioned over window 123) such that the entirety of window 123 is covered by the display construct, and a user can view through the display construct 1 and the window 123 the external environment (e.g., flowers, glass, and trees). Display construct 1 is coupled to the window with a fastener that facilitates rotation of the display construct about an axis parallel to the window bottom horizontal edge, which rotation is in the direction of arrow 127. In the example shown in FIG. 1B, display constructs 2 and 3 are transparent at least in part and are disposed over window 121 such that the entirety of window 121 is covered by the two display construct each covering (e.g., extending to) about half of the surface area of window 121, and a user can view through the display constructs 2 and 3 and the window 121 the external environment (e.g., flowers, glass, and trees). Display construct 2 is coupled to the window 121 with a fastener that facilitates rotation of the display construct about an axis parallel to the window left vertical edge, which rotation is in the direction of arrow 126. Display construct 3 is coupled to the window with a fastener that facilitates rotation of the display construct about an axis parallel to the window 121 right vertical edge, which rotation is in the direction of arrow 125.

In some embodiments, the display construct is coupled to a structure (e.g., a fixture). The structure may comprise a window, a wall, or a board. The display construct may be coupled to the structure with a fastener. There may be a distance between the display construct and the structure, e.g., when the display construct is operational. The distance may be at most about 0.5 meters (m), 0.4m, 0.3m, 0.2m, 0.1m, 0.05m, 0.025m, or 0.01m.

In some embodiments, the E-box is operatively coupled to, or includes, a power supply. The power supply can be an electrical device that supplies electric power to an electrical load. The power supply can convert electric current from a source to the correct voltage, current, and/or frequency to power the load. The power supply may limit the current drawn by the load to safe levels (e.g., according to jurisdictional and/or safety standards), shut off the current (e.g., in the event of an electrical fault), condition power (e.g., to prevent electronic noise and/or voltage surges on the input from reaching the load), correct power-factor, and/or store energy (e.g., to facilitate continued operation of the load in the event of a temporary interruption in the source power). The load may be the media display (e.g., OLED display). The power supply may be an electric power converter. The power supply can be a separate standalone device. The power supply can be included in the E-box. The standalone power supply device can be disposed in a structure such as a fixture. The structure can comprise a window frame portion (e.g., mullion or transom), or a wall. The power supply device can be disposed at a distance from the E-box and/or timing controller. The distance may be at least about 30 feet ('), 50', 100', 200', 300'. The E-box may or may not be part of the fastener (e.g., attached to the fastener). In some embodiments, the E-box (e.g., including any analogue to digital converter) may be disposed at a distance from the fastener (e.g., not be part of the fastener).

In some embodiments, housing of an electronic component (e.g., circuitry) comprises at least one heat exchanger. For example, the E-box, power supply housing, and/or timing controller housing (e.g., fastener) may comprise one or more heat exchangers (e.g., as disclosed herein). The heat exchangers may be fans. The heat exchangers may be passive or active. The heat exchangers may comprise a heat pipe. The heat exchangers may comprise a component configured to efficiently absorb and/or transfer heat. For example, the heat exchanger may comprise a metal slab (e.g., heat sink). The metal slap may comprise elemental metal or metal alloy.

In some embodiments, the housing of an electronic component (e.g., fastener) may comprise one or more fans. The fans may direct gas (e.g., air) from one of its sides to the other (e.g., pushing gas into the ambient environment or puling gas out of the ambient environment). The direction of the fan rotation may determine its pushing/pulling gas functionality. The fan may have a fundamental length scale (e.g., height, length, width, radius, or radius of a bounding circle). The fundamental length scale (FLS) of the fan may be at most about 5 centimeters (cm), 4 cm, 3 cm, 2.5 cm, 2 cm, 1.5 cm, 1 cm, or 0.5 cm. The FLS may have any value between the aforementioned values (e.g., from about 5 cm to about 0.5 cm, from about 5 cm to about 2 cm, or from about 2 cm to about 0.5 cm). The height and the length of the fan may be (e.g., substantially) equal. The width of the fan may be at most about half, third, fourth, or fifth of the height and/or length of the fan. The fan may have a plurality of blades (e.g., at least 3, 4, 5, 6, 7, 8, 9, or 10 blades). In some embodiments, the fan may be bladeless. The fan may require low voltage, e.g., of at most about 1.5 volts (V), 2V, 3V, 4V, 5V, 6V, 7V, 8V, 9V, or 10V. The speed of the fan may be at least about 5 thousand revolutions per minutes (KRPM), 5.5 KRPM, 6 KRPM, 6.5 KRPM, 7 KRPM, 7.5 KRPM, 8 KRPM, 8.5 KRPM, 9 KRPM, 9.5 KRPM, 10 KRPM, 10.5 KRPM, 11 KRPM, 11.5 KRPM, or 12 KRPM. The fan may have a low noise signature. The low noise signature may be of at most about 10.0 decibels (dbA), 15 dbA, 20, 25 dbA, or 30 dbA, wherein dbA values are adjusted for varying sensitivity of a human ear to different frequencies of sound. The low noise signature may be below a speaking sound (e.g., of about 65 dbA). The low noise signature may be at most in the order of a breathing noise (e.g., of about 10 dbA), of a silent study room (e.g., of about 20 dbA), of a soft whisper (e.g., of about 40 dbA), or of an office environment (e.g., from about 50 dbA to about 65 dbA). The noise level of the fan may abide by jurisdictional standards, e.g., by standards promulgated by the Occupational Safety and Health Administration (OSHA). The fan may have a weight of at most about 5 grams (g), 6 g, 8 g, or 10 g. The fan may have a conduction capacity of air of at least about 0.02 cubic meters per minute (M3/min), 0.03 M3/min, 0.04 M3/min, 0.05 M3/min, 0.06 M3/min, 0.07 M3/min, 0.08 M3/min, 0.09 M3/min, 0.1 M3/min, 0.15 M3/min, 0.2 M3/min, 0.3 M3/min, 0.4 M3/min, or 0.5 M3/min. The fan may have a conduction capacity between any of the conduction capacities mentioned herein (e.g., from about 0.02 M3/min to about 0.05 M3/min, from about 0.05 M3/min to about 0.1 M3/min, or from about 0.1 M3/min to about 0.5 M3/min).

In some embodiments, at least two of the plurality of circuit boards may be disposed in a manner that facilitates shielding, heat exchange and/or cooling element disposed therebetween. At least one shielding element may be disposed between a first circuit board and a second circuit board that are located (e.g., directly) adjacent to each other. The shielding element may comprise electrical and/or electromagnetic (e.g., radio frequency) shielding. The shielding may or may not act as a heat exchanger and/or cooling element. The housing of an electronic component may comprise a heat exchanger and/or cooling element that is separate from the shielding. The heat exchanger and/or cooling element may comprise a heat pipe, or a metallic slab. Metallic may comprise elemental metal or metal alloy. The metal may be configured for (e.g., efficient and/or rapid) heat conduction. The metal may comprise copper, aluminum, brass, steel, or bronze. The cooling element may comprise a fluid, gaseous, or semisolid (e.g., gel) material. The cooling element may be active and/or passive. The cooling element may comprise a circulating substance. The cooling element may be operatively coupled to an active cooling device (e.g., thermostat, cooler, and/or refrigerator). The active cooling device may be disposed externally to the device ensemble housing. The cooling element may be disposed in a fixture (e.g., the floor, ceiling, wall, or framing) of the enclosure (e.g., building or room) in which the housing of an electronic component is disposed. The fixture may comprise a mullion or transom.

Figure 17:
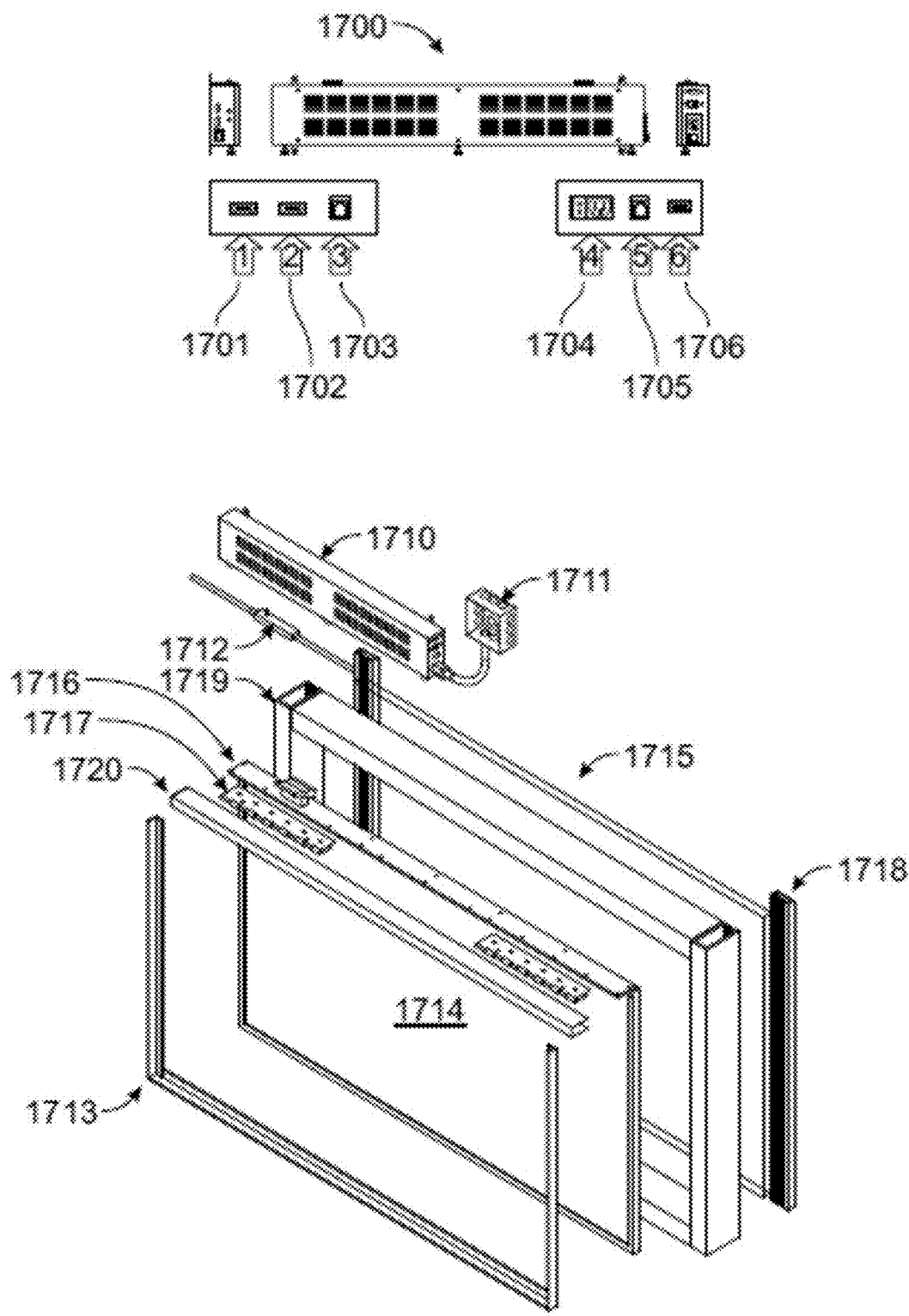
FIG. 17 schematically shows a display construct assembly and a controller and power supply assembly.

In some embodiments, the display construct assembly can accept one or more connector types for media signal and/or electricity. For example, at least one connector and/or socket to one or more drivers and/or receivers, e.g., for use in serial communications systems (e.g., RS485 (input and output)). The connector and/or socket types may comprise HDMI, display port (DP) input and/or output or alternating current (AC) input and/or switch. FIG. 17 shows an example of a side of a controller and power supply assembly 1700 that includes HDMI input 1701, DP1 input 1702, RS485 input 1703, AC switch and AC input 1704, RS485 output 1705, and DP output 1706. FIG. 17 shows a perspective disassembled (e.g., exploded) view of a controller and power supply assembly 1710 connected to a main power line 1711, a window controller 1712, an IGU 1715, framing cap 1718 (sometimes referred to as "beauty cap"), window frame 1719, circuitry 1716 (e.g., comprising a booster and/or driver for the display matrix), hinges (e.g., hinge 1717), display construct 1714, cover 1720, and a display construct frame (e.g., edge bezel) 1713 for the display construct. The display construct frame can be a cover for the touch screen component(s) (e.g., as part of the edge bezel). The window controller may be disposed to the side of the window, closer or further from the window. The window controller may be disposed in (or on) the window frame, in (or on) a wall, in (or on) a celling, in (or on) a floor. The hinge may or may not be temporarily locked (e.g., using insertions (e.g., slits or crevices), protrusions, and/or spring (e.g., spring plunger)).

In some embodiments, the display construct is registered with a viewing window (e.g., Integrated glass unit abbreviated herein as "IGU"). The display construct may be configured to be positioned on at least a portion of a (e.g., tintable) window. For example, the display construct may be configured to be super positioned with at least a portion of the window. The display construct may be configured to facilitate simultaneous viewing from one side of a window (e.g., internal environment) to its opposing side (e.g., external environment). The display construct may be position in the light of sight of a user viewing through a window (or any portion thereof).

In some embodiments, a controller is operatively coupled (e.g., communicatively coupled) with the display construct. The communication may be wired and/or wireless. The controller may control the display construct at least partially automatically. The controller may be a timing controller (e.g., T-CON), e.g., as disclosed herein. The timing controller may be specific for each display construct (e.g., aligned for each emitting entity matrix). The control may include electronic and/or optical control. The controller may comprise a microcontroller. The controller may be disposed adjacent to the glass (e.g., IGU) and/or display construct. The controller may be disposed in a window frame (e.g., transom or mullion). In some embodiments, a mullion (e.g., FIG. 1B, 131) is a vertical run of window framing, and a transom (e.g., FIG. 1B, 130) is a horizontal run of window framing. The window frame may (e.g., directly or indirectly) hold the glass and/or display construct. The glass may be a tintable glass. The tintable glass may be controlled (e.g., using at least one controller). For example, the tintable glass may be controlled by a hierarchy of controllers (e.g., see FIG. 15). The hierarchy of controllers may be static or dynamic (e.g., in which the hierarchical designation of controllers is dynamically altered). The one or more controllers that control the viewing (e.g., tintable) window may or may not control the display construct (also referred to herein as "media display construct").

Figure 2:
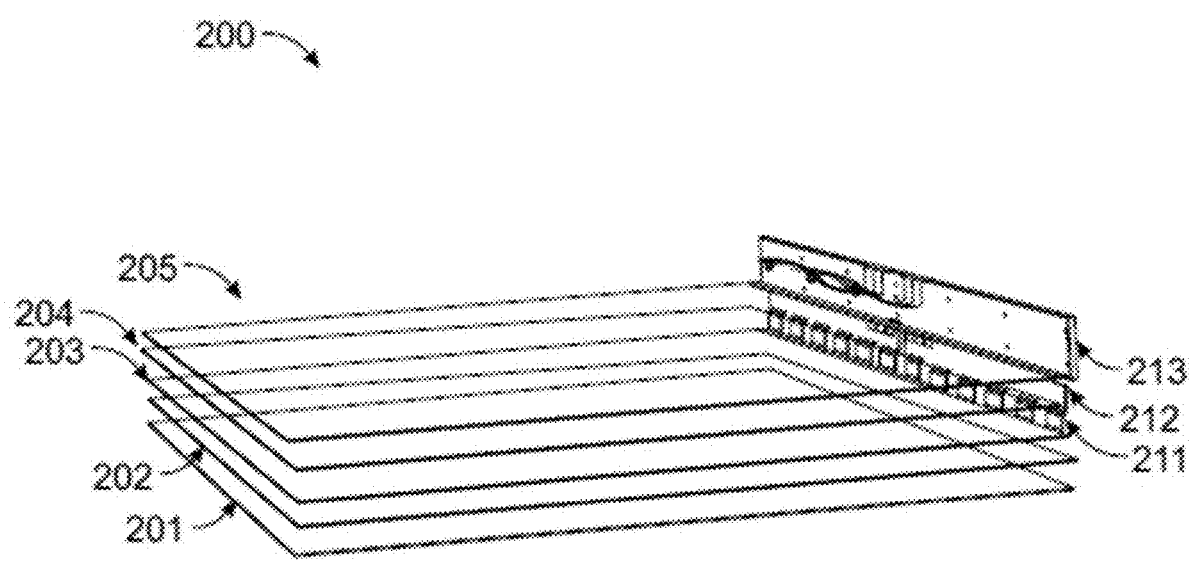
FIG. 2 schematically shows a display construct assembly.

In some embodiments, the display construct comprises glass. The glass may be in the form of one or more glass pane. For example, the display construct may include a display matrix (e.g., an array of lights) disposed between two glass panes. The array of lights may include an array of colored lights. For example, an array of red, green, and blue colored lights. For example, an array of cyan, magenta, and yellow colored lights. The array of lights may include light colors used in electronic screen display. The array of lights may comprise an array of LEDs (e.g., OLEDs, e.g., TOLEDs). The matrix display (e.g., array of lights) may be at least partially transparent (e.g., to an average human eye). The transparent OLED may facilitate transition of a substantial portion (e.g., greater than about 30%, 40%, 50%, 60%, 80%, 90% or 95%) of the intensity and/or wavelength to which an average human eye senses. The matrix display may form minimal disturbance to a user looking through the array. The array of lights may form minimal disturbance to a user looking through a window on which the array is disposed. The display matrix (e.g., array of lights) may be maximally transparent. At least one glass pane of the display construct may be of a regular glass thickness. The regular glass may have a thickness of at least about 1 millimeters (mm), 2 mm, 3 mm, 4 mm, 5 mm, or 6 mm. The regular glass may have a thickness of a value between any of the aforementioned values (e.g., from 1 mm to 6 mm, from 1 mm to 3 mm, from 3 mm to about 4 mm, or from 4 mm to 6 mm). At least one glass pane of the display construct may be of a thin glass thickness. The thin glass may have a thickness of at most about 0.4 millimeters (mm), 0.5 mm, 0.6 mm, 0.7 mm, 0.8 mm, or 0.9 mm thick. The thin glass may have a thickness of a value between any of the aforementioned values (e.g., from 0.4 mm to 0.9 mm, from 0.4 mm to 0.7 mm, or from 0.5 mm to 0.9 mm). The glass of the display construct may be at least transmissive (e.g., in the visible spectrum). For example, the glass may be at least about 80%, 85%, 90%, 95%, or 99% transmissive. The glass may have a transmissivity percentage value between any of the aforementioned percentages (e.g., from about 80% to about 99%). The display construct may comprise one or more panes (e.g., glass panes). For example, the display construct may comprise a plurality (e.g., two) of panes. The glass panes may have (e.g., substantially) the same thickness, or different thickness. The front facing pane may be thicker than the back facing pane. The back facing pane may be thicker than the front facing pane. Front may be in a direction of a prospective viewer (e.g., in front of display construct 101, looking at display construct 101). Back may be in the direction of a (e.g., tintable) window (e.g., 102). One glass may be thicker relative to another glass. The thicker glass may be at least about 1.25*, 1.5*, 2*, 2.5*, 3*, 3.5*, or 4* thicker than the thinner glass. The symbol "*" designates the mathematical operation of "times." The transmissivity of the display construct (that including the one or more panes and the display matrix (e.g., light-array or LCD)) may be of at least about 20%, 30%, 35%, 40%, 45%, 50%, 60%, 70%, 80%, or 90%. The display construct may have a transmissivity percentage value between any of the aforementioned percentages (e.g., from about 20% to about 90%, from about 20% to about 50%, from about 20% to about 40%, from about 30% to about 40%, from about 40% to about 80%, or from about 50% to about 90%). A higher transmissivity parentage refers higher intensity and/or broader spectrum of light that passes through a material (e.g., glass). The transmissivity may be of visible light. The transmissivity may be measured as visible transmittance (abbreviated herein as "Tvis") referring to the amount of light in the visible portion of the spectrum that passes through a material. The transmissivity may be relative to the intensity of incoming light. The display construct may transmit at least about 80%, 85%, 90%, 95%, or 99% of the visible spectrum of light (e.g., wavelength spectrum) therethrough. The display construct may transmit a percentage value between any of the aforementioned percentages (e.g., from about 80% to about 99%). In some embodiments, instead of an array of lights, a liquid crystal display is utilized. FIG. 2 shows a schematic example of a display construct assembly 200 prior to its lamination, which display construct that includes a thicker glass pane 205, a first adhesive layer 204, a display matrix 203, a second adhesive layer 202, and a thinner glass pane 201, which matrix is connected via wiring 211 to a circuitry 212 that controls at least an aspect of the display construct, which display construct is coupled to a fastener 213.

The display matrix has reflectance and/or color properties. The display matrix can be colored, gray scale, or black and white. The display matrix may have a color depth. The color depth may be at least about 0.25, 0.5, 1, 1.25, or 1.5 billion colors. The color depth may be of any value between the aforementioned values (e.g., from about 0.25 billion colors to about 1.5 billion colors, from about 0.25 billion colors to about 1.25 billion colors, or from about 1 billion colors to about 1.5 billion colors). The display construct may have a contrast ratio of at least about 100000, 120000, 150000, 170000, or 200000, to one. The display construct may have a contrast ratio relative to one between any of the above reference values (e.g., from about 100000:1 to about 200000:1, from about 100000:1 to about 150000:1, or from about 150000:1 to 200000:1). The reflectance of the display construct may be at most about 2%, 4%, 8%, 10%, 14%, or 18%. The reflectance of the display construct may have any value between the aforementioned values (e.g., from about 2% to about 18%, or from about 2% to about 14%).

In some embodiments, the at least one glass pane of the display construct and/or in the IGU, is strengthened. At least one glass of the display construct and/or IGU may be a native glass (e.g., that did not undergo strengthening and/or tempering process). The glass may be a strengthened glass. The strengthened glass may be heat strengthened, heat tempered, or chemically strengthened. The chemically strengthen glass may be chemically tempered glass. The chemically strengthened glass may include Gorilla glass. The glass may comprise used SentryGlass (R). The chemically strengthened glass may comprise one or more ion (e.g., cation) doped glass. The cation may be an alkali (e.g., potassium) or alkali earth cation. The glass may comprise one or more pigments. The glass may allow transition of (e.g., the wavelength and/or intensity of) UV light therethrough. The glass may reduce (e.g., prevent) penetration of (e.g., the wavelength and/or intensity of) UV light therethrough. The glass may absorb at least part of (e.g., the wavelength and/or intensity of) UV light. In some embodiments, the glass may comprise a surface treatment (e.g., sanding).

In some embodiments, the display construct may include a binder (e.g., a laminate and/or adhesive). In some embodiments, the display construct may include a binder that includes a polymer and/or resin. The binder may be disposed between a glass pane and the display matrix. The binder may be chosen to facilitate formation of the construct (e.g., adhesion of the display matrix to the glass pane) with minimally (e.g., without) damaging the display matrix. The binder may be cured by heat and/or UV treatment. The temperature of the heat treatment may be such that minimally damages the display matrix (e.g., not damages the display matrix to a measurable and/or substantial degree). Not damage the array to a substantial degree may refer to not damaging the array to a degree that affects its intended purpose (e.g., performance as a display according to its specification). The binder may include at least one organic polymer. The at least one organic polymer may include Polyvinyl butyral (PVB), Ethylene-vinyl acetate (EVA), Polyacrylamide, SGP resin (e.g., SGP 5000 of Dupont). The binder may comprise OCA, e.g., by 3M (e.g., 3M 8211, 3M 8212, 3M 8213, 3M 8214, 3M 8215, 3M 8171, or 3M 8172). The polymer(s) may allow transition of (e.g., the wavelength and/or intensity of) UV light therethrough. The polymer may reduce (e.g., prevent) penetration of (e.g., the wavelength and/or intensity of) UV light therethrough. The polymer may absorb at least part of (e.g., the wavelength and/or intensity of) UV light.

In some embodiments, the display construct comprises lamination. The display construct may comprise a tintable device (e.g., electrochromic device). The tintable device may be laminated onto the display construct (to form a single display construct unit). For example, the display construct may comprise deposited electrochromic layer construct (e.g., deposited on the back side of the media display (e.g., back side of the LEDs). The display construct may comprise one or more layers (e.g., deposited and/or laminated layers) to protect the media display from radiation (e.g., UV and/or IR radiation). The added layering may constitute a film (e.g., electrochromic device, UV protective layering, and/or IR protective layering). The film may be part of the display construct. The film may facilitate longer operational lifetime of the display construct. The film may facilitate greater contrast of the media displayed. The display construct (e.g., including the electrochromic film) may be coupled to a tintable (e.g., electrochromic) window. The film may constitute any tintable window capability (e.g., liquid crystals device, suspended particle device, microelectromechanical system (MEMS) device (such as micro shutters), or any technology configured to control light transmission through a window). The liquid crystal device may comprise a polymer dispersed liquid crystal layer.

In some embodiments, the display construct may comprise a binder in a form of at least one layer. The binder may include at least one optically clear adhesive layer (abbreviated herein as "OCA" layer). For example, the display construct may comprise two binder layers. The binder layers may have a thickness of at least about 0.2 mm, 0.3 mm, 0.4 mm, 0.5 mm, 0.6 mm, 0.7 mm, 0.8 mm, 0.9 mm, or 1 mm. The binder layers may have a thickness of any value between the aforementioned values (e.g., from about 0.2 mm to about 1 mm, from about 0.2 mm to about 0.6 mm, or from about 0.7 to about 1 mm). The binder thickness may be chosen to minimize weight, e.g., while sufficiently binding the construct to form a high tolerance construct that can be machine cut (e.g., have a high die-cut machine tolerance). The binder may increase durability and/or optical characteristics of the display construct, as compared to a display construct devoid the binder. The binder may be (e.g., substantially and/or entirely) transparent (e.g., to the visible light). The binder may be uncolored. The binder may contact the (e.g., largest) surface of the display matrix and the (e.g., largest) surface of a pane (e.g., glass pane), thus binding the display matrix to the pane. The binder may minimally (e.g., not) contribute to an optically and/or visibly distort the displayed media by the display.

In some embodiments, the pane(s), binder, and display matrix are cured before deployment. The curing can be by UV light, moisture, and/or heat. The curing method may be selected to preserve the functionality of the display matrix, and minimize any optical distortion (e.g., maximize transmittance, reduce haze, and/or gas gaps such as air gaps). The binder may increase the durability of the display construct. For example, the binder can reduce the breakage susceptible of the display construct, and/or reduce its flammability. The binder may facilitate adjustment of a refractive index of a pane to ambient air (e.g., where the viewer is), e.g., to (i) minimize loss due to any Fresnel reflection, (ii) transmit all colors with minimal distortion through the display construct, and/or (iii) enhance the image projected by the display construct. The distortion of colors may be due to their passage through the binder, through the glass pane, and to the ambient air. The display construct (e.g., the binder therein) may improve preserve and/or improve an operating temperature range of the display matrix. The binder may prevent one or more gasses and/or debris (e.g., dust or sebaceous) to reach the display matrix. The display construct (e.g., binder, glass, and/or any coating) may prevent physical disturbance to the display matrix (e.g., due to contact). The contact can be direct contact by a user.

In some embodiments, the IGU and/or display construct may comprise a coating (e.g., an anti-reflective coating). The coating may improve optical performance of the glass and/or display construct. The coating may be applied on a glass pane, binder layer, display matrix, and/or electrochromic construct. The coating may be deposited in the form of an anti-reflective, anti-glare, anti-condensation, anti-scratch, anti-smudge treatment, and/or anti-UV, treatment.

In some embodiments, the display construct may comprise a seal. The seal may be disposed between two glasses of the display construct between which the display matrix is disposed. The seal may comprise a polymer/resin (e.g., any polymer/resin disclosed herein). The seal may comprise a carbon based (e.g., organic) polymer or a silicon based polymer. The seal may protect the display construct from light (e.g., UV), humidity, oxygen, physical contact (e.g., physical damage), debris, and/or other environmental components.

In some embodiments, the display construct is durable over a prolonged lifetime. The expected lifetime can be at least about 2y, 5y, 10y, 15y, 25y, 50y, 75y, or 100 (y) years. The expected lifetime can be any value between the aforementioned values (e.g., from about 5 y to about 100 y, from about 2 y to about 25 y, from about 25 y to about 50 y, or from about 50 y to about 100 y). The prolonged lifetime may be at least 20 Kh, 30 Kh, 50 Kh, 100 Kh, 500 Kh, or 1000 Kh (thousand hours). The prolonged lifetime of the display construct may have any value between the aforementioned values (e.g., from about 20 Kh to about 1000 Kh, from about 20 Kh to about 100 Kh, or from about 100 Kh to about 1000 Kh). The number of hours may refer to the number of hours in which the display construct operates, e.g., for its intended purpose. The lifetime of the display construct may depend on its operating hours and/or any environmental conditions (e.g., UV light, humidity, and/or temperature at its deployed site.

Figure 3:
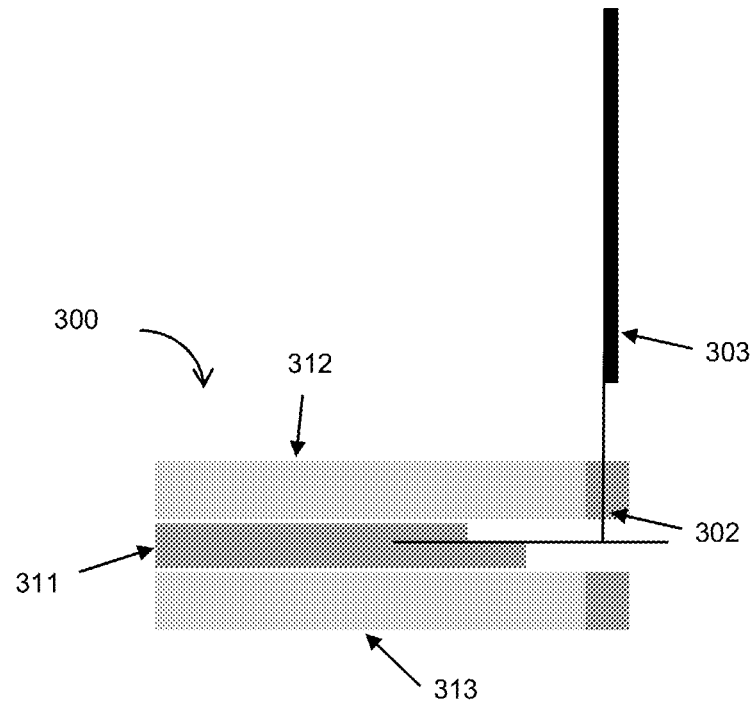
FIG. 3 schematically shows a display construct assembly.

In some embodiments, the display construct is fastened to a fixture (e.g., window frame or wall) that holds the (e.g., tintable) window, e.g., by a fastening mechanism (also referred to herein as a "fastener."). The fastener may comprise one or more components. For example, the fastener can comprise a bracket, a hinge, a cover. The fastener can be permanent or impermanent. The impermanent fastener may be removed by manual labor and/or automatically. For example, the fastener may comprise one or more screws that fasten it to the window frame. The fastener may comprise a hinge and/or bracket. The hinge may be flexible. The bracket and/or cover (or any portion thereof) may be inflexible or non-flexible. The fastener (e.g., including hinge and/or bracket) may be non-transparent. The fastener (e.g., any of its components) may comprise an elemental metal, metal alloy, an allotrope of elemental carbon, a polymer, or a composite material. At least two components of the fastener can be made of (e.g., substantially) the same type. At least two components of the fastener can be made of different material types. The elemental metal may comprise aluminum. The metal alloy may comprise steel. The fastener may comprise a non-corrosive material. At least a portion of the fastener (e.g., the bracket and/or cover) may be configured to carry the weight of the display construct, e.g., without (e.g., substantial) deformation over its intended lifetime (e.g., as disclosed herein). The display construct may weigh at least about 5 Kg, 10 Kg, 15 Kg, 20 Kg, 25 Kg, 30 Kg, 35 Kg, 40 Kg, or 50 kilograms (Kg). The display construct may weigh any weight between the aforementioned weights (e.g., from 5 Kg to 50 Kg, from 5 Kg to 25 Kg, or from 25 Kg to 50 Kg). FIG. 3 shows an example of a vertical cross section of an assembly 300 (partial view shown) in which a display matrix 311 is disposed between a first pane 312 and a second pane 313 as part of a display construct, and an L shaped bracket 302 disposed between the two glass panes 312 and 313 and coupled to the display construct, which L bracket is coupled to a hinge 303.

The fastener may be configured for easy install and/or removal of the display construct from the supporting structure (e.g., window frame and/or wall). Removal may be for servicing, replacement, and/or upgrade of any portion of the display construct and/or structure (or any associated device). For example, the fastener may allow (e.g., easy) removal and/or insertion of display construct. For example, the fastener may allow (e.g., easy) removal and/or insertion of a framing portion to which the fastener is attached. For example, the fastener may allow (e.g., easy) removal and/or insertion of a tintable window that is supported by the frame to which the fastener is attached. Easy may refer to low labor cost, low labor grade (e.g., low labor qualification), and/or short labor time. The fastener may be configured to slide and/or lock for installation onto a supporting structure (e.g., a fixture).

In some embodiments, a connecting material is disposed between the display construct and the fastener (e.g., and the bracket and/or cover). The connecting material may comprise a polymer (e.g., as disclosed herein). The connecting material may comprise a sealing gasket. The connecting material may be curable (e.g., by heat, humidity and/or UV). The connecting material may have low resistance. The connecting material may comprise at least one polymer and/or at least one resin. The connecting material may have a low electrical resistance such that it is suitable for usage as a packing material in the electronic industry (e.g., for smartphones, packaging, liquid crystal displays, and personal computers. The connecting material may comprise polyethylene terephthalate (PET), very high bond (VHB) material (e.g., 3M VHB 4926), or SR, or SRS-40P. The connective material may comprise an acrylic material. The connecting material may retain its property and shape in ambient temperatures. The tensile strength of the connecting material may be at least about 0.60 MPa, 0.63 MPa, 0.66 MPa, 0.68 MPa, or 0.70 Mega Pascal (MPa). The shear strength of the connecting material may be at least about 0.54 MPa, 0.60 MPa, 0.620 MPa, 0.64 MPa, or 0.68 MPa. The shear strength may be smaller than the tensile strength. The shear strength and/or tensile strength may be such that they will be able to facilitate holding the display construct by the fastener (or any portion of the fattener to which the display construct is connected by the connecting material (e.g., adhesive)), e.g., for the projected life time and/or use time of the display construct. The connecting material may be hard and/or flexible. The connecting material may be an adhesive. The connecting material may be softer before its curing, and harder after its curing. The connecting material may be chosen to carry at least the load (e.g., weight) of the display construct, e.g., during constant and/or varying conditions (e.g., per its intended purpose). The bracket may include a straight portion, a curved portion, and/or a corner. The bracket may be devoid of a corner. The bracket may be straight or bent. The bracket may comprise two straight portions (e.g., two arms) that form (e.g., about) an angle. The angle may be a right angle or an obtuse angle. The bracket can be "L" shaped. An arm of the bracket and/or cover may be disposed between two panes, contact the display matrix, and/or contact the binder.

In some embodiments, wires are hidden from view of a user by the fastener (e.g., or any component thereof). For example, the bracket and/or cover may hide one or more (e.g., electrical) wires connected to the display matrix, e.g., from a user. The wires may be connected to the bracket and/or cover. The bracket and/or cover may comprise a recessed portion that is configured to accommodate the wire(s). In some embodiments, the cover and the bracket are the same component (e.g., 531). The recessed portion may be hidden from view of a user (e.g., may be disposed in the back portion of the bracket and/or cover). The wire(s) may connect to the display matrix (e.g., light array or LCD). The wire(s) may connect to a controller. The controller may comprise a timing controller and/or a microcontroller. The connecting material (e.g., connectors) may be disposed along the width (e.g., along fastener structure 104) of display construct. The connecting material may be disposed along at least about 50%, 80%, or 90% of the display construct width. The fastener may comprise a curved portion. The fastener may comprise a non-curved portion.

In some embodiments, the fastener comprises a hinge. In some embodiments, the hinge includes two leaves connected by a joint that forms an axis about which the leaves are configured to move about. A first leaf of the hinge may be operatively coupled (e.g., connected) to the bracket and/or cover. A second leaf of the hinge may be operatively coupled (e.g., connected) to a fixture. The fixture may be a wall or a window frame. The hinge may facilitate movement of the display construct around the hinge axis. The joint may facilitate opening of the hinge to an acute angle, a right angle, an obtuse angle, a flat angle (e.g., e.g., 180°), or complete rotation (e.g., ~360°). Fastening the hinge to a fixture and to the display construct (e.g., via the bracket and/or cover) facilitates movement of the display construct about the axis of the hinge joint. Such movement may facilitate servicing the display construct without disturbance to the window (e.g., IGU) and/or to the fixture. Servicing may include cleaning, repairing, and/or replacing e.g., the display construct and any portion or component thereof.

Figure 37:
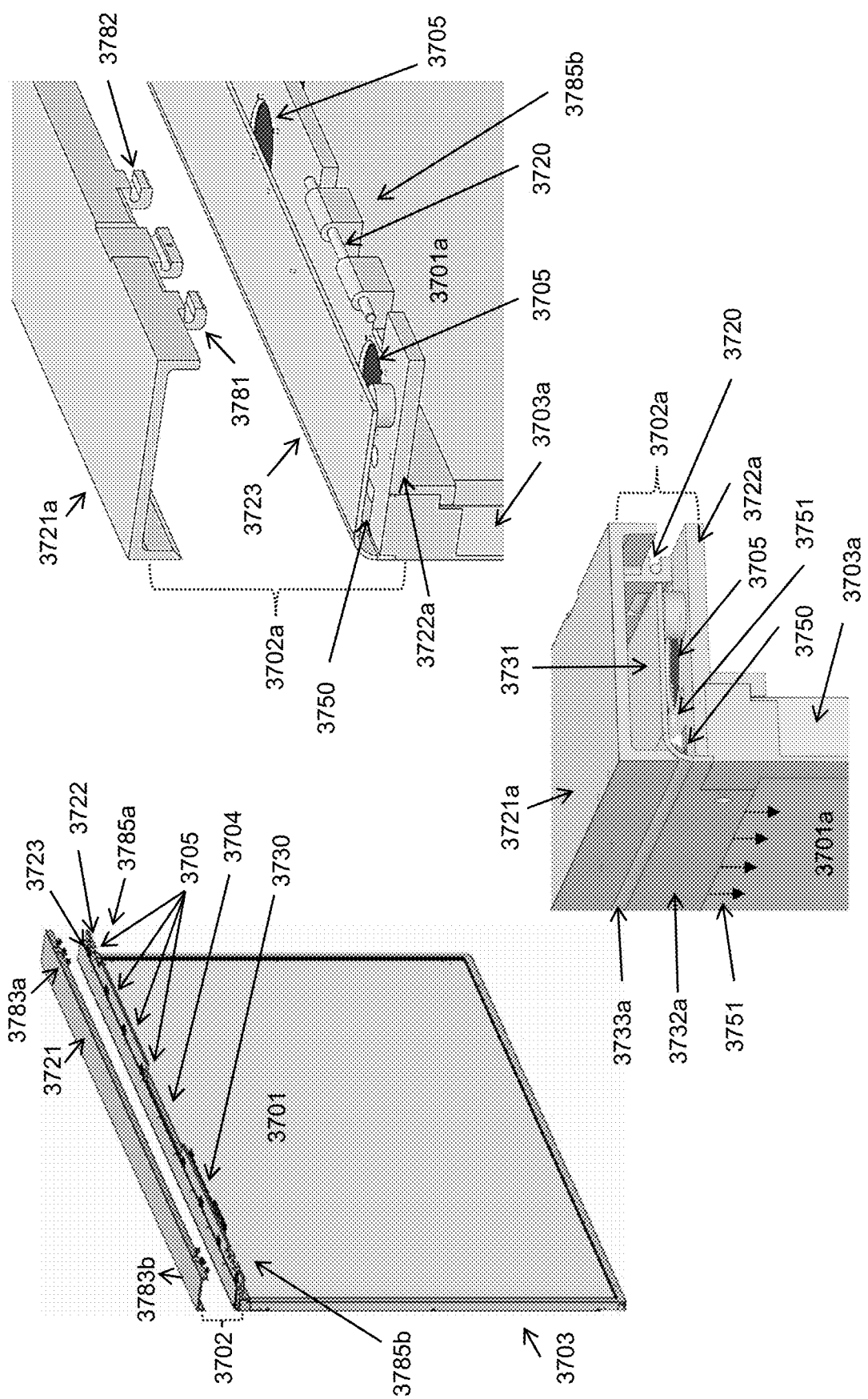
FIG. 37 schematically show various views of a display constructs and associated components (e.g., portions thereof)

In some embodiments, the fastener may comprise a plurality of components. The plurality of components may comprise a bracket, a cover, a hinge, and/or a board. The display construct may be coupled (e.g., connected) to a bracket and/or cover. The bracket and/or cover may be coupled to one leaf of the hinge. Another leaf of the hinge may be coupled to a fixture indirectly by coupling the other hinge leaf directly to a board that is directly connected to a fixture. The board may include any of the fastener material disclosed herein (e.g., elemental metal and/or metal alloy). The fastener can include a plurality of components of the same type. For example, the fastener can include a plurality of hinges, a plurality of brackets, a plurality of covers, and/or a plurality of boards. The plurality of fastener components can be at least 2, 3, 4, 5, 8, or 10 components (e.g., of the same type or of different types). The hinge may comprise hinge component set (e.g., knuckles and pintle). The fastener may comprise a plurality of hinge component sets. The hinge component sets may be aligned to have a single hinge axis. The fastener may be formed of two swiveling leaves about an axis of the hinge complement sets. AT least one (e.g., each) of the leaves may comprise a single slab incorporating half of the plurality of hinge components (e.g., knuckles)), such that when the two leaves are integrated, a plurality of functional hinge components sets are created (e.g., as shown in the example of FIG. 37). In some embodiments, two leaves having respective hinge components to form a plurality of operational hinge components, wherein each of the two leaves is formed of a single slap of material, form a fastener that is stronger and/or more durable as compared to coupling the display construct to a plurality of separate fasteners each having a single hinge set. In some embodiments, two leaves having respective hinge components to form a plurality of operational hinge component, wherein each of the two leaves is formed of a single slab of material, form a fastener that is easier to install, maintain, and/or replace as compared to coupling the display construct to a plurality of separate fasteners each having a single hinge set. In some embodiments, two leaves having respective hinge components to form a plurality of operational hinge component, wherein each of the two leaves is formed of a single slab, facilitate more accurate alignment of the display construct as compared to coupling the display construct to a plurality of separate fasteners each having a single hinge set. Such a single fastener offers additional advantages such as incorporating heat exchangers (e.g., fan), directing the heat exchange (e.g., within the fastener and/or along the display construct), and/or coupling one or more circuit boards to the fastener.

Figure 4:
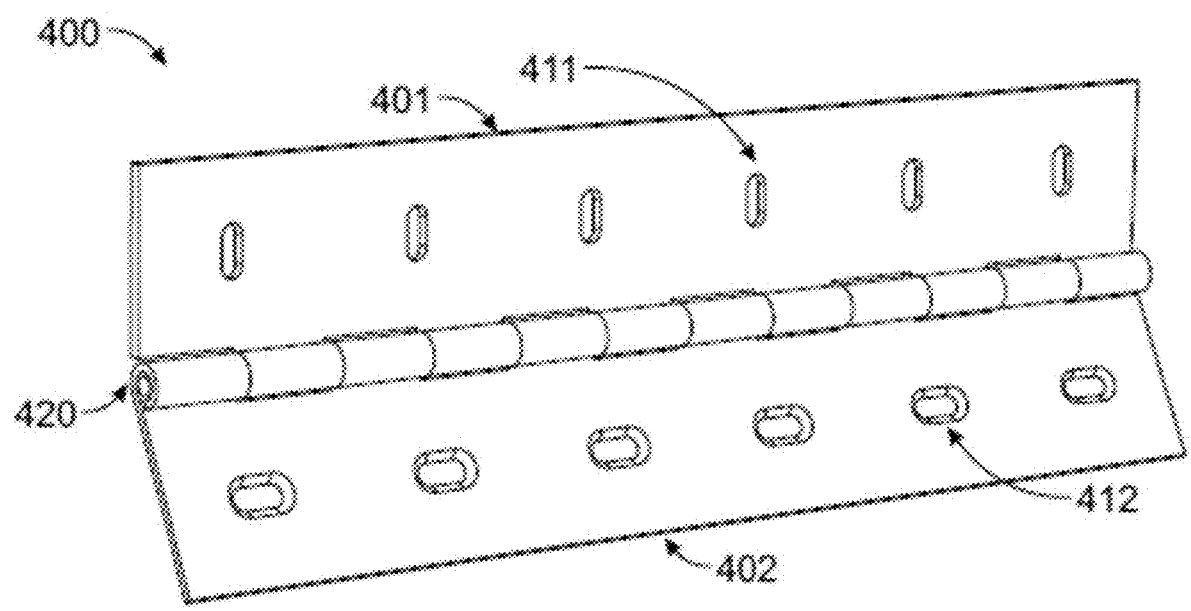
FIG. 4 schematically shows a hinge.

In some embodiments, at least one leaf of the hinge comprises one or more holes. At least one hole of the one or more holes is configured to allow a screw to pass through and connect (e.g., reversibly) the hinge to the fixture (e.g., window frame) and/or bracket. The connection of the fastener (or any component thereof) to the display construct and/or fixture (e.g., window frame) may be (I) irreversible (e.g., using the connecting material) or (II) reversible (e.g., using one or more screws). The fixture and/or board may use both irreversible and reversible connection between itself and the display construct. For example, the hinge may be connected reversibly to the window frame and irreversibly to the bracket. For example, the hinge may be connected reversibly to the bracket and irreversibly to the window frame. For example, the hinge may be connected reversibly to the window frame and reversibly to the bracket, which will be connected irreversibly (e.g., glued) to the display construct. For example, the hinge may be connected reversibly to the wall and reversibly to the cover, which will be connected irreversibly (e.g., glued) to the display construct. For example, the hinge may be connected reversibly to the board and reversibly to the cover, which will be connected irreversibly (e.g., glued) to the display construct. The board may be coupled reversibly (e.g., via screw(s)) or irreversibly (e.g., via binder (e.g., glue)) to the fixture. FIG. 4 shows a schematic example of a hinge 400 having a first leaf 401 having a plurality of holes (e.g., 411) that allow movement of a screw in one direction; and a second leaf 402 having a plurality of holes that allow movement of a screw in a second direction, which first direction may be perpendicular to the second direction. The hinge shown in FIG. 4 has a joint 420 that facilitates rotation of the first leaf with respect to the second leaf. In some embodiments, the first leaf has hole(s) having a long axis in a first direction, and the second leaf has hole(s) having a long axis in a second direction, which first direction forms an angle with the second direction that is non-zero (e.g., the first direction can be perpendicular to the second direction). Which relative direction of the long axis can be measured when the hinge is closed, and the two leaves lie one on top of the other. In some embodiments, the bracket may be an extension of a leaf of the hinge. In some embodiments, the bracket may be coupled (e.g., fastened) to the leaf of the hinge, e.g., reversibly (e.g., via crew(s)) or irreversibly (e.g., via adhesive). In some embodiments, the cover may be an extension of a leaf of the hinge. In some embodiments, the cover may be coupled (e.g., fastened) to the leaf of the hinge, e.g., reversibly (e.g., via crew(s)) or irreversibly (e.g., via adhesive).

In some embodiments, electrical circuitry is communicatively coupled to the display construct. The electrical circuitry may (i) boost the signal transmitted to the display matrix, and/or (ii) transmit power arriving from a power supply to the display matrix. In some embodiments, the circuitry may comprise touch screen circuitry. In some embodiments, the touch screen circuitry may be separate (e.g., and be disposed in a touch screen sensor cover). In some embodiments, the circuitry may connect touch screen sensor(s) to the power supply. In some embodiments, the touch screen circuitry may have a separate connector to the power supply.

Figure 5:
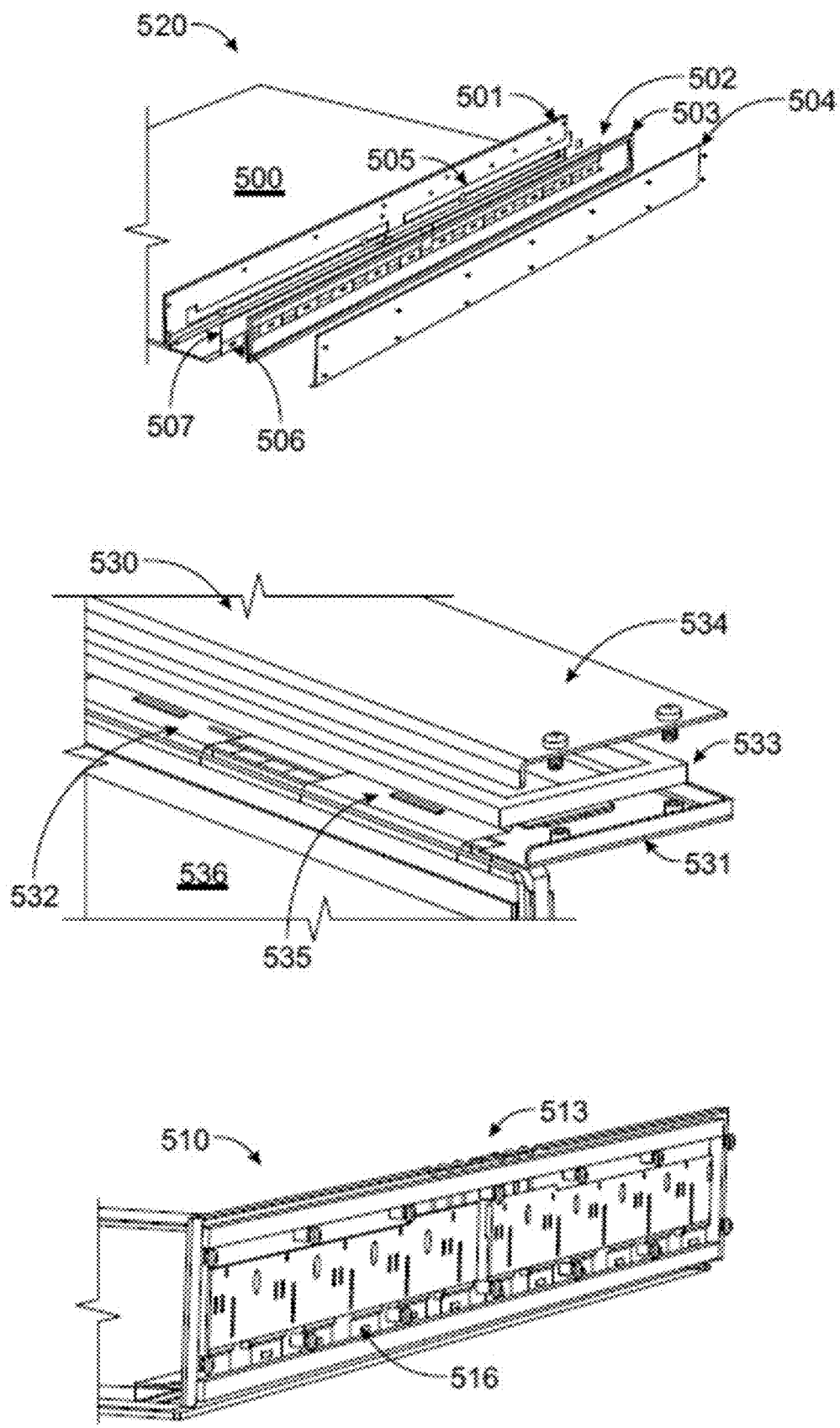
FIG. 5 schematically shows various fasteners and display construct assemblies.

FIG. 5 shows an example of an assembly 520 in which a display construct 500 (partial view shown) connected to a fastener that includes an L bracket that is the first cover portion 501, a thermal pad 505, flexible electrical connectors such as 506 (MXC) connector, a circuitry 502 (e.g., a booster board), a flexible insulator 503 and a second cover portion 504; and 510 shows a schematic bottom view of the circuitry board with screws and connectivity, which circuitry board is attached to a cover. The assembly 520 is shown from a different perspective in 530, indicating the display construct 536, flexible wiring (e.g., MXC) 535, a first portion of the cover 531 (partial view shown) that is a bracket, gasket (e.g., flexible insulator) 533 (partial view shown), circuitry 532 (partial view shown), and a second portion of the cover 534 (partial view shown). The flexible insulator can be a foam gasket (e.g., poron). The flexible insulator can have a least 25% compression. The bracket can have one or more thermal pads disposed on it. Referring to FIG. 5, in one embodiment, L-bracket 501 is seen to extend across a linear dimension of a transparent display (and affixed to cover glass 500), which L bracket 501 is the first cover. In one embodiment, the length of bracket 501 may be up to about 10 feet. The circuitry (e.g., signal booster) may be connected to the display matrix by one or more flexible wiring (e.g., MXC). At times a plurality of circuitry boards (e.g., at least 2, 3, or 4 boards) may be disposed in the fastener (e.g., between the first and second cover). FIG. 5 shown an example of two circuit boards 502 and 507. One or more (e.g., flexible) connectors may connect the circuitry board to the flexible display matrix. The number of flexible connectors (e.g., MXCs) may be at least 2, 5, 6, 8, or 10. FIG. 5 shows examples of flexible connectors 516, 535, and 506. One or more (micro) cable bundles and/or (e.g., micro) coaxial cables may couple (i) the circuitry (e.g., booster) disposed in the fastener with (ii) the controller (e.g., timing controller). One or more (micro) cable bundles and/or (e.g., micro) coaxial cables may be connected by a connector to the circuit board (e.g., the booster board). The number of electrical connectors (e.g., connector 630 (partial view shown), e.g., IPLEX connectors) between the circuit board and the controller may be at least 1, 2, 3, 4, or 5. FIG. 5 shows an example of the electrical cable 513 connecting the board (e.g., driver board) and the controller (e.g., timing controller). One or more fine wiring bundles may connect the controller (e.g., T-CON) to a booster board that is connected to flexible connectors (e.g., MXC cable) to the display matrix (e.g., TOLED). The fosterer may be configured to secure, house, and/or hide the cables and/or wiring from being viewed by a viewer of the display construct.

Figure 10:
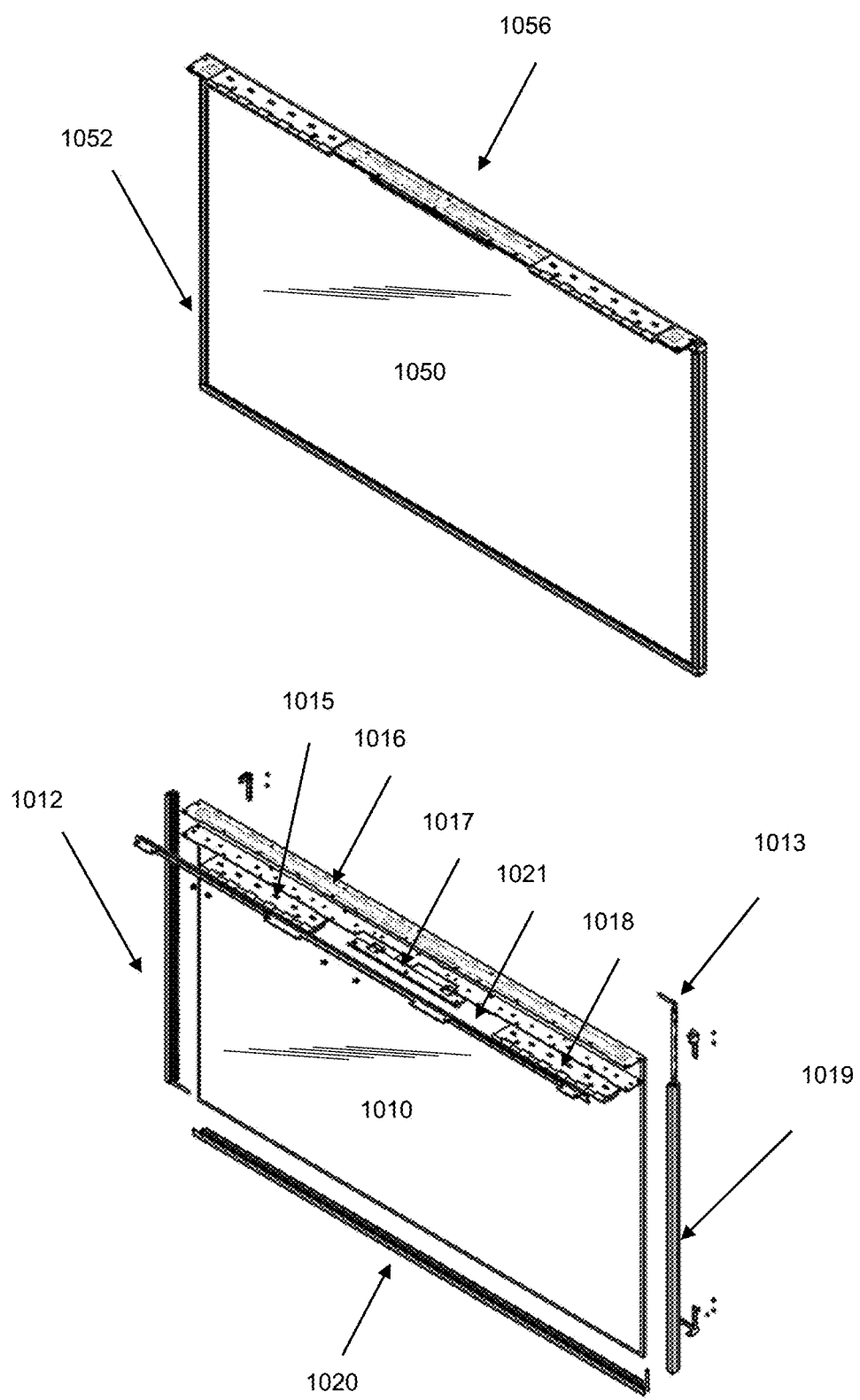
FIG. 10 schematically shows various fastener options and display construct assemblies.

The electrical circuitry (e.g., and any connecting cables thereof) may be at least partially masked from view of a user by the fastener (or any component thereof, e.g., by the hinge and/or by the board). The electrical circuitry (e.g., and any connecting cables thereof) may be at least partially secured from contact by a user. The bracket, cover, board, and/or hinge may have an openable portion. The openable portion may swivel around an axis (e.g., the openable portion may swivel around a secondary hinge to facilitate it's swiveling). The Fastener may have one or more of its component types (e.g., one or more brackets, one or more covers, one or more boards, one or more primary hinges, and/or one or more secondary hinges). One or more components of the fastener can span a FLS of the display construct and/or viewing window, or a portion thereof. The openable and/or removable portion may facilitate servicing the electrical circuitry (e.g., and any connecting cables thereof), e.g., without disassembling the fastener from the supporting structure to which it is coupled and/or from the display construct. Usage of the opening (coupled with the secondary hinge or without any secondary hinge) may facilitate (e.g., reversible) detachment of the connective cabling between (i) the E-box and/or power supply box and (ii) the circuitry attached to the display construct (e.g., display construct and/or touch screen related circuitry). Such (e.g., reversible) cabling attachment and detachment may allow replacement and/or servicing of the E-box and/or of the power supply, without disassembling the fastener from the supportive structure and/or from the display construct. Such (e.g., reversible) cabling attachment and detachment may allow replacement and/or servicing of the display construct and/or fastener, without disassembling the E-box and/or power supply unit. Such (e.g., reversible) cabling attachment and detachment may allow separation (e.g., disconnection) between (I) the display construct-fastener assembly, and (II) the E-box and/or power supply unit. The display construct-fastener assembly may optionally comprise touch screen facilitator (e.g., sensor and emitter panels). For example, the openable and/or removable portion (e.g., a secondary hinge) may facilitate servicing a booster board or any cables and/or connectors connected thereto. Servicing may include removing, repairing, replacing, and/or cleaning. For example, the board may have a secondary opening that facilitates exposing at least a portion of the controller and/or wiring. FIG. 10 shows an example of a secondary opening including portions 1017 and 1021 as part of the fastening system. A cushion may be disposed between the openable and/or removable portion and the electrical circuitry (e.g., and any connecting cables thereof). The cushion can protect the electrical circuitry (e.g., and any connecting cables thereof) and/or prevent its movement. Protection can be from light, temperature (e.g., heat or cold), contact, humidity, and/or oxygen. The cushion may comprise a polymeric foam (e.g., polyurethane). The cushion may comprise a foam gasket. This cushion may aid in maintaining a (e.g., reasonable) bending radius on the wire(s). The wiring may comprise microflex-complete (MXC) cable(s), e.g., to connect the circuitry to the controller (e.g., timing controller) and/or power source. The wiring may be coupled to the circuitry via one or more connectors (e.g., IPEX or micro connectors). The micro connectors may connect the circuitry (e.g., disposed in the fastener) to the display matrix. The circuitry may comprise a booster board. Micro connectors can have a plurality of wires, e.g., bonded in an envelope. The wiring may comprise coaxial cable(s).

In some embodiments, the fastener may comprise a regression forming an opening. The regression may be a secondary opening. The regression may be centered about the middle length of the fastener. The regression may or may not be covered. The covering of the regression may or may not be reversible. For example, the covering may be a secondary hinge leaf. The covering may be bolted to the fastener with screw(s) and/or clips. The fastener may comprise two hinge leaves that are coupled with knuckles and pintle mechanism to form a hinge. The regression may be covered when the fastener is in its closed hinge position. The regression may be (reversibly) covered when the (primary) fastener hinge(s) is in its closed position. The regression may be (reversibly) opened when the (primary) fastener hinge(s) is in its open position. FIG. 10 shows a cover 17017 that covers an opening in fastener 1021. The width of the regression (e.g., see FIG. 41, broken arrow $W_{opening}$) may extend to at most about 95%, 90%, 80%, 70%, 60%, 50%, 40%, or 30% of the hinge leaf width (e.g., see FIG. 41, broken arrow $W_{total}$). The regression may be from an edge from the hinge leaf towards its internal portion. The regression may be an opening withing the hinge leaf (e.g., a window within the hinge leaf), e.g., having the above references extension as its width. The length of the opening (e.g., regression. E.g., see FIG. 41, broken arrow $L_{opening}$) may extend to at most about 60%, 50%, 40%, 30%, 20%, or 10% of the total length of the hinge leaf (e.g., see FIG. 41, broken arrow $L_{total}$). The regression may extend to a width and/or length that may facilitate connecting and/or disconnecting any connectors that couple a circuit board to the display construct and/or touch screen related apparatus (e.g., sensor and emitter panel). The opening (e.g., regression) may or may not be centered about a length and/or a width of the fastener (or any hinge leaf thereof).

In some embodiments, the controller may comprise a timing controller (abbreviated herein as "T-CON"). The timing controller may control operation timing of various components of the display matrix (e.g., when a LED is lit up in the display matrix). The timing controller can translate between a video signal and a row and a column driver signaling required by the display matrix. The media signal may be transmitted to the T-CON board over a communication interface such as Low-voltage differential signaling (LVDS), Embedded DisplayPort (eDP), Mobile Industry Processor Interface (MIPI®), Display Serial Interface (DSI), or VX1. The circuitry (e.g., chip therein and/or controller) may comprise a 60 Hz to 120 Hz frame rate converters. The timing controller may refresh a charge to minimize optical response decay of the LCD chemical(s) responding to electrical charge, e.g., at a rate to keep the signal uniform, avoid decay, and/or adequate update. The controller (e.g., T-CON) may be disposed at a distance from the display construct assembly that includes the display construct and the fastening system (e.g., fastener).

Figure 6:
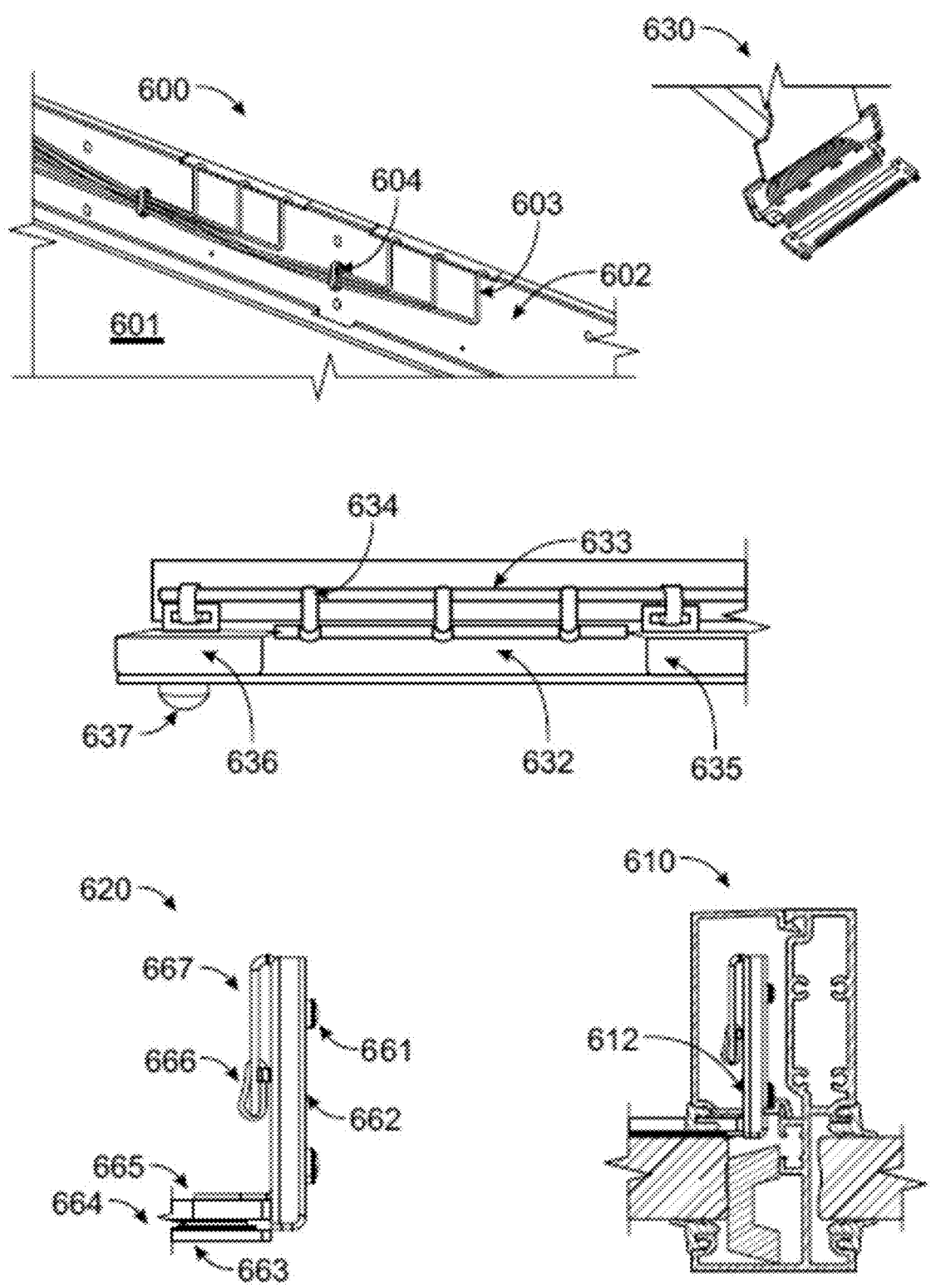
FIG. 6 schematically various fasteners, display construct assemblies, and wiring.

In some embodiments, the display construct is operatively coupled (e.g., connected by wiring) to a power supply. The circuitry is operatively coupled (e.g., connected by wiring) to a power supply. The connection may be direct or indirect. The indirect connection may be through the circuitry (e.g., booster). The power supply may be a secondary power supply. The power supply may be coupled to the municipal power source (e.g., power plant), and/or building power source (e.g., generator, solar cell(s), and/or wind turbine). Power source may be renewable and/or non-renewable. The power source may be coupled to the BMS. The power source may be coupled to a network infrastructure (e.g., as disclosed herein). The power source may supply power at about 240V or 120V (e.g., house current) AC. The secondary power source may comprise a converter reducing the voltage (e.g., to at most about 24V, 48V, or 54 Volts (V)). FIG. 6 shows an example of a perspective view of an assembly 600 including a display construct coupled to a fastener and a circuitry in which a fastener 602 (partial view shown) is coupled to a display construct 601 (partial view shown) that is connected through wiring 603 (partial view shown) to a circuitry (not shown) disposed in the fastener, which wiring is secured by hooks such as hook 604. The hook can be a tie mount. FIG. 6 shows a perspective view of a hinge leaf 634 to onto which wiring 633 are connected to, which wiring are connected to a circuitry 632, which hinge leaf 634 is joined with hinge leaf portion 635 (partial view shown) and hinge leaf 636 portion that is connected by a screw 637 to a fixture (not shown). Hinge leaf portions 635 and 636 are part of the same hinge leaf. FIG. 6 shows a side view example of an assembly 620 including a fastener 662 coupled with screws, e.g., 661, to a fixture (not shown), which fixture has dangling wiring 667 emerging from its body and fastened to a hook 666. The wiring 667 is connected (i) to a circuitry (not shown) disposed in the fastener body 662 and to (ii) a display construct (partial view shown) that includes a display matrix 664 that is disposed between a thicker glass 665 and a thinner glass 663. FIG. 6 shows a side view example of an assembly 612 (similar to 620) disposed in a vertical cross section of a window frame 610. FIG. 6 shows an example of electrical wiring 630 that can be utilized in the display construct assembly. The fastener may comprise a driver and/or booster board. The circuitry may facilitate data (e.g., network communication) and/or power transmission.

The secondary power source may supply a direct current (DC) voltage. The secondary power source may be disposed adjacent to the display construct and/or IGU. The secondary power source can be disposed in the window frame, in a wall, in a floor, or in a ceiling. The controller of the display construct can be disposed separately from its power supply. The shortest distance from (i) the display construct, booster board, driver board, and/or timing controller (e.g., T-CON) to (ii) the power supply can be at least about 0.25m, 0.5m, 1m, 1.5m, 2m, 2.5m, 3m, 3.5m, 4m, 4.5m, 5m, 5.5m, 6m, 6.5m, 7m, 8m, 10m, or 20 meters (m). The shortest distance from (i) the display construct, booster board, driver board, and/or timing controller to (ii) the power supply can be of any value between the aforementioned values (e.g., from about 0.25 to about 20m, from about 0.25m to about 5m, from about 5m to about 7m, or from about 7m to about 20m). For example, the shortest distance from (i) the driver and/or booster board to (ii) the power supply and/or T-CON can be at least about 1.5m, 2m, 2.5m, 3m, 3.5m, 4m, 4.5m, 5m, 5.5m, 6m, 6.5m, 7m, 8m, or 10m. The shortest distance from (i) the driver and/or booster board to (ii) the power supply and/or T-CON can be of any value between the aforementioned values (e.g., from about 1.5 to about 10m, from about 1.5 m to about 5m, or from about 5m to about 10m). The shortest distance from (i) the display construct and/or booster board to (ii) the power supply and/or T-CON can be of any value between the aforementioned values (e.g., from about 5' to about 30', from about 10' to about 25', or from about 15' to about 20'). For example, the shortest distance from (i) the driver board and/or display construct to (ii) the power supply and/or T-CON can be at least about 5', 10', 15', 20', 25', 25', 30', 50', 100', 200', or 300' (feet). The shortest distance from (i) the display construct, and/or booster board to (ii) the power supply and/or timing controller can be of any value between the aforementioned values (e.g., from about 5' to about 300', from about 10' to about 25', from about 15' to about 20', from about 20' to about 50', from about 50' to about 200', or from about 100' to about 300').

In some embodiments, a local controller may control the viewing (e.g., tintable) window (e.g., as part of the IGU) and/or the display construct. The local controller may be part of a control network. The control network may be a hierarchal control network (e.g., as disclosed herein). The hierarchy of the controllers in the control network may be static or dynamic. The local controller may be disposed adjacent to the display construct and/or IGU. The local controller can be disposed in the window frame, in a wall, in a floor, or in a ceiling. In some embodiments, one local controller controls the viewing (e.g., tintable) window and the display construct (e.g., the media displayed by the display construct). In some embodiments, separate controllers control the viewing (e.g., tintable) window and the display construct (e.g., the media displayed by the display construct). Communication between the local controller and other components of the network interface may be wired and/or wireless. The wired communication may include coaxial cable, twisted pair, NM cable, Underground Feeder (UF) cable, Thermoplastic High Heat-resistant Nylon-coated (THHN) wire, Thermoplastic Heat and Water-resistant Nylon-coated (THWN) wire, standard phone wire, or category 3 (Cat 3) cable, and/or category 5 (Cat 5) cable. The control system (e.g., the local controller) may be communicatively coupled to the display construct (e.g., via the timing controller (T-CON)) by wired and/or wireless communication. For example, the display construct may be connected to the local controller via one or more wires and/or wirelessly. For example, the T-CON may be connected to the local controller via one or more wires. The shortest distance from (i) the display construct and/or T-CON to (ii) the local controller can be at least about 0.25m, 0.5m, 1m, 1.5m, 2m, 2.5m, 3m, 3.5m, 4m, 4.5m, 5m, 5.5m, 6m, 6.5m, 7m, 8m, 10 meters (m). The shortest distance from (i) the display construct and/or T-CON to (ii) the local controller can be of any value between the aforementioned values (e.g., from about 0.25 to about 10m, from about 0.25m to about 5m, from about 5m to about 7m, or from about 7m to about 10m). The distance may correspond to a minimal measure of the wire length (e.g., when the display construct is communicatively coupled to the local controller at least in part via wiring). The shortest distance (I) between the display construct and the local controller, and (II) between the local controller to the power supply, may be (e.g., substantially) equal. The shortest distance (I) between the display construct and the local controller, and (II) between the local controller to the power supply, may be (e.g., substantially) unequal. The shortest distance (I) between the timing controller and the local controller, and (II) between the local controller to the power supply, may be (e.g., substantially) equal. For example, the shortest distance (I) between the timing controller and the local controller, may be smaller than (II) between the local controller to the power supply. For example, the shortest distance (I) between the timing controller and the local controller, may be longer than (II) between the local controller to the power supply. The shortest distance (I) between the timing controller and the local controller, and (II) between the local controller to the power supply, may be (e.g., substantially) unequal. For example, the shortest distance (I) between the timing controller and the local controller, may be smaller than (II) between the local controller to the power supply. For example, the shortest distance (I) between the timing controller and the local controller, may be larger than (II) between the local controller to the power supply.

FIG. 7 shows an example of a vertical cross section of a display construct portions coupled to a circuitry and to a fastener, that includes: an L-bracket 701 is depicted in cross section, a circuitry 702 (e.g., a booster board), cable(s) 703, foam gasket 704, screw 705, tape 706, first glass pane 707, adhesive (e.g., OCA) 708, display matrix 709, second glass pane 710, cover 714, bumper 712, an adhesive 713, and 711 the viewing window (partial view shown). The display construct may comprise a flexible bumper (e.g., polymer or resin) that separates it from the window (e.g., 711). The bumper may prevent glass to glass contact between the display construct and the window (e.g., tintable window), which may lead to damage of the display construct and/or window (e.g., prevent cracks and/or breakage). The bumper may increase the safe operation of swiveling the display construct, e.g., about the hinge axis. In one embodiment in a cross-section, the L bracket is defined by one or more right angle, though the angle could be other than 90 degrees. In the embodiment depicted, L-bracket is affixed to a cover glass (e.g., 707) via an adhesive element. In embodiments, the adhesive element is an adhesive tape. In one embodiment, the adhesive tape comprises a VHB type tape. In one embodiment, the adhesive element is a liquid or gel adhesive that bonds the L-bracket to the cover glass. Cover glass (e.g., 707) may be plastic, glass or other transparent material. The thickness of the cover glass in one example can be about 4 mm, but it could be thicker or thinner than 4 mm. The cover glass may be part of the display construct (e.g., transparent display) and/or the display construct (e.g., transparent display) element may be laminated to the cover glass. In the example shown in FIG. 7, a second cover glass 710 is laminated to a transparent display element 709, that is, transparent display element 709 (e.g., a T OLED) is sandwiched between cover glass 707 and second cover glass 710. The laminate structure formed may rest against the viewing window (e.g., 711) or be parallel to but spaced apart from the viewing window. The laminate structure comprising the first glass pane 707, the display matrix 709 and the second glass pane 710 (e.g., second glass cover) may be considered a transparent display assembly (also termed herein "display construct").

In one embodiment, the adhesive element is of sufficient strength to support a weight of a transparent display assembly. As depicted, one face of L-bracket (e.g., 701) is used as a surface for the adhesive element and at least this much surface area is attached to the transparent display assembly, via the cover glass (e.g., 707).

As depicted in the example shown in FIG. 7, a cover 714 is attached to L-bracket 701. In this example, L-bracket 701 includes an overhang portion on the vertical leg. Together with cover 714, a chamber is formed, within which a circuitry 702 for the display matrix is housed. Circuitry 702 may be in the form of a circuit board (e.g., a driver and/or booster board). In one embodiment the cover seals the electronics from the environment via one or more gaskets. In one embodiment, the L-bracket 701 is configured to provide movement and/or physical connectivity between a frame of a window and the display construct (e.g., see FIG. 1A). In one embodiment, circuitry 702 is coupled to a display matrix via one or more conductors, e.g., ribbon cable, flex circuit and/or other wired connections 175. In certain embodiments, wired connections 175 (refer to FIG. 2b) may be micro-coaxial cable (e.g., see 802, FIG. 8). In embodiments, wired connections 802 may terminate at the L-bracket with multipin connectors (see FIG. 8, 803).

In some embodiments, the display construct comprises a touch screen. The display construct may comprise at its edges one or more optical sensors to facilitate functionality of the touch screen by user(s). The touch screen can receive contact (e.g., touch) input from user(s) and deliver an output response. The response can be functional the response can include a change in visual, data, or sound. The touch screen can utilize the display matrix. The display construct can be operatively coupled to an information processing system (e.g., comprising one or more processors, and/or network interface). User(s) can the information processing system through simple (e.g., single) or multi-touch gestures by touching the display construct pane facing the user(s). Touch can be using a specialized device (e.g., stylus or electronic pen) or one or any portion of their body (e.g., more fingers). The specialized device may be adapted to the display construct. The touchscreen can be a resistive touchscreen, surface acoustic wave touchscreen (e.g., using ultrasonic waves), capacitive touchscreen, infrared grid touchscreen (e.g., using photodetectors), optical imaging (e.g., using CMOS sensors), infrared acrylic projection (e.g., comprising infrared LEDs), dispersive signal touchscreen, or acoustic pulse recognition touchscreen. The display construct is enhanced per requirements of the touch screen technology. For example, when sensors (e.g., COMS) and/or projectors (e.g., LEDs) are required for the touch screen, those are added to the display construct, e.g., by placing them inside a frame surrounding at least a portion of the display construct.

In some embodiments, the display construct can act as a touch screen. A frame may comprise one or more sensors disposed on or in the frame. The frame may include a circuitry, one or more connectors (e.g., to power supply and/or network system), and any optical component (e.g., reflector, mirror, prism, beam splitter, and/or lens). The sensors may be configured to detect a presence and position of a user's finger, stylus, marker, smart pen, and/or other marking and/or indicating device within an area bounded by the frame shape (e.g., an area spanned by a surface of a transparent display assembly). Sensors may be disposed along and/or within lengths of one or more frame portions (e.g., within a channel defined by one or more frame portion). One or more frame portions may comprise sensors, circuits, and/or connections. The one or more frame portions may include at least 1, 2, 3, or 4 frame portions (e.g., 1012, 1019, and 1020). The frame portion may be a bezel. The frame portion may comprise a groove. The frame portion may be configured to hold the display construct. The width of the frame portion groove may be configured to accommodate the width of the display construct. In some embodiments, all edges (e.g., sides) of the display construct may comprise touch screen frames. Circuits may process signals from sensors and output signals representative of a location of a marking or indicating device within an area bounded by a frame. A frame may comprise connections to other circuits, including circuits disposed on, or coupled to, the transparent display assembly (e.g., circuits on L-bracket). Circuits may comprise but are not limited to, one or more of: processor, memory, display, analog and/or digital circuits.

A frame may provide a transparent display assembly with interactive display functionality (e.g., white board functionality). A fixed or moving location of a user's finger or indicating device against a transparent display may be sensed by sensors of a frame within an area bounded by the frame, and signals representative of the location may be generated by circuits of the frame. Signals representative of a location within an area bounded by a frame may comprise signals compatible with display technology of a display. In some embodiments, signals representative of a location within an area bounded by a frame comprise, but are not limited to, universal serial (USB, e.g., USB 2.0) and/or content management system (CMS) signals (that provides, e.g., high definition multimedia interface (HDMI) signals or Display Port (DP) signals). Signals representative of a fixed or moving location of a user's finger or indicating device within an area of a frame may be processed by software and/or circuits associated with the frame and/or transparent frame assembly. The processed signals may be displayed on a transparent display assembly, e.g., in the form of a representation of the fixed or moving location (e.g., as writing, printing, a shape). Software associated with the frame and/or transparent display may be configured to provide other functionality, including, but not limited to, (i) display of a sensed location of a user's finger, or other indicating device, on another display or device, (ii) interaction with the transparent display and frame by more than one user, (iii) export of displayed content, (iv) import of display content, (v) erase of displayed content, and/or (vi) selection of display colors. In one embodiment, a frame may comprise one or more commercially available touch screens (e.g., from FlatFrog USA Inc. 333 West San Carlos Street, San Jose CA 95110).

FIG. 10 shows an example of a display construct 1010, components of a fastener that includes leaf 1021, primary hinges 1018 and 1015 that allow swiveling of the display construct about their axis, secondary hinge (including portion 1017) that facilitates exposure of a portion of circuitry 1016 (e.g., of a booster board and/or driver board). Leaf 1021 has an opening that facilitates accessing the circuitry 1016 through the opening covered by hinge leaf 1017. Display construct 1010 is framed by touch screen sensor and emitter array 1013 and protective covers 1012 and 1019 that cover the sensor and emitter array in a protective framing. Display construct 1050 shows a touch screen sensor and emitter array covered and assembled 1052 with the display construct 1050, and well as an assembled fastener 1056. In some examples, the secondary hinge (e.g., 1017) is absent (e.g., as in example 3504). In some embodiments, the fastener (including the primary hinge) has an opening through which at least a portion of the circuitry (e.g., PCB) is viewable and/or accessible. For example, at least some of the connectors in the circuitry can be viewable and/or accessible through the opening. For example, at least some of the connectors between the circuitry and the display construct can be viewable and/or accessible through the opening (e.g., see FIG. 35 opening 3504 allowing viewing of connectors 3509 attached to circuitry 3530 (e.g., comprising the booster and/or driver board)).

In one embodiment, a fastener comprises one or more portion that is configured to provide physical connectivity of the transparent display to a window (e.g., a hinge). In one embodiment, one or more portion of a fastener is configured to provide movement between the transparent display and a lite of a window (e.g., using a hinge of the fastener).

With reference to FIG. 4, in one embodiment, L-bracket comprises one or hinges, e.g., hinge 400. In one embodiment, the hinge comprises a plurality of elongated holes or slots. In one embodiment, an axis of elongation of at least one of the plurality of holes is orthogonal to an axis of elongation of at least one other of the plurality of holes. This allows for a method of installation of the transparent display assembly to the window frame. For example, one or more hinges (e.g., 400) are mounted to the window frame via holes that provide a distance at which the transparent display assembly will be from the window (e.g., 711). Prior to its mounting, L-bracket (e.g., 701), pre-mounted to the transparent display assembly, can be affixed to the other leg of the one or more hinges (e.g., 400), which provides, via the other plurality of holes, orthogonal to those on the other leg of the hinge, centering the L-bracket/transparent display element within the viewable area of the window, between the framing elements.

With reference to FIG. 7, in one embodiment, one or more hinges having a joint 750 that connects a first hinge leaf 752 and a second hinge leaf 753 shown in a closed position 791. The open position is shown in 720, in which the dotted arrow 790 indicated the relative movement of the first hinge leaf can be termed herein as "first leg," and the second hinge leaf may be termed herein as a "second leg." The first leg can be coupled to or comprises the bracket. The fastener comprising the hinge leaves 752 and 753 is coupled to a display construct 754 (partial view shown), and to a window 751 (partial view shown). The second leg can be coupled to a window frame 755. In one embodiment, one or hinges are configured to enable movement of a transparent display assembly away or toward the viewing window. In one embodiment the movement is rotational about a longitudinal axis, e.g., a pivot. In one embodiment, during a movement of a transparent display relative to a viewing window, no movement of the transparent display assembly occurs relative to circuitry 757 (e.g., booster and/or driver board), conductors 758 such as a ribbon cable and/or other wiring elements used to couple the transparent display to the circuitry. FIG. 7 shows an example of a display construct 784 (partial view shown) coupled to a first hinge leaf 782. The hinge leaf 782 is joined by joint 780 to the second hinge leaf 783 that is coupled to cover 785 that is coupled to a window frame for window 781 (partial view shown).

This configuration provides for longer life to the electrical connections between the display and the controller (e.g., T-CON), because the connections are not subject to the movement and friction associated with movement of the transparent display and fastener (e.g., bracket) assembly.

Figure 8:
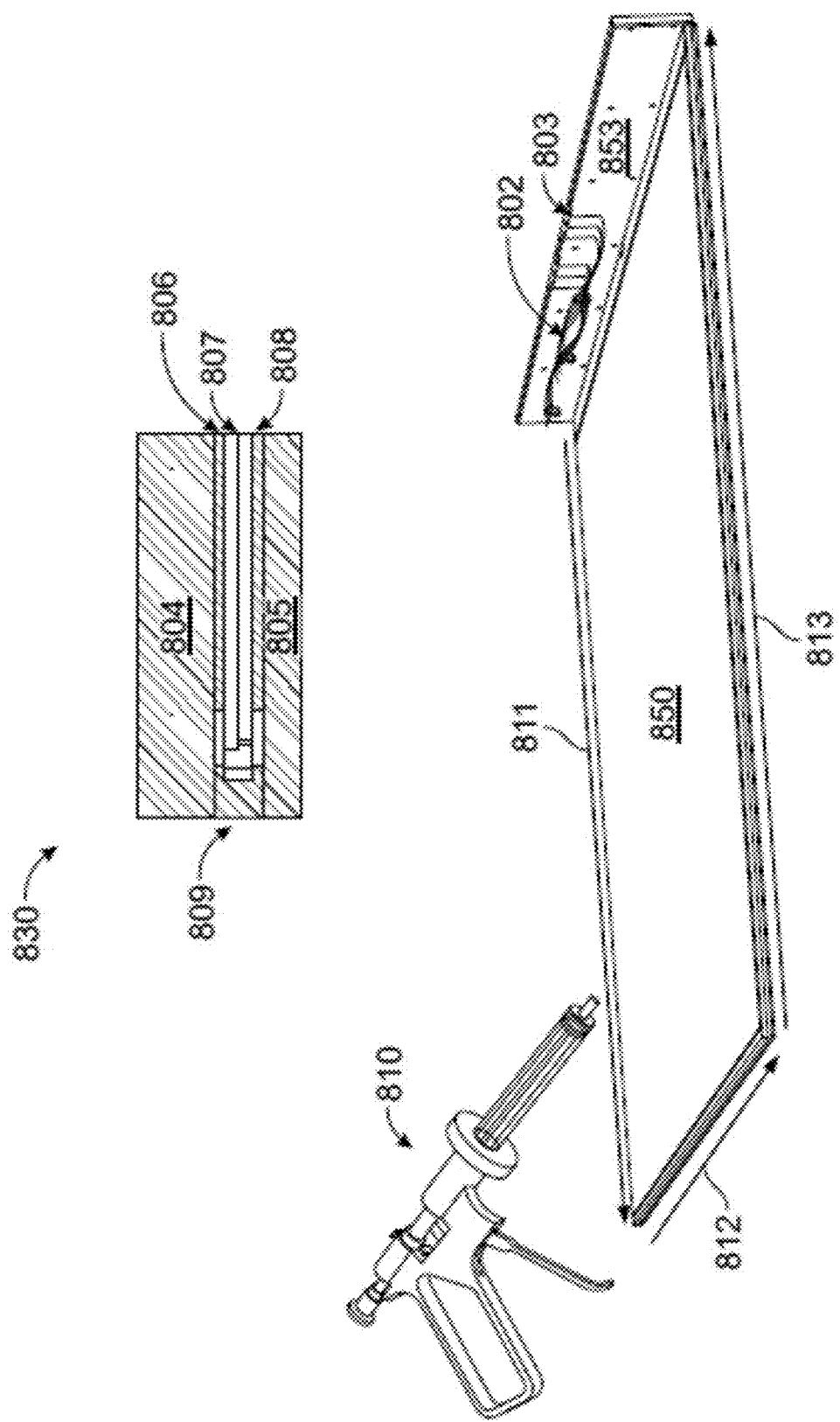
FIG. 8 schematically shows various views of a display construct assembly and applicator.

Referring to FIG. 8, in one embodiment, a seal is provided along at least 3 edges of a transparent display assembly, e.g., along the edge of a laminate assembly as described herein. In embodiments, the seal is in the form of a silicone or other transparent plastic, resin, or other polymer cap (or bumper) that fits over the laminate transparent assembly edges, sealing the unit. The seal may provide a bumper function between the second cover glass (e.g., FIG. 7, 710) and the window (e.g., FIG. 7, 711). FIG. 8 shows an example of a perspective view of display construct 850 and a seal that is applied according to arrows 811, 812, and 813 along three sides of display construct 850, e.g., by use of an applicator (e.g., syringe gun) 810. Display construct 850 is coupled to fastener 530 onto which wires 802 connect a display matrix in the display construct, with a circuitry disposed in the fastener (now shown). The display construct 850 is shown in the example of FIG. 8 also as a vertical cross section 830 of a portion of a display construct that includes a thicker glass pane 804, a thinner glass pane 805, adhesive layers 806 and 808, a display matrix 807, and a seal 809. The seal may protrude from the glass panes and/or serve as a bumper. The protrusion of the seal may be random, or directional. For example, the protrusion may be directed towards one side of the display construct (e.g., that is destined to touch the window). The protrusion of the seal may be (e.g., substantially) uniform or non-uniform (e.g., towards one side of the display construct).

FIG. 9 shows an example of a cover 903 (shown in cross section) that may be used to conceal L-bracket 904 from view. Cover 903 may be removably attached to window frame 905. Power and communications may be delivered to the transparent display assembly via wires 906, in this example housed within window frame 905. L-bracket may allow servicing of the transparent display or replacement, and/or servicing or replacement of any circuitry (e.g., disposed in a fastener of which the bracket is a part of). FIG. 9 shows an example of a transparent display assembly having a display construct including (e.g., glass) pane 907, display matrix 908, and (e.g., glass) pane 902, which display construct is coupled to, or be comprised of, a frame 905. A frame may comprise portions coupled, or configured to be coupled, to each other. A frame may comprise at least three (3) portions. A frame may comprise a shape that (e.g., approximates) matches a shape of at least a portion of a periphery of a display construct (e.g., transparent display assembly). A frame may be coupled or attached to sides (or to edges) of a display construct (e.g., transparent display assembly). In one embodiment, frame portions are coupled to each other to form a frame shape, e.g., after the frame portions have been coupled to a display construct (e.g., transparent display assembly). In one embodiment, frame portions may be coupled to each other to form a frame shape, e.g., before the frame portions are coupled to a display construct (e.g., transparent display assembly). A display construct (e.g., transparent display assembly) may be positioned within an area bounded by the frame shape. Frame portions may comprise channels (e.g., U-shaped channels) configured to receive and/or retain sides of a transparent display assembly therein.

FIG. 9 shows an example of a window frame (e.g., a mullion) portion 951 to which a fastener is attached 953 (which fastener includes a hinge/lock 952). Fastener 953 is coupled to a display construct 954 (partial view shown) and to an integrated glass unit 961 (IGU) (partial view shown) that includes: a first pane 955, an enclosed environment 957, a second pane 956, and an electrochromic construct 958 disposed on second pane 956. The enclosed environment in the IGU can be an insulated, (e.g., hermitically) sealed, and/or inert environment. FIG. 9 shows an example of a power source unit and/or controller (e.g., timing controller) that are collectively designated as numeral 959, disposed in the frame portion 951, and electrical wiring and/or communication pathways 960 that travel from an environment external to the window frame 951 to the display construct 954. The electrical wiring and/or communication pathways can travel through the window frame to the IGU. The electrical wiring and/or communication pathways can travel to the IGU through the controller and/or power source assembly. The pane can be of a transparent hard material (e.g., glass or polymeric such as plastic). Transparent can be at least in the wavelengths sensitive to an average human viewer.

The present invention should not be limited by the embodiments, aspects and advantages disclosed above as other embodiments, aspects and advantages are within its scope, including one or more of those that follow. In one embodiment, the present invention comprises a structure (e.g., a fastener), wherein the structure (e.g., fastener) is comprised of a first portion and a second portion, the first and second portion configured to move relative to each other. In one embodiment, the structure comprises one or more bracket. In one embodiment, the structure comprises one or more hinge. In one embodiment, the structure comprises one or more electrical connector. In one embodiment, the electrical connector comprises a micro-coax cable. In one embodiment, the electrical connector comprises one or more ribbon cable. In one embodiment the structure is configured to be mounted to a display construct (e.g., comprising transparent display). In one embodiment, the transparent display is a T. OLED display. In one embodiment, the display construct (e.g., including the transparent display) comprises one or more optically clear glass, hardened polymer (e.g., plastic), or a hardened resin. In one embodiment, the structure comprises one or more electronic circuit configured to communicate with the display matrix (e.g., transparent display matrix). In one embodiment, the structure is configured to mount to a frame. In one embodiment, the frame comprises a window frame. In one embodiment, the structure is configured to be mounted to a FLS (e.g., a length) of the transparent display. In one embodiment, the structure comprises a length, wherein the length is from about 0.1 feet to about 10 feet. In one embodiment, a first portion of the fastener comprises at least one bracket and the second portion of the fastener comprises one or more hinges. In one embodiment, the structure comprises a display matrix, and an adhesive element, wherein the display matrix is mounted to the first portion and/or to second portion, e.g., via the adhesive element. In one embodiment, the adhesive elements comprise an adhesive tape. In one embodiment, the adhesive tape comprises VHB tape. In one embodiment, the first portion of the fastener and/or second portion of the fastener is configured to be mounted to a viewing window (e.g., tintable window). In one embodiment, the first portion of the fastener is configured to be mounted to a display construct and the second portion is configured to be mounted to a window (wherein the second portion comprise a hinge). In one embodiment, the hinge comprises a plurality of elongated holes, wherein an axis of elongation of at least one of the plurality of holes is orthogonal to an axis of elongation of at least one other of the plurality of holes.

In one embodiment, the present invention comprises a frame. The frame can be comprised of a transparent display and a fastener (comprising a bracket) configured to provide movement and physical connectivity between the frame and the display construct (e.g., comprising the transparent display). In one embodiment, the frame comprises a window frame. In one embodiment the bracket comprises an L-bracket, wherein the L-bracket is coupled to the frame and to the display construct (e.g., comprising the transparent display). In one embodiment, the bracket is coupled to the transparent display via an adhesive structure. In one embodiment, the adhesive structure comprises adhesive tape. In one embodiment, the bracket comprises one or more hinge. In one embodiment, the hinge is configured to provide the movement of the display construct (e.g., comprising the transparent display) relative to a fixture (e.g., window frame). In one embodiment, the movement comprises rotational movement. In one embodiment, the movement is about a horizontal axis. In one embodiment, the movement is about a vertical axis. In one embodiment, the frame comprises a lite (e.g., a windowpane). In one embodiment, the bracket is configured to move a face of the transparent display close to or against a face of the lite. In one embodiment, the frame defines an interior area (e.g., that is a surface of the window in the frame), wherein the transparent display comprises a height and a width that defines an area that fits within the interior area. In one embodiment, the area of the display construct (e.g., comprising the transparent display) fits (e.g., substantially) within all the interior area. In one embodiment, the area of the transparent display fits within one half or less than one half of the interior area. In one embodiment, the structure comprises one or more conductor, ribbon cable and/or connector, and the one or more conductor, ribbon cable and/or connector provides electrical connectivity between a control and the transparent display.

Figure 11:
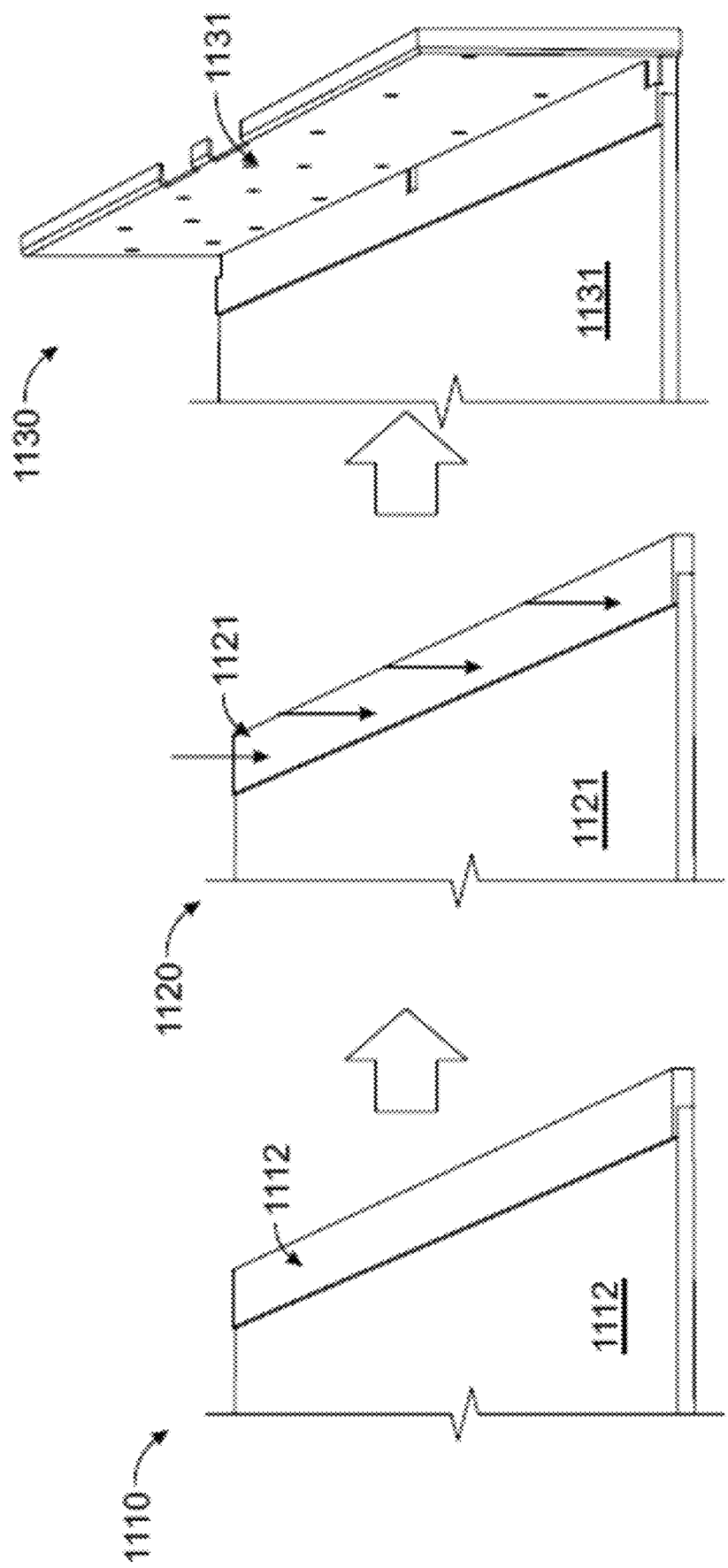
FIG. 11 schematically various operations in display construct assembly formation.

In some embodiments, an assembly having a display construct and a fastener is formed. The display construct can be adhered to at least a component of the fastener, e.g., a bracket. FIG. 11 shows an example of stage in construction an assembly of a display construct and a fastener. In 1110, a display construct 1112 has an area 1112 designated for adhesive application. In 1120, an adhesive is applied on the adhesive designated area according to arrows the arrows, e.g., 1121. In 1130, a fastener 1131 (e.g., L bracket) is placed on the adhesive designated area having an applied adhesive placed thereon. Items 1121, 1131, and 1112 show portions of display constructs. The fastener and the display construct can be disposed in the same plane or in different planes. At least a portion of the fastener can be disposed in the same plane or in different planes relative to the display construct. The display construct can be coupled at an angle to the fastener (e.g., as shown in FIG. 12, 1210). The display construct and the fastener can form one plane (e.g., as shown in 1220). FIG. 12 shows an example of display construct 1211 forming an angle with fastener 1218, and display construct 1221 forming a planar plane with fastener 1228. The display construct may comprise irradiating entities (e.g., LEDs) that irradiate more in one direction than in another (e.g., more in a forward direction than in a back direction). An image displayed by a display matrix may be visible clearly from one side of the display matrix than from its opposing side. The display construct may comprise two arrangements (e.g., matrices) of irradiating entities (e.g., LED matrices) disposed back to back. The at least one (e.g., each) of the two arrangements of irradiating entities may be disposed with its more irradiating side facing away from the back (and towards a viewer), and its less irradiating side facing the back (and away from the viewer). The back to back arrangement of the irradiating entity arrangements in the display construct may facilitate clear image viewing from both sides of the display construct. A display construct having back to back arrangements of irradiating entities may utilize a flat fasteners (e.g., 1228). In some embodiments, two display constructs may be disposed adjacent to each other in a back to back configuration, e.g., such that at least one (e.g., each) of the display constructs may have its more illuminating side facing away from the back (and towards a viewer), and its less irradiating side facing the back (and away from the viewer). The two back to back display constructs may utilize a flat fastener (e.g., 1228) to fasten both display constructs to a structure (e.g., fixture).

In some embodiments, the window is disposed in an enclosure. In some embodiments, an enclosure comprises an area defined by at least one structure. The at least one structure may comprise at least one wall. An enclosure may comprise and/or enclose one or more sub-enclosures. The at least one wall may comprise metal (e.g., steel), clay, stone, plastic, glass, plaster (e.g., gypsum), polymer (e.g., polyurethane, styrene, or vinyl), asbestos, fiber-glass, concrete (e.g., reinforced concrete), wood, paper, or a ceramic. The at least one wall may comprise wire, bricks, blocks (e.g., cinder blocks), tile, drywall, or frame (e.g., steel frame).

In some embodiments, the enclosure comprises one or more openings. The one or more openings may be reversibly closable. The one or more openings may be permanently open. A fundamental length scale of the one or more openings may be smaller relative to the fundamental length scale of the wall(s) that define the enclosure. A fundamental length scale may comprise a diameter of a bounding circle, a length, a width, or a height. A surface of the one or more openings may be smaller relative to the surface the wall(s) that define the enclosure. The opening surface may be a percentage of the total surface of the wall(s). For example, the opening surface can measure at most about 30%, 20%, 10%, 5%, or 1% of the walls(s). The wall(s) may comprise a floor, a ceiling or a side wall. The closable opening may be closed by at least one window or door. The enclosure may be at least a portion of a facility. The facility may comprise a building. The enclosure may comprise at least a portion of a building. The building may be a private building and/or a commercial building. The building may comprise one or more floors. The building (e.g., floor thereof) may include at least one of: a room, hall, foyer, attic, basement, balcony (e.g., inner or outer balcony), stairwell, corridor, elevator shaft, façade, mezzanine, penthouse, garage, porch (e.g., enclosed porch), terrace (e.g., enclosed terrace), cafeteria, and/or Duct. In some embodiments, an enclosure may be stationary and/or movable (e.g., a train, an air-plane, a ship, a vehicle, or a rocket).

Certain disclosed embodiments provide a network infrastructure in the enclosure (e.g., a facility such as a building). The network infrastructure is available for various purposes such as for providing communication and/or power services. The communication services may comprise high bandwidth (e.g., wireless and/or wired) communications services. The communication services can be to occupants of a facility and/or users outside the facility (e.g., building). The network infrastructure may work in concert with, or as a partial replacement of, the infrastructure of one or more cellular carriers. The network infrastructure can be provided in a facility that includes electrically switchable windows. Examples of components of the network infrastructure include a high speed backhaul. The network infrastructure may include at least one cable, switch, physical antenna, transceivers, sensor, transmitter, receiver, radio, processor and/or controller (that may comprise a processor). The network infrastructure may be operatively coupled to, and/or include, a wireless network. The network infrastructure may comprise wiring. One or more sensors can be deployed (e.g., installed) in an environment as part of installing the network and/or after installing the network. The network infrastructure may be configured to facilitate at least third generation (3G), fourth generation (4G), or fifth generation (5G) cellular communication. The network may be configured to facilitate media transmission (e.g., presentation, still, or video (e.g., movie) transmission). The network may be configured for simultaneous data and power communication (e.g., on the same cable such as a coaxial cable). The network may be a local network. The network may comprise a cable configured to transmit power and communication in a single cable. The communication can be one or more types of communication. The communication can comprise cellular communication abiding by at least a second generation (2G), third generation (3G), fourth generation (4G) or fifth generation (5G) cellular communication protocol. The communication may comprise media communication facilitating stills, music, or moving picture streams (e.g., movies or videos). The communication may comprise data communication (e.g., sensor data). The communication may comprise control communication, e.g., to control the one or more nodes operatively coupled to the networks. The network may comprise a first (e.g., cabling) network installed in the facility. The network may comprise a (e.g., cabling) network installed in an envelope of the facility (e.g., such as in an envelope of an enclosure of the facility. For example, in an envelope of a building included in the facility).

In another aspect, the present disclosure provides networks that are configured for transmission of any communication (e.g., signal) and/or (e.g., electrical) power facilitating any of the operations disclosed herein. The communication may comprise control communication, cellular communication, media communication, and/or data communication. The data communication may comprise sensor data communication and/or processed data communication. The networks may be configured to abide by one or more protocols facilitating such communication. For example, a communications protocol used by the network (e.g., with a BMS) can comprise a building automation and control networks protocol (BACnet). The network may be configured for (e.g., include hardware facilitating) communication protocols comprising BACnet (e.g., BACnet/SC), LonWorks, Modbus, KNX, European Home Systems Protocol (EHS), BatiBUS, European Installation Bus (EIB or Instabus), zigbee, Z-wave, Insteon, X10, Bluetooth, or WiFi. The network may be configure to transmit the control related protocol. A communication protocol may facilitate cellular communication abiding by at least a $2^{nd}$, $3^{rd}$, $4^{th}$, or $5^{th}$ generation cellular communication protocol. The (e.g., cabling) network may comprise a tree, line, or star topologies. The network may comprise interworking and/or distributed application models for various tasks of the building automation. The control system may provide schemes for configuration and/or management of resources on the network. The network may permit binding of parts of a distributed application in different nodes operatively coupled to the network. The network may provide a communication system with a message protocol and models for the communication stack in each node (capable of hosting distributed applications (e.g., having a common Kernel). The control system may comprise programmable logic controller(s) (PLC(s)).

In various embodiments, a network infrastructure supports a control system for one or more windows such as tintable (e.g., electrochromic) windows. The control system may comprise one or more controllers operatively coupled (e.g., directly or indirectly) to one or more windows. While the disclosed embodiments describe tintable windows (also referred to herein as "optically switchable windows," or "smart windows") such as electrochromic windows, the concepts disclosed herein may apply to other types of switchable optical devices comprising a liquid crystal device, an electrochromic device, suspended particle device (SPD), NanoChromics display (NCD), Organic electroluminescent display (OELD), suspended particle device (SPD), NanoChromics display (NCD), or an Organic electroluminescent display (OELD). The display element may be attached to a part of a transparent body (such as the windows). The tintable window may be disposed in a (non-transitory) facility such as a building, and/or in a transitory facility (e.g., vehicle) such as a car, RV, bus, train, airplane, helicopter, ship, or boat.

In some embodiments, a tintable window exhibits a (e.g., controllable and/or reversible) change in at least one optical property of the window, e.g., when a stimulus is applied. The change may be a continuous change. A change may be to discrete tint levels (e.g., to at least about 2, 4, 8, 16, or 32 tint levels). The optical property may comprise hue, or transmissivity. The hue may comprise color. The transmissivity may be of one or more wavelengths. The wavelengths may comprise ultraviolet, visible, or infrared wavelengths. The stimulus can include an optical, electrical and/or magnetic stimulus. For example, the stimulus can include an applied voltage and/or current. One or more tintable windows can be used to control lighting and/or glare conditions, e.g., by regulating the transmission of solar energy propagating through them. One or more tintable windows can be used to control a temperature within a building, e.g., by regulating the transmission of solar energy propagating through the window. Control of the solar energy may control heat load imposed on the interior of the facility (e.g., building). The control may be manual and/or automatic. The control may be used for maintaining one or more requested (e.g., environmental) conditions, e.g., occupant comfort. The control may include reducing energy consumption of a heating, ventilation, air conditioning and/or lighting systems. At least two of heating, ventilation, and air conditioning may be induced by separate systems. At least two of heating, ventilation, and air conditioning may be induced by one system. The heating, ventilation, and air conditioning may be induced by a single system (abbreviated herein as "HVAC"). In some cases, tintable windows may be responsive to (e.g., and communicatively coupled to) one or more environmental sensors and/or user control. Tintable windows may comprise (e.g., may be) electrochromic windows. The windows may be located in the range from the interior to the exterior of a structure (e.g., facility, e.g., building). However, this need not be the case. Tintable windows may operate using liquid crystal devices, suspended particle devices, microelectromechanical systems (MEMS) devices (such as microshutters), or any technology known now, or later developed, that is configured to control light transmission through a window. Windows (e.g., with MEMS devices for tinting) are described in U.S. Pat. No. 10,359,681, issued Jul. 23, 2019, filed May 15, 2015, titled "MULTI-PANE WINDOWS INCLUDING ELECTROCHROMIC DEVICES AND ELECTROMECHANICAL SYSTEMS DEVICES," and incorporated herein by reference in its entirety. In some cases, one or more tintable windows can be located within the interior of a building, e.g., between a conference room and a hallway. In some cases, one or more tintable windows can be used in automobiles, trains, aircraft, and other vehicles, e.g., in lieu of a passive and/or non-tinting window.

In some embodiments, an enclosure includes one or more sensors. The sensor may facilitate controlling the environment of the enclosure such that inhabitants of the enclosure may have an environment that is more comfortable, delightful, beautiful, healthy, productive (e.g., in terms of inhabitant performance), easer to live (e.g., work) in, or any combination thereof. The sensor(s) may be configured as low or high resolution sensors. Sensor may provide on/off indications of the occurrence and/or presence of a particular environmental event (e.g., one pixel sensors).

In various embodiments, a network infrastructure supports a control system for one or more viewing windows such as electrochromic (e.g., tintable) windows. The control system may comprise one or more controllers operatively coupled (e.g., directly or indirectly) to one or more windows. In some embodiments, electrochromic window is an example of optically switchable windows, tintable windows, and/or smart windows. The concepts disclosed herein may apply to other types of switchable optical devices including, for example, a liquid crystal device, or a suspended particle device. For example, a liquid crystal device and/or a suspended particle device may be implemented instead of, or in addition to, an electrochromic device.

In some embodiments, a tintable window exhibits a (e.g., controllable and/or reversible) change in at least one optical property of the window, e.g., when a stimulus is applied. The stimulus can include an optical, electrical and/or magnetic stimulus. For example, the stimulus can include an applied voltage. One or more tintable windows can be used to control lighting and/or glare conditions, e.g., by regulating the transmission of solar energy propagating through them. One or more tintable windows can be used to control a temperature within a building, e.g., by regulating the transmission of solar energy propagating through them. Control of the solar energy may control heat load imposed on the interior of the facility (e.g., building). The control may be manual and/or automatic. The control may be used for maintaining one or more requested (e.g., environmental) conditions, e.g., occupant comfort. The control may include reducing energy consumption of a heating, ventilation, air conditioning and/or lighting systems. At least two of heating, ventilation, and air conditioning may be induced by separate systems. At least two of heating, ventilation, and air conditioning may be induced by one system. The heating, ventilation, and air conditioning may be induced by a single system (abbreviated herein as "HVAC). In some cases, tintable windows may be responsive to (e.g., and communicatively coupled to) one or more environmental sensors and/or user control. Tintable windows may comprise (e.g., may be) electrochromic windows. The windows may be located in the range from the interior to the exterior of a structure (e.g., facility, e.g., building). However, this need not be the case. Tintable windows may operate using liquid crystal devices, suspended particle devices, microelectromechanical systems (MEMS) devices (such as micro shutters), or any technology configured to control light transmission through a window. Windows (e.g., with MEMS devices for tinting) are described in U.S. patent application Ser. No. 14/443,353, filed May 15, 2015, titled "MULTI-PANE WINDOWS INCLUDING ELECTROCHROMIC DEVICES AND ELECTROMECHANICAL SYSTEMS DEVICES," that is incorporated herein by reference in its entirety. In some cases, one or more viewing (e.g., tintable) windows can be located within the interior of a building, e.g., between a conference room and a hallway. In some cases, one or more viewing (e.g., tintable) windows can be used in automobiles, trains, aircraft, and other vehicles, e.g., in lieu of a passive and/or non-tinting window.

In some embodiments, the tintable window comprises an electrochromic device (referred to herein as an "EC device" (abbreviated herein as ECD), or "EC"). An EC device may comprise at least one coating that includes at least one layer. The at least one layer can comprise an electrochromic material. In some embodiments, the electrochromic material exhibits a change from one optical state to another, e.g., when an electric potential is applied across the EC device. The transition of the electrochromic layer from one optical state to another optical state can be caused, e.g., by reversible, semi-reversible, or irreversible ion insertion into the electrochromic material (e.g., by way of intercalation) and a corresponding injection of charge-balancing electrons. For example, the transition of the electrochromic layer from one optical state to another optical state can be caused, e.g., by a reversible ion insertion into the electrochromic material (e.g., by way of intercalation) and a corresponding injection of charge-balancing electrons. Reversible may be for the expected lifetime of the ECD. Semi-reversible refers to a measurable (e.g., noticeable) degradation in the reversibility of the tint of the window over one or more tinting cycles. In some instances, a fraction of the ions responsible for the optical transition is irreversibly bound up in the electrochromic material (e.g., and thus the induced (altered) tint state of the window is not reversible to its original tinting state). In various EC devices, at least some (e.g., all) of the irreversibly bound ions can be used to compensate for "blind charge" in the material (e.g., ECD).

In some implementations, suitable ions include cations. The cations may include lithium ions (Li+) and/or hydrogen ions (H+) (i.e., protons). In some implementations, other ions can be suitable. Intercalation of the cations may be into an (e.g., metal) oxide. A change in the intercalation state of the ions (e.g., cations) into the oxide may induce a visible change in a tint (e.g., color) of the oxide. For example, the oxide may transition from a colorless to a colored state. For example, intercalation of lithium ions into tungsten oxide ($WO_3$-y ($0<y\leq \sim 0.3$)) may cause the tungsten oxide to change from a transparent state to a colored (e.g., blue) state. EC device coatings as described herein are located within the viewable portion of the tintable window such that the tinting of the EC device coating can be used to control the optical state of the tintable window.

Figure 13:
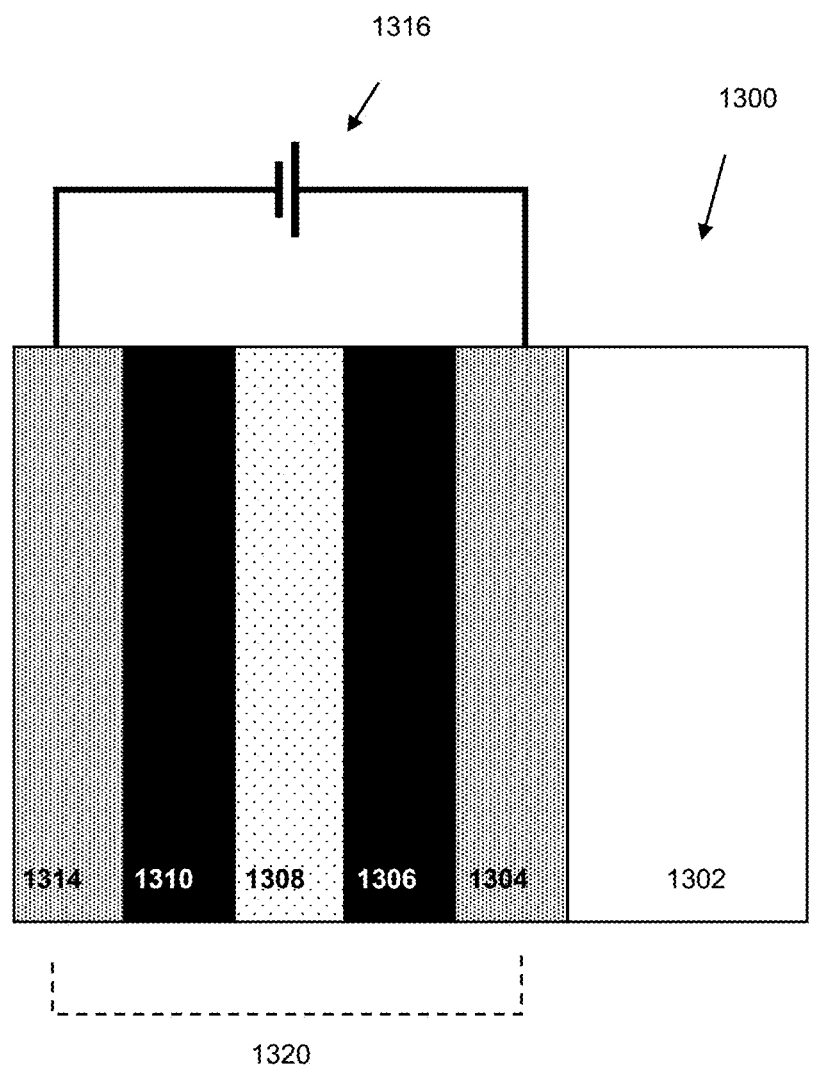
FIG. 13 schematically shows various layers in an electrochromic construct.

FIG. 13 shows an example of a schematic cross-section of an electrochromic construct 1300 in accordance with some embodiments. The EC device coating is attached to a substrate 1302, a transparent conductive layer (TCL) 1304, an electrochromic layer (EC) 1306 (sometimes also referred to as a cathodically coloring layer or a cathodically tinting layer), an ion conducting layer or region (IC) 1308, a counter electrode layer (CE) 1310 (sometimes also referred to as an anodically coloring layer or anodically tinting layer), and a second TCL 1314. Elements 1304, 1306, 1308, 1310, and 1314 are collectively referred to as an electrochromic stack 1320. A voltage source 1316 operable to apply an electric potential across the electrochromic stack 1320 effects the transition of the electrochromic coating from, e.g., a clear state to a tinted state. In other embodiments, the order of layers is reversed with respect to the substrate. That is, the layers are in the following order: substrate, TCL, counter electrode layer, ion conducting layer, electrochromic material layer, TCL.

In various embodiments, the ion conductor region (e.g., 1308) may form from a portion of the EC layer (e.g., 1306) and/or from a portion of the CE layer (e.g., 1310). In such embodiments, the electrochromic stack (e.g., 1320) may be deposited to include cathodically coloring electrochromic material (the EC layer) in direct physical contact with an anodically coloring counter electrode material (the CE layer). The ion conductor region (sometimes referred to as an interfacial region, or as an ion conducting substantially electronically insulating layer or region) may form where the EC layer and the CE layer meet, for example through heating and/or other processing steps. Examples of electrochromic devices (e.g., including those fabricated without depositing a distinct ion conductor material) can be found in U.S. patent application Ser. No. 13/462,725, filed May 2, 2012, titled "ELECTROCHROMIC DEVICES," that is incorporated herein by reference in its entirety. In some embodiments, an EC device coating may include one or more additional layers such as one or more passive layers. Passive layers can be used to improve certain optical properties, to provide moisture, and/or to provide scratch resistance. These and/or other passive layers can serve to hermetically seal the EC stack 1320. Various layers, including transparent conducting layers (such as 1304 and 1314), can be treated with anti-reflective and/or protective layers (e.g., oxide and/or nitride layers).

In certain embodiments, the electrochromic device is configured to (e.g., substantially) reversibly cycle between a clear state and a tinted state. Reversible may be within an expected lifetime of the ECD. The expected lifetime can be at least about 2y, 5y, 10y, 15y, 25y, 50y, 75y, or 100 (y) years. The expected lifetime can be any value between the aforementioned values (e.g., from about 5 y to about 100 y, from about 2 y to about 25 y, from about 25 y to about 50 y, or from about 50 y to about 100 y). A potential can be applied to the electrochromic stack (e.g., 1320) such that available ions in the stack that can cause the electrochromic material (e.g., 1306) to be in the tinted state reside primarily in the counter electrode (e.g., 1310) when the window is in a first tint state (e.g., clear). When the potential applied to the electrochromic stack is reversed, the ions can be transported across the ion conducting layer (e.g., 1308) to the electrochromic material and cause the material to enter the second tint state (e.g., tinted state).

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, and/or transparent-opaque. In some embodiments, the terms "clear" and "bleached" refer to an optically neutral state, e.g., untinted, transparent and/or translucent. In some embodiments, the "color" or "tint" of an electrochromic transition is not limited to any wavelength or range of wavelengths. The choice of appropriate electrochromic material and counter electrode materials may govern the relevant optical transition (e.g., from tinted to untinted state).

In certain embodiments, at least a portion (e.g., all of) the materials making up electrochromic stack are inorganic, solid (e.g., in the solid state), or both inorganic and solid. Because various organic materials tend to degrade over time, particularly when exposed to heat and UV light as tinted building windows are, inorganic materials offer an advantage of a reliable electrochromic stack that can function for extended periods of time. In some embodiments, materials in the solid state can offer the advantage of being minimally contaminated and minimizing leakage issues, as materials in the liquid state sometimes do. One or more of the layers in the stack may contain some amount of organic material (e.g., that is measurable). The ECD or any portion thereof (e.g., one or more of the layers) may contain little or no measurable organic matter. The ECD or any portion thereof (e.g., one or more of the layers) may contain one or more liquids that may be present in little amounts. Little may be of at most about 100 ppm, 10 ppm, or 1 ppm of the ECD. Solid state material may be deposited (or otherwise formed) using one or more processes employing liquid components, such as certain processes employing sol-gels, physical vapor deposition, and/or chemical vapor deposition.

Figure 14A:
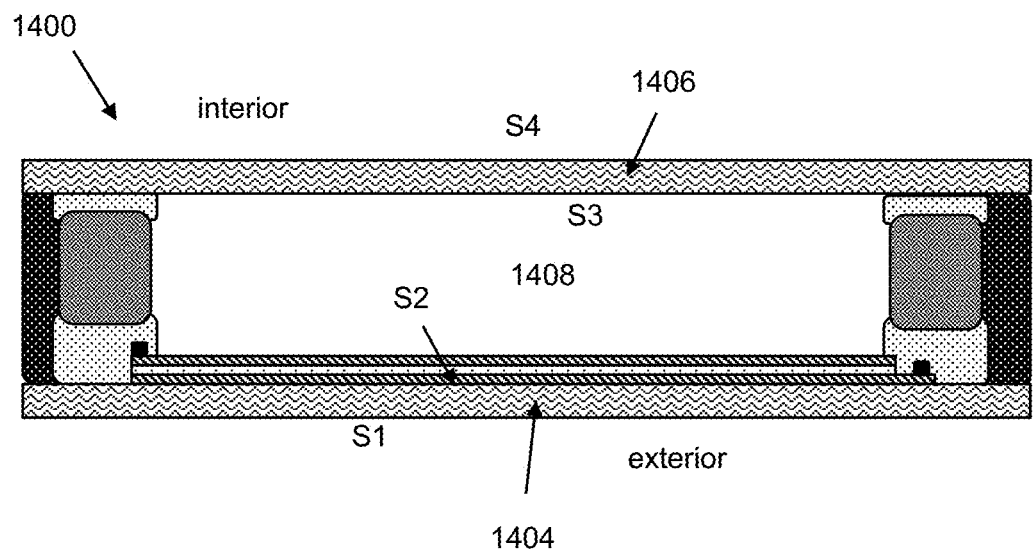
FIGS. 14A-B schematically show various views of integrated glass units.
Figure 14B:
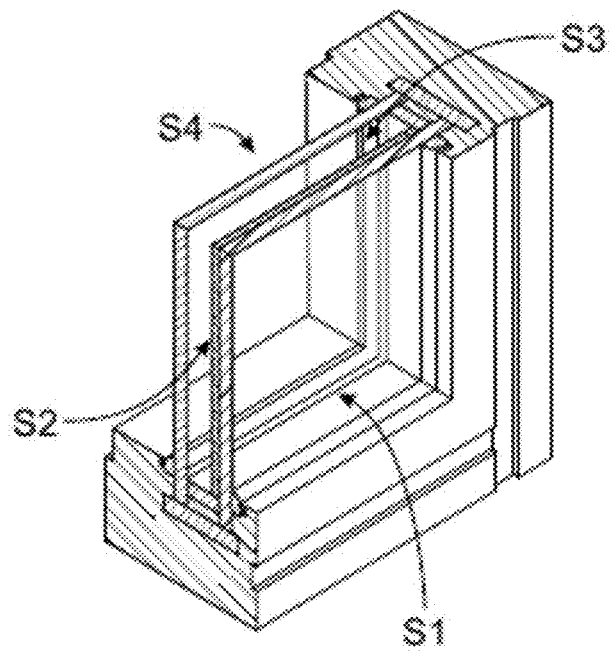

FIG. 14 show an example of a cross-sectional view of a tintable window embodied in an insulated glass unit ("IGU") 1400, in accordance with some implementations. It can be desirable to have IGUs serve as the fundamental constructs for holding electrochromic panes (also referred to herein as "lites" and in the singular "lite") when provided for installation in a building. An IGU lite may be a single substrate or a multi-substrate construct. The lite may comprise a laminate, e.g., of two substrates. IGUs (e.g., having double- or triple-pane configurations) can provide a number of advantages over single pane configurations. For example, multi-pane configurations can provide enhanced thermal insulation, noise insulation, environmental protection and/or durability, when compared with single-pane configurations. A multi-pane configuration can provide increased protection for an ECD. For example, the electrochromic films (e.g., as well as associated layers and conductive interconnects) can be formed on an interior surface of the multi-pane IGU and be protected by an inert gas fill in the interior volume (e.g., 1408) of the IGU. The inert gas fill may provide at least some (heat) insulating function for an IGU. Electrochromic IGUs may have heat blocking capability, e.g., by virtue of a tintable coating that absorbs (and/or reflects) heat and light.

In some embodiments, an "IGU" includes two (or more) substantially transparent substrates. For example, the IGU may include two panes of glass. At least one substrate of the IGU can include an electrochromic device disposed thereon. The one or more panes of the IGU may have a separator disposed between them. An IGU can be a hermetically sealed construct, e.g., having an interior region that is isolated from the ambient environment. A "window assembly" may include an IGU. A "window assembly" may include a (e.g., stand-alone) laminate. A "window assembly" may include one or more electrical leads, e.g., for connecting the IGUs and/or laminates. The electrical leads may operatively couple (e.g., connect) one or more electrochromic devices to a voltage source, switches and the like, and may include a frame that supports the IGU or laminate. A window assembly may include a window controller, and/or components of a window controller (e.g., a dock).

FIG. 14 shows an example implementation of an IGU 1400 that includes a first pane 1404 having a first surface S1 and a second surface S2. In some implementations, the first surface S1 of the first pane 1404 faces an exterior environment, such as an outdoors or outside environment. The IGU 200 also includes a second pane 1406 having a first surface S3 and a second surface S4. In some implementations, the second surface (e.g., S4) of the second pane (e.g., 1406) faces an interior environment, such as an inside environment of a home, building, vehicle, or compartment thereof (e.g., an enclosure therein such as a room).

In some implementations, the first and the second panes (e.g., 1404 and 1406) are transparent or translucent, e.g., at least to light in the visible spectrum. For example, each of the panes (e.g., 1404 and 1406) can be formed of a glass material. The glass material may include architectural glass, and/or shatter-resistant glass. The glass may comprise a silicon oxide ($SO_x$). The glass may comprise a soda-lime glass or float glass. The glass may comprise at least about 75% silica ($SiO_2$). The glass may comprise oxides such as $Na_2O$, or $CaO$. The glass may comprise alkali or alkali-earth oxides. The glass may comprise one or more additives. The first and/or the second panes can include any material having suitable optical, electrical, thermal, and/or mechanical properties. Other materials (e.g., substrates) that can be included in the first and/or the second panes are plastic, semi-plastic and/or thermoplastic materials, for example, poly(methyl methacrylate), polystyrene, polycarbonate, allyl diglycol carbonate, SAN (styrene acrylonitrile copolymer), poly(4-methyl-1-pentene), polyester, and/or polyamide. The first and/or second pane may include mirror material (e.g., silver). In some implementations, the first and/or the second panes can be strengthened. The strengthening may include tempering, heating, and/or chemically strengthening.

Figure 15:
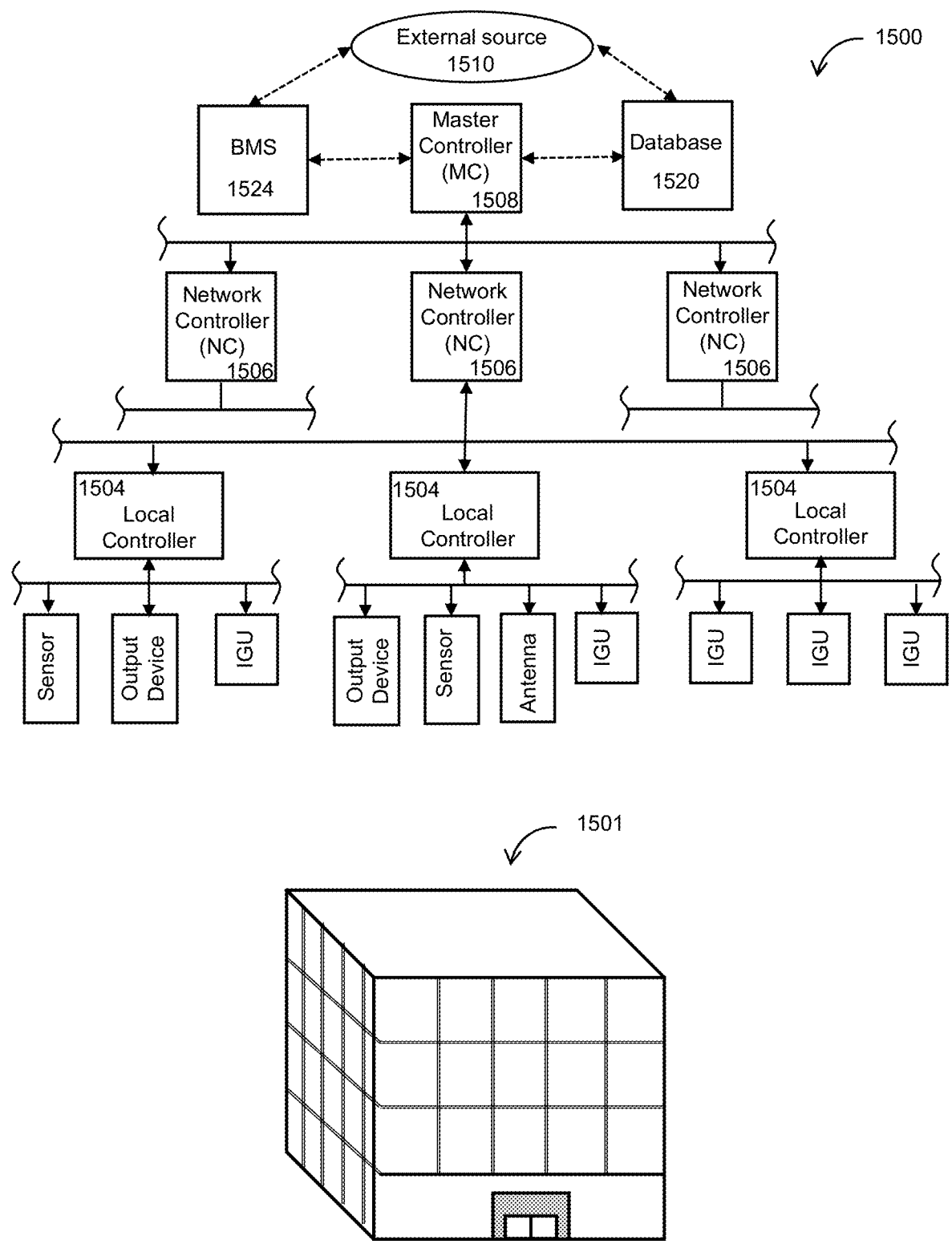
FIG. 15 schematically shows a control hierarchy scheme and a building.

In some embodiments, the sensor(s) are operatively coupled to at least one controller and/or processor. Sensor readings may be obtained by one or more processors and/or controllers. A controller may comprise a processing unit (e.g., CPU or GPU). A controller may receive an input (e.g., from at least one sensor). The controller may comprise circuitry, electrical wiring, optical wiring, socket, and/or outlet. A controller may deliver an output. A controller may comprise multiple (e.g., sub-) controllers. The controller may be a part of a control system. A control system may comprise a master controller, floor (e.g., comprising network controller) controller, a local controller. The local controller may be a window controller (e.g., controlling an optically switchable window), enclosure controller, or component controller. For example, a controller may be a part of a hierarchal control system (e.g., comprising a main controller that directs one or more controllers, e.g., floor controllers, local controllers (e.g., window controllers), enclosure controllers, and/or component controllers). A physical location of the controller type in the hierarchal control system may be changing. For example: At a first time: a first processor may assume a role of a main controller, a second processor may assume a role of a floor controller, and a third processor may assume the role of a local controller. At a second time: the second processor may assume a role of a main controller, the first processor may assume a role of a floor controller, and the third processor may remain with the role of a local controller. At a third time: the third processor may assume a role of a main controller, the second processor may assume a role of a floor controller, and the first processor may assume the role of a local controller. A controller may control one or more devices (e.g., be directly coupled to the devices). A controller may be disposed proximal to the one or more devices it is controlling. For example, a controller may control an optically switchable device (e.g., IGU), an antenna, a sensor, and/or an output device (e.g., a light source, sounds source, smell source, gas source, HVAC outlet, or heater). In one embodiment, a floor controller may direct one or more window controllers, one or more enclosure controllers, one or more component controllers, or any combination thereof. The floor controller may comprise a floor controller. For example, the floor (e.g., comprising network) controller may control a plurality of local (e.g., comprising window) controllers. A plurality of local controllers may be disposed in a portion of a facility (e.g., in a portion of a building). The portion of the facility may be a floor of a facility. For example, a floor controller may be assigned to a floor. In some embodiments, a floor may comprise a plurality of floor controllers, e.g., depending on the floor size and/or the number of local controllers coupled to the floor controller. For example, a floor controller may be assigned to a portion of a floor. For example, a floor controller may be assigned to a portion of the local controllers disposed in the facility. For example, a floor controller may be assigned to a portion of the floors of a facility. A master controller may be coupled to one or more floor controllers. The floor controller may be disposed in the facility. The master controller may be disposed in the facility, or external to the facility. The master controller may be disposed in the cloud. A controller may be a part of, or be operatively coupled to, a building management system. A controller may receive one or more inputs. A controller may generate one or more outputs. The controller may be a single input single output controller (SISO) or a multiple input multiple output controller (MIMO). A controller may interpret an input signal received. A controller may acquire data from the one or more components (e.g., sensors). Acquire may comprise receive or extract. The data may comprise measurement, estimation, determination, generation, or any combination thereof. A controller may comprise feedback control. A controller may comprise feed-forward control. Control may comprise on-off control, proportional control, proportional-integral (PI) control, or proportional-integral-derivative (PID) control. Control may comprise open loop control, or closed loop control. A controller may comprise closed loop control. A controller may comprise open loop control. A controller may comprise a user interface. A user interface may comprise (or operatively coupled to) a keyboard, keypad, mouse, touch screen, microphone, speech recognition package, camera, imaging system, or any combination thereof. Outputs may include a display (e.g., screen), speaker, or printer. FIG. 15 shows an example of a control system architecture 1500 comprising a master controller 1508 that controls floor controllers 1506, that in turn control local controllers 1504. In some embodiments, a local controller controls one or more IGUs, one or more sensors, one or more output devices (e.g., one or more emitters), or any combination thereof. FIG. 15 shows an example of a configuration in which the master controller is operatively coupled (e.g., wirelessly and/or wired) to a building management system (BMS) 1524 and to a database 1520. Arrows in FIG. 15 represents communication pathways. A controller may be operatively coupled (e.g., directly/indirectly and/or wired and/wirelessly) to an external source 1510. The external source may comprise a network. The external source may comprise one or more sensor or output device. The external source may comprise a cloud-based application and/or database. The communication may be wired and/or wireless. The external source may be disposed external to the facility. For example, the external source may comprise one or more sensors and/or antennas disposed, e.g., on a wall or on a ceiling of the facility. The communication may be monodirectional or bidirectional. In the example shown in FIG. 15 the communication all communication arrows are meant to be bidirectional. FIG. 15 shows an example of a perspective view of an enclosure 1501 (e.g., building).

The controller may monitor and/or direct (e.g., physical) alteration of the operating conditions of the apparatuses, software, and/or methods described herein. Control may comprise regulate, manipulate, restrict, direct, monitor, adjust, modulate, vary, alter, restrain, check, guide, or manage. Controlled (e.g., by a controller) may include attenuated, modulated, varied, managed, curbed, disciplined, regulated, restrained, supervised, manipulated, and/or guided. The control may comprise controlling a control variable (e.g., temperature, power, voltage, and/or profile). The control can comprise real time or off-line control. A calculation utilized by the controller can be done in real time, and/or offline. The controller may be a manual or a non-manual controller. The controller may be an automatic controller. The controller may operate upon request. The controller may be a programmable controller. The controller may be programed. The controller may comprise a processing unit (e.g., CPU or GPU). The controller may receive an input (e.g., from at least one sensor). The controller may deliver an output. The controller may comprise multiple (e.g., sub-) controllers. The controller may be a part of a control system. The control system may comprise a master controller, floor controller, local controller (e.g., enclosure controller, or window controller). The controller may receive one or more inputs. The controller may generate one or more outputs. The controller may be a single input single output controller (SISO) or a multiple input multiple output controller (MIMO). The controller may interpret the input signal received. The controller may acquire data from the one or more sensors. Acquire may comprise receive or extract. The data may comprise measurement, estimation, determination, generation, or any combination thereof. The controller may comprise feedback control. The controller may comprise feed-forward control. The control may comprise on-off control, proportional control, proportional-integral (PI) control, or proportional-integral-derivative (PID) control. The control may comprise open loop control, or closed loop control. The controller may comprise closed loop control. The controller may comprise open loop control. The controller may comprise a user interface. The user interface may comprise (or operatively coupled to) a keyboard, keypad, mouse, touch screen, microphone, speech recognition package, camera, imaging system, or any combination thereof. The outputs may include a display (e.g., screen), speaker, or printer.

The methods, systems and/or the apparatus described herein may comprise a control system. The control system can be in communication with any of the apparatuses (e.g., sensors) described herein. The sensors may be of the same type or of different types, e.g., as described herein. For example, the control system may be in communication with the first sensor and/or with the second sensor. The control system may control the one or more sensors. The control system may control one or more components of a building management system (e.g., lightening, security, and/or air conditioning system). The controller may regulate at least one (e.g., environmental) characteristic of the enclosure. The control system may regulate the enclosure environment using any component of the building management system. For example, the control system may regulate the energy supplied by a heating element and/or by a cooling element. For example, the control system may regulate velocity of an air flowing through a vent to and/or from the enclosure. The control system may comprise a processor. The processor may be a processing unit. The controller may comprise a processing unit. The processing unit may be central. The processing unit may comprise a central processing unit (abbreviated herein as "CPU"). The processing unit may be a graphic processing unit (abbreviated herein as "GPU"). The controller(s) or control mechanisms (e.g., comprising a computer system) may be programmed to implement one or more methods of the disclosure. The processor may be programmed to implement methods of the disclosure. The controller may control at least one component of the forming systems and/or apparatuses disclosed herein.

Figure 16:
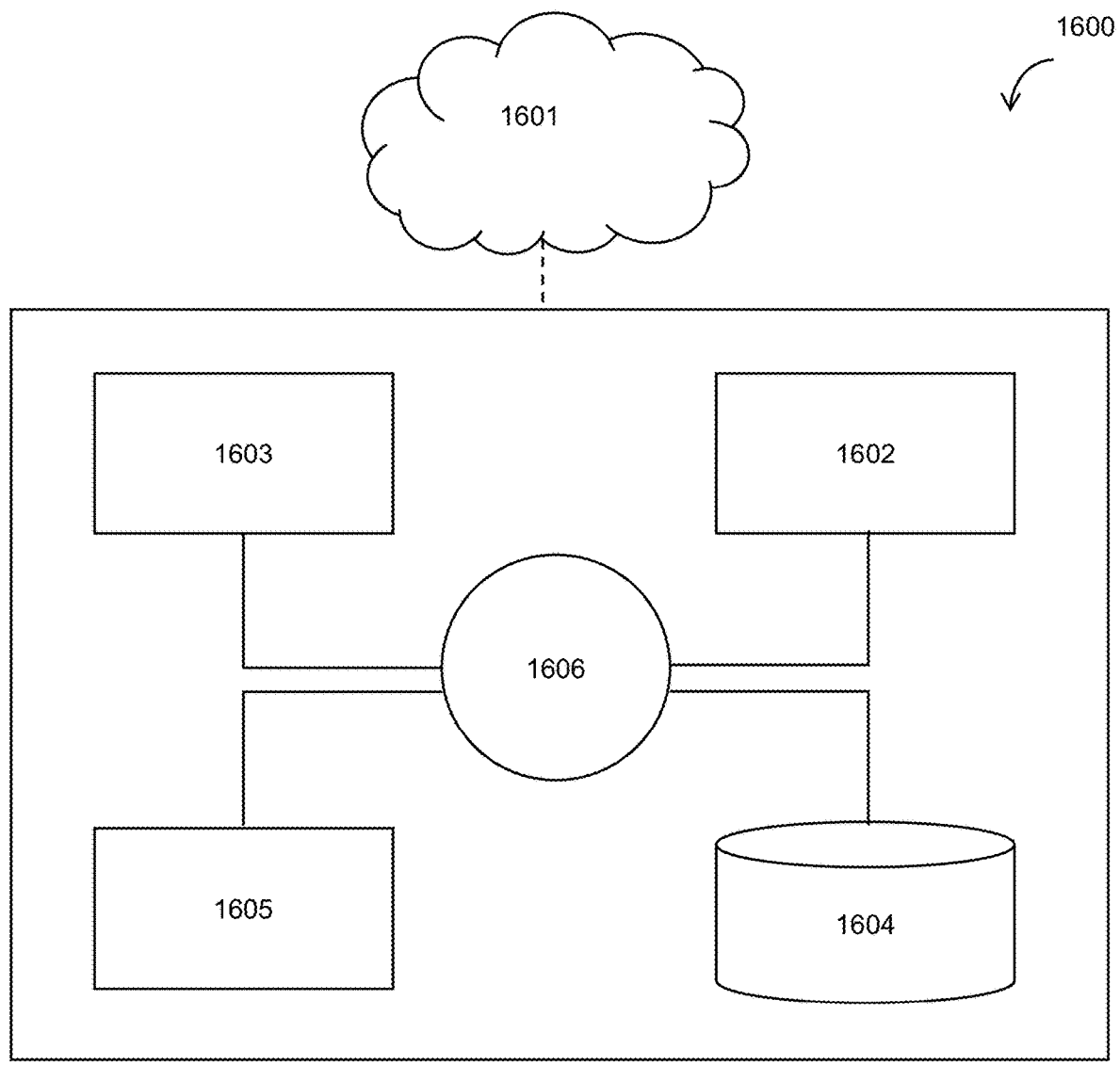
FIG. 16 schematically shows a processing system.

FIG. 16 shows a schematic example of a computer system 1600 that is programmed or otherwise configured to one or more operations of any of the methods provided herein. The computer system can control (e.g., direct, monitor, and/or regulate) various features of the methods, apparatuses and systems of the present disclosure, such as, for example, control heating, cooling, lightening, and/or venting of an enclosure, or any combination thereof. The computer system can be part of, or be in communication with, any sensor or device (e.g., including sensor and/or emitter) ensemble disclosed herein. The computer may be coupled to one or more mechanisms disclosed herein, and/or any parts thereof. For example, the computer may be coupled to one or more sensors, valves, switches, lights, windows (e.g., IGUs), motors, pumps, optical components, or any combination thereof.

In some embodiments, the circuitry is operatively (e.g., communicatively) coupled to a network of the enclosure (e.g., facility comprising a building). The circuitry may comprise a driver board, or a controller. The controller may be any controller disclosed herein (e.g., timing controller, touch screen controller, and/or any controller of the (e.g., hierarchical) control system). The controller may be operatively coupled to a device ensemble. The device ensemble may comprise a sensor or an emitter. For example, the device ensemble may comprise a plurality of sensors, a plurality of emitters, or any combination thereof. The emitter may be a light (e.g., LED) or a sound (e.g., buzzer or loudspeaker) emitter. The sensor may sense any environmental characteristic of the environment (e.g., light, temperature, chemical content (e.g., of the atmosphere), or sound). The chemical content may comprise volatile organic compounds (VOCs), carbon dioxide, oxygen, carbon monoxide, hydrogen sulfide, or humidity. The control system may be configured to control (e.g., via the network) the environment, e.g., using a building management system. The control system may be configured to control (e.g., via the network) a ventilation, heating, air conditioning, cooling, lighting, security, safety, fire, or sound system of the enclosure (e.g., facility). The control system may be configured to control (e.g., via the network) the at least one tintable window, display construct, and/or touch screen. The network may facilitate updating any of the software (e.g., non-transitory computer readable media) associated with the devices to which it is operatively (e.g., communicatively) coupled. The network may facilitate updating any of the logic (e.g., control logic) associated with the devices to which it is operatively (e.g., communicatively) coupled. The logic may be embedded in a software. The network may facilitate updating any of the data streams associated with the devices to which it is operatively (e.g., communicatively) coupled. The update may be in real-time. The network may facilitate a response time and/or update time having a delay of at most about 2 milliseconds (ms), 3 ms, 4 ms, 5 ms, 7 ms, 10 ms, or 15 ms. The network may facilitate low latency communication. The display construct, touch screen functionality, and/or tintable window may (e.g., each) have a unique identification (alphanumeric) code. The display construct, touch screen functionality, and/or tintable window may (e.g., each) be uniquely recognized by the network and/or control system. The display construct, touch screen functionality, and/or tintable window may (e.g., each) be uniquely identified as a device and/or node by the network and/or control system.

In some embodiments, the device (e.g., display construct, touch screen functionality, and/or tintable window) is communicatively coupled to the network. A third party device and/or data stream (e.g., third party media provider) may utilize a network authentication protocol, e.g., to communicate with the control system and/o with another device. The network authentication protocol may open one or more ports for network access. The port(s) may be opened when an organization and/or a facility authenticates (e.g., through network authentication) an identity of a device that attempts to operatively couple (and/or physically couples) to the network. Operative coupling may comprise communicatively coupling. The organization and/or facility may authorize (e.g., using the network) access of the device to the network. The access may or may not be restricted. The restriction may comprise one or more security levels. The identity of the device can be determined based on the credentials and/or certificate. The credentials and/or certificate may be confirmed by the network (e.g., by a server operatively coupled to the network). The authentication protocol may or may not be specific for physical communication (e.g., Ethernet communication) in a local area network (LAN), e.g., that utilizes packets. The standard may be maintained by the Institute of Electrical and Electronics Engineers (IEEE). The standard may specify the physical media (e.g., target apparatus) and/or the working characteristics of the network (e.g., Ethernet). The networking standard may support virtual LANs (VLANs) on a local area (e.g., Ethernet) network. The standard may support power over local area network (e.g., Ethernet). The network may provide communication over power line (e.g., coaxial cable). The power may be direct current (DC) power. The power may be at least about 12 Watts (W), 15 W, 25 W, 30 W, 40 W, 48 W, 50 W, or 100 W. The standard may facilitate mesh networking. The standard may facilitate a local area network (LAN) technology and/or wide area network (WAN) applications. The standard may facilitate physical connections between target apparatuses and/or infrastructure devices (hubs, switches, routers), e.g., by various types of cables (e.g., coaxial, twisted wires, copper cables, and/or fiber cables). Examples of network authentication protocols can be 802.1X, or KERBEROS. The network authentication protocol may comprise secret-key cryptography. The network can support (e.g., communication) protocols comprising 802.3, 802.3af (PoE), 802.3at (PoE+), 802.1Q, or 802.11s. The network may support a communication protocol for Building Automation and Control (BAC) networks (e.g., BACnet). PoE communication may be facilitated using a cable such as a twisted pair cable, or coaxial cable. The cable may comprise an IX Industrial Cable, or IX extreme-performance polymer locked wireline cable. The protocol may define service(s) used to communicate between various devices coupled to the network. The one or more devices include sensors, emitters, tintable windows, display constructs, touch screen functionality, controllers, transceivers, antennas, third party media provider related equipment, personal computers, mobile circuitry (e.g., laptop, cellular phone, touch pad), and/or any other (e.g., third party) devices. The protocol services may include device and object discovery (e.g., Who-Is, I-Am, Who-Has, and/or I-Have). The protocol services may include Read-Property and Write-Property (e.g., for data sharing). The network protocol may define object types (e.g., that are acted upon by the services). The protocol may define one or more data links and/or physical layers (e.g., ARCNET, Ethernet, BACnet/IP, BACnet/IPv6, BACnet/MSTP, Point-To-Point over RS-232, Master-Slave/Token-Passing over RS-485, ZigBee, and/or LonTalk). The protocol may be dedicated to devices (e.g., Internet of Things (IoT) devices and/or machine to machine (M2M) communication). The protocol may be a messaging protocol. The protocol may be a publish-subscribe type protocol. The protocol may be configured for messaging transport. The protocol may be configured for remote devices. The protocol may be configured for devices having a small code footprint and/or minimal network bandwidth. The small code footprint may be configured to be handled by microcontrollers. The protocol may have a plurality of quality of service levels including (i) at most once, (ii) at least once, and/or (iii) exactly once. The plurality of quality of service levels may increase reliability of the message delivery in the network (e.g., to its target). The protocol may facilitate messaging (i) between device to cloud and/or (ii) between cloud to device. The messaging protocol is configured for broadcasting messages to groups of devices (e.g., as described herein) such sensors, and/or emitters. The protocol may comply with Organization for the Advancement of Structured Information Standards (OASIS). The protocol may support security schemes such as authentication (e.g., using tokens). The protocol may support access delegation standard (e.g., OAuth). The protocol may support granting a first application (and/or website) access to information on a second application (and/or website) without providing the second with a security code (e.g., token and/or password) relating to the first application. The protocol may comprise a Message Queuing Telemetry Transport (MQTT) or Advanced Message Queuing Protocol (AMQP) protocol. The protocol may be configured for a message rate of at least one (1) message per second (e.g., per publisher), or more messages per second (e.g., per publisher). The protocol may be configured to facilitate a message payload size of at most about 64, 86, 96, or 128 bytes. The protocol may be configured to communicate with any device (e.g., from a microcontroller to a server) that operates a protocol compliant (e.g., MQTT) library and/or connects to compliant broker (e.g., MQTT broker) over a network. Each device (e.g., target apparatus, sensor, or emitter) can be a publisher and/or a subscriber. At least one broker can handle millions of concurrently connected devices, or less than millions. The broker can handle at least about 100, 10000, 100000, 1000000, or 10000000 concurrently connected devices. In some embodiments, the broker is responsible for receiving at least a portion (e.g., all) of the messages, filtering the messages, determining who is interested in each message, and/or sending the message to these subscribed device (e.g., broker client). The protocol may require internet connectivity to the network. The protocol may facilitate bi-directional, and/or synchronous peer-to-peer messaging. The protocol may be a binary wire protocol. Examples of such network protocol, control system, and network can be found in U.S. Provisional Patent Application Ser. No. 63/000,342, filed Mar. 26, 2020, titled "MESSAGING IN A MULTI CLIENT NETWORK," which is incorporated herein by reference in its entirety.

In some embodiments the controller(s) directly associated with the display construct is operatively coupled to one or more controllers of the facility. The one or more controllers of the facility may be a hierarchical control system. For example, the display construct may be operatively coupled to one or more controllers of the facility may be via a Power over Ethernet connection.

The computer system can include a processing unit (e.g., 1606) (also "processor," "computer" and "computer processor" used herein). The computer system may include memory or memory location (e.g., 1602) (e.g., random-access memory, read-only memory, flash memory), electronic storage unit (e.g., 1604) (e.g., hard disk), communication interface (e.g., 1603) (e.g., network adapter) for communicating with one or more other systems, and peripheral devices (e.g., 1605), such as cache, other memory, data storage and/or electronic display adapters. In the example shown in FIG. 16, the memory 1602, storage unit 1604, interface 1603, and peripheral devices 1605 are in communication with the processing unit 1606 through a communication bus (solid lines), such as a motherboard. The storage unit can be a data storage unit (or data repository) for storing data. The computer system can be operatively coupled to a computer network ("network") (e.g., 1601) with the aid of the communication interface. The network can be the Internet, an internet and/or extranet, or an intranet and/or extranet that is in communication with the Internet. In some cases, the network is a telecommunication and/or data network. The network can include one or more computer servers, which can enable distributed computing, such as cloud computing. The network, in some cases with the aid of the computer system, can implement a peer-to-peer network, which may enable devices coupled to the computer system to behave as a client or a server.

The processing unit can execute a sequence of machine-readable instructions, which can be embodied in a program or software. The instructions may be stored in a memory location, such as the memory 1602. The instructions can be directed to the processing unit, which can subsequently program or otherwise configure the processing unit to implement methods of the present disclosure. Examples of operations performed by the processing unit can include fetch, decode, execute, and write back. The processing unit may interpret and/or execute instructions. The processor may include a microprocessor, a data processor, a central processing unit (CPU), a graphical processing unit (GPU), a system-on-chip (SOC), a co-processor, a network processor, an application specific integrated circuit (ASIC), an application specific instruction-set processor (ASIPs), a controller, a programmable logic device (PLD), a chipset, a field programmable gate array (FPGA), or any combination thereof. The processing unit can be part of a circuit, such as an integrated circuit. One or more other components of the system 1600 can be included in the circuit.

The storage unit can store files, such as drivers, libraries and saved programs. The storage unit can store user data (e.g., user preferences and user programs). In some cases, the computer system can include one or more additional data storage units that are external to the computer system, such as located on a remote server that is in communication with the computer system through an intranet or the Internet.

The computer system can communicate with one or more remote computer systems through a network. For instance, the computer system can communicate with a remote computer system of a user (e.g., operator). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. A user (e.g., client) can access the computer system via the network.

Methods as described herein can be implemented by way of machine (e.g., computer processor) executable code stored on an electronic storage location of the computer system, such as, for example, on the memory 1602 or electronic storage unit 1604. The machine executable or machine-readable code can be provided in the form of software. During use, the processor 1606 can execute the code. In some cases, the code can be retrieved from the storage unit and stored on the memory for ready access by the processor. In some situations, the electronic storage unit can be precluded, and machine-executable instructions are stored on memory.

The code can be pre-compiled and configured for use with a machine have a processer adapted to execute the code or can be compiled during runtime. The code can be supplied in a programming language that can be selected to enable the code to execute in a pre-compiled or as-compiled fashion.

In some embodiments, the processor comprises a code. The code can be program instructions. The program instructions may cause the at least one processor (e.g., computer) to direct a feed forward and/or feedback control loop. In some embodiments, the program instructions cause the at least one processor to direct a closed loop and/or open loop control scheme. The control may be based at least in part on one or more sensor readings (e.g., sensor data). One controller may direct a plurality of operations. At least two operations may be directed by different controllers. In some embodiments, a different controller may direct at least two of operations (a), (b) and (c). In some embodiments, different controllers may direct at least two of operations (a), (b) and (c). In some embodiments, a non-transitory computer-readable medium cause each a different computer to direct at least two of operations (a), (b) and (c). In some embodiments, different non-transitory computer-readable mediums cause each a different computer to direct at least two of operations (a), (b) and (c). The controller and/or computer readable media may direct any of the apparatuses or components thereof disclosed herein. The controller and/or computer readable media may direct any operations of the methods disclosed herein.

In some embodiments, at least one display construct and associated integrated glass unit(s) are operated in coordination with one another. Control of the at least one display construct and associated tintable window (e.g., integrated glass unit(s)) may be via integration of the display construct control with control of the tintable window. For example, the display construct and the tintable glass may be operatively (e.g., communicatively) coupled to the control system, e.g., via the network. Control of the at least one display construct may be via Ethernet. A tint level of the tintable window(s) may be adjusted when one or more associated display constructs are in use. The tint level of the tintable window may automatically change (e.g., darken) when the one or more display constructs are in use. Automatically changing (e.g., darkening or lightening) the tint level of the tintable window(s) may be based at least in part on outside radiation and/or display contrast. Automatically changing the tint level of the tintable window may be based at least in part on privacy (e.g., limiting an ability to see the display construct from someone outside of the facility). When the tintable window(s) is in use, a zone of tintable windows may have its tint level (automatically) altered (e.g., darkened or lightened). A zone of tintable windows may comprise a plurality of tintable windows. The zone may comprise (i) tintable windows facing a particular direction of an enclosure (e.g., facility), (ii) a plurality of tintable windows on a particular face (e.g., façade) of a facility, (iii) a tintable windows on a particular floor of a facility, (iv) a plurality of tintable windows in a particular type of room and/or activity (e.g., open space, office, conference room, lecture hall, corridor, reception hall, or cafeteria), (v) tintable windows disposed on the same fixture (e.g., internal or external wall), and/or (vi) a plurality of tintable windows that are user defined (e.g., a group of tintable windows in a room or on a façade that are a subset of a larger group of tintable windows, for example, a conference room with a display construct on one of eight tintable windows may darken the tint of eight tintable windows—the zone). The (automatic) tinting of the tintable window may be based at least in part on whether the display construct is showing active content (e.g., content intended for user viewing) or inactive content. The automatic changing of the tint level of the tintable window when the at least one display construct is in use, may be overridden by a user (e.g., by manually adjusting the tint level). A user may override the automatic tinting of the tintable window(s) using mobile circuitry (e.g., a remote controller, a virtual reality controller, a cellular phone, an electronic notepad, a laptop computer and/or by a similar mobile device).

In some embodiments, at least one display construct and associated tintable window(s) may be adjacent to a heat dissipation system (e.g., heater). Heat adjacent to the display construct (e.g., heat generated by the display construct, any touch screen, circuitry, power supply, adjacent sensors, adjacent emitters, and/or sun radiation (e.g., transmitted through the tintable window)) may be dissipated. The heat may be transferred via conduction, convection, and/or electromagnetic waves (radiation). The heat may be actively or passively removed. Heat may be removed via convection and/or conduction. The active heat removal may be controlled (e.g., using the control system). Active (e.g., forced) convection (e.g., fans) may create air flow to dissipate heat adjacent to the display construct(s). The air flow may be in gaps (e.g., between the tintable window(s) and the display construct(s)). One or more temperature sensor(s) adjacent to, or integrated with, the display construct(s) and/or operatively coupled to the display construct may sense a temperature and signal to initiate forced convection when a first (high) temperature threshold is reached. The temperature sensor(s) may (automatically) shut down the display construct(s) when a second (higher) temperature threshold is reached (e.g., to prevent malfunction and/or damage). The damage may be permanent or temporary. The first temperature threshold may be of a lower temperature value than the second temperature threshold. The threshold may depend on ambient temperature. Ambient temperature may include temperature external to the enclosure in which the display construct is disposed, or temperature in the enclosure in which the display construct is disposed. Thermal heat penetrating through the tintable window(s) may be limited (e.g., via a use of low emissivity (Lo-E) glass), e.g., to reduce a thermal load on the display construct(s).

In some embodiments, an operation of at least one display construct and associated tintable window(s) includes maintenance tasks associated with the display construct(s). Control of maintenance tasks of the display construct (e.g., pixel compensation, temperature, usage and/or resetting) may be automatic (e.g., using the control system). Pixel compensation may include adjusting a brightness of a pixel in the display construct based at least in part on how that pixel has been used over its lifetime. For example, what wavelength and/or intensity the pixel emitted, and optionally for how long. For example, how frequently was the wavelength and/or intensity projected by the pixel. For example, what has been displayed by that pixel (e.g., video with motion or static display). The display construct temperature, the fan speed, the extent of display construct usage, and/or the type of display construct usage, may be monitored over time. Monitoring may by a control system.

Monitoring may utilize a sensor coupled to the network (e.g., and to the control systems). The monitoring may be in situ and/or in real time while the display construct is projecting media. The control system may utilize image processing to assess the status of one or more emitting entities (e.g., LEDs or other lights) of the display construct. The sensor may comprise a camera (e.g., stills or video camera). The camera may comprise a pixel array (e.g., charge-coupled device (CCD) camera). The camera may be configured for digital imaging (e.g., CCD or a complementary metal-oxide-semiconductor (CMOS) camera). The camera may comprise a photographic plate. The camera may be sensitive to color gamut (e.g., the full range of colors visible to an average human eye). The control system may monitor the display construct continuously and/or intermittently (e.g., at predetermined intervals). The control system may record data relating to monitoring the display construct continuously or intermittently. The data may be recorded at predetermined intervals and/or when a threshold has been reached. The threshold may be thermal, electrical, and/or optical threshold. The threshold may be time dependent (e.g., temperature of over 50° C. for more than about 1 minute). The display construct adjustment (e.g., reset) may be based at least in part on such monitoring of the display construct (e.g., optical, thermal, and/or electrical) properties (e.g., depending on a time threshold). The threshold may be a value or a function (e.g., time and/or space dependent function). Space may relate to a type of enclosure in which the display construct is disposed. For example, a display construct in a conference room may have a lower error tolerance than a display construct in a corridor. The monitoring of the display construct may provide predictions regarding the life of component(s) of the display construct (e.g., pixels, electrical circuitry, filter and/or fan). Monitoring the display construct (e.g., over time) may proactively compensate for any predicted decay in components related to, or of, the display construct (e.g., pixels, electrical circuitry, filter and/or fan). Monitor and/or diagnostics of the display construct may be via a network (e.g., a network disposed, at least in part, in a skin of the facility). Monitoring and/or diagnostics of the display construct may be by a control system. Adjusting (e.g., resetting) the display construct may include (automatically and/or controllably) turning the display construct off and on. The display construct may be cycled once per time interval (e.g., every at least about 24 hours, 36 hours, 48 hours, or 72 hours), e.g., if the pixels of the display construct may be susceptible to malfunction (e.g., burn failures). The time interval may depend on the type of predicted failure and/or its extent (e.g., predicted failure of one pixel, or predicted failure of a group of pixels). The time interval for cycling may depend on the type of viewing of the display construct. For example, static viewing done for longer than a predetermined threshold of time (e.g., use the display construct as a sign) may increase the risk of pixel malfunction (e.g., failure). More frequent on/off cycling when the display construct is used for static viewing as opposed to video with movement, may reduce the risk of pixel malfunction in static viewing. The control system may predict (e.g., via a software module) maintenance and/or replacement of the display construct or any of its components (e.g., based on the monitored pixel status). The predictions may be based at least in part on real-time sensor measurements of an output of the display construct (e.g., as compared to an expected output). The predictions may be based at least in part on prior sensor measurements of an output of the display construct (e.g., as compared to an expected output), e.g., done in a laboratory or other test facility (e.g., fatigue tests). The predictions may be based at least in part on observation of the display construct to be maintained/replaced. The predictions may be based at least in part on observation of other display construct (e.g., a test display construct) than the one to be maintained/replaced. The predictions may be based at least in part on average pixel status, e.g., considering the irradiation profile of the display construct and/or any of its individual pixels. The control system may provide notification regarding anticipated replacement and/or maintenance. Such predictions may allow performance of proactive maintenance and/or replacement. Such predictions may allow prospective stocking of respective display constructs to be maintained and/or replaced. Such predictions may allow for timely scheduling of personnel that would perform such maintenance and/or replacement.

In some embodiments, the display construct lifetime is expanded using one or more compensatory procedures (e.g., methods). The compensatory procedure(s) may be initiated on detection of compromise of the emitting components of the display construct (e.g., emitting pixels such as LED pixels). A compensatory procedure may be initiated automatically (e.g., by one or more controllers, e.g., a control system), e.g., as disclosed herein. A compensatory procedure may be initiated by the user, e.g., through the APP. The APP may prompt the user to initiate compensatory procedure and/or to select compensatory procedures. There may be one, two, three, or more compensatory methods available to the app. The compensatory procedures may differ from each other (i) in the maximum current intensity provided to the emitting entities (e.g., pixels such including LED), (ii) in the timing sequence (e.g., frequency) in which the current is provided to the emitting entities of the display construct, (iii) in any ramp up of the current, (iv) in any ramp down of the current, (v) in any hold value of the current, (vi) in a manner (e.g., function type) of current dependency on time, or (vii) any combination thereof. The function may include a top hat type function, and/or a gradual function (e.g., including ramping up and/or ramping down of the current). The gradual function may include linear, trigonometric, and/or exponential portions.

Figure 18:
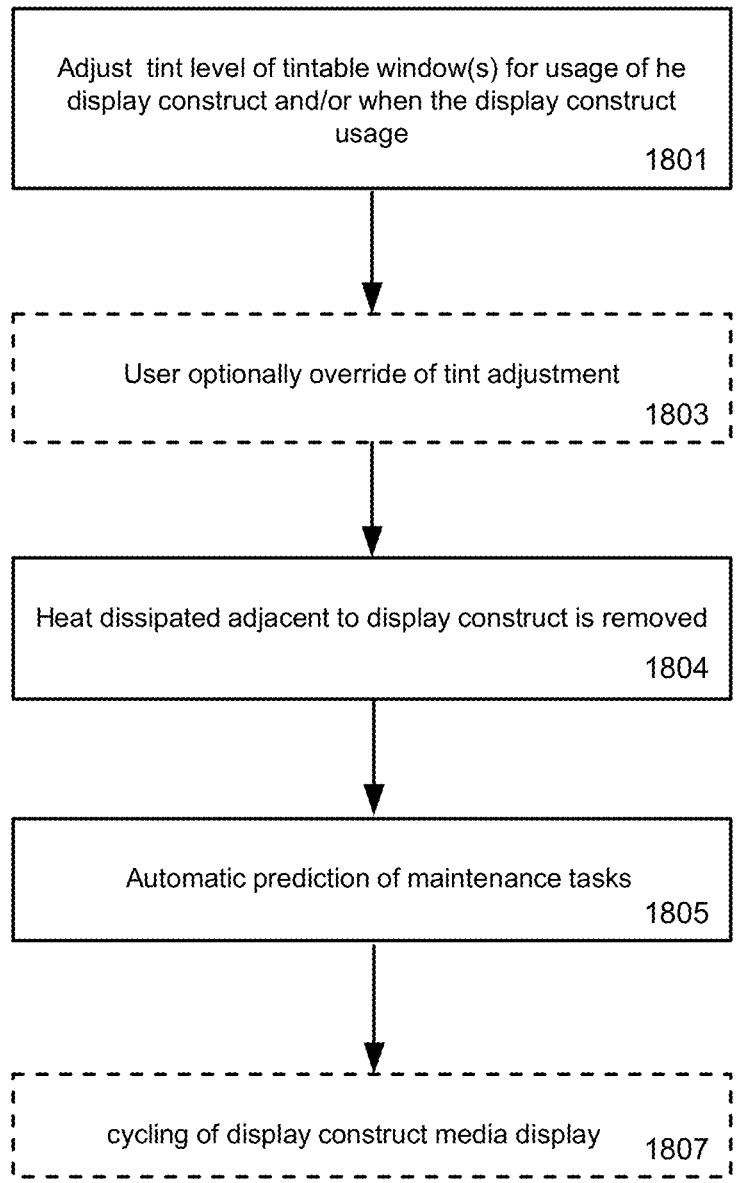
FIG. 18 is a flow chart showing an example of an operating method for a display construct.

FIG. 18 shows an example of operations related to at least one display construct and associated tintable window(s). Control of the at least one display construct and associated tintable window(s) may be via integration of the display construct control with control of the tintable window(s). Control of the at least one display construct may be via the network. In block 1801, a tint level of at least one tintable window is adjusted when one or more associated display construct(s) is in use and/or in preparation for the display construct's usage. For example, the tint level of the tintable window(s) may automatically darken when the one or more display construct(s) is in use. Automatically darkening the tint level of the at least one tintable window may be based at least in part on (i) outside radiation, (ii) media displayed on the display contrast, (iii) type of media displayed (e.g., static or changing), and/or (iv) privacy request. Automatically darkening the tint level of the tintable window(s) may be based at least in part on privacy (e.g., limiting an ability to see the display construct from someone outside of the facility). When one or more display constructs is in use, a zone of tintable windows may have their tint level altered (e.g., darkened). A zone of tintable windows may include a plurality of tintable windows facing a particular direction in a facility, may be a plurality of tintable windows on a particular face of a facility, may be a plurality of tintable windows on a particular floor of a facility, may be a plurality of tintable windows in a particular type of room (e.g., open space, office, conference room, lecture hall, cafeteria), and/or may be a plurality of tintable windows that are user defined (e.g., a group of tintable windows in a room or on a facade that are a subset of a larger group of tintable windows, for example, a conference room with a display construct on one of eight tintable windows may darken the tint of eight tintable windows—the zone). The zone may be any zone disclosed herein. The automatic tinting of the tintable window may be based at least in part on whether the display construct is showing active content (e.g., content intended for user viewing) or inactive content. In block 1803, the automatic darkening of the tint level of the tintable window may be overridden by a user manually adjusting the tint level of the one or more tintable windows. A user may override the automatic tinting of the tintable window(s) using mobile circuitry (e.g., a remote controller, a virtual reality controller, a cellular phone, an electronic notepad and/or a laptop computer). In block 1804, heat adjacent to the display construct (e.g., heat generated by any components related to the display construct and/or sun radiation transmitted through the tintable window) may be dissipated and passively and/or actively (e.g., controllably) removed (e.g., using automatic actuation of fans or any other heat exchangers). A temperature sensor adjacent to, or integrated with, the display construct may sense the temperature and signal to start the active heat exchange operation (e.g., initiating forced convection) when a first high temperature threshold is reached. The temperature sensor may shut down the display construct(s) when a second higher temperature threshold is reached.

Operation 1805 shows (e.g., automating) prediction and/or anticipation of maintenance task(s) of the display construct (e.g., pixel compensation, temperature, usage and/or resetting). Pixel compensation may include adjusting a brightness of a pixel in the display construct based at least in part on how much that pixel has been used, how often that pixel has been used and/or what has been displayed by that pixel (e.g., video with motion or static display). The display construct temperature, the active heat exchange intensity (e.g., fan speed) and/or the amount of display construct usage, may be monitored. The display construct adjustment (e.g., reset) may be based at least in part on the monitoring of the display construct properties. As the pixels deteriorate, they may require more current and/or voltage to produce a requested output. The display construct adjustment may comprise adjusting intensity of one or more pixels of the display construct to generate the requested output. The monitoring of the display construct may provide predictions regarding the status and/or predicted lifespan of components in the display construct (e.g., pixels, electrical circuitry, filter and/or fan). The control system may notify and/or proactively compensate for any predicted decay in components related to the display construct. Monitoring and/or diagnostics of the display construct may be via a network, which may be disposed, at least in part, in a skin of the facility. In block 1807 the display construct is optionally adjusted and/or reset. The adjustment and/or resent may include automatically turning the display construct off and on, e.g., to crease pixel lifespan and/or reduce pixel output malfunction.

In some embodiments, an operation of at least one display construct and associated tintable window(s) is based at least in part on a status of at least one display construct. A status of the display construct may be examined, monitored, and/or verified as to whether the at least one display construct is on. If the at least one display construct is not on, then a default and/or manual tint level of the tintable window(s) may be activated. The (e.g., on/off) status of the display construct may be periodically checked. If the at least one display construct is on (e.g., operating), then a determination may be made whether the display construct is displaying active or passive content. If the display construct is not on (e.g., not displaying media), then a default or manual tint level of the tintable window(s) may be activated. If the display construct is displaying active content, (i) a zone of tintable windows in proximity to the display construct(s) displaying active content may be identified, (ii) may have the tint level identified of the windows in the zone (e.g., different tint level based at least in part on presence of sun radiation, sun glare and/or desired contrast) and/or (iii) may adjust the tint levels of the tintable windows in the identified zone.

Figure 19:
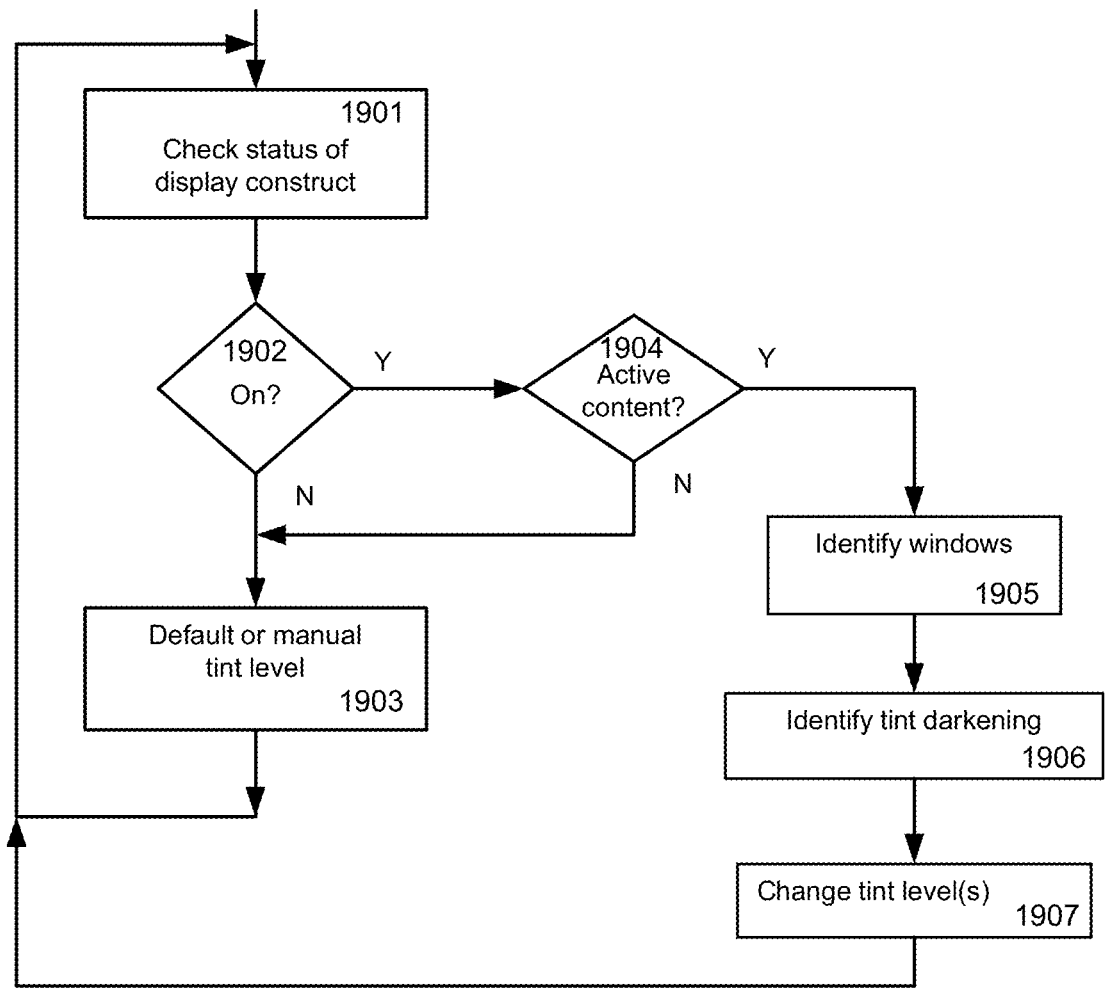
FIG. 19 is a flow chart showing an example of an operating method for a display construct.

FIG. 19 shows an example of control operations relating to at least one display construct and associated tintable window(s). A status of the at least one display construct is checked in block 1901. In block 1902, the control system determines whether the at least one display construct is on (e.g., at least one pixel is controllably emitting radiation). If the at least one display construct is not on, then a default or manual tint level of the tintable window(s) is activated in block 1903, and the status of the display construct is periodically checked. If the at least one display construct is on, then a determination may be made whether the display construct is displaying active content in block 1904. If not, then a default or manual tint level of the tintable window(s) may be activated in block 1903, and the status of the display construct is periodically checked. If the display construct is displaying active content, tintable window(s) in proximity to the display construct(s) displaying active content is identified in block 1905. The tintable window(s) may have their tint level identified (e.g., different tint level based at least in part on presence of sun/glare and desired contrast) in block 1906, and any tint level adjustment is made to the tintable windows in block 1907. The tintable windows may be part of the zone (e.g., and the zone may be identified by the controller), or not part of the zone. If a first tintable window coupled to a display construct is part of a zone that comprises at least one second tintable window not coupled to a display construct. The tint of the second tintable window may or may not be altered to the tint of the first tintable window. Altering tint of other windows in the zone in concert with alteration of the tint of the tintable window that is coupled with the display construct, may be predetermined, and/or determined by a user.

In some embodiments, a plurality of display constructs is connected together in a control scheme. A plurality of display constructs may be mounted adjacent to one or tintable windows. The tintable windows may be connected (e.g., wired or wirelessly), via local (e.g., window) controllers as part of a control system. The control system may comprise a distributed network of controllers coupled to a power and/or communication network. The control system can control various functions (e.g., functions of a facility (e.g., office building, warehouse, etc.)), which may include adjusting the tint of the tintable window(s) and/or displaying media content on the display construct. The display constructs may be connected (e.g., wired or wirelessly), via a display interface that may be housed in one or more housings. The display interface housing may be referred to herein as electrical-box ((E)-box) e.g., 2006. The E-Box may be operatively coupled (e.g., for power and/or communication) to the network. The network may provide data and/or power to the display constructs. A user content server may provide data through the network to be displayed on the display constructs and/or may provide data and power to the display interface via one or more connections to the display interface. The display interface may include an adapter (e.g., Ethernet adapter (e.g., RS-485-to-ethernet)) and/or the E-boxes may include native adapter (e.g., Ethernet/IP) support. The E-box may send prompts and/or respond to queries from the network. The connection of devices for data transmission may include, for example, Ethernet, USB (e.g., USB 2.0), HDMI, Display Port, Thunderbolt, port under RS-485 standard, port under RS-422, port under RS-232 standard, and/or other types of connections for data and/or media transmission. The connection may facilitate an extensive operational distance (e.g., between a transmitter and a receiver) over a distance of at least about 10 feet ('), 15', 20', 50', 70', 100', 150', 300', 500', 1000', 2000', 3000', or 4000'. The connection may facilitate an extensive operational distance over a distance of at least about 10 meters (m), 50m, 100m, 500m, 800m, 1000m, 1200m, or 1500m. Power may be provided to the E-boxes via power-over-internet and/or via separate power cables. The plurality of display constructs may show different content on each display construct, may show the same (e.g., duplicate) content, or may be configured to show one image across multiple display constructs (e.g., such that a section of the image with be shown on each of the plurality of display construct). The connection of display constructs may allow for small numbers (e.g., at most 10, 9, 8, 5, 6, or 4) of display constructs to be controlled via a local controller. In some embodiments, a larger number (e.g., more than 10) display constructs may be coupled via a network (e.g., floor) controller or may allow for all display constructs in a facility to be controlled by a main controller. The display constructs may display media individually (e.g., independent of other display constructs) or a group of display constructs (e.g., at least 2, 4, 6, 8, 10, 20, 25, 50, or 75 display constructs may be arranged in a group (set) of displays), e.g., that may be controlled to display data as if a single display construct (e.g., one media that is respectively parceled among the displays in a display group). The display constructs may form a video wall. The video wall may comprise a plurality of display construct tiled together (e.g., contiguously, or overlapped), in order to form one large screen. The controller controlling the video wall controller may parcel a single image to be projected on the video wall into parts to be displayed on individual display constructs that constitute the video wall. Display constructs may be coupled to a wall (e.g., opaque or transparent), or to a tintable window. The video wall controller may comprise hardware-based controller, or software-based & media-card controller. The hardware based controller may comprise media processing chipsets and may be devoid of an operating system. The software-based & media-card controller may be disposed in a processor having an operating system. The processor may be a server or may be local. The processor may be configured with multiple-output graphic cards and/or video capture input cards.

The display constructs may be configured in layouts. The layouts may comprise matrix grid layouts (e.g., 2×2, 3×3, or 4×4.) of identical display geometries (e.g., having the same aspect ratio). The layouts can comprise layouts of non-identical display geometries (e.g., having different aspect ratios), e.g., in configurations other than symmetrical matrixes. The media content in displayed may be identical, parceled, or entirely different. For example, at least two different parallel contents may be displayed on the video wall of the display constructs.

Figure 20:
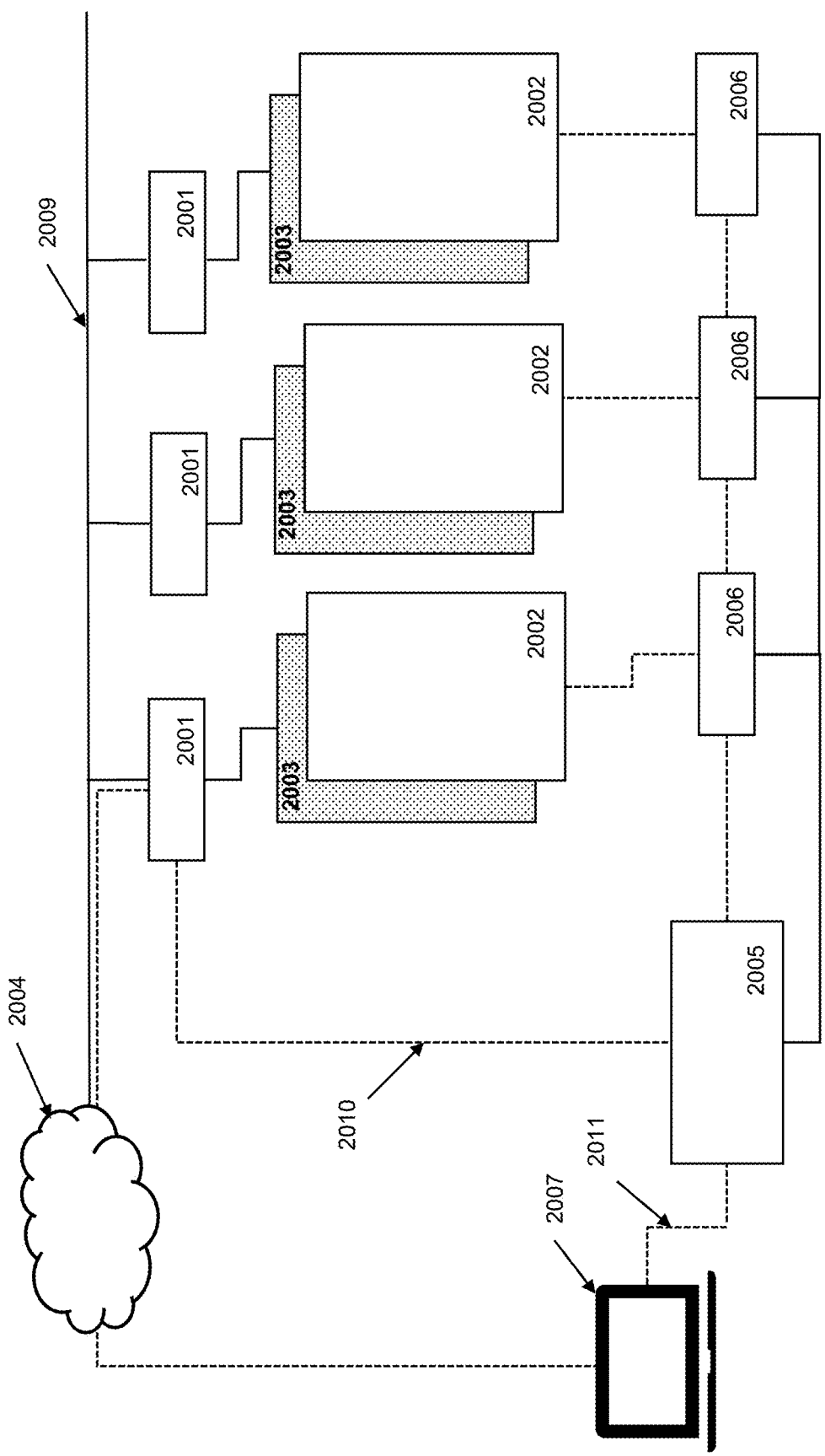
FIG. 20 schematically shows a control scheme for display constructs.

FIG. 20 shows an example of a control scheme for a plurality of display constructs. A plurality of display constructs 2002 may be mounted adjacent to a plurality of tintable windows 2003. The tintable windows 2003 may be connected (e.g., wired and/or wirelessly) 2009, via local (window) controllers 2001, to a control network 2004 that controls various functions of a facility (e.g., office building, warehouse, etc.), which may include adjusting the tint of the tintable windows 2003. The display constructs 2002 may be connected (e.g., wired and/or wirelessly) 2010, via a display interface 2005 and controllers housed within housings (also referred to herein as electrical (E)-boxes) 2006, to control network 2004 (comprising the control system). The control network may be couple via wiring network to the tintable windows and/or display construct, which wiring (e.g., coaxial cables) may provide data and/or power to the display constructs 2002. A user content server 2007 may provide data (e.g., through the wiring and/or control network) to be displayed on the display constructs 2002 and/or may provide data and power to the display interface 2005 via one or more connections 2011 to the display interface 2005. The display interface may include an Ethernet adapter (e.g., RS-485-to-ethernet). The E-boxes 2006 may include native Ethernet/IP support. The E-boxes 2006 may send prompts and/or respond to queries from the network 2004. The connection of devices for data transmission may include, for example, Ethernet, HDMI, Display Port, RS-485 and/or other types of connections for data transmission such as for media content management system (CMS) signal transmission. Power may be provided to the E-boxes 2006 via power-over-internet and/or via separate power cables. The plurality of display constructs 2002 may show different content, the same content, or may be employed to show one image across multiple display constructs 2002 (e.g., as in a video wall).

In some embodiments, a display construct is utilized to display various media in a facility. The display construct may include one or more media displays that may be at least partially transparent, e.g., when the display construct is not operating (e.g., TOLED display). The display construct may be coupled to (e.g., directly or indirectly) to a hard surface such as a wall, a board, or a window (e.g., vision window). The hard surface may be of a fixture. The window may be a tintable window (e.g., an electrochromic window). The window may be disposed in the building, or in an envelope of the building. The vision window may comprise a tintable window that includes an electrochromic widow that can tint (e.g., darken, lighten, and/or alter its color (e.g., hue)), which can provide a background for contrasting the media displayed by the display construct.

In some embodiments, one or more display constructs may be operatively coupled (e.g., mounted) to the hard surface (e.g., window, wall, or board). The coupling may be via a hinge, adhesive, fasteners, and/or by other suitable mechanisms. The coupling may be at least partially disposed within one or more window frame portions. The window frame(s) may include vertical portions (e.g., mullions) and may include horizontal portions (e.g., transoms). The display construct may be directly adhered (e.g., using an adhesive) to the hard surface. The adhesive may or may not contact the window frame (or portion thereof). The hard surface may comprise of a hardened material (e.g., glass, metal, or polymer). The hard surface may comprise a solid (e.g., gypsum, ceramic, concrete and/or stone). Multiple display constructs may be mounted (e.g., via a hinge, adhesive, fasteners, and/or by other mechanism).

In some embodiments, the display construct is controlled by at least one controller. The controller may be part of the control system. The controller may comprise a controller than directly couples (e.g., connects) to the display construct. The connection between the controller and the display construct may be using wired and/or wireless communication. The controller may be coupled to the display construct via a plurality of wiring (e.g., for communication and/or power). The controller may be disposed in a housing. The housing may comprise one or more materials. The material may include elemental metal, metal alloy, polymer (e.g., plastic), resin, wood, glass, composite and/or other materials. The materials may comprise transparent or opaque materials. The material may comprise conductive or insulating (e.g., dielectric) material. The housing may comprise a dispersing or specular material. The housing may have a plurality of faces. At least two (e.g., all) of the plurality of the wiring may extend from one face of the plurality of faces of the controller housing. At times, one controller housing (e.g., comprising one or more controllers) may be coupled to a plurality of display construct. At times, one controller may be (e.g., directly) operatively coupled to one display construct. At times, one controller may be (e.g., directly) operatively coupled to two or more display constructs. Direct coupling may comprise a wire that connects the controller and the display construct. The wire may be an uninterrupted wire. The controller and/or housing may comprise wiring inlets, e.g., compatible with USB standard (e.g., USB 2.0 standard). The wiring inlets may or may not be in the same face as the wiring outlets in the controller housing. At times, a plurality of control housings may be disposed adjacent to each other (e.g., contact each other, or may be directly coupled to each other (e.g., via wiring). At least two of the wiring (e.g., all of the wiring) connecting the controller(s) in at least two different housings (e.g., all of the housings) with at least two (e.g., all) of the display constructs (e.g., in a set of display constructs), may extend (i) from the same face type of the housings and/or (ii) to the same general direction (e.g., upwards, downwards, left, or right). The face type may be assigned according to the direction in which the face faces (e.g., downward face, upward face, eastward face, westward face, northward face, eastward face, or any combination thereof). The directions may be relative to a user facing the display construct, and relative to a gravitational center.

In some embodiments, the controller housing is mounted in a frame portion. The controller housing may be mounted within at least a portion of the window, board, or wall frame. The portion of the frame may be an upper horizontal mullion(s) (transom(s)), within lower horizontal mullion(s) (transom(s)), and/or within the vertical (side) mullions, or a combination of the mullions that form the window frame(s). Upper and lower are relative to the gravitational center. Display connectors may connect a controller to a display construct via one or more cables and/or wires. The display connectors connecting controllers to respective display constructs, which may be via cables, may extend from one face of the plurality of faces of the controller housing or may extend from more than one face of the plurality of faces of the controller housing. At least two (e.g., all) of the cables that connect the controllers to the corresponding display constructs may be (e.g., substantially) of the same length. The cable may extend at least partially within the window frame(s). The cables that connect the controller to the display construct may be of different lengths. The cable may extend at least partially within and/or outside of the window frame(s). The (e.g., local) controller may include power supply connector that may connect, e.g., to one or more electric power supply. Power supply connectors may be disposed in the same face or in a different face from the face from which the data cables to the display construct(s) extend from. The different faces may form an angle, the angle may be (e.g., substantially) a right angle. The different faces may be parallel to each other. Data (e.g., communication and/or media) cable(s) may connect from one or more sources of data (e.g., server(s)) to the controllers. The data cables may connect to a media content provider server and/or a server that controls a level of tint of the window(s). In some embodiments, the power and data are coupled to the display construct via the same cable (e.g., coaxial cable).

In some embodiments, a plurality of devices (e.g., including a sensor and/or emitter) is integrated into a common housing. The housing may include one or more circuit boards. The housing may integrate an ensemble of devices.

The ensemble may have a single housing (e.g., cover). One or more circuit boards (e.g., printed circuit boards PCB) may be disposed in the single housing. At least one controller may be disposed in the housing. The housing may be adapted to mount to a window, wall, ceiling, or any other structure and/or fixture in an enclosure (e.g., a facility, building, or room) to perform various functions. The common assembly of devices (e.g., the ensemble of devices) may include power conditioning components, circuitry (e.g., a processing unit), memory, and/or a network interface. The housing may comprise mounting adapters that can be provided for installing an assembly to at least a portion of a fixture such as a window mullion. The housing may comprise one or more features desirable for optimal performance, such as (I) one or more opening for admitting external environmental characteristic(s) into the housing, (II) electrical and/or electromagnetic (e.g., radio frequency) shielding, and/or (III) heat exchangers (e.g., passive or active). For example, the housing may comprise one or more openings (e.g., holes) that facilitate air flow past the circuit board. The housing may comprise a heat sink. The heat exchangers and/or shields may shield the circuitry from external influences and/or may shield between the circuit boards encapsulated in the housing. The housing may comprise an open body and a lid. The lid may comprise the one or more openings (e.g., holes). The lid may snap into the open body to close the casing. The housing may comprise openings for receiving cabling.

FIG. 21A shows an example of a hard surface 2101 (e.g., a tintable window) mounted (e.g., via a hinge and/or adhesive) within a frame 2102. The frame 2102 includes mullions 2103a and 2103b that are vertical, and transoms 2104a and 2104b (sometimes referred to as horizontal mullions). Two display constructs 2105a and 2105b are mounted (e.g., via a hinge and/or adhesive) within the frame 2102 and cover (e.g., all of) the viewable surface of hard surface 2101 (e.g., viable surface of a board, or of a window such as a tintable window). Two controllers housed within housings (also referred to herein as electrical (E-) boxes) 2106a and 2106b are mounted in a portion of the frame 2102 within the upper (relative to the gravitational center towards which vector 2100 is pointing to) transom 2104a. The circuitry in E-Box 2106a (e.g., including timing controller, network communication (e.g., router), and/or media related circuitry) is connected via wiring 2109a to display construct 2105a. The circuitry in E-Box 2106b is connected via wiring 2109b to display construct 2105b. The display connectors 2108a extend from the housings 2106a in the same downward direction. The display connectors 2108b extend from the housings 2106b in the same downward direction. The connectors 2108a and 2108b are arranged to point to the same downward direction. The cables 2109a and are (e.g., substantially) the same length from each E-box 2106a and 2106b to the respective display constructs 2105a and 2105b, and extend within a portion of the frame 2102. E-box 2106a is configured to connect (e.g., via a connector) to power supply cable 2110a. E-box 2106b is configured to connect (e.g., via a connector) to power supply cable 2110b. At least one power supply cables supplying power to the E-Box circuitry can connect its own power supply sources. At least two power supply cables supplying power to the E-Box circuitry can connect one power supply source. FIG. 21A shows an example in which two power supply cables 2110a and 2110b connect to the same power supply source 2111. The power supply cables 2110a and 2110b extend from each of the E-boxes (e.g., substantially) perpendicular to the direction that the display connectors 2108a and 2108b extend from the E-boxes (e.g., the connectors extend to the same side of the E-box). Media wiring 2112a connect from a source of data (e.g., server) to the circuitry housed in the E-box (e.g., media circuitry board) 2106b. Media wiring 2112b is connected to E-box 2106a and (via E-box 2106b) to cable 2112a and to the source of data 2115. The media cables 2112a and 2112b can connect to a media content provider server. The E-box may be operatively coupled (e.g., wirelessly and/or wired) to the network that is coupled to at least one controller that controls that facility or any controllable device within the facility. For example, in the event that the hard surface 2101 is a tintable window, any (e.g., all) of the E-box may be operatively coupled to the at least one controller that controls a level of tint of this window, e.g., via the media cables (e.g., 2112a and/or 2112b) or via dedicated cables (not shown in FIG. 21A).

FIG. 21B shows an example of a hard surface 2121 (e.g., a tintable window) mounted (e.g., via a hinge and/or adhesive) within a frame 2122. The frame 2122 includes mullions 2123a and 2123b that are vertical, and transoms 2124a and 2124b (sometimes referred to as horizontal mullions). Four display constructs 2125a, 2125b, 2125c and 2125d are mounted (e.g., via a hinge and/or adhesive) within the frame 2122 and cover all of the viewable surface of hard surface 2121 (e.g., viable surface of a board, or of a window such as a tintable window). Four controllers housed within housings (also referred to herein as electrical (E)-boxes) 2126a, 2126b, 2126c and 2126d are mounted in a portion of the frame 2122 within the upper (relative to the gravitational center towards which vector 2120 is pointing to) transom 2124a. The circuitry in E-Box 2126a (e.g., including timing controller, network and/or media related circuitry) is connected via wiring 2129a to display construct 2125a. The circuitry in E-Box 2126b is connected via wiring 2129b to display construct 2125b. The circuitry in E-Box 2126c (e.g., including timing controller and media related circuitry) is connected via wiring 2129c to display construct 2125c. The circuitry in E-Box 2126d is connected via wiring 2129d to display construct 2125d. The display connectors 2128a extend from the housings 2126a in the same downward direction. The display connectors 2128b extend from the housings 2126b in the same downward direction. The display connectors 2128c extend from the housings 2126c in the same downward direction. The display connectors 2128d extend from the housings 2126d in the same downward direction. The connectors 2128a, 2128b, 2128c and 2128d are arranged to point to the same downward direction. The cables 2129a and are (e.g., substantially) the same length from each E-box 2126a, 2126b, 2126c and 2126d to the respective display constructs 2125a, 2125b, 2125c and 2125d, and extend within a portion of the frame 2102. E-box 2126a is configured to connect (e.g., via a connector) to power supply cable 2130a. E-box 2126b is configured to connect (e.g., via a connector) to power supply cable 2130b. E-box 2126c is configured to connect (e.g., via a connector) to power supply cable 2130c. E-box 2126d is configured to connect (e.g., via a connector) to power supply cable 2130d. At least one power supply cables supplying power to the E-Box circuitry can connect its own power supply sources. At least two or more power supply cables supplying power to the E-Box circuitry can connect one power supply source. FIG. 21B shows an example in which four power supply cables 2130a, 2130b, 2130c and 2130d connect to the same power supply source 2131. The power supply cables 2130a, 2130b, 2130c and 2130d extend from each of the E-boxes (e.g., substantially) perpendicular to the direction that the display connectors 2128a, 2128b, 2128c and 2128d extend from the E-boxes. Media wiring 2132a connect from a source of data (e.g., server) to the circuitry housed in the E-box (e.g., media circuitry board) 2126d. Media wiring 2132b is connected to E-box 2126c and (via E-box 2126d) to cable 2132a and to the source of data 2135. Media wiring 2132c is connected to E-box 2126b and (via E-boxes 2126d and 2126c) to cable 2132a and to the source of data 2135. Media wiring 2132d is connected to E-box 2126a and (via E-boxes 2126d, 2126c and 2126b) to cable 2132a and to the source of data 2135. The media cables 2132a, 2132b, 2132c and 2132d can connect to a media content provider server. The E-box may be operatively coupled (e.g., wirelessly and/or wired) to the network that is coupled to at least one controller that controls that facility or any controllable device within the facility. For example, in the event that the hard surface 2121 is a tintable window, any (e.g., all) of the E-box may be operatively coupled to the at least one controller that controls a level of tint of this window, e.g., via the media cables (e.g., 2132a, 2132b, 2132c and/or 2132d) or via dedicated cables (not shown in FIG. 21B).

FIG. 22A shows an example of hard surfaces 2221a and 2221b (e.g., tintable windows) mounted (e.g., via a hinge and/or adhesive) within frames 2222a and 2222b. The frames 2222a and 2222b include mullions 2223 that are vertical, and transoms 2224 (sometimes referred to as horizontal mullions). Two display constructs 2225a, 2225b are mounted within frame 2222a, and two display constructs 2225c and 2225d are mounted within the frame 2222b and cover all of the viewable surface of hard surfaces 2221a and 2221b (e.g., viable surface of a board, or of a window such as tintable windows). Four controllers housed within housings (also referred to herein as electrical (E)-boxes) 2226a, 2226b, 2226c and 2226d are mounted in a portion of the frames 2222a and 2222b within the vertical side (relative to the gravitational center towards which vector 2220 is pointing to) mullions 2223. The circuitry in E-Box 2226a (e.g., including timing controller and media related circuitry) is connected via wiring 2229a to display construct 2225a. The circuitry in E-Box 2226b is connected via wiring 2229b to display construct 2225b. The circuitry in E-Box 2226c (e.g., including timing controller, network components and/or media related circuitry) is connected via wiring 2229c to display construct 2225c. The circuitry in E-Box 2226d is connected via wiring 2229d to display construct 2225d. The display connectors 2228a, 2228b, 2228c and 2228d extend from the respective housings 2226a, 2226b, 2226c and 2226d in the same horizontal direction. The connectors 2228a, 2228b, 2228c and 2228d are arranged to point to the same horizontal direction. The cables 2229a, 2229b, 2229c, and 2229d are (e.g., substantially) the same length from each E-box 2226a, 2226b, 2226c and 2226d to the respective display constructs 2225a, 2225b, 2225c and 2225d, and extend within portions of the frames 2222a and 2222b. The E-boxes may be operatively coupled (e.g., wirelessly and/or wired) to the network that is coupled to at least one controller that controls that facility or any controllable device within the facility. For example, in the event that the hard surfaces 2221a and 2221b are one or more tintable windows, any (e.g., all) of the E-boxes may be operatively coupled to the at least one controller that controls a level of tint of these windows.

FIG. 22B shows an example of hard surfaces 2231a and 2231b (e.g., tintable windows) mounted (e.g., via a hinge and/or adhesive) within frames 2232a and 2232b. The frames 2232a and 2232b include mullions 2233 that are vertical, and transoms 2234 (sometimes referred to as horizontal mullions). A display construct 2235a is mounted within frame 2232a, and a display construct 2235b is mounted within the frame 2232b and cover all of the viewable surface of hard surfaces 2231a and 2231b (e.g., viable surface of a board, or of a window such as tintable windows). Two controllers housed within housings (also referred to herein as electrical (E)-boxes) 2236a and 2236b are mounted in a portion of the frames 2232a and 2232b within the upper (relative to the gravitational center towards which vector 2230 is pointing to) transom 2234. The circuitry in E-Box 2236a (e.g., including timing controller, network components and/or media related circuitry) is connected via wiring 2239a to display construct 2235a. The circuitry in E-Box 2236b is connected via wiring 2239b to display construct 2235b. The display connectors 2238a and 2238b extend from the respective housings 2236a and 2236b in the same downward direction. The connectors 2238a and 2238b are arranged to point to the same downward direction. The cables 2239a and 2239b are (e.g., substantially) the same length from each E-box 2236a and 2236b to the respective display constructs 2235a and 2235b, and extend within portions of the frames 2232a and 2232b. The E-boxes may be operatively coupled (e.g., wirelessly and/or wired) to the network that is coupled to at least one controller that controls that facility or any controllable device within the facility. For example, in the event that the hard surfaces 2231a and 2231b are one or more tintable windows, any (e.g., all) of the E-boxes may be operatively coupled to the at least one controller that controls a level of tint of these windows.

Figure 23:
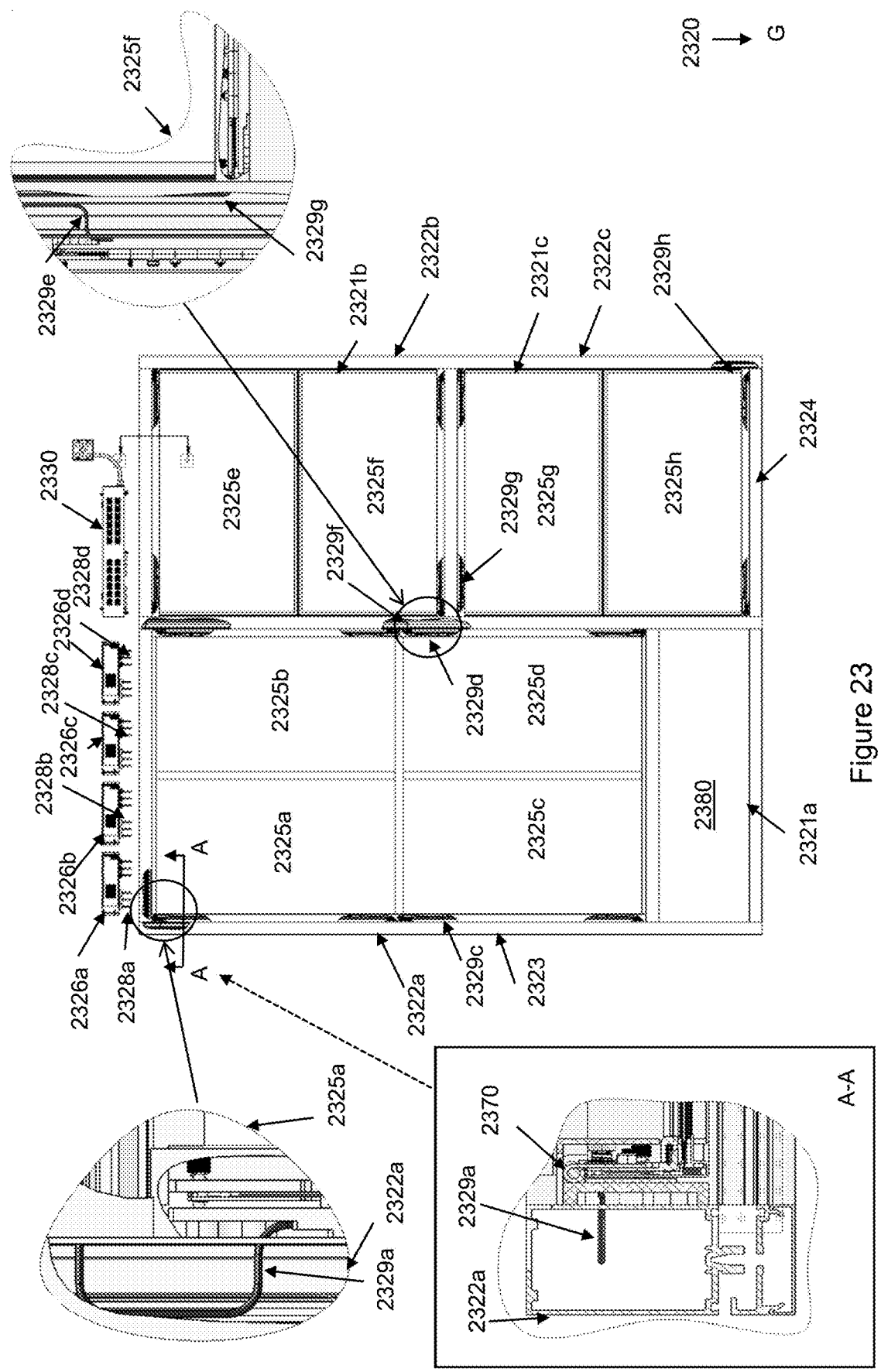
FIG. 23 schematically shows various windows and display constructs.

FIG. 23 shows an example of hard surfaces 2321a, 2321b and 2321c (e.g., tintable windows) mounted (e.g., via a hinge such as 2370 and/or adhesive) within frames 2322a, 2322b and 2322c. The frames 2322a, 2322b and 2322c include mullion 2323 that is vertical, and transoms 2324 (also referred to as horizontal mullion). Four display constructs 2325a, 2325b, 2325c and 2325d are mounted within frame 2322a, two display constructs 2325e and 2325f are mounted within the frame 2322b, and two display constructs 2325g and 2325h are mounted within frame 2322c and may cover (e.g., substantially) all (or only a portion) of the viewable surface of respective hard surfaces 2321a, 2321b and 2321c (e.g., visible surface of a board, or of a window such as tintable windows). For example, surface 2380 of the tintable window is not covered by a display construct. Four controllers housed within housings (E-boxes) 2326a, 2326b, 2326c and 2326d are mounted in a portion of the frame 2322a within the upper (relative to the gravitational center towards which vector 2320 is pointing to) mullions 2323. The circuitry in E-Box 2326a is connected via wiring 2329a to display construct 2325a. The wiring may be configured to transmit data and/or power (e.g., to the touch screen). The circuitry in E-Box 2326b is connected via wiring 2329b to display construct 2325b. The circuitry in E-Box 2326c is connected via wiring 2329c to display construct 2325c. The circuitry in E-Box 2326d is connected via wiring 2329d to display construct 2325d. The display connectors 2328a, 2328b, 2328c and 2328d extend from the respective housings 2326a, 2326b, 2326c and 2326d in the same downward direction. The connectors 2328a, 2328b, 2328c and 2328d are arranged to point to the same downward direction. The cables 2329a, 2329b, 2329c, and 2329d are (e.g., substantially) the same length from each E-box 2326a, 2326b, 2326c and 2326d to the respective display constructs 2325a, 2325b, 2325c and 2325d, and extend within portions of the frames 2322a. The E-boxes may be operatively coupled (e.g., wirelessly and/or wired) to the network that is coupled to at least one controller that controls that facility or any controllable device within the facility. For example, in the event that the hard surfaces 2321a, 2321b and 2321c are one or more tintable windows, any (e.g., all) of the E-boxes may be operatively coupled to the at least one controller that controls a level of tint of these windows. A controller housed within a housing 2330 is mounted in a portion of the frame 2322b within the upper (relative to the gravitational center towards which vector 2320 is pointing to) mullions 2323. The circuitry in controller 2330 (e.g., including timing controller, network components and/or media related circuitry) is connected via wiring 2329e to display construct 2325e. The circuitry in controller 2330 is connected via wiring 2329f to display construct 2325f. The circuitry in controller 2330 (e.g., including timing controller, network components and/or media related circuitry) is connected via wiring 2329g to display construct 2325g. The circuitry in controller 2330 is connected via wiring 2329h to display construct 2325h. The cables 2329e, 2329f, 2329g, and 2329h are (e.g., substantially) the same length from controller 2330 to the respective display constructs 2325e, 2325f, 2325g and 2325h, and extend within portions of the frames 2322b and 2322c. The controllers 2330 may be operatively coupled (e.g., wirelessly and/or wired) to the network that is coupled to at least one controller that controls that facility or any controllable device within the facility. For example, in the event that the hard surfaces 2321a, 2321b and 2321c are one or more tintable windows, any (e.g., all) of the controller may be operatively coupled to the at least one controller that controls a level of tint of these windows.

Figure 24:
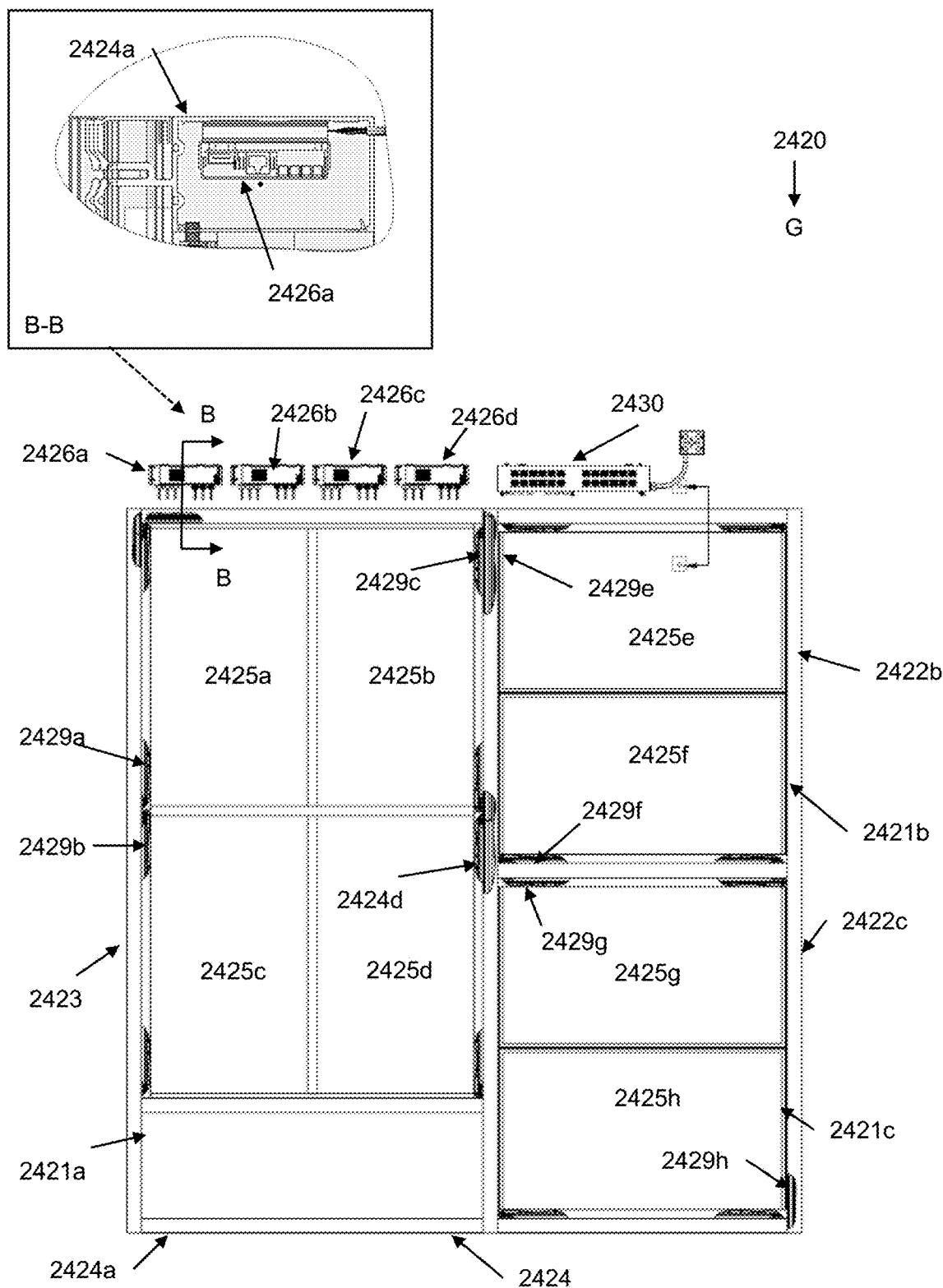
FIG. 24 schematically shows various windows and display constructs.

FIG. 24 shows an example of hard surfaces 2421a, 2421b and 2421c (e.g., tintable windows) mounted (e.g., via a hinge and/or adhesive) within frames 2422a, 2422b and 2422c. The frames 2422a, 2422b and 2422c include mullions 2423 that are vertical, and transoms 2424 (sometimes referred to as horizontal mullions). Four display constructs 2425a, 2425b, 2425c and 2425d are mounted within frame 2422a, two display constructs 2425e and 2425f are mounted within the frame 2422b, and two display constructs 2425g and 2425h are mounted within frame 2422c and may cover all (or only a portion) of the viewable surface of respective hard surfaces 2421a, 2421b and 2421c (e.g., visible surface of a board, or of a window such as tintable windows). Four controllers housed within housings (also referred to herein as electrical (E)-boxes) 2426a, 2426b, 2426c and 2426d are mounted in a portion of the frame 2422a within the upper (relative to the gravitational center towards which vector 2420 is pointing to) mullions 2423. The circuitry in E-Box 2426a (e.g., including timing controller, network components and/or media related circuitry) is connected via wiring 2429a to display construct 2425a. The circuitry in E-Box 2426b is connected via wiring 2429b to display construct 2425b. The circuitry in E-Box 2426c (e.g., including timing controller, network components and/or media related circuitry) is connected via wiring 2429c to display construct 2425c. The circuitry in E-Box 2426d is connected via wiring 2429d to display construct 2425d. The cables 2429a, 2429b, 2429c, and 2429d are (e.g., substantially) the same length from each E-box 2426a, 2426b, 2426c and 2426d to the respective display constructs 2425a, 2425b, 2425c and 2425d, and extend within portions of the frames 2422a. The E-boxes may be operatively coupled (e.g., wirelessly and/or wired) to the network that is coupled to at least one controller that controls that facility or any controllable device within the facility. For example, in the event that the hard surfaces 2421a, 2421b and 2421c are one or more tintable windows, any (e.g., all) of the E-boxes may be operatively coupled to the at least one controller that controls a level of tint of these windows. A controller housed within a housing 2430 is mounted in a portion of the frame 2422b within the upper (relative to the gravitational center towards which vector 2420 is pointing to) mullions 2423. The circuitry in controller 2430 (e.g., including timing controller, network components and/or media related circuitry) is connected via wiring 2429e to display construct 2425e. The circuitry in controller 2430 is connected via wiring 2429f to display construct 2425f. The circuitry in controller 2430 (e.g., including timing controller, network components and/or media related circuitry) is connected via wiring 2429g to display construct 2425g. The circuitry in controller 2430 is connected via wiring 2429h to display construct 2425h. The cables 2429e, 2429f, 2429g, and 2429h are (e.g., substantially) the same length from controller 2430 to the respective display constructs 2425e, 2425f, 2425g and 2425h, and extend within portions of the frames 2422b and 2422c. The controllers 2430 may be operatively coupled (e.g., wirelessly and/or wired) to the network that is coupled to at least one controller that controls that facility or any controllable device within the facility. For example, in the event that the hard surfaces 2421a, 2421b and 2421c are one or more tintable windows, any (e.g., all) of the controller may be operatively coupled to the at least one controller that controls a level of tint of these windows.

Figure 25:
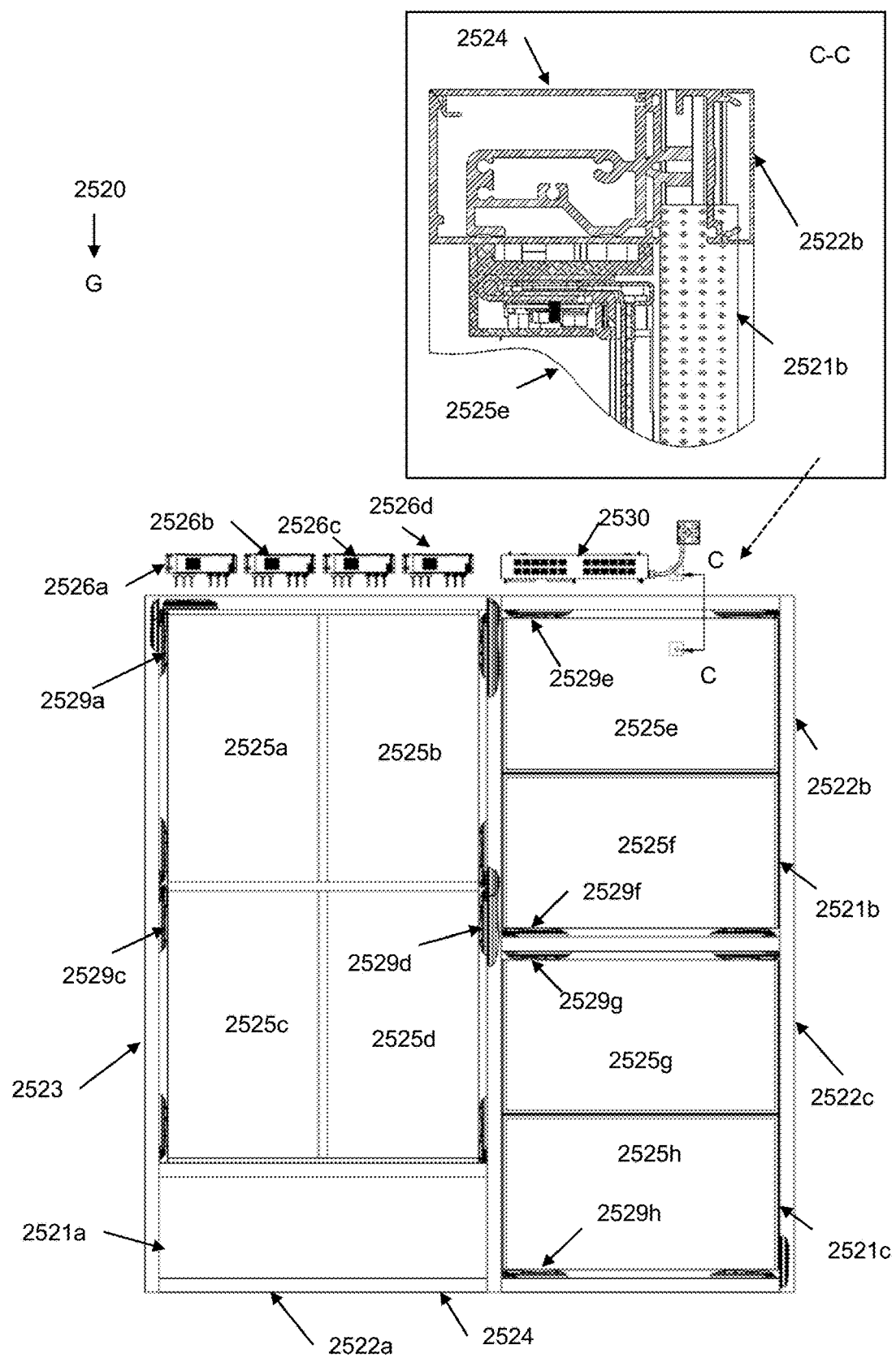
FIG. 25 schematically shows various windows and display constructs.

FIG. 25 shows an example of hard surfaces 2521a, 2521b and 2521c (e.g., tintable windows) mounted (e.g., via a hinge and/or adhesive) within frames 2522a, 2522b and 2522c. The frames 2522a, 2522b and 2522c include mullions 2523 that are vertical, and transoms 2524 (sometimes referred to as horizontal mullions). Four display constructs 2525a, 2525b, 2525c and 2525d are mounted within frame 2522a, two display constructs 2525e and 2525f are mounted within the frame 2522b, and two display constructs 2525g and 2525h are mounted within frame 2522c and may cover all (or only a portion) of the viewable surface of respective hard surfaces 2521a, 2521b and 2521c (e.g., visible surface of a board, or of a window such as tintable windows). Four controllers housed within housings (also referred to herein as electrical (E)-boxes) 2526a, 2526b, 2526c and 2526d are mounted in a portion of the frame 2522a within the upper (relative to the gravitational center towards which vector 2520 is pointing to) mullions 2523. The circuitry in E-Box 2526a (e.g., including timing controller, network components and/or media related circuitry) is connected via wiring 2529a to display construct 2525a. The circuitry in E-Box 2526b is connected via wiring 2529b to display construct 2525b. The circuitry in E-Box 2526c (e.g., including timing controller, network components and/or media related circuitry) is connected via wiring 2529c to display construct 2525c. The circuitry in E-Box 2526d is connected via wiring 2529d to display construct 2525d. The cables 2529a, 2529b, 2529c, and 2529d are (e.g., substantially) the same length from each E-box 2526a, 2526b, 2526c and 2526d to the respective display constructs 2525a, 2525b, 2525c and 2525d, and extend within portions of the frames 2522a. The E-boxes may be operatively coupled (e.g., wirelessly and/or wired) to the network that is coupled to at least one controller that controls that facility or any controllable device within the facility. For example, in the event that the hard surfaces 2521a, 2521b and 2521c are one or more tintable windows, any (e.g., all) of the E-boxes may be operatively coupled to the at least one controller that controls a level of tint of these windows. A controller housed within a housing 2530 is mounted in a portion of the frame 2522b within the upper (relative to the gravitational center towards which vector 2520 is pointing to) mullions 2523. The circuitry in controller 2530 (e.g., including timing controller, network components and/or media related circuitry) is connected via wiring 2529e to display construct 2525e. The circuitry in controller 2530 is connected via wiring 2529f to display construct 2525f. The circuitry in controller 2530 (e.g., including timing controller, network components and/or media related circuitry) is connected via wiring 2529g to display construct 2525g. The circuitry in controller 2530 is connected via wiring 2529h to display construct 2525h. The cables 2529e, 2529f, 2529g, and 2529h are (e.g., substantially) the same length from controller 2530 to the respective display constructs 2525e, 2525f, 2525g and 2525h, and extend within portions of the frames 2522b and 2522c. The controllers 2530 may be operatively coupled (e.g., wirelessly and/or wired) to the network that is coupled to at least one controller that controls that facility or any controllable device within the facility. For example, in the event that the hard surfaces 2521a, 2521b and 2521c are one or more tintable windows, any (e.g., all) of the controller may be operatively coupled to the at least one controller that controls a level of tint of these windows.

In some embodiments, one or more controllers in housings ((E)-boxes) provides functionality to one or more display constructs. The E-box may have a cover bracket that may be secured to a mounting bracket. The cover bracket and mounting bracket may mount within a portion of a window frame and/or to other structure. The E box may have a length, width, and height. The length of the E-box may be at most 15 inch ("), 14", 13", 12", 11", or 10". The length of the E-box may have any value between the aforementioned values (e.g., between about 15" and 10", e.g., about 12.5". The width of the E-box may be at most 5 inch ("), 4", 3.5", 3", 2.5", 2", or 1.5". The width of the E-box may have any value between the aforementioned values (e.g., between about 5" and 1.5", e.g., about 3.75". The height of the E-box may be at most 3", 2.5", 2", 1.5", or 1". The height of the E-box may have any value between the aforementioned values (e.g., between about 3" and 1", e.g., 1.75". The E-box may include an analog-to-digital converter circuit board, which may mount to one or both of the cover bracket and mounting bracket. The circuit board may include terminals for connecting to a power supply (e.g., AC or DC electrical source) via cables, which provide electric power to the E-box, the circuit board may include at least one data input connector(s) (e.g., Display port, HDMI, Ethernet or other type of connector for data transmission), which may receive data for display on an associated display construct, and may include at least one E-box connector(s) (e.g., for content management system (CMS) data transmission (e.g., Display port, HDMI), Ethernet or other type of connector for data transmission), which may transmit data to another E-box. The E-box may include a controller board, which may operatively engage the circuit board. The controller board may include a timing controller, network components, and/or media related circuitry. The timing controller may be employed for precise coordination of the timing altering various positions (e.g., LEDs) in the display construct. The controller board may include connectors that connect to cabling, which may connect to a display construct. The cabling may transmit data between the E-box and the display construct. The connectors from the e-box to the display construction (e.g., transmitting power and/or data) may extend in the same direction from the E-box or may extend from the E-box in different directions. For example, all power connectors from the E-box to the display construct may extend to the same direction and emerge from the same side of the E-box and/or PCB disposed therein. For example, all communication connectors from the E-box to the display construct may extend to the same direction and emerge from the same side of the E-box and/or PCB disposed therein. The power connectors supplying power from the PCB of the E-box to the display construct may reside on the same PCB side as the data connectors from the PCB of the E-box to the display construct (e.g., and extend to the same direction, e.g., towards the display construct and away from the E-box). The connectors of data and/or power between the E-box and the display construct, may reside in the E-box at a first side that has an angle (is perpendicular) to a second side of that E-Box in which the connectors for the incoming power supply cables reside. The connectors of data and/or power between the E-box and the display construct, may reside in the E-box at a first side that has an angle (is perpendicular) to a third side of that E-Box in which the connectors for the incoming data and/or media communication cables reside. The connector for (i) incoming power supply, (ii) incoming data (e.g., media) communication, and (iii) power and/or data to the display construct reside, may or may not reside on one PCB. The E-box may be operatively coupled (e.g., wirelessly and/or wired) to the network that is coupled to at least one controller that controls a facility or any controllable device within the facility. The E-box may have a unique network identifier (ID), e.g., for communication with the at least one controller that controls the facility.

In some embodiments, a plurality of cabling extends from the E-box to the display construct. The cabling is connected via connectors to the circuitry in the E-box. The circuitry can be in one or more printed circuit boards (PCBs). The cabling may be connector to the circuit boar via connectors. The connectors may connect a plurality of wires bundled into a cable. The number of connectors may be at least 2, 4, 6, or 8. The number of connectors may be an even number. The cabling may have the same of different functionality. The functionality can include transmission of data and/or transmission of electricity (e.g., electrical power). For example, a connector may connect cabling that transmits data from the PCB to the display construct. For example, a connector may connect cabling that transmits electricity from the PCB to the display construct. The connectors may form two groups of connectors. The members of the connector groups may be identical or different. For example, a connector group may comprise a data connector and a power connector.

Respective arrangement of the connector types in the groups of connectors may follow a mirror symmetry, inversion symmetry, and/or rotational (e.g., C2) symmetry. The mirror, rotational axis, and/or inversion point for the applicable symmetry operation may be disposed between the two connector groups.

Figure 26:
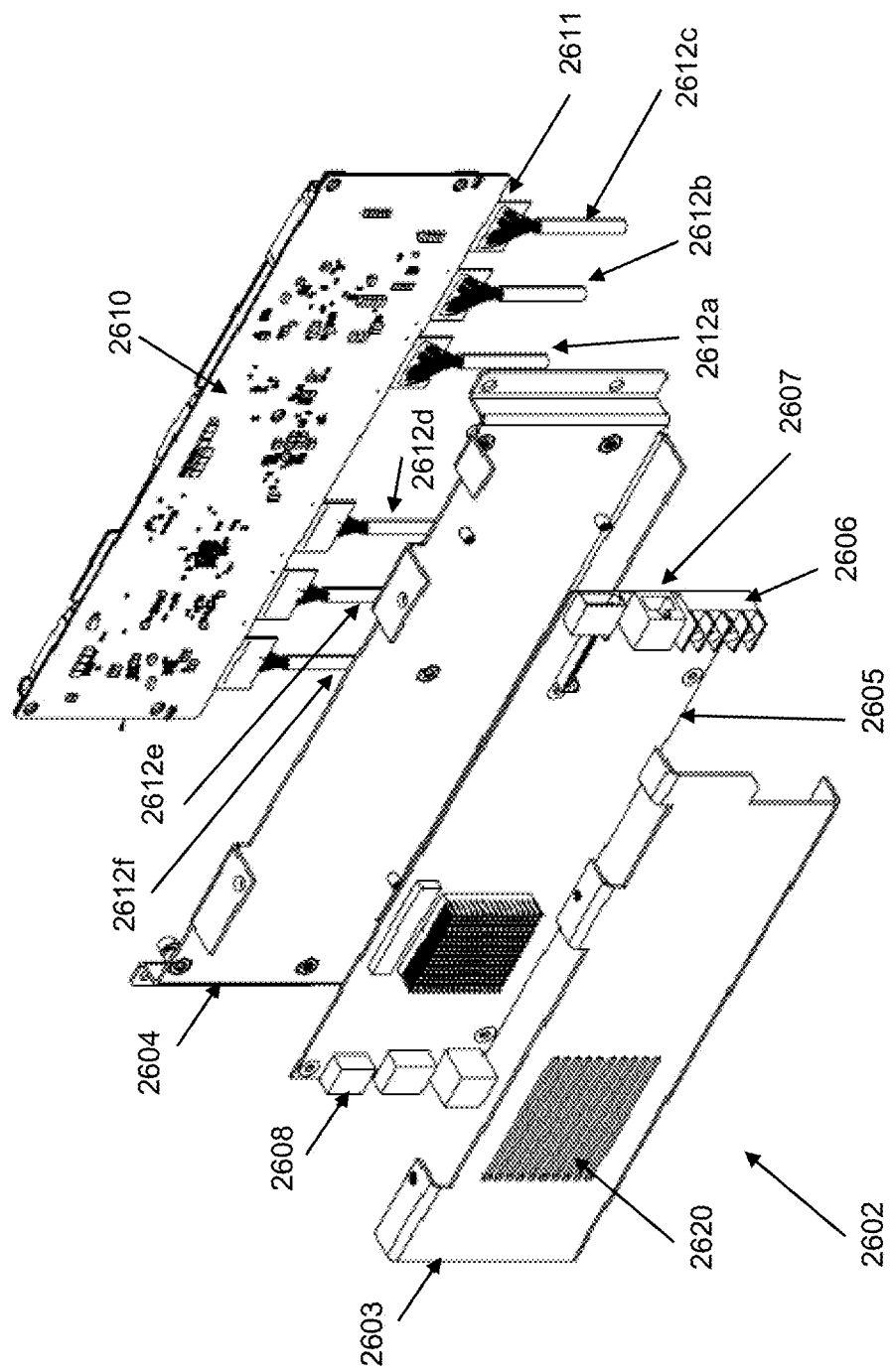
FIG. 26 schematically shows a disassembled (e.g., exploded) view of a box comprising circuitry.

FIG. 26 shows an exploded view of an example of a controller in a housing (E-box) 2602. The E-box 2602 has a cover bracket 2603 that is secured to a mounting bracket 2604. The cover bracket 2603 has a plurality of slits 2620 (e.g., for ventilation and/or heat exchange). The cover bracket 2602 and mounting bracket 2604 may mount within a portion of a window frame (not shown in this figure) or to other structure (e.g., fixture). The E-box 2602 includes an analog-to-digital converter circuit board 2605, which may mount to one or both of the cover bracket 2603 and the mounting bracket 2604. The circuit board 2605 may include terminals 2606 for connecting to (e.g., AC) power supply cables, which provide electric power to the E-box 2602, at least one data input connector(s) (e.g., Display port, HDMI, Ethernet or other type of connector for data transmission) 2607, which may receive data for display on an associated display construct, and at least one E-box connector(s) (e.g., Display port, HDMI, Ethernet or other type of connector for data transmission) 2608, which may transmit data to another E-box. The E-box 2602 includes a controller board 2610, which operatively engages the circuit board 2605. The controller board 2610 may include a timing controller and/or media related circuitry. The timing controller may be employed for (e.g., precise) coordination of the timing altering various positions (e.g., LEDs) of the display construct. The circuit board (e.g., controller board) 2610 includes connectors (e.g., 2611) that connect to cabling 2612a-f, which connects to a display construct. The cabling 2612a-f may transmit data and/or power between the E-box 2602 and the display construct. For example, some of the cabling 2612a-f can transmit data and some of the cabling can transmit power. For example, the two outer most cabling 2612c and 2612f can transmit power, and the four inner cabling 2612e, 2612d, 2612a, and 2612b can transmit data. For example, the two inner most cabling 2612d and 2612a can transmit power, and the four outer cabling 2612e, 2612f, 2612c, and 2612b can transmit data. For example, the two intermediate cabling 26123 and 2612b can transmit power, and the four other cabling 2612d, 2612f, 2612c, and 2612a can transmit data. Two of the cabling 2612a-f can transit power and four of the cabling 2612a-f can transmit data. The connectors may extend in the same direction from the E-box or may extend from the E-box in different directions. In the example shown in FIG. 26, the connectors 2611 extend in the same direction from the E-box 2602. The connectors may extend from the E-box at a right angle from the direction that the (e.g., AC) power supply cables extend or may extend at any other angle from the direction that the power supply cables extend. The E-box may be operatively coupled (e.g., wirelessly and/or wired) to the network that is coupled to at least one controller that controls a facility or any controllable device within the facility. The E-box may have a unique network ID for communication with the at least one controller that controls the facility.

Figure 27A:
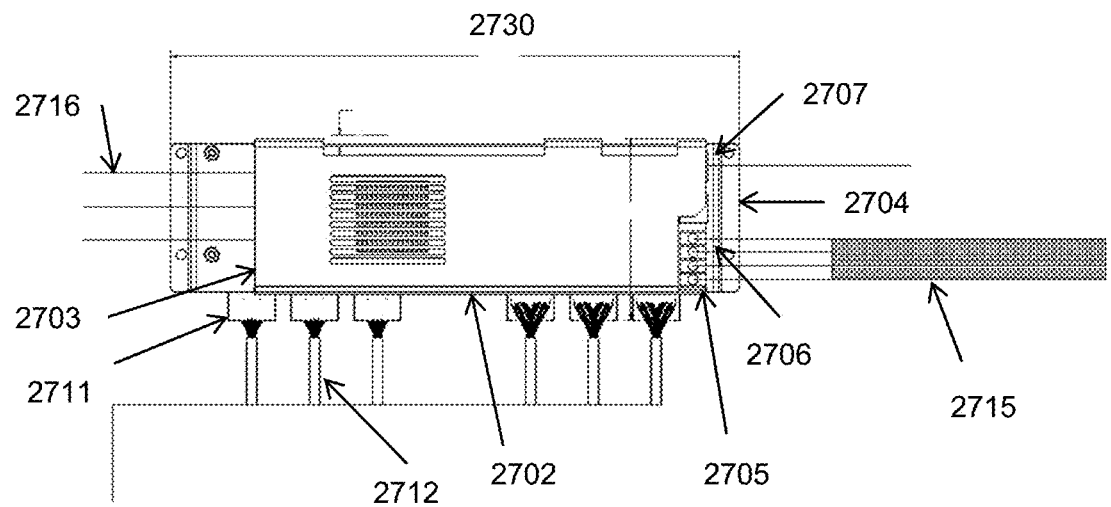
FIGS. 27A-B schematically show various views of a box comprising circuitry.
Figure 27B:
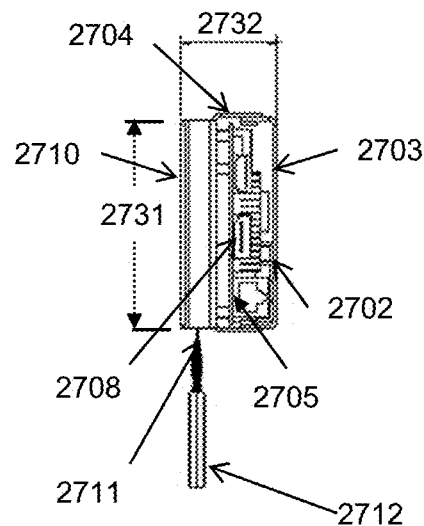

FIGS. 27A and 27B show various views of an assembled E-box 2702 shown in FIG. 26 as an exploded view. The E-box 2702 has a cover bracket 2703 that is secured to a mounting bracket 2704. The cover bracket 2702 and mounting bracket 2704 may mount within a portion of a window frame (not shown in this figure) or to other structure. The E-box 2702 may have dimensions (e.g., as disclosed herein) for fitting within a structure (e.g., a length 2730, a width 2731, and a thickness 2732). The structure may be any structure disclosed herein. The E-box 2702 includes a (e.g., an analog-to-digital converter) circuit board 2705, which may mount to one or both of the cover bracket 2703 and the mounting bracket 2704. The circuit board 2705 includes terminals 2706 for connecting to (e.g., AC) power supply cables 2715, which provide electric power to the E-box 2702, at least one data input connector(s) (e.g., Display port, HDMI, Ethernet or other type of connector for data transmission) 2707, which may receive data for display on an associated display construct, and at least one E-box connector(s) (e.g., Display port, HDMI, Ethernet or other type of connector for data transmission) 2708, which transmit data via cables 2716, e.g., to another E-box or to the network. The E-box 2702 includes a controller board 2710, which operatively engages the circuit board 2705. The controller board 2710 may include a timing controller and media related circuitry. The timing controller may be employed for precise coordination of the timing altering various positions (e.g., LEDs) in the display construct. The controller board 2710 includes connectors 2711 that connect to cabling 2712, which connects to a display construct. The cabling 2712 may transmit data and/or power between the E-box 2702 and the display construct. The connectors 2711 extend in the same direction from the E-box 2702.

Figure 32:
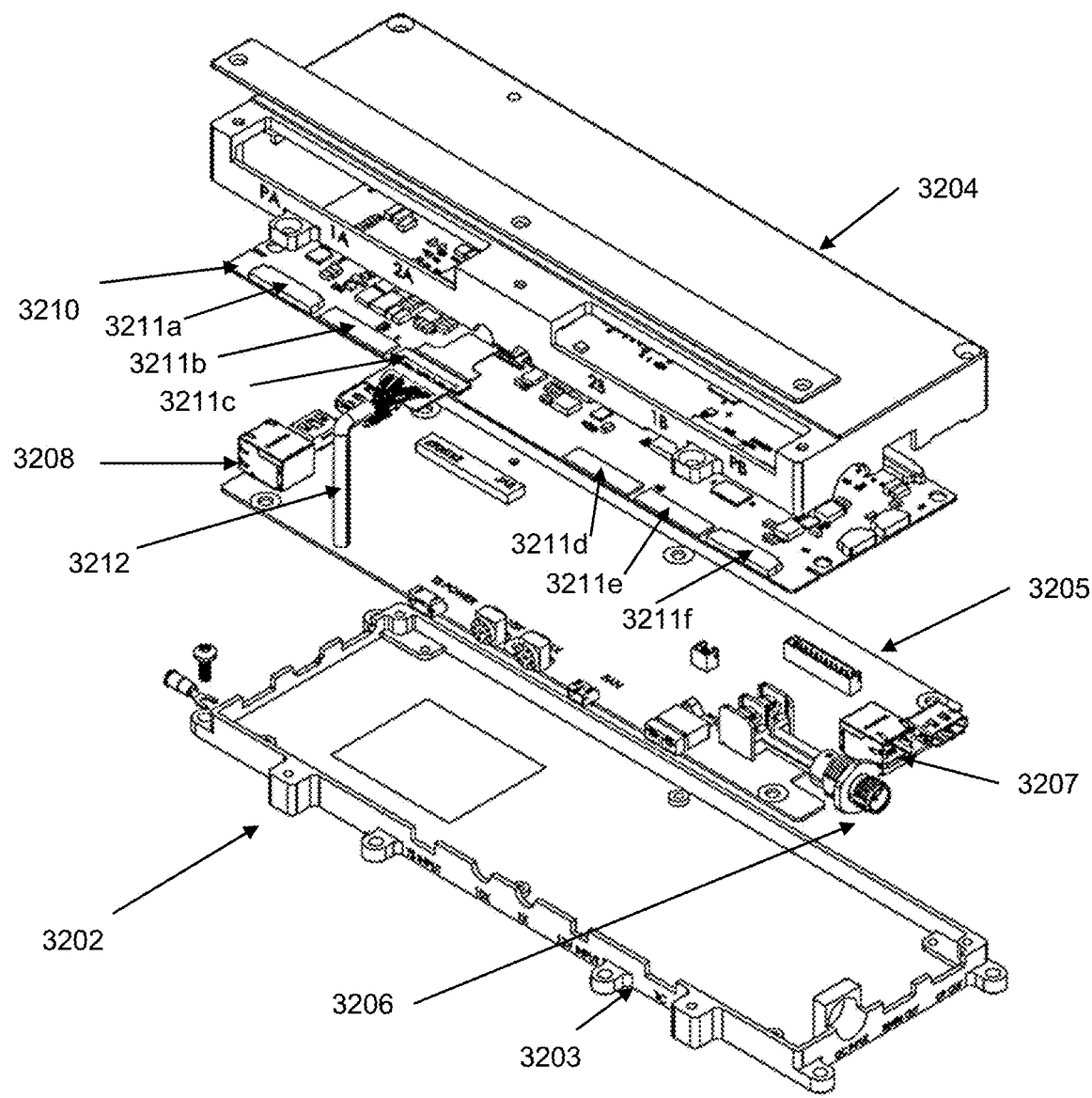
FIG. 32 schematically shows a disassembled (e.g., exploded view) of a box comprising circuitry.
Figure 33C:
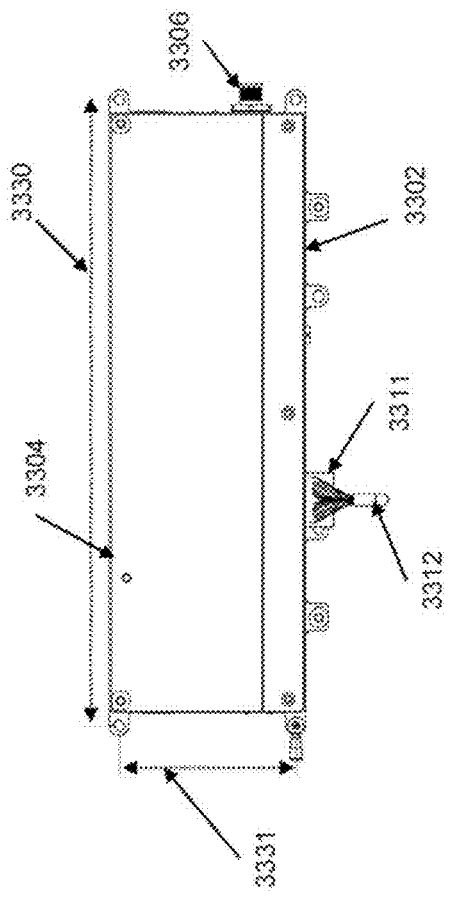
FIGS. 33A-D schematically show various views of a box comprising circuitry.
Figure 33D:
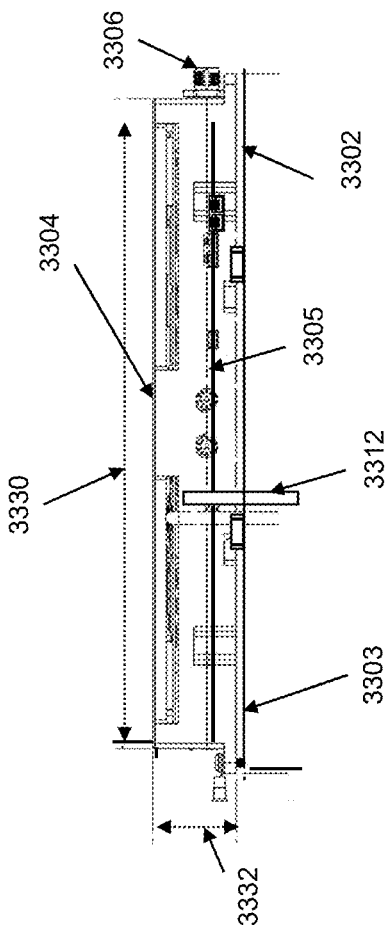
Figure 33A:
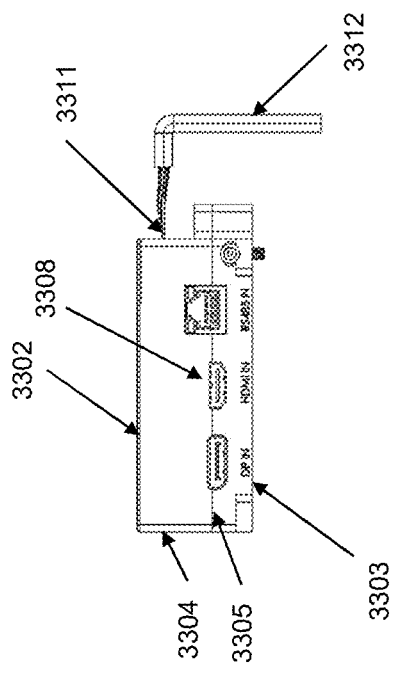
Figure 33B:
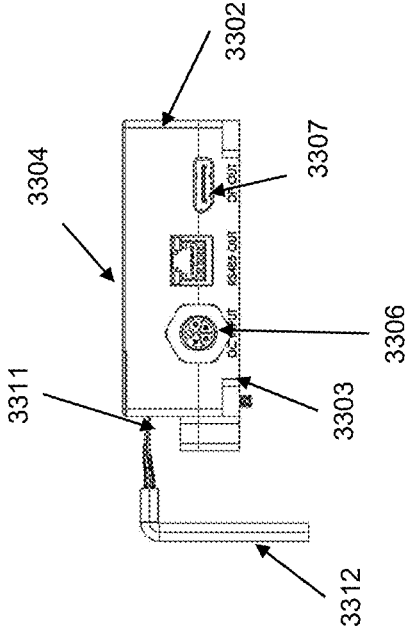

FIG. 32 shows an example of an exploded view of an E-box 3202. The E-box 3202 has a cover bracket 3203 that is secured to a mounting bracket 3204. The cover bracket 3202 and mounting bracket 3204 may mount within a portion of a structure such as a fixture, e.g., a window frame (not shown in this figure). The E-box 3202 may have dimensions consistent with fitting the E-box 3202 into a portion of the structure or may have other dimensions that are larger or smaller than these dimensions (e.g., as disclosed herein). The E-box 3202 includes a (e.g., an analog-to-digital converter) circuit board 3205, which may mount to one or both of the cover bracket 3203 and the mounting bracket 3204. The circuit board 3205 may include one or more terminal(s) 3206 for connecting to (e.g., AC) power supply cable(s), which provide electric power to the E-box 3202 (e.g., via a coaxial cable), at least one data input connector(s) (e.g., Display port, HDMI, Ethernet and/or other type of connector for data transmission) 3207, which may receive data for display on an associated display construct, and at least one E-box connector (e.g., Display port, HDMI, Ethernet and/or other type of connector for data transmission) 3208, which may transmit data to another E-box and/or to the network. The E-box 3202 includes a (e.g., controller) circuit board 3210, which operatively engages the circuit board 3205. The circuit board 3210 may include a timing controller, network components, and/or media related circuitry. The timing controller may be employed for precise coordination of the timing altering various positions (e.g., LEDs) in the display construct. The circuit board 3210 includes connectors 3211a-f that connect to cabling (e.g., 3212), which connect in turn to a display construct. The cabling 3212 may transmit data and/or power between the E-box 3202 and the display construct. The E-box 3202 may be operatively coupled (e.g., wirelessly and/or wired) to the network that is coupled to at least one controller that controls a facility or any controllable device of the facility. The E-box 3202 may have a unique network ID for communication with the at least one controller that controls the facility.

FIGS. 33A through 33D show various views of an E-box. The E-box 3302 has a cover bracket 3303 that is secured to a mounting bracket 3304. The cover bracket 3303 and mounting bracket 3304 may mount within a structure or a portion of the structure (e.g., a fixture such as a window frame (not shown in this figure)). The E-box 3302 may have dimensions for mounting within the structure (e.g., having a length 3330, a width 3331, and a thickness 3332), e.g., any dimensions disclosed herein. The E-box 3302 includes a (e.g., an analog-to-digital converter) first circuit board, which may mount to one or both of the cover bracket 3303 and the mounting bracket 3304. The first circuit board includes one or more terminal(s) (e.g., 3306) for connecting to (e.g., AC) power supply cables (e.g., comprising coaxial cable or twisted wire), which provide electric power to the E-box 3302; one or more data input connector(s) (e.g., Display port, HDMI, Ethernet and/or other type of connector for data transmission) 3307, which may receive data for display on an associated display construct, and one or more E-box connector(s) (e.g., Display port, HDMI, Ethernet and/or other type of connector for data transmission) 3308, which may transmit data to another E-box. The E-box 3302 includes a second (e.g., controller) circuit board 3305, which operatively engages the first circuit board. In some embodiments, the first circuit board and the second circuit board are one circuit board (e.g., and reside on the same or on different sides of the circuit board). In some embodiments, the first circuit board and the second circuit board are separate circuit boards, that are separated by a distance that facilitates heat exchange and/or shielding (e.g., electronic and/or electromagnetic (e.g., radio frequency) shielding). The heat exchanger and/or shield may comprise elemental metal or metal alloy. The heat exchanger may exchange heat passively and/or actively. The heat exchanger may comprise a heat pipe, a slab, or a mesh. The heat exchanger may comprise a heat sink. The second circuit board 3305 may include a timing controller, network components, and/or media related circuitry. The timing controller may be employed for precise coordination of the timing altering various positions (e.g., LEDs) in the display construct. In the example shown in FIGS. 33A-D, the second circuit board includes one or more connector(s) 3311 that connect to cabling 3312, which in turn connects to a display construct. The cabling 3312 may transmit data and/or power between the E-box 3302 and the display construct. There may be additional cabling connecting the E-box with the display construct (not shown). The E-box 3302 may be operatively coupled (e.g., wirelessly and/or wired) to the network that is coupled to at least one controller that controls a facility or any controllable device within the facility. The E-box 3302 may have a unique network ID for communication with the at least one controller that controls the facility.

FIG. 34A through 34E show various view examples of circuit board 3405, which may mount to within an E-box. The circuit board 3405 may include one or more terminal(s) 3406 for connecting to AC power supply cable(s), which provide electric power to the circuit board 3405, at least one data input connector(s) (e.g., Display port, HDMI, Ethernet and/or other type of connector for data transmission) 3407, which may receive data for display on an associated display construct, and at least one E-box connector(s) (e.g., Display port, HDMI, Ethernet and/or other type of connector for data transmission) 3408, which may transmit data to another E-box. The circuit board 3405 may operatively engage a controller board, which may include a timing controller and media related circuitry, and connectors that connect to cabling, which connects to a display construct.

In some embodiments, certain apparatus, non-transitory computer readable media, and/or methods described herein comprise techniques that pass gas (e.g., air) over at least one lite of a tintable window. The tintable window may comprise an insulated glass unit, e.g., a tinted electrochromic coated lite of an IGU. Passing of the gas (e.g., air) may be in order to remove heat and/or lessen the heat load on the lite, e.g., and any optically switchable device (e.g., electrochromic coating) on the substrate of the lite, and/or other components (e.g., display construct). Passing the gas (e.g., air) may be for removal of heat via, e.g., convection. The heat may be removed via conduction and/or radiation. In some embodiments, gas that has been heated by and/or through the IGU lite may be passed such as by pumping, pushing and/or suction. The flow of gas may be to the internal environment of the facility and/or to the exterior of the facility (e.g., building) having the IGU lite. For example, the heated gas may be used to warm the interior of the facility. In some embodiments, the heated gas may be used to drive a turbine to generate electricity. The electricity thus generated may be stored in a battery on the forced air window assembly.

In some embodiments, a forced gas tintable (e.g., electrochromic) window may comprise two or more vent modules in communication with an interior space between an electrochromic lite of an IGU subassembly and a third lite. In some cases, one or more of these vent modules may comprise one or more air movement devices, e.g., one or more fans, for actively moving the gas (e.g., air) through the interior space between an electrochromic lite and a third lite. In one case, the one or more air movement devices (e.g., fans) may comprise one of a blade fan, a bladeless fan, or an air pump. In some cases, one or more air movement devices from the structure and outside the forced air tintable window may be configured to feed air into one or more of the vent modules or output air from one or more of the vent modules. In certain embodiments, the vented air may be used to generate electricity by turning a turbine connected to a generator. The generated electricity may be stored in a battery, e.g., in one of the venting modules. Examples of forced air tintable windows, their usage, and control thereof can be found in PCT/US15/14453 (WO 2015/120045A1), filed on Feb. 4, 2015, titled "Forced Air Smart Windows," which is incorporated herein by reference in its entirety.

FIG. 28 shows an example of a display construct 2801 coupled to a fastener 2802, which display construct is framed by sensor and emitter panels, e.g., 2803. The display construct is coupled (e.g., via wiring and/or cabling not shown in FIG. 28) to an E-box 2811 and to a power source 2810. The E-box and the power source can be disposed adjacent to the display construct, or further away, e.g., as disposed herein (e.g., in a fixture cavity such as in window frame, or in a wall cavity). The fastener 2802 includes a hinge having a first leaf 2821 comprising a bracket, and a second leaf 2822, coupled by a knuckles and pintle arrangement. The fastener 2802 includes a gas guide 2823 (partial view shown) that facilitates directional flow of gas through a set of fans 2805 coupled to respective holes in leaf portion 2821 (partial view shown). The gas directing components is configured to attach a circuit board 2830 having connectors 2831 that connect the circuit board to the display construct 2801. The circuit board may comprise a controller and/or a driver board.

In some embodiments, a display construct includes touch screen functionality. In some embodiments, a plurality of display constructs may be arranged adjacent to each other (e.g., to form a display wall such as a video wall). The display constructs may be arranged in a matrix (also called herein group or set of display constructs). There may be a gap between two immediately adjacent display constructs. Immediately adjacent display constructs exclude another display construct therebetween. The gap may be masked or unmasked. The gap masking may comprise a flexible filler such as a transparent polymer and/or resin. The flexible filler may comprise a carbon-based or a silicon-based polymer or resin. The filler may comprise an optical grade material. The filler may polymerize and/or cure by mixing at least two components. At least one of the at least two component and/or the filler may have a viscosity of at least about 400 millipascals second (mPa*s), 1000 mPa*s, 2000 mPa*s, 3000 mPa*s, 5000 mPa*s, 6000 mPa*s, 7000 mPa*s, 8000 mPa*s, 9000 mPa*s, 10000 mPa*s, 25000 mPa*s, or 50000 mPa*s. The density of the filler may be at least about 0.9 grams per centimeter cubed (g/cm$^3$), 0.95 g/cm$^3$, 0.97 g/cm$^3$, 0.98 g/cm$^3$, or 0.99 g/cm$^3$. The filler may have low shrinkage after curing (e.g., shrinkage of at most about 0.2%, 0.1%, or 0.5% volume per volume after curing relative to before curing). The filler may have a dielectric constant of at most about 2.5, 2.6, 2.7, 2.8, or 2.9. The filler may have a dielectric constant between any of the aforementioned dielectric constants (e.g., from 2.5 to 2.9, or from 2.7 to 2.8). The filler may be optically clear (e.g., to an average human). The filler may have a pulls strength of at least 2 Kilogram force per centimeter squared ($Kgf/cm^2$), 2.2 $Kgf/cm^2$, 2.5 $Kgf/cm^2$, 3 $Kgf/cm^2$, 3.5 $Kgf/cm^2$, 4.0 $Kgf/cm^2$, 4.5 $Kgf/cm^2$, 5.0 $Kgf/cm^2$ 5.5 $Kgf/cm^2$, or 6 $Kgf/cm^2$. The filler may have a transmittance of at least about 98%, 98.5, 99%, 99.2%, 99.4%, or 99.5% of the (e.g., visible) light. The filler may have a refractive index of at most about 1.9, 1.7, 1.6, 1.5, 1.4, or 1.3, e.g., at 25° C., at 23° C., or at 20° C. For example, the filler may be a Wacker Lumisil® (WL) filler (e.g., of the WL 100, 200, or 300 series). The flexible filler may be configured to allow for expansion and/or contraction of the displays (e.g., due to temperature change). The flexible filler may be configured to bind the immediately adjacent display to each other and/or to a structure. The structure may be a tintable window, board, or wall. A mounting bracket and/or hinge may be secured to the display construct and may mount to a structure. The structure may comprise a frame or wall portion. The structure may comprise a fixture. The frame may comprise a vertical mullion and a horizontal mullion (transom). The fixture (e.g., frame) may be mounted (e.g., bonded, fastened and/or by other attachment means) to various surfaces (e.g., a wall, a board, glass internal to a facility and/or other mounting location). In some embodiments, the display construct may be directly attached to the structure (e.g., tintable window). Direct attachment may be using the polymer and/or resin. Direct attachment may be using bonding. The bonding may utilize an adhesive polymer and/or resin (e.g., as disclosed herein). The bonding material may have a state in which it is more malleable than the other (e.g., rigid) state. The rigid state may be prevalent at ambient conditions. The malleable state may be in specific controllable conditions that differ from ambient conditions. The change between malleable and rigid states may be triggered by external stimulus (e.g., heat, magnetic field, electric field, and/or chemical stimulus). For example, the filler (e.g., adhesive polymer and/or resin) may be heat sensitive. For example, the filler may be more malleable in a non-ambient condition (e.g., in a heated environment), e.g., and facilitates detachment of the display construct(s) from their supporting structure (e.g., for maintenance or exchange). Division between the display constructs and/or touch screens in the set may be masked, e.g., due to the proximity of the display constructs and lack of emitter-sensor panel between two immediately adjacent display constructs. The flexible filler may be disposed between two immediately adjacent display constructs.

In some embodiments, the display construct may be fastened to a side bracket. The side bracket may be fastened to a structure (e.g., fixture such as a frame portion or a wall). The side bracket may be secured to the display construct (e.g., via an adhesive and/or screws). The side bracket is operatively coupled to at least one pair (e.g., two pair) of an emitter panel and a sensor panel. A first sensor and emitter panel pair may be disposed orthogonal to a second sensor and emitter panel pair. The two orthogonal sensor and emitter panel pairs may facilitate operation of at least one touch screen.

In some embodiments, a plurality of display constructs is arranged to form a display construct wall. The display construct wall may or may not comprise touch screen capability. For example, at least one (e.g., all) display construct in the display construct wall may have touch screen capability. A touch screen may be facilitated by at least one pair of sensor and emitter panels. A touch screen may comprise two orthogonal pairs of sensor and emitters, e.g., arranged orthogonally (e.g., as disclosed herein). A distance between an emitter panel and its sensor panel may span one or more display constructs. The display constructs may be disposed in a matrix arrangement (e.g., in a 2×2 display constructs may form a display construct set). In some embodiments, at least one (e.g., each) display construct in the set comprises its dedicated touch screen having at least one set (e.g., two sets) of sensor and emitter panel. In some embodiments, at least two display constructs in the set comprises its dedicated touch screen having at least one set (e.g., two sets) of sensor and emitter panel. Signal from an emitter in the emitter panel travels until it reaches a sensor in the sensor panel. If a signal does not reach the sensor, then the touch screen controller may interpret such disturbance as a touch of the touch screen. Thus, the path between the emitter and the sensor should not be unintentionally disturbed.

In some embodiments, the display construct and/or set of display constructs is (e.g., substantially) planar. The tolerance for planarity variation of the display construct be limited (e.g., to facilitate operation of the sensor-emitter panels disposed adjacent to the display construct). The tolerance for planarity variation between the display constructs in the set may be limited (e.g., to facilitate operation of the sensor-emitter panels disposed adjacent to the display construct set). The variation from planarity may be stricter towards a viewer than away from the viewer. The variation from planarity may be stricter towards a side of the display construct adjacent to which the touch screen is disposed (e.g., the sensor and emitter panel are disposed). For example, the display construct can be convex toward the viewer and/or touch screen with a deviation of a predetermined distance or less. The display construct can be convex away from the viewer and/or touch screen by more than that predetermined distance. The touch screen may be configured to show display data as if a single display construct (e.g., one media that is respectively parceled among the displays in a display set such that each display in the set displays a portion of the screen image). A user may use a selector (e.g., cursor and/or a touch screen) to control the plurality of display constructs as if the set of display constructs was a single display. The tolerance may allow planarity deviation of any display construct disposed between the sensor-emitter panel by at most about 100 micrometers (µm), 300 µm, 500 µm, 700 µm, or 900 µm. The planarity deviation limit may be in the direction towards the sensor-emitter panel. The display construct may be a (e.g., slightly) concave, convex, or rippled display (e.g., within the tolerance mentioned herein). The gap between two immediately adjacent display may be at most about 0.1 inches ("), 0.2", 0.3", 0.4", or 0.5". The gap may have any value between the aforementioned values (e.g., from about 0.1" to about 0.5"). The display construct set may have a glass panel that is common to a plurality of displays (e.g., TOLEDS). The display constructs can each have a glass panel that is supports the display (e.g., TOLED)

FIGS. 29A-29D show examples of various display constructs including touch screen functionality. FIG. 29A shows an example of four displays (e.g., OLEDs) 2903a, 2903b, 2903c and 2903d sandwiched between a front glass 2904 (that may be tempered) that is common to the four displays and four back glass panels (e.g., 2905) that each individually supports a display. The displays together form a display construct set. The four displays in FIGS. 29A and 29B are arranged as a two by two matrix (also called herein group or set) with a gap (e.g., 2915) between two immediately adjacent displays. The gap 2915 may be masked (e.g., by a flexible filler such as a transparent polymer and/or resin disposed between the displays (e.g., to allow for expansion and contraction of the displays due to temperature and/or to bond the display constructs and/or glass panels together)). A sensor-emitter panel 2918 is secured to the display construct 2902 and mounts to a framing cap 2919. The display construct is secured with a hinge (not shown) to a structure that is a window frame 2906 having a vertical mullions 2907 and horizontal mullions 2908 (transom). The frame 2906 may be mounted (e.g., bonded) to various surfaces (e.g., a wall, a board, glass internal to a facility or other mounting location). The bonding may be with an adhesive polymer and/or resin, which may or may not have a state in which it is more malleable than the other (e.g., rigid) state, which rigid state may be prevalent at ambient conditions. FIG. 29A shows an example of a side framing cap 2910 that is configured to secure the sensor-emitter panel to the display construct 2902 a side 2920 of the display construct set, with the sensor and emitter panel configured to operate as a touch screen. The set of displays 2903a-2903d has two sets of sensor-emitter panels that are normal to each other, which sensor-emitter panels border the set of display constructs (rather than bordering each of the displays). The tolerance for height differences between the displays 2903a-2903d in the display construct 2902 may be limited (e.g., none of the displays can protrude at most a tolerance threshold (e.g., as disclosed herein) from the sensor-emitter panel towards the viewer), so that the signal from the emitter will be able to reach unobstructed the sensor on the opposite side of the display construct set (e.g., the display within the set cannot be convex toward the viewer with a deviation of more than the tolerance threshold but may be concave away from the viewer by more than the tolerance threshold).

Figure 36:
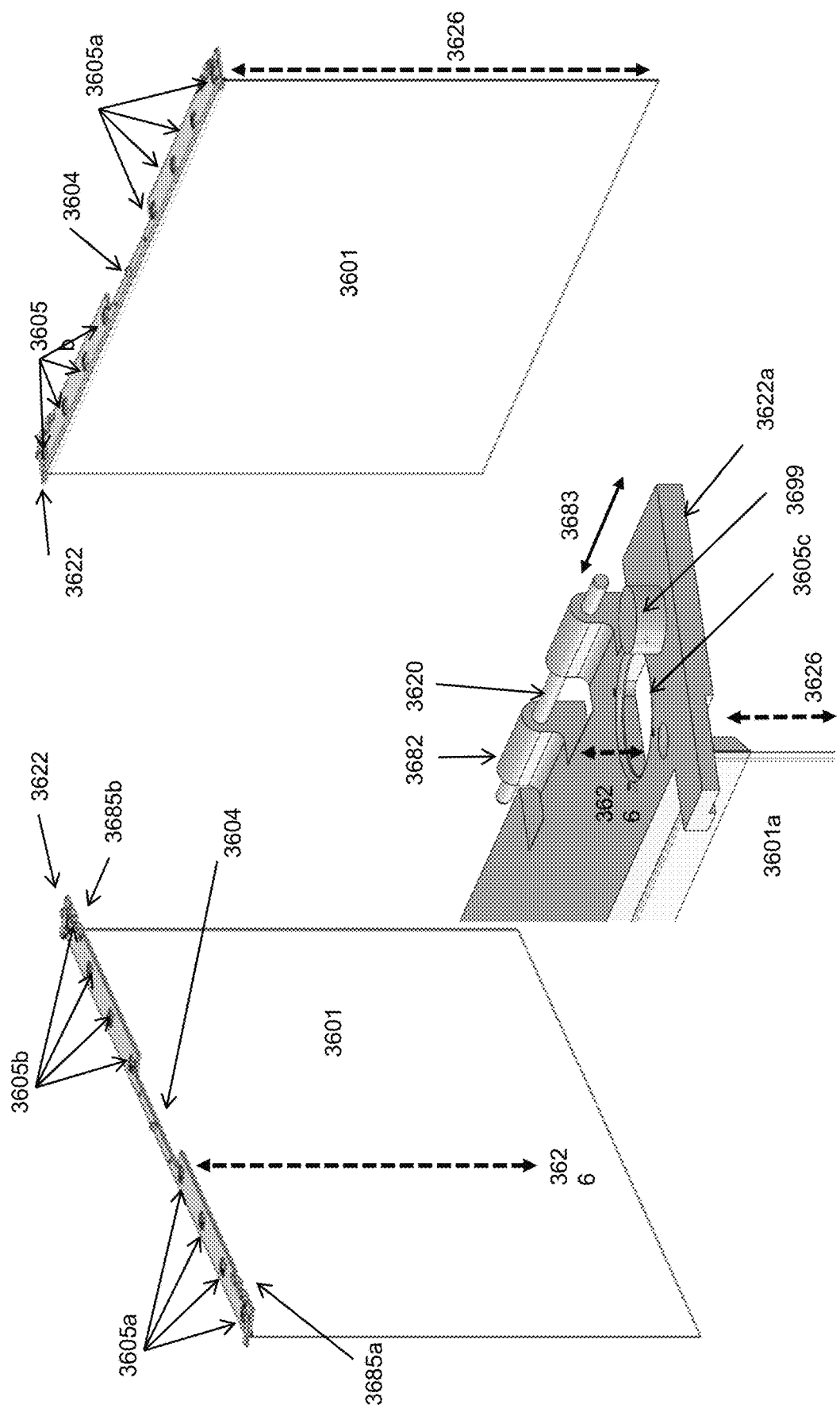
FIG. 36 schematically show various views of a display constructs and associated components (e.g., portions thereof)

In some embodiments, a fastener is configured to couple the display construct to a supporting structure. The display construct may or may not be equipped with touch screen capability. The supporting structure can be a fixture. For example, the supporting structure can be a frame portion of a window (e.g., tintable window). The structure can be any structure disclosed herein (e.g., a wall, an arch, a door frame, or any other structural frame). In some embodiments, the fastener comprises a hinge configured to allow swiveling (e.g., of the coupled display construct) about its axis. The fastener may comprise a movable joint (e.g., a hinge). The fastener may allow swinging of at least one of its portions about an axis. The fastener may comprise a mechanical bearing that connects two solid objects. At least one of the solid objects can swing about an axis (e.g., pin, pintle, or rod, e.g., cylindrical rod). The swinging motion may be to a limited angle of rotation between the two solid portions (e.g., hinge leaves). The angle may be at most about 270 degrees (0), 180°, 90°, 60°, 45°, or 30°. The angle may facilitate reaching any circuitry and/or (e.g., electrical) connections coupled to the fastener. The angle may facilitate attaching and/or detaching the display construct from the fastener. The angle may facilitate attaching and/or detaching the fastener to the supporting structure. The fastener may comprise a barrel hinge, butt hinge, Mortise hinge, concealed hinge (e.g., cup hinge or euro hinge), continuous hinge (e.g., plano hinge), flag hinge, H-Hinge, HL hinge, pivot hinge (e.g., double acting hinge), self-closing hinge, spring hinge, or living hinge (e.g., devoid of knuckles or pins). The swiveling may be of the hinge leaves (e.g., any anything attached to the hinge leaves). The hinge axis may be of the same material as the fastener body (e.g., hinge leaves), or of a different material. For example, the hinge axis can be of a harder material as compared to the hinge body (e.g., hinge leaves). The hinge axis and/or leaves can comprise metal (e.g., comprise elemental metal or metal alloy). The fastener may include knuckles and/or an axis (e.g., a pin). The leaf may extend from a set of knuckles that hold the hinge axis. For example, the fastener may comprise two sets of knuckles and/or two pins. The knuckles may be part of the leaf of the fastener (e.g., an integral part of the leaf, made of the same material piece). Any part of the hinge may comprise a composite material (e.g., comprising carbon fiber). The hinge may comprise a ceramic material. The hinge may be made of a heat conductive material such as metal (e.g., copper and/or aluminum). The metal may comprise an elemental metal or a metal alloy. The hinge axis (e.g., pintle) can be of a durable material. The durable material may comprise stainless steel, titanium, plane steel, iron, Inconel, Hastelloy, Waspaloy, Rene alloy, Incoloy, MP98T, TMS alloy, or CMSX single crystal alloy. The durable material may comprise a superalloy (e.g., high performance alloy). The hinge (e.g., any of its components such as its axis (e.g., pintle)) can comprise the durable material (e.g., superalloy). The knuckle of the hinge may have a hollow cylindrical cavity (e.g., having a circular cross section). The cavity may form the joint of the hinge through which the hinge axis is set. The knuckles of either leaf can alternate and interlock with the axis (e.g., pintle) passing through the knuckles. The knuckle can form a closed cylindrical cavity. The knuckle can form an open cavity. FIG. 37 shows an example of a hinge leaf 3721 having knuckle (e.g., 3781) that forms an open cavity configure to accommodate the hinge axis 3720. The open cavity of the knuckle facilitates attachment and/or detachment of its leaf (e.g., 3721) from the axis. In the knuckle example having an open cavity, the knuckle may separate from the pintle by (i) moving the knuckles away from the pintle in a direction normal to the pintle (e.g., and in the direction opposite to the chuckle cavity opening (e.g., 3782) that extends along the pintle axis, and/or (ii) extracting the pintle by moving it along its axis. FIG. 36 shows an example of a knuckle 3682 having a closed cylindrical cavity through which axis (e.g., pintle) 3620 traverses. In a closed knuckle example, the pintle may be able to move (i) along its axis (e.g., 3683) and in a circular motion about its axis. In a closed knuckle scenario, the knuckle may detach from the pintle by extracting the pintle by moving it along its axis (e.g., 3683).

Figure 40:
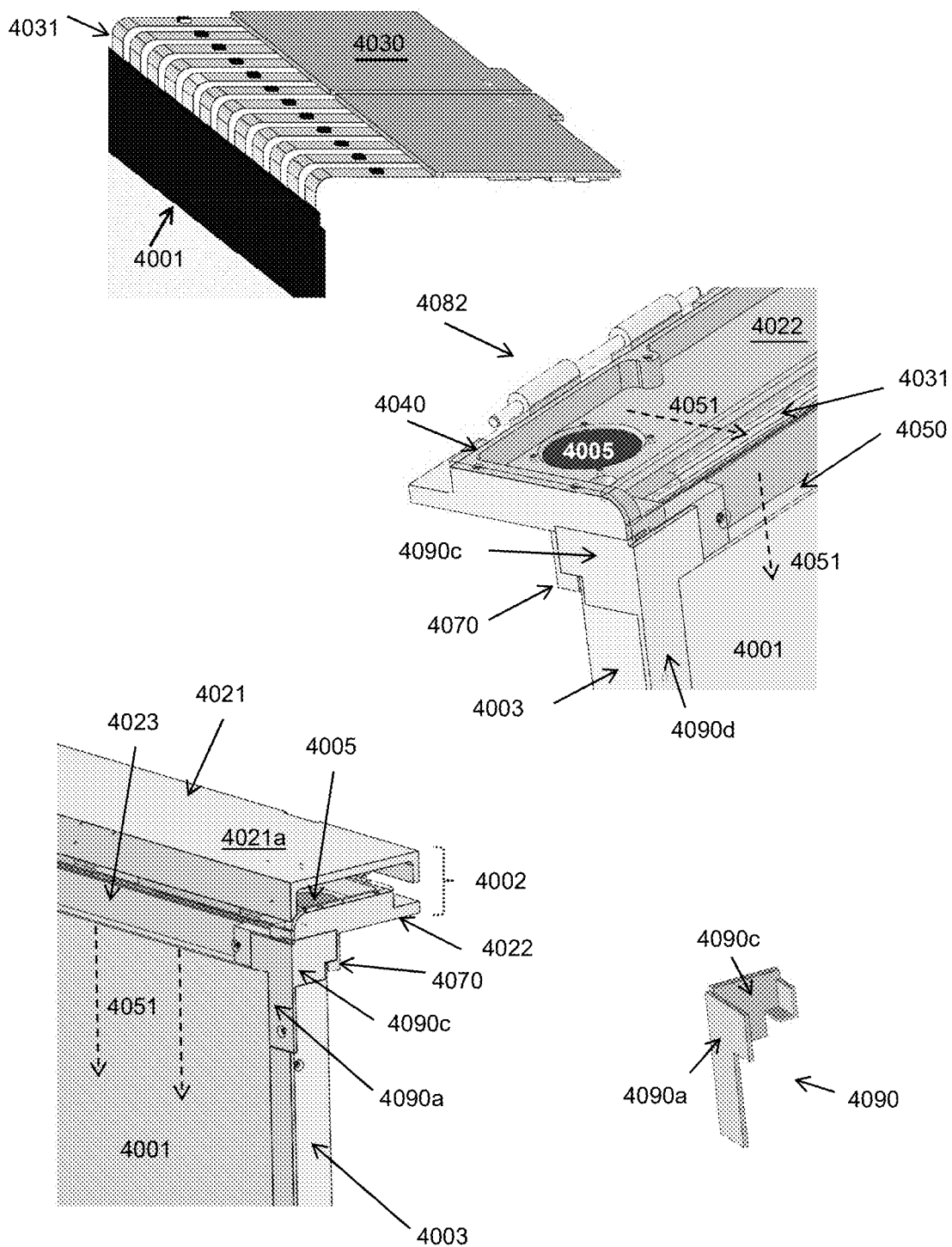
FIG. 40 schematically show various views of portions of a display constructs and associated components (e.g., portions thereof)
Figure 41:
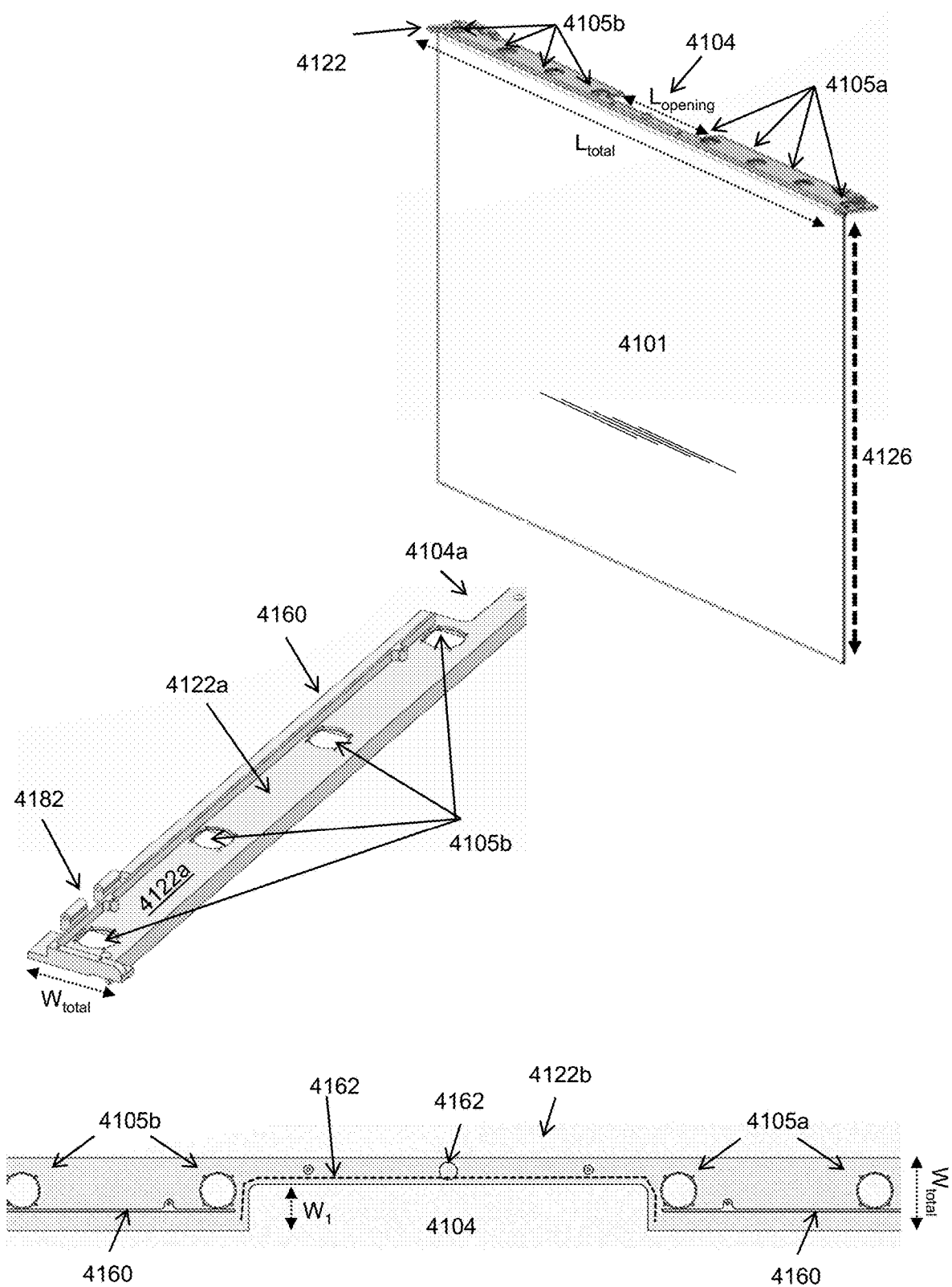
FIG. 41 schematically show various views of a display constructs and associated components (e.g., portions thereof)

In some embodiments, a plane of the hinge leaf face is (e.g., substantially) planar. In some embodiments, a plane of the hinge leaf face is devoid of curvature (e.g., concave, convex, or rippled). FIG. 40 shows perspective view examples of hinge leaf 4021 having a planar hinge leaf face surface 4021a. FIG. 41 shows an example of hinge leaf 4122 having a planar hinge leaf face surface 4122a (partial view shown).

In some embodiments the fastener is configured to accommodate various components. The fastener (e.g., comprising the hinge) may be configured to accommodate one or more circuitry boards. For example, the fastener may be configured to accommodate a circuit board comprising a booster and/or driver board for the display to which it is configured to connect to. For example, the fastener may be configured to accommodate a circuit board of the touch screen functionality (e.g., sensor and emitter panels). The fastener may be configured to allow easy installation, removal, and/or maintenance (e.g., as disclosed herein). Easy may refer to low labor cost, low labor grade (e.g., low labor qualification), and/or short labor time. At least one of the hinge leaves can comprise an opening through which at least a portion of the circuitry (e.g., PCB) is viewable and/or accessible. At least one of the hinge leaves may be configure to facility viewing, access to, and/or manipulation of, at least one connector. For example, at least some of the connectors in the circuitry (or coupled to the circuitry) can be viewable, accessible, and/or manipulatable through the opening. For example, at least some of the connectors between the circuitry and the display construct can be viewable and/or accessible through the opening. The opening may facilitate removal of cable(s) coupled to the connector. The opening may facilitate attachment and detachment of the cables, e.g., for maintenance, replacement, and/or removal (e.g., of the cabling, of the circuitry, and/or of the display construct). The fastener may snap and/or be screwed to the structure. The circuit board may snap into the fastener, attached to the fastener (e.g., using an adhesive), or snap to the fastener. At times, the display construct may require replacement before replacement of any portion of the support structure (e.g., and/or tintable glass) to which it is coupled. The fastener may or may not have magnetic components. The fastener may be coupled to a supporting structure. The fastener may or may not be attached to a window. The fastener may or may not be bolted into a window (e.g., using through holes in the window). In some embodiments, the fastener is not directly coupled to the window (e.g., using any through holes in the window and/or using an adhesive). In some embodiments, the display construct is not directly coupled to the window (e.g., using any through holes in the window and/or using an adhesive).

Figure 35:
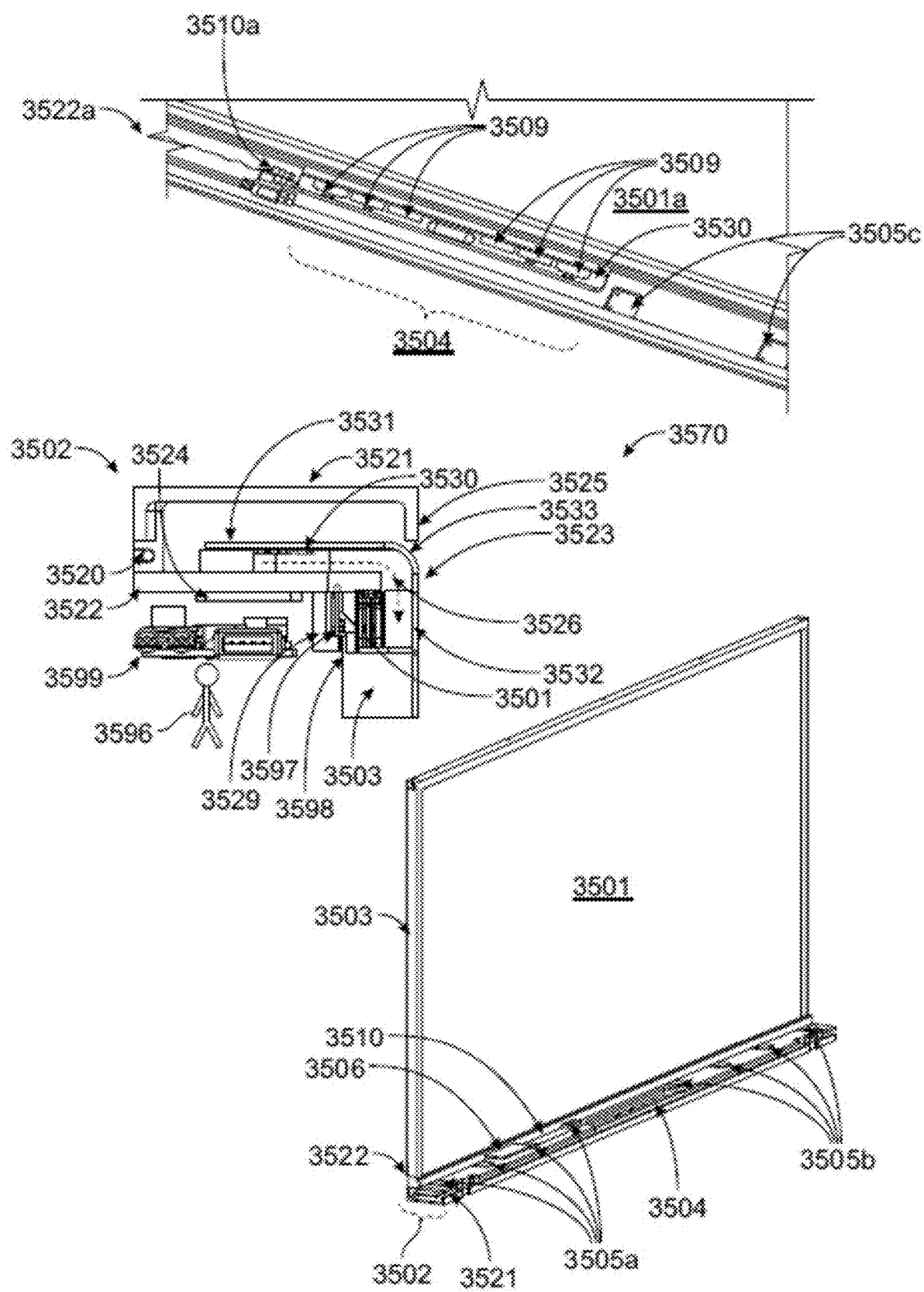
FIG. 35 schematically show various views of a display constructs and associated components (e.g., portions thereof)

FIG. 35 shows example views of a fastener 3502 that is coupled to a display construct 3501 bordered by sensor-emitter panels housed in a protective framing such as 3503 to facilitate touch screen capability. The fastener 3502 has an opening 3504 through which a portion of a circuit board 3530 can be viewed. The circuit board can incorporate a booster and/or driver board coupled with the display emitters (e.g., LEDs). The circuit board 3530 comprises six connectors 3509. The connectors can facilitate transmittance of data (including media and/or control related data) and/or power from the power source and/or E-Box (compositing the circuit board (e.g., timing controller)) to the display construct. The fastener may comprise a hinge axis 3520 coupled to hinge leaves 3521 and 3522. A first hinge leaf 3521 comprises a bracket configured to attach to the structure (e.g., frame portion). A second hinge leaf 3522 comprises the opening 3504 for the circuitry and/or connectors. Any of the hinge leaves can be made from a single piece of material (e.g., from a single slab), or can be made of portions attached together to form a single piece. Attached can comprise stitched, welded, interlocked, or screwed, In some embodiments, the fastener is configured to extend along a side of the display construct. The fastener can comprise a single unit that extends to the at least a portion of the side length of the display construct. The single unit may be of a single material (e.g., a single slab). The single unit may or may not have one or more openings. The extension of the unit (e.g., hinge leaf) may be of at least about 30%, 40%, 50%, 60%, 70%, 80%, 90%, 95%, or 95% of the length of the display construct side. In some embodiments, at least a portion of the fastener (e.g., at least one hinge leaf) extends to the full length of a side of the display construct. In some embodiments, the fastener extends (e.g., slightly) beyond the full length of the side of the display construct. In some embodiments, the fastener accommodates the side of the display construct. FIG. 35 shows an example of fastener 3502 having a portion (e.g., hinge leaf) 3522 that extends to at least the full length of display construct 3501, which hinge leaf 3522 has an opening 3504 that facilitate access to at least a portion of the circuitry 3530 (e.g., connectors 3509 thereof) as well as a plurality of openings that facilitate air flow and/or heat exchange, which hinge leaf is formed of a single portion (e.g., single slab).

In some embodiments, the fastener may be configured to facilitate heat exchange. The fastener may be configured to accommodate any of the heat exchange devices and/or technologies disclosed herein. For example, the fastener may be configured to accommodate one or more fans for active gas (e.g., air) conduction. The fastener may be configured to accommodate at least 1, 2, 3, 4, 5, 6, 7, 8, 9, 10, or 20 fans. The fastener may be configured to accommodate a number of fans between any of the aforementioned number of fans (e.g., from 1 to 20, from 1 to 10, or from 10 to 20). The number of fans may be an even number. The number of fans may be (e.g., evenly) distributed on both sides of the opening. The opening to the circuitry may be centered along a length of the fastener. The openings for the gas flow (e.g., and placement of the fans) may be disposed along the fastener and further away from the opening. Every two fans may be symmetrically aligned along the middle portion of the fastener length (e.g., leaf length). FIG. 35 shows an example of a fastener 3502 having a leaf with an opening 3504 centered along its length, which leaf has a plurality of openings 3505a and 3505b (eight openings in total) that facilitate gas exchange and accommodation of fans (e.g., 3524). The plurality of openings may be vent holes. The openings can be arranged symmetrically along the length center of the fastener and extend along the fastener leaf away from the opening. The openings in each of the opening groups 3505a and 3505b are distributed evenly (e.g., are evenly spaced) along the fastener (e.g., hinge leaf) portion and arranged symmetrically as two groups, with respect to the center of the fastener length. Fastener leaf 3522 is coupled to a corner 3529 configured to hold a circuit board 3597. The circuit board can be coupled to the sensor and emitter panel disposed in a protective framing cover 3503. The framing cover protects at least a portion of a transparent material (e.g., 3598) configured to allow the emitted radiation (e.g., infrared radiation) of the touch screen functionality to travel therethrough.

In some embodiments, the display construct fastener comprises a plurality of circuit boards. The circuit boards may include a booster and/or driver board, and/or at least one circuitry facilitating the touch screen functionality. For example, there could be two circuit boards facilitating the touch screen functionality. At least one of the plurality of circuit boards may be attached to the fastener. FIG. 35 shows an example of a touch screen circuitry 3597 coupled to the hinge leaf 3522 by a connective piece (e.g., L bracket 3529. An additional circuitry 3599 (e.g., facilitating the touch screen functionality) (e.g., 3599) may or may not be coupled to the fastener (e.g., to hinge leaf 3522).

In some examples, the fastener facilitates cooling and/or air flow on one side of the display construct, and touch screen functionality on the opposing side of the display construct. FIG. 35 shows an example of touch screen 3501 coupled to fastener 3502 such that an air flow 3536 is directed to the back side of the display construct 3501 that would be further away from a viewer, and a touch screen functionality (e.g., including transparent material 3598) disposed on the opposing side of the display construct 3501 that is closer to the viewer (e.g., and accessible to the viewer for touch screen functionality). The viewer is displayed schematically as figurine 3596 to designate the viewer side of display construct 3501 (e.g., which scale may be disproportional, e.g., to the display construct).

In some embodiments, the fastener may be configured to facilitate heat exchange. The fastener may be configured to facilitate active heat conduction from the external atmosphere towards the display construct (e.g., gas pushing). The fastener may be configured to facilitate active heat conduction from the display construct towards the external atmosphere (e.g., gas suction). For example, the fastener may be configured to accommodate one or more fans configured to direct gas (e.g., air) from the ambient atmosphere around the fastener, towards a designated path. The path may be designated by a directing structure. The directing structure may at least one planar and/or a curved portion. FIG. 35 shows an example of a gas directing structure 3523 having planar portions 3531 and 3532, and curved portion 3533. The gas directing structure may be formed of one piece of material (e.g., one slab), or a plurality of attached (e.g., stitched, soldered, interlocked, and/or fastened) portions. The gas directing portion may be configured to direct the gas along path 3526. FIG. 35 shows various views of a fastener and associated components. The gas may be directed from the external environment (e.g., atmosphere of the enclosure) towards the display construct, e.g., through the gas directing path (e.g., formed by the gas directing structure and/or the fastener. The gas directing structure may be part of the fastener or coupled thereto. The gas directing structure may be coupled (e.g., fastened to or be a part of) to a first leaf of the fastener. The gas directing structure may not be part of (or coupled to) the other (e.g., second) leaf. The gas directing structure may be coupled (e.g., fastened to or be a part of) to a first leaf of the fastener configured to attach to the display construct. The gas directing structure may not be part of (or not be coupled to) the other (e.g., second) leaf configured to attach to the supportive structure (e.g., fixture such as a frame portion or a wall). The supportive structure may be part of the enclosure (e.g., a fixture of the enclosure). The fans may comprise an actuator. The fans may be controlled by the controller (e.g., any controller disclosed herein). The fans may be controller locally (e.g., in the controller of the fastener and/or the E-box). The fans may be controlled remotely (e.g., by the BMS, and/or by higher hierarchy controller such as a floor controller or a master controller). The fans may be controller by a controller configured to control a sensor and/or emitter (e.g., a device ensemble).

FIG. 36 shows perspective view examples of a display construct coupled to a portion of the fastener. FIG. 36 shows an example of hinge leaf 3622 having two knuckle groups 3685a and 3685b. Each knuckle group has a hinge (e.g., 3620) inserted therethrough. Each knuckle group is part of a knuckle assembly forming a hinge. The knuckle groups 3685a and 3685b form an integral portion of the hinge leaf 3622 that has a plurality of openings arranged in two symmetric groups 3605a and 3605b about the center of the length of hinge leaf 3622. The hinge leaf 3622 has an egressed portion 3604 centered about the length of the hinge length. The hinge leaf 3622 is formed of a single piece (e.g., single slab, slice, strip, or plate). The hinge leaf 3622 extends along the full length of the side of display construct 3601. The display construct 3601 is devoid of a frame surrounding all its sides. The openings (e.g., 3605c) are configured to allow gas (e.g., air) to pass therethrough from one side of the display construct 3601, e.g., along path 3626. Hinge leaf 3622 also comprises a protruding feature (e.g., boss) 3699. The ending "a" in numerals 3601a and 3622a designates that a portion of the respective items without the ending "a" is shown (e.g., 3601a is a portion of display construct 3601).

FIG. 37 shows perspective view examples of display construct 3701 framed by sensor-emitter panel e.g., 3703. The display construct is coupled to a fastener 3702 having two hinge leaves 3721 and 3722. The hinge leaf 3721 is configured to couple to a supporting structure. The hinge leaf 3721 has two sets of open knuckles 3783a and 3783b configured to attach or detach to hinge leaf 3722, by integrating with the closed cavity knuckles 3785a and 3785b respectively, each holding a hinge pintle. The hinge leaf 3721 is formed in a shape of a bracket. Hinge leaf 3722 comprises an opening 3704 (e.g., carved out portion, or egress) centered along its length, which opening extends to a portion of the hinge leaf width. The opening is configured to facilitate access to a portion of any attached circuitry (e.g., booster and/or driver board) and/or connectors that would be attached to hinge leaf 3722 and/or coupled to (e.g., and communicating with) the display construct and to the E-box and power source. Hinge leaf 3722 has a plurality of openings (e.g., 3705) arranged as two groups about the length of the leaf hinge 3722. The openings in each group are evenly spaced. The openings allow exchange of gas (e.g., air). Hinge leaf 3722 is coupled to a gas directing structure (e.g., gas guide) 3723. The gas guide is configured to direct any incoming gas (e.g., air) through the openings (e.g., 3705) to one side of the display construct through cavity 3750, such that the gas will flow, e.g., in the direction depicted in broken arrows 3751 (or in a reverse direction). Portion 3732 covers (and forms) the cavity 3750, which portion 3732, 3733, and 3731 are part of the gas guide portion 3723. The ending "a" in numerals 3701a, 3702a, 3703a, 3721a, 3722a, 3723a, and 3733a designates that a portion of the respective items without the ending "a" is shown (e.g., 3701a is a portion of display construct 3701).

In some embodiments, the fastener is configured to facilitate heat exchange. The heat exchange may be active. The heat exchange may be facilitated by one or more fans, gas (e.g., air) directing component, and/or gas channel. The paths formed in the fastener for the gas flow may be designed to accommodate the flow of air without forming excessive or reduced pressure in the faster, e.g., as compared to ambient pressure. The area through which the gas is allowed to flow in the fastener may be greater that the area through which the gas flows in the fans. For example, the total horizontal cross sectional area of the fan openings (e.g., 3805) may be smaller than the total horizontal cross sectional area between the gas guide (e.g., 3823) and the plate (e.g., 3855) that together form the gas channel directing the gas (e.g., 3851) towards the outer portion of the display construct (e.g., 3801).

Figure 38:
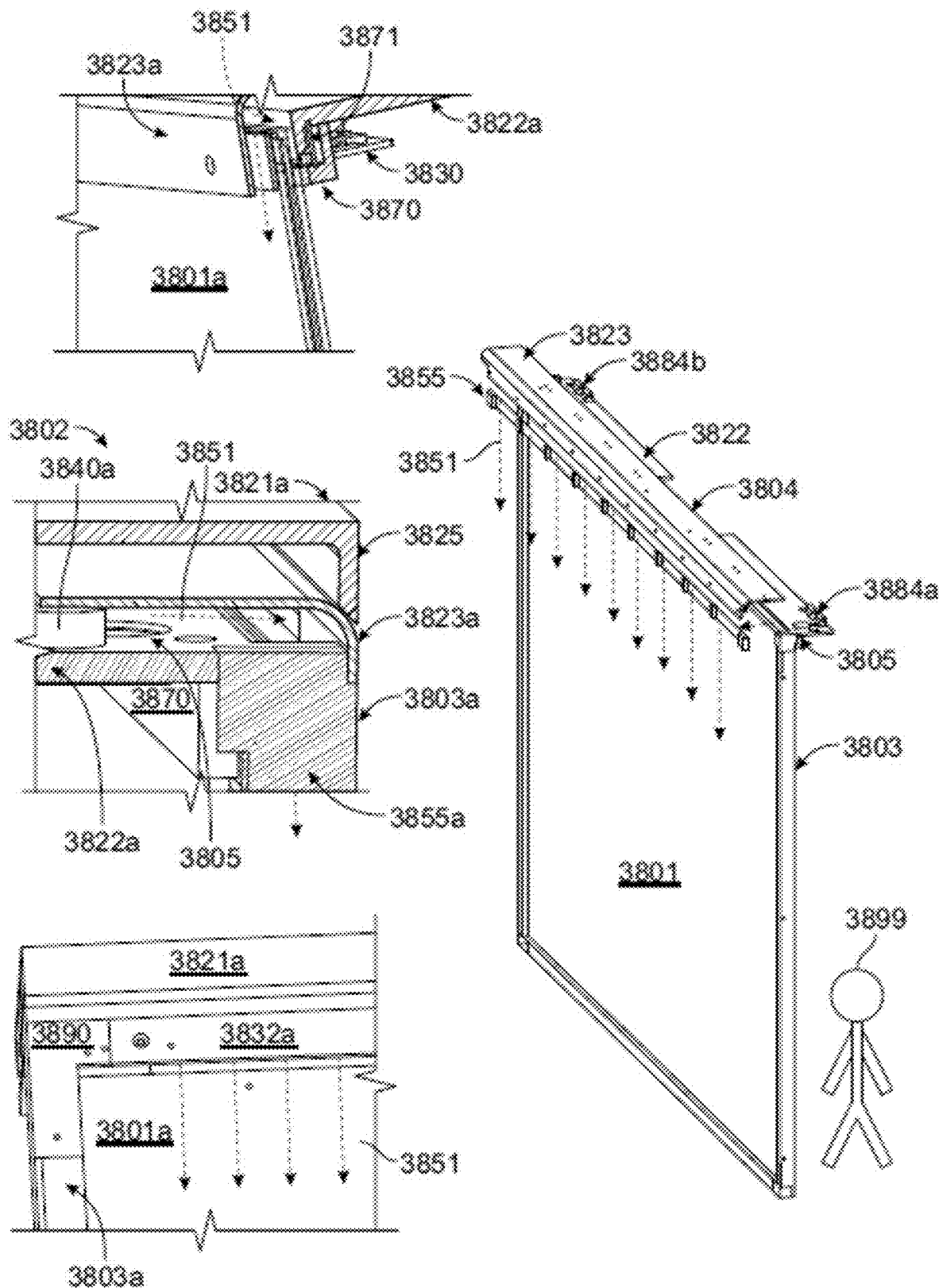
FIG. 38 schematically show various views of a display constructs and associated components (e.g., portions thereof)

FIG. 38 shows perspective view examples of display construct 3801 coupled to portions of a fastener 3822 (e.g., hinge leaf) having an opening (e.g., regression, carveout, or egress) 3804 that extends to a portion of its width, which opening is centered along its length. The opening 3804 is configured to allow access to a portion of the circuitry 3830 and/or connectors thereof. Hinge leaf 3822 has two sets of knuckles 3884a and 3884b, and a plurality of openings (e.g., 3805) that facilitates flow of gas (e.g., air) therethrough. Hinge leaf 3822 is coupled to a gas guide 3823 that is configured to guide gas flowing through (e.g., incoming or outgoing) the openings (e.g., 3805). The gas guide is coupled to a plate 3855 having ten protrusions. The protrusions are evenly spaced along the length of the plate. The plate is coupled with the gas guide 3823 to form a gas passage (e.g., between every two protrusions). The protrusions are configured to prevent bending (e.g., collapse) of the gas guide and/or the plate. The protrusions are configured to ensure that the gas passages remain operational and/or intact over time. The gas guide 3823 and the plate 3855 guide the gas in the direction depicted by the broken arrows (e.g., 3851). Gas guide 3832 (e.g., that is attached to, or as part of, hinge leaf 3822) is configured to engage with hinge leaf 3821 comprising a bracket. The display construct 3801 is framed by sensor-emitter panels (e.g., 3803) that facilitate touch screen capability. The bracket portion of the fastener can have at least one pointed end (e.g., 3821) or at least one non-pointed end portion (e.g., 3525). At least one end of the bracket may be disposed close to the gas guide, e.g., when the hinge of the fastener is in a closed position. At least one end of the bracket may or may not contact the gas guide. The fastener may be configured to allow a gas passage (e.g., and a gap) between the bracket portion of the fastener and the gas guide, e.g., when the fastener is in a closed position. FIG. 35 shows an example of a gap between the gas guide 3523 and the non-pointed bracket end 3525 of leaf 3921 of the fastener. FIG. 38 shows an example of a gap between a pointed bracket end 3825 of leaf 3821 of the fastener and its complementary portion gas guide 3823 that is part of the bent portion 3533. At least one end of the bracket may form a right angle or a non-right angle with a side of the bracket. At least one end of the bracket may have an angle and/or curvature that is complementary to the gas guide portion immediately adjacent to it, e.g., when the fastener is in a closed position (e.g., shown in the example of 3802). Hinge leaf 3822 is configured to mount a circuitry 3871 (e.g., facilitating the touch screen functionality), which mounting is by using a mounting structure that in the shape of an L bracket 3870. The mounting structure can be an integral part of the hinge leaf 3822, or may be a separate portion that is snapped, interlocked, soldered, glued, bolted, or otherwise attached to hinge leaf 3822. The ending "a" in numerals 3801a, 3803a, 3821a, 3822a, 3832a, 3821a, 3823a, 3840a, and 3855a designates that a portion of the respective items without the ending "a" is shown (e.g., 3801a is a portion of display construct 3801). Item 3890 is a connective piece (e.g., 4090). The gas guide can be coupled (e.g., attached) to the fastener by any attachment (e.g., coupling) method disclosed herein (e.g., snapping, soldering, gluing, bolting, interlocking, or screwing). At the closed position of the fastener, the first leaf and the second leaf (and any objects attached thereto) maintain a separation (e.g., gap) from each other (e.g., do not contact each other). The separation (e.g., gap) can be of at most about 0.2 millimeters (mm), 0.3 mm, 0.4 mm, 0.5 mm, 0.8 mm, 1 mm, 3 mm, or 5 mm. The separation (e.g., gap) can be between any of the aforementioned values (e.g., from about 0.2 mm to about 5 mm, from about 0.2 mm to about 0.5 mm, from about 0.3 mm to about 1 mm, or from about 0.8 mm to about 5 mm). The gap may be between the tip of the bracket portion (e.g., 3525) of the first hinge leaf and its complementary portion that is part of the second hinge leaf (e.g., attached to or an integral part of), such as the gap guide (3.g., 3523) complementary portion (e.g., 3533) to the bracket tip portion (e.g., 3525). The ending "a" in numerals 3501a, 3510a, and 3522a, designates that a portion of the respective items without the ending "a" is shown (e.g., 3501a is a portion of display construct 3501). Item 3505c represent a portion of fans 3505b. The fastener and associated components are represented as a side view in 3570.

In some embodiments, the fastener is masked from the viewer by a cap (e.g., beauty cap). The cap can serve as a protective lid or cover for the fastener. The cap can mask the fastener in the supportive structure (e.g., fixture) in which it is installed. For example, the cap can mimic a portion of a framing (e.g., window framing), or a portion of a wall. The cap can be camouflaged in its surrounding (e.g., in the supportive structure). The cap can attach to the supportive structure, e.g., using any of the attachments disclosed herein, e.g., bolting, screwing, snapping, or adhering (e.g., using an adhesive). The supportive structure may be configured to facilitate such attachment (e.g., by incorporating a complementary structure to which the cap would attach to).

In some embodiments, the gas guide is configured to guide the gas along a side of the display construct. The side of the display construct along which the gas is guided to, may be closest to the supportive structure (e.g., wall, tintable glass, and/or framing). The side of the display construct along which the gas is guided to, may be further away from a viewer. The side of the display construct along which the gas is guided to, may be opposite to a side of the display construct having the touch screen capability. The side of the display construct along which the gas is guided to, may be opposition to the side along which emitters are emitting radiation as part of the touch screen functionality. FIG. 38 shows an example of a display construct 3801 having gas flow directed on one side of display construct 3801, illustrated by broken arrows, e.g., 3841, which side of the display construct is opposite to the side viewed and/or accessed by a viewer illustrated schematically by figurine 3899 (e.g., which scale may be unproportioned, e.g., to the display construct).

In some embodiments, the gas guide may be separated from a hinge leaf by a protruded feature (e.g., a boss). The protruding feature may protrude from the gas guide or from the hinge leaf. The protruding feature may be an integral part of the gas guide or hinge leaf. The protruding feature may be a separate piece that is attached to the gas guide or hinge leaf (e.g., using any of the attachment methods disclosed herein). FIG. 38 shows an example of a protruding feature 3840 (e.g., boss) that protrudes from hinge leaf 3822. The protruding feature may offer structural support to portion(s) of the fastener.

In some embodiments, initiation of active heat exchange may be controlled by a controller. The controller may utilize a feedback control scheme. The feedback control scheme may utilize temperature data. The temperature data may derive from at least one temperature sensor. The temperature data may relate to the temperature at one or more positions of the display construct. The fastener may be configured to accommodate and/or connect to at least one temperature sensor (e.g., thermocouple or IR sensor). The at least one temperature sensor may be configured to sense a temperature of the display construct. The at least one temperature sensor may be disposed such that it will contact a side (e.g., rim) of the display construct away from the viewer, closest to the supporting structure, and/or closest to a window to which it is coupled. The at least one sensor may be disposed in a framing (e.g., sensor and emitter protective framing) and/or any portion (e.g., component) of the fastener. The control scheme may direct activation of the active heat exchange system (e.g., fans and/or cooler) when the temperature reaches first threshold (e.g., as disclosed herein). The control scheme may direct shutting off operation of the display construct when the temperature reaches a second threshold (e.g., as disclosed herein). The control scheme may direct de-activation of the active heat exchange system (e.g., fans and/or cooler) when the temperature reaches a third threshold (e.g., as disclosed herein). In some embodiments, the second threshold is higher than the first threshold (e.g., has a higher temperature value). In some embodiments, the third threshold is lower than the first threshold (e.g., has a lower temperature value). At times, the active heat exchange is always in an "on" mode, and is shut down if the temperature exceeds a threshold (e.g., the second threshold delineated herein). The (e.g., any of the high temperature) threshold may be of a temperature having a value of at least about 40° C., 43° C., 45° C., 47° C., 49° C., 50° C., 53° C., 55° C., or 57° C. The lowest threshold may be of a temperature having a value of at most about 25° C., 30° C., 35° C., 40° C., or 45° C. The high temperature threshold may be a temperature at which the light emitting entities are likely to be (e.g., permanently) damages (e.g., burn out).

Figure 39:
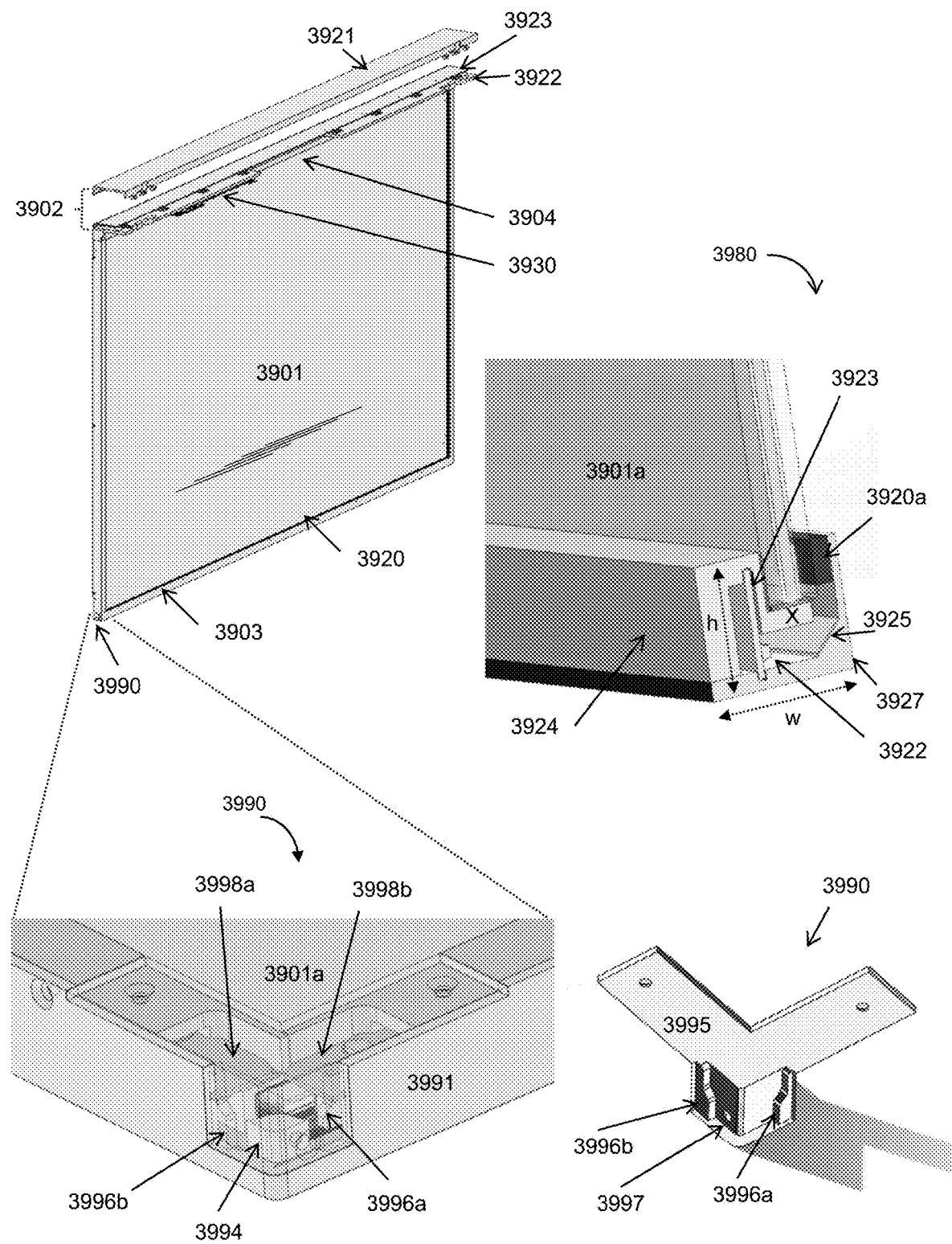
FIG. 39 schematically show various views of a display constructs and associated components (e.g., portions thereof)

FIG. 39 shows perspective view examples of various portions of display construct 3901 having touch screen capability, coupled to a fastener 3902. The fastener has a hinge having a first hinge leaf 3921 and a second hinge leaf 3922, which leaves are configured to swing about an axis. Item 3980 shows a portion of the display construct bordered by a portion of the sensor-emitter panel and its housing. The fastener includes a gas guide 3923, a plurality of holes that facilitate egress and/or ingress of gas therethrough, and a first circuitry 3930. The hinge leaf 3922 has a depression 3904. The depression can be configured to facilitate access to a second circuitry and/or connectors (not shown in FIG. 39) configured to be coupled to the display construct and to the E-box (e.g., timing controller therein) and/or power source. The first circuitry 3930 may be disposed on (or be otherwise coupled to) a side of the hinge leaf 3922. The first circuitry may be configured to facilitate operation of the touch screen functionality, which includes sensor and emitter panels bordering the display construct, e.g., 3903. The sensor and emitter panel comprises a circuitry 3923 to which the sensors and emitters (e.g., 3922 are coupled to, a reflective surface (e.g., mirror) 3925, a protecting framing including 3924 and 3927, and transparent material 3920 configured to allow radiation from the emitters to travel therethrough (and optionally protect the circuitry from the ambient environment such as from humidity). The framing portion 3924 is configured to support the display construct 3901 above a portion of sensor and emitter assembly (e.g., above reflecting surface 3925). The protecting framing (and the components therein) extends along a side of the display construct 3901. Every two perpendicular protecting framings meet at a connection corner 3990 at an edge of the display construct 3901. The connecting corner comprises a body 3991 and a cover 3995 of the body. The body may be a single piece faceplate. The cover (e.g., corner cover) is a tripoded cover 3995. The tripoded cover has three extensions that together form the tripod. Two of the three extensions are disposed on a plane, and the third extension is disposed normal to the plane. The third extension comprises two wavy structures. The tripoded cover 3995 is configured to seal the connector of the two normal protecting frames at their meeting edge 3990. The body of the connecting corner is configured to house circuit boards 3998a and 3998b of the sensor-emitter circuitry. 3901a is a portion of display construct 3901. The circuit boards are connected to each other at the corner (not shown). One of the two circuit boards is connected to the touch screen circuit board 3930. The body is configured to house an internal connector 3094 that has two curved edges, and two pointy edges forming a cross section akin to an eye or an almond. The internal connector 3994 comprises housing configured to accommodate a screw. The integral connector may be part of the single piece faceplate 3991.

In some embodiments, the framing of the display construct is configured to (i) support the display construct and (ii) separate the display construct from the sensor and emitter assembly, and (iii) protect the sensor and emitter assembly from the ambient environment. The display construct is configured to be located in a cavity that is horizontally and/or vertically within of the sensor and emitter assembly. The display construct is separated from a cavity holding the sensor and emitter assembly at least in part by a framing (e.g., 3924) and/or by an adhesive. FIG. 39 shows an example of display construct 3901 held by framing portion 3924 and an adhesive (e.g., double sided tape) that contacts the display construct with the transparent material 3920. The framing comprising 3924 and 3927 forms an internal cavity for the sensor and emitter assembly (e.g., 3922 and 3925), and an external cavity housing the display construct (e.g., 3901). The transparent material 3920 of the sensor-emitter assembly caps (at least in part, e.g., with the adhesive material) this internal cavity from external influences (e.g., humidity and/or debris). 3920a is a portion of transparent material 3920. Position X on which the display construct 3901 is disposed, is vertically and horizontally within the height of the framing h and the width of the framing w. The adhesive material can be a very bonding (VHB) adhesive material (e.g., VHB double side tape of 3M).

In some embodiments, two orthogonal sensor and emitter panels are held together by a corner assembly piece. The corner assembly piece may comprise guiding features configured to guide two orthogonal circuitry of the sensors and emitters and align them (e.g., vertically) with respect to each other, e.g., within a tolerance. The corner piece may have step guides, or wavy guides. FIG. 39 shows an example of a corner assembly 3940 comprising a body 3991 and a corner cover 3995, which corner assembly has two guides 3996a and 3996b, each guiding a sensor and emitter circuitry. The guide (e.g., self-guiding feature) may be configured to hold the circuit board in place (e.g., within a tolerance). The tolerance may allow vertical and/or horizontal displacement of the circuit board of at most about 0.5 millimeter (e.g., mm), 0.4 mm, 0.3 mm, 0.2 mm, or 0.1 mm.

In some embodiments, the framing of the display construct is coupled to the fastener using at least one connective piece. The connective piece may comprise a tripod. The connective piece may have three planes facing three orthogonal directions. The connective piece may be configured to connect the fastener with the protective framing of the sensor-emitter panel. The connective piece may be configured to engulf three orthogonal sides of a portion of (e.g., an edge of) the fastener. FIG. 40 shows perspective view examples of various portions of a display construct and associated components. FIG. 40 shows an example of an entire connective piece 4090 having three orthogonal sides 4090a, 4090b, and 4090c (4090d is a partial view of 4090a). The connective piece 4090 is configured to connect to the gas direction portion 4032 (shown in a partial view thereof) that directs gas through a first opening 4005, a second opening 4050 and onto the rear side of display construct 4001 (shown as a portion of the display construct), e.g., along broken arrows 4051. The connective piece 4090 is configured to seal a circuitry held by supporting portion 4070, and couple to (e.g., connect to) the supporting portion, and to a side of the protective framing of the sensor-emitter assembly 4003 (partial view shown) at its 4090a side. The fastener comprises at least one hinge having knuckles and pintle (e.g., 4082), a first hinge leaf 4021 (partial view shown) comprising a bracket that is configured to mount on a supportive structure (e.g., fixture), and a second hinge leaf 4022 (partial view shown). The second hinge leaf having at least one gas opening such as 4005, comprises an elevated structure 4040 that reduces escape of gas between the leaf of the hinge, when the hinge is at its closed position. The fastener 4002 is configured to house at least one circuit board, e.g., 4030 (shown as the entire circuit board). Circuit board 4030 (e.g., comprising the driver and/or booster board) is configured to connect to the display construct 4001 and provide data and/or power via cabling 4031. Circuit board 4030 is also configured to connect the E-box (e.g., comprising the timing controller) and/or to the power supply via (e.g., six) other cables not sown in FIG. 40. The other cables may extend from the face of board 4030 that is opposite to the one shown in FIG. 40.

In some embodiments, the fastener is configured to direct a flow of gas. The flow of gas can be directed along designated openings in the fastener and/or formed by the fastener. The fastener, e.g., at its operational and/or closed position, may reduce the probability of gas flow in directions other than the designated openings. The operational position of the fastener can be a position that facilitates operation of the display construct for its intended purpose (e.g., projecting media). The fastener may comprise a hinge having two leaves (e.g., joined by knuckles and pintle arrangement). At least one of the leaves may comprise an elevated rim to reduce gas from in that direction, e.g., when the fastener is closed and/or operational. At least one of the leaves may comprise a gasket to reduce gas from in that direction, e.g., when the fastener is closed and/or operational. FIG. 41 shows perspective and top view examples of display construct 4101 coupled to a portion of a fastener 4122 having a plurality of holes 4105*b* and 4105*a* configured to facilitate gas flowing therethrough. The hinge leaf 4122 comprises knuckles 4182. The hinge leaf comprises an elevated portions 4160 that reduces flow of gas through the elevated portion, which flow of gas is between the interior of the fastener (e.g., when closed and/or operational) and the ambient environment. The elevated portion may comprise a gasket; or be devoid of a gasket. The hinge leaf 4122 comprises a depression 4104 that extends to a portion of its width and is centered at its length. 4104*a* is a portion of 4104. Items 4122*a* and 4122*b* are portions of 4122. A gasket may be placed along the 4122 rim of the opening 4104, as depicted in broken line 4162. Hinge leaf 4122 comprises a protruding feature (e.g., boss) 4162. The protruding feature may offer structural support to component(s) of the hinge. The protruding feature may be an integral part of the fastener (e.g., of the hinge leaf). The protruding feature may be a separate piece that is attached to the fastener (e.g., of the hinge leaf), e.g., using any of the attachment methods disclosed herein. The protruding feature may be configured to prevent bending (e.g., collapse) of the fastener portion(s) (e.g., hinge leaf). The gasket may be formed of a polymer and/or resin. The polymer and/or resin may comprise a carbon or a silicon based material. For example, the polymer may be a polyurethane polymer. The gasket may comprise a foamy material. The gasket may comprise gas pockets, or may be devoid of (e.g., detectable) gas pockets. The gasket may comprise a flexible material (e.g., rubber or latex). The gasket may comprise a material that is opaque or transparent to visible light.

In some embodiments, the circuitry contacts and/or attached to the gas guide. For example, the circuitry can be disposed and/or attach to the gas guide, e.g., above the gas guide. Above may be in a direction opposite to a gravitational center (e.g., opposite to the direction of the gravitational vector 4200 that points to the gravitational center). The circuitry may be configured to facilitate gas flow through the gas channels. FIG. 42 shows various portions of the display construct and associated fastener assembly as perspective views. FIG. 42 shows an example of a circuit board 4230 (e.g., comprising the driver and/or booster board) that is configured to connect to the display construct (shown as portion 4201) and provide data and/or power via cabling 4231. Circuit board 4230 (partial view shown) is also configured to connect the E-box (e.g., comprising the timing controller) and/or to the power supply via (e.g., six) other cables not sown in FIG. 42. The other cables may extend from the face of board 4230 that is opposite to the one shown in FIG. 42. FIG. 42 shows an example of integration of the circuit board 4230 into the fastener that comprises a first portion 4222 (partially shown) and a second portion 4221 (partial view shown) held by hinges 4285. Hinge leaf 4222 is coupled to a gas guide 4223 that is configured to guide gas flowing through (e.g., incoming or outgoing) the openings (not shown in FIG. 42). The gas guide is coupled to a plate 4255 (partial view shown) having ten protrusions. The protrusions can be evenly spaced along the length of the plate. The plate is coupled with the gas guide 4223 to form a gas passage (e.g., between every two protrusions). The protrusions are configured to prevent bending (e.g., collapse) of the gas guide and/or the plate. The protrusions are configured to ensure that the gas passages remain operational and/or intact over time. The gas guide 4223 and the plate 4255 guide the gas in the direction depicted by the broken arrows (e.g., 4251). The hinge leaf 4222 is configured to engage with hinge leaf 4221 comprising a bracket. The display construct 4201 (partial view shown) is framed by sensor-emitter panels (e.g., 4203, partial view shown) that facilitate touch screen capability. 4299 shows a portion view of the fastener, display construct, and associated components. At least one gas passages may be aligned with a fan. The gas passage may be configured to facilitate a flow of gas that is at least as the flow of gas generated by the fan e.g., that is aligned to the gas passage). The gas passage may be configured to prevent a pressure in the fasteners that differs from ambient pressure, e.g., during operation of the fan(s). The ambient pressure may be of about 1 atmosphere. A pressure differing from ambient pressure comprises over or under pressure.

In some embodiments, the two portions of the fastener (e.g., first and second hinge leaves) are configured to reversibly engage and disengage from each other. For example, one hinge leaf may comprise knuckles having a closed cavity that hold a pintle, and the other leaf may comprise complementary knuckles having open cavity and are devoid of a pintle. The two complementary sets of knuckles may engage. The engagement may comprise a snap (e.g., slip in and snap). The engagement may press a spring. The engagement may be detected by a compression of a spring and/or by a sensor (e.g., pressure sensor). Once the complementary sets of knuckles are engaged, they may be affixed to prevent disengagement. The Affixing may be by utilizing a screw and/or a pin. Affixing may be automatically initiated on engagement of the two sets of complementary knuckles (e.g., using the sensor and/or spring). The Affixing may be manual. Affixing the two hinge leaves (e.g., by affixing the knuckles) may be reversible (e.g., automatic and/or manual). The knuckles may comprise an indentation on their surface (e.g., a notch or an incision). The screw and/or pin may engage with the indentation, e.g., upon affixing (e.g., securing) the knuckles and pintle mechanism. Affixing the knuckles and pintle may prevent the hinge to open. At least one of the hinges may comprise the fixating (e.g., affixing) mechanism. Fixating may be (e.g., automatically and/or manually) reversible (e.g., become unfixed). The unfixed hinge can open and close. The fixed hinge may remain in one position (e.g., closed position). Automatic fixation of the hinge may be controller by a controller (e.g., of the control system, or by a separate controller operatively coupled to the hinge).

Figure 43:
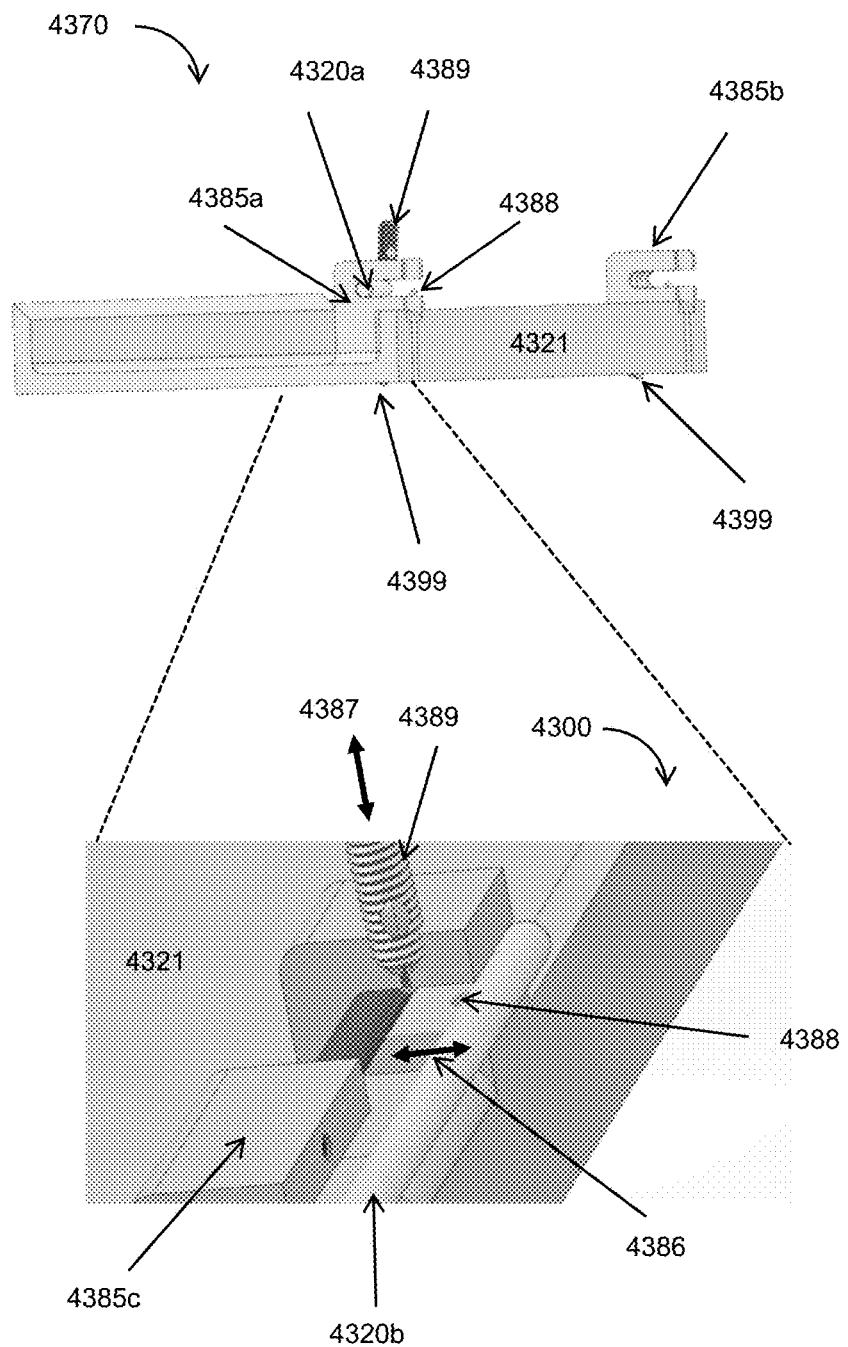
FIG. 43 schematically show various views of portions of a fastener and associated components.

FIG. 43 shows an example of a hinge leaf 4321 having two sets of open cavity knuckles 4385a and 4385b. Pintle 4320a is shown as engaged with knuckle set 4385a, which pintle simulates the complementary set of closed cavity knuckles and pintle assembly (e.g., 4082) of the complementary hinge leaf (e.g., 4022 shows a portion of a hinge leaf). Screw 4389 is engaged with knuckles 4385a. FIG. 43 shows a protrusion 4388 representing a snap spring. Screw 4389 can be engaged or disengaged with the knuckle in the direction 4387. Pintle 4320b (partial view shown) can engage or disengage from knuckle 4385c (partial view shown) by moving in direction 4386. 4300 shows a portion view of hinge leaf 4321, knuckle set 4851a, and screw 4389. Fastener portion 4321 is shown as perspective view in 4370.

In some embodiments, a user controls a set of displays via a touch screen as if the set of displays was a single display (e.g., screen division of an image). The screen division of the displayed image among the display set may be effectuated via software (e.g., non-transitory computer readable medium). The software may read inputs (e.g., via the network and/or USB) from each touch display and, knowing where each display is located in the set (also called group), may compute the location of the user touch in the set. For example, assuming the set has a Cartesian coordinate system where 0, 0 is located at a lower left corner (as viewed by a viewer of the displays) and 100%, 100% is located at the upper right corner (as viewed from a viewer of the displays), for a 2×2 display group the lower left corner of a display set is 0, 0 and the upper right corner of the display set is 100%, 100%. For this example of a 2×2 display set, the transformation of the touch on any display is represented by: X=(0.5*(X of one of the left side displays) or (0.5+(0.5*(X of one of the right side displays))); and Y=(0.5*(Y of one of the lower displays) or (0.5+(0.5*(Y of one of the upper displays))); where X is in a horizontal direction relative to a display viewer and Y is in a vertical direction relative to a display viewer. Adjustments may be made to the transformation of the coordinate system to account for screen gap between the touch displays. Each of the four displays may include its own two sets of sensor and emitter panel (e.g., around the edge of each display) to detect user touch for touch screen functionality. Each of the displays may have only two of the four sensor and emitter panels attached, which panels may be attached around the outer edges of the display set.

FIG. 30A shows an example of four displays 3002a, 3002b, 3002c and 3002d that form a display set 3003. Each of the displays 3002a-d displays the same image. FIG. 30A shows an example of four displays 3022a, 3022b, 3022c and 3022d that form a display set 3023. Each of the displays 3022a-d displays together the image displayed in, e.g., 3002c. If a user will want to click on the surfer displayed in the display set 3003, the user will be able to do so by clicking on any position 3008a-d of display set 3003. If a user will want to click on the surfer displayed in the display set 3023, the user will be able to do so by clicking on position 3029 of display set 3023, but not on, e.g., position 3028 (that is analogous to position 3008c). The screen division of the image among the display set 3023 may be effectuated via software. The software may read inputs (e.g., from the touch screen or curser) and, knowing how the image is parceled among the displays, compute a location that the user points to. For example, assuming the set has a Cartesian coordinate system where 0, 0 is located at a lower left corner (as viewed by a viewer of the displays) and 100%, 100% is located at the upper right corner (as viewed from a viewer of the displays), for a 2×2 display group the lower left corner of display 3002c is 0, 0 and the upper right corner of display 3002b is 100%, 100%. For this example of a 2×2 display set, the transformation of the touch on any display is represented by: X=(0.5*(X of display 3002a or 3002c) or (0.5+(0.5*(X of display 3002b or 3002d))); and Y=(0.5*(Y of display 3002c or 3002d) or (0.5+ (0.5*(Y of display 3002a or 3002b))); where X is in a horizontal direction relative to a display viewer and Y is in a vertical direction relative to a display viewer. Adjustments may be made to the transformation of the coordinate system to account for screen gap 3005 between the touch displays. FIG. 30A shows an example of gaps 3005 and 3025 between two immediately adjacent displays, which gaps may be filled with a polymer and/or resin.

FIG. 30B shows an example of four displays 3010a, 3010b, 3010c and 3010d (shown by the left four displays shown in FIG. 30B) in a display set 3011, wherein the image is displayed across the four displays 3010a-3010d as if they were as singled display (shown by the right four displays shown in FIG. 30B). Each of the displays can have its own identification (e.g., shown as numbers 1, 2, 3, and 4).

Figure 31A:
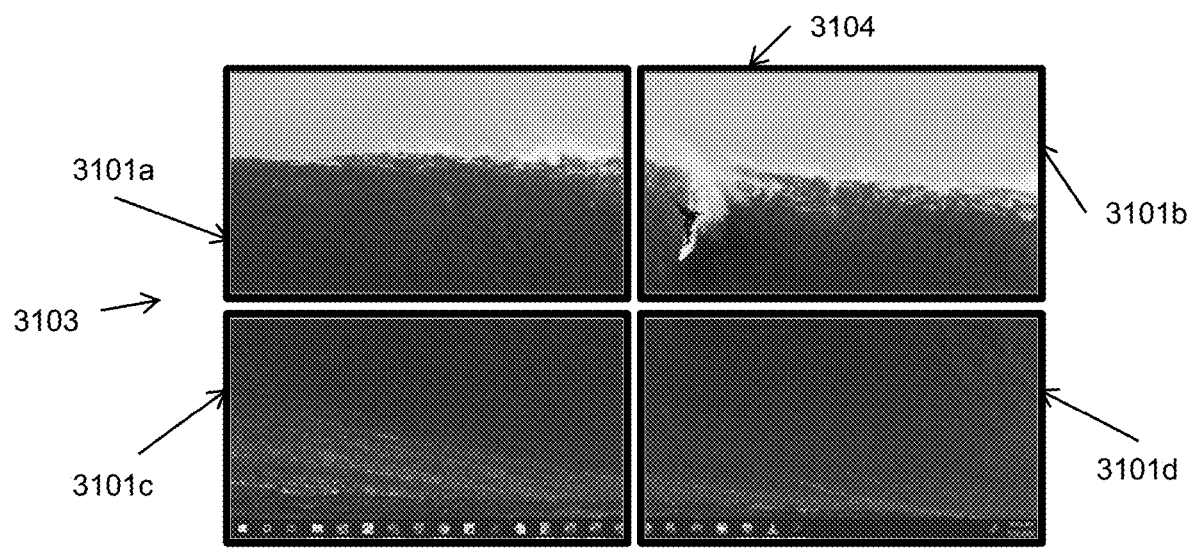
FIGS. 31A-B schematically show various display constructs.

FIG. 31A shows an example of four display constructs 3101a, 3101b, 3101c and 3101d in a 2×2 display construct set 3103. Each of the four displays 3101a-3101d includes its own two sets of sensor and emitter panel 3104 (shown around the edge of each display) to detect user contact for touch screen functionality.

Figure 31B:
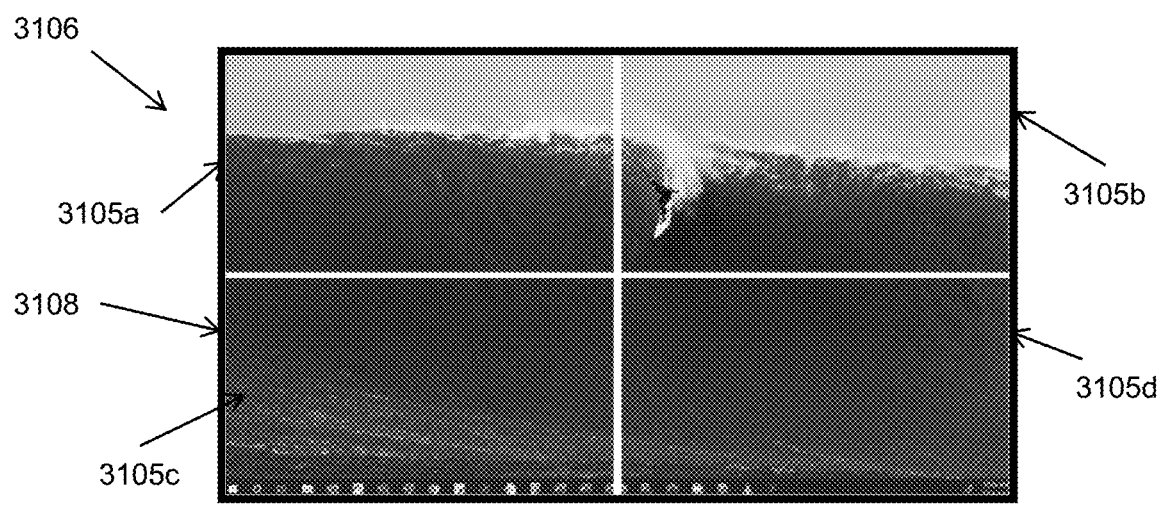

FIG. 31B sows an example of four display constructs 3105a, 3105b, 3105c and 3105d in a 2×2 display construct set 3106 that engulf the display construct set. The set of display constructs 3106 collectively has two perpendicular sensor and emitter panels attached in frame 3108, which panels are attached around the outer edges of the display set 3106. Thus, each of the display constructs 3105a-d has two sides on which a sensor emitter panel portion is disposed (e.g., the external matrix sides), and two sides devoid of a sensor and emitter panel (e.g., the internal matrix sides).

In some embodiments, a plurality of display constructs is operatively coupled to one or more controllers (e.g., to hierarchical control system), see for example FIG. 20. A plurality of display constructs may be mounted adjacent to (e.g., connected to a framing of) one or more tintable windows. The tintable windows may be connected (e.g., wired or wirelessly), via local (e.g., window) controllers as part of the control system. The control system may comprise a distributed network of controllers coupled to a power and/or communication network. The control system can control various functions (e.g., functions of a facility (e.g., office building, warehouse, etc.)), which may include adjusting the tint of the tintable window(s) and/or displaying media content on the display construct. The display constructs may be connected (e.g., wired and/or wirelessly), via a display interface that may be housed in one or more housings. The display interface housing may be incorporated together with: a tintable window, an insulated glass unit (IGU), and/or framing of the tintable window and/or IGU. The IGU may comprise a tintable window. The display interface housing may be disposed in an electrical-box ((E)-box), e.g., as disclosed herein. The display interface may include a set-top box (STB) which may be integrated with, or separate from, the tintable window(s), IGU, and/or framing thereof. The set-top box may be operatively (e.g., communicatively) coupled to one or more display constructs. The E-Box and/or STB may be operatively coupled (e.g., for power and/or communication) to the network. The network may be a local network of a facility in which the display constructs are disposed. The network may provide data and/or power to the display constructs. A user content server may provide data through the network, which data may be displayed on the display constructs. The network (e.g., through the E-box and/or STB) may provide data and power to the display interface via one or more connections to the display interface. The display interface may include an adapter (e.g., Ethernet adapter (e.g., RS-485-to-ethernet)). The E-boxes and/or STBs may include native adapter (e.g., Ethernet/IP) support. The E-box and/or STB may send prompts and/or respond to queries from the network. The connection of devices for data transmission may include Ethernet, HDMI, Display Port, RS-485 and/or other types of connections for data and/or media transmission, e.g., as disclosed herein. An authorized devices with access to the network and/or control system may operatively couple to, and/or be configurable to interact with, the display interfaces, E-Boxes, STBs, and/or media content server.

In some embodiments, display constructs are placed in a side-by-side arrangement to form a matrix of display constructs. A display interface may provide video and/or still picture content to one or more display constructs of the matrix of display constructs. The media content may be coordinated or uncoordinated amongst at least two of the display constructs in the matrix. Uncoordinated images may include reproduction of media on two or more display constructs of the matrix, to project (i) different medias or (i) the same media, in an independent fashion. The matrix of display constructs may include (i) at least two display constructs displaying coordinated media projection and/or (ii) at least two display constructs displaying uncoordinated media projection. The matrix of display constructs may include (i) at least two display constructs displaying different media projections and/or (ii) at least two display constructs displaying the same media projection. Coordinated images may include two or more display constructs projecting media in a synchronized fashion. One example of synchronized images is when the two or more displays project the same media at the same time, which media is duplicated on the two or more display constructs. Another example is when the two or more display constructs project different portions of an intended media to be displayed, such that that, when the two or more display constructs of the matrix are combined, a greater portion of the (e.g., the entire) intended media for display is displayed. The matrix of display constructs perform a function of a display wall. As used herein, a "display wall" refers to a matrix of display constructs whether coordinated or not (see, e.g., FIG. 30A). A video wall is a particular case of a display wall. As used herein, a "video wall" refers to a matrix of display constructs in which image projection is coordinated such that all display constructs reproduce a respective portion to form a combined image (See, e.g., FIG. 30B) of a media intended for display. For example, when all the displays in a display wall together project one media image, then they perform a function of a video wall.

In some embodiments, a portable unit having circuitry (e.g., comprising a controller and/or a control application) such as a cellular phone, tablet, or laptop, is utilized by a user (e.g., an installer, field service engineer, and/or technician) to commission set-up, and/or adjust setting of the display constructs. The application may be inscribed by code (e.g., a software) on the circuitry. A facility (e.g., building) may have an existing (e.g., local) network, interconnection of display constructs, display interfaces, and/or controller system. The display constructs and/or interfaces may be addressable on the network and/or by the portable unit. The layout, location, and/or intended operation of specific display constructs may be defined in a Building Information Modeling (BIM) file. The layout, location, and/or intended operation of specific interfaces may be defined in the BIM file. The BIM file may include a Revit file used in Autodesk® Revit® software. The portable unit may access the BIM (e.g., database) file and/or other resources operatively coupled to the network. The network access may be for establishing a communication link with one or more display constructs and/or interfaces, e.g., for configuration purposes (e.g., for alignment of digital data regarding the display constructs with the real configuration of the display constructs). In some embodiments, the portable unit executes a user installation application. The portable unit may provide a graphical user interface. The graphical user interface (GUI) may be organized to follow a (e.g., smart) sequence for easing the configuration process. The install and/or configuration application may be configured for a mobile or for a non-mobile circuitry. The configuration may be with respect to the (e.g., local) network, local controller and/or the control system of the facility.

Figure 44:
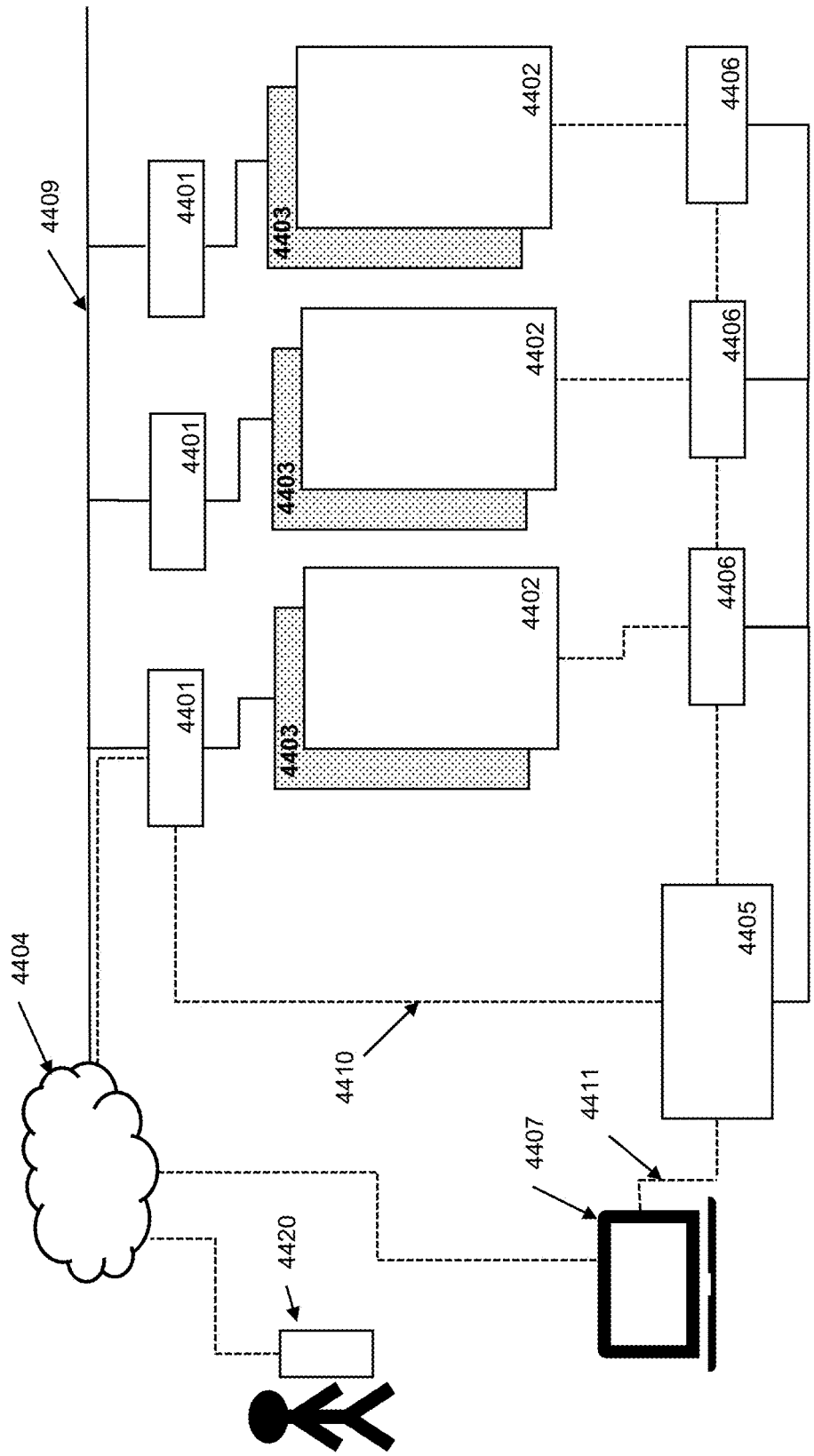
FIG. 44 schematically shows a control scheme for display constructs and a portable networked device used to configure display constructs.

FIG. 44 shows an example of a control scheme for a plurality of display constructs. A plurality of display constructs 4402 may be mounted adjacent to a plurality of tintable windows and/or IGUs 4403. The tintable windows and/or IGUs 4403 may be connected (e.g., wired and/or wirelessly) 4409, via local (window) controllers 4401, to a control network 4404 that controls various functions of a facility (e.g., office building, warehouse, etc.), which may include adjusting the tint of the tintable windows and/or IGUs 4403. The display constructs 4402 may be connected (e.g., wired and/or wirelessly) 4410, via a display interface 4405 and controllers housed within housings (also referred to herein as electrical (E)-boxes 4406, to control network 4404 (comprising the control system). The control network may be couple via wiring network to the tintable windows and/or display construct, which wiring (e.g., coaxial cables) may provide data and/or power to the display constructs 4402. A user content server 4407 may provide data (e.g., through the wiring and/or control network) to be displayed on the display constructs 4402 and/or may provide data and power to the display interface 4405 via one or more connections 4411 to the display interface 4405. The display interface may include an Ethernet adapter (e.g., RS-485-to-ethernet). The E-boxes 4406 may include native Ethernet/IP support. The E-boxes 4406 may send prompts and/or respond to queries from the network 4404. The connection of devices for data transmission may include, for example, Ethernet, HDMI, Display Port, RS-485 and/or other types of connections for data transmission. Power may be provided to the E-boxes 4406 via power-over-internet and/or via separate power cables. The plurality of display constructs 4402 may show different content, the same content, may be employed to show one image across multiple display constructs 4402 (e.g., as in a video wall), or any combination thereof. FIG. 44 shows an example similar to the control scheme for display constructs in FIG. 20, with the addition of a portable control unit 4420 to be utilized by a user, e.g., to access any selected display constructs linked by controller network 4404. The user (e.g., technician) may enter an area where the can visually inspect the targeted display construct(s). The user may activate a user interface executed on portable control unit 4420 to select and adjust corresponding settings for each targeted display construct.

In some embodiments, the installation, configuration, and/or reconfiguration application (APP) includes (e.g., in a sequence) a group of actions that lead to a requested configuration, e.g., in a reliable, easy to perform, and/or intuitive manner. The APP may prompt the user to enter data by presenting (e.g., simple and/or intuitive) question(s). The APP facilitate interaction between the user, the target display construct, and/or the APP. The APP may present prompts for the user on the mobile device and/or on the target display construct. The APP may encourage interactive interaction between the user, the target display construct, and/or the APP. The user interface of the APP may request the user to input (i) the number of total displays in a particular Display Array (e.g., a matrix of display constructs is a side-by-side layout), (II) the number display construct columns in the matrix, (III) the number display construct rows in the matrix, (IV) identify each of the matrix display constructs with an identification (ID), (V) identify how each of the matrix display constructs is oriented (e.g., whether an aspect ratio is in a Landscape or Portrait format), (VI) how is a display construct of the matrix aligned with respect to the viewer, the plane of the display configured for media projection, the horizon, and/or a gravitational center and/or (VII) how is a display construct fastener aligned with respect to the viewer, the horizon, and/or a gravitational center. For example, the user interface of the APP may present the question: when the format is landscape, is the fastener edge (e.g., side with a mounting bracket) at the top (Up) or bottom (Down) for a targeted display with respect to the gravitational center. For example, the user interface of the APP may present the question: when the format is portrait, is the fastener edge at the right or left for each targeted display with respect to a view position and/or with respect to a plane of the display projecting the media. The user may face the plane of the display construct projecting the media. Such configuration(s) may allow a fastener (e.g., mounting bracket) relationship to a projecting plane orientation, which projecting plane is of the display construct. Such configuration may facilitate logical display (e.g., correct display) of a content by the display construct, e.g., as viewed by the user. For example, an intend top of the images shown at the top of the display constructs, with respect to the gravitational center. The correct content display may be tested by the user by displaying a test display content. The test display content may comprise a menu of the APP, a logo, a word, a picture, or any other logical display content. The test display content may unambiguously determine a right side, left side, top and bottom of a display construct. For example, a word, sentence, paragraph, image, or letter sequence devoid of internal mirror symmetry may be a satisfactory test display content. For example, a word such as HELLO, or a picture of a face. A letter combination that may not serve as a satisfactory test display content would be "IOI," "dob," or "un," or "OOO." A symmetrical flower (e.g., having point symmetry) will similarly be unsatisfactory. In order to confirm that valid configuration settings have been made, the APP may project the test display content (e.g., an image, word, or letter combination) on the target display construct(s) being configured. The projected image may be logically oriented with respect to various directional parameters (e.g., a gravitational center and/or viewer, right and/or left, top and/or bottom) so that any errors may be immediately apparent to the installer. The projected test display content may be a writing to be read by the installer.

In some embodiments, multiple addressable display constructs are utilized together as a display wall (e.g., as a video wall). Identifiers are assigned for uniquely specifying each display construct in the matrix. A display construct identifier may be referred to herein as "Set ID." The identifier can be used by a server when directing media to the display construct in the matrix. The directed media may comprise images or portion of an image (e.g., a segmented image). The media may comprise stills or video images. For example, the Set IDs may be set in the display controller (e.g., in the normal, automatic fashion) when the displays are connected (e.g., as a plug and play module), e.g., to facilitate the display wall. When the Set ID is automatically assigned, then the APP may be used to validate (e.g., verify) the assignments and/or to reassign the Set ID. The Set ID may or may not be coupled (or included in) a network ID of the display construct.

In some embodiments, the APP is configured to identify a target display with an ID controlled by the controller(s) to which it is operatively coupled. For example, a display construct may receive a network ID which differentiates (e.g., only) between the various display constructs in the display wall or video wall. For example, a display construct may receive a network ID which differentiates between the various display constructs installed in the facility (or segment of the facility managed by one entity). For example, a display construct may receive a network ID which differentiates between the various display constructs and other devices operatively coupled to the network, e.g., in the facility (or segment of the facility). For example, the network IDs may differentiate between a display construct and other node(s) (e.g., device(s)) coupled to the network. The other node(s) may or may not be of a different type than the display construct. For example, the node may be another display construct on the same matrix. For example, the node may be another display construct in the facility that is not part of that matrix. For example, the node may be a sensor, a head end, an emitter, an antenna, a transceiver, a controller, a processor, or a tintable window. In validating a Set ID for a target display construct of an installed display matrix, the user may be asked to verify that the Set ID projected by the target display matches the Set ID shown in the APP for the target display. For any missing and/or erroneous Set ID entries, the user may assign/reassign a Set IDs as an input to the APP. The assigned/reassigned Set IDs may be verified by commanding a target display construct to display its Set ID, e.g., on a projected screen such as a Menu Screen.

In some embodiments, the APP elicits responses from the user to determine how the media will be used in relation with a plurality of displays in a matrix of display constructs (e.g., whether the displays will be utilized as a video wall function). The APP may display a query such as "Will the Video Wall function be used (Y or N)." For example, the user may determine if a first display construct of a display construct matrix displays media independently of a second display construct (or more display construct) of the display construct matrix. In some instances, each display construct in a display construct matrix (e.g., forming a display wall) displays media in a dependent or independent manner with respect to each other. For example, at least two display constructs in a display construct matrix (e.g., each display construct in the display matrix) may be each connected to its own HDMI or DP (display port) connection) in an uncoordinated fashion. For example, at least two display constructs in a display construct matrix (e.g., each display construct in the display matrix) may be each connected to its own HDMI or DP (display port) connection) in a coordinated fashion. For example, at least two display constructs in a display construct matrix (e.g., all display constructs in the display matrix) may be connected to one HDMI or DP connection in an uncoordinated fashion. In some instances, a display construct of a display matrix projects media in coordination with at least one other display construct, e.g., to function as a display wall (e.g., as a video wall).

In some embodiments, a display construct matrix performs a function of a video wall. The configuration of the display constructs in the matrix may accounts for a gap distance between two immediately adjacent display constructs. Two immediately adjacent display constructs negate presence of an additional display construct therebetween. The two immediately adjacent display constructs may be separated by a framing portion (e.g., a mullion or a transom) and/or by a fastener. Accounting for such gap between two immediately adjacent display constructs of the matrix may provide a visual appearance of spatial continuity. Rows and/or columns of display constructs of a matrix may be aligned with each other. Rows and/or columns of display constructs of a matrix may be misaligned (e.g., staggered) with each other. The rows and/or columns of displays in the matrix may be immediately adjacent to each other. The APP may request input from a user (e.g., by presenting the questions) regarding (A) what is the vertical distance between adjacent active areas, and/or (B) what is the horizontal distance between active areas? Using the gap distances, individual images on the display constructs may optionally be shifted (e.g., by considering the gap input). A portion of the video content intended for the gap may be lost (as there is no display construct in the gap), an overall continuous displayed image by the display construct matrix may be obtained, when functioning as a video wall. For example, the missing portions may be intuitively compensated by the human brain. The gap may account for a percentage of the overall image projected, which percentage is at most about 10%, 5%, 2.5%, 1%, 0.5%, or 0.25% of the video wall image projected by the matrix of display constructs. When a user is entering data for the gap distances, the APP may impose a (e.g., maximum, and/or minimum) threshold gap size, e.g., to prevent entry of nonsensical values beyond the threshold window.

In some embodiments, when (e.g., all) relevant settings have been configured, the APP performs a verification function by driving the display construct matrix (and/or any of its display constructs) to project a test display content (e.g., a verification image(s)). The user may be prompted by the APP to answer whether the requested image is displayed correctly. When the user provides a positive response, the selected setting may be (e.g., automatically) saved in one or more devices (e.g., in the E-Box, the STB, another display interface, in the content server, in the controller(s), in a memory, and/or in the network). When the user provides a negative response, then the installation application may (i) return to a home screen for continued adjustment of selected parameter(s), or (ii) present a series of questions to resolve (e.g., common) setup issues.

In some embodiments, the APP allows users (e.g., maintenance personnel) to configure matrices of media displays by navigating an "on screen menu" and performing (e.g., basic) display functions, e.g., using a (e.g., Windows) desktop application running on a portable unit (e.g., laptop). The APP may comprise a software tool which guides and/or eases display construct setup, provides basic display functions to control display construct(s) in a matrix of display constructs, and/or may emulate a TV remote control to perform the setup for respective display constructs. A graphical user interface of the APP may include a main screen, a remote menu, and/or a display wall configuration wizard. The portable unit may be configured to facilitate receipt of user input. The user input may include a tactile input (e.g., via a touchscreen interface, a mouse, and/or a keyboard of the portable unit), a voice input (e.g., via a microphone of the portable unit), and/or a gesture input (e.g., via camera of the portable unit). The input may facilitate activation of at least one APP selection by the user (e.g., via buttons, dropdown menus, popup menus, words, or phrases). The user may input responses and/or parameter values using the input methodologies, e.g., as disclosed herein. For example, the main screen may provide for selecting a size and shape of a display matrix (e.g., having number of columns and/or rows), selecting a display orientation (e.g., landscape or portrait) of a target display construct, and/or select whether coordinated or non-coordinated image projection is to be used. Based at least in part on a number of rows and columns that have been input for a particular display construct matrix, the APP screen (e.g., main screen or other screens in the user interface of the APP) may show a (e.g., graphic depiction, audio description, and/or written description) of the display construct matrix, e.g., by displaying test display content (e.g., icons) arranged according to the rows and columns.

FIG. 45 shows an example of a main screen (e.g., home screen) 4500 for a graphical user interface (GUI) of an application, e.g., the APP disclosed herein. A Display Matrix icon 4502 may be selected to enable entry of a number of rows and a number of columns in a target matrix of display constructs, using input field areas (e.g., rectangles) 4504 and 4506 respectively. Depending on the number of display constructs that make up the matrix, the GUI may be configured to show display icons 4510 with an icon representing each display construct in the matrix at its position with respect to the other display constructs of the matrix. By activating (e.g., highlighting) a virtual display icon of 4510, the user may configure the display orientation (e.g., landscape or portrait) information corresponding to the respective real display construct, by selecting orientations of orientation icon 4507 (e.g., by toggling or selecting from a dropdown menu, not shown). Display icons 4510 may be displayed with a corresponding landscape or portrait shape or aspect to match (not shown). In the example shown in FIG. 45, display icons 4510 provide an indication of the Set ID currently assigned to each display construct in the matrix. A Validate Set ID icon 4512 can be activated by the user. Selecting the Set ID icon may initiate network messages that cause each corresponding real display construct to display the Set ID currently set in its configuration in the APP. A (e.g., pop-up) message 4514 may be displayed to allow the user to select an OK icon 4516 to indicate correct Set ID assignments, or to select a Cancel icon 4518 (e.g., to configure reassignment of one or more Set IDs, e.g., as described herein). Message 4514 may be cleared, and the main screen may return to its default content at main screen 4520.

In the example shown in FIG. 45, main screen 4520 further includes a Video Wall icon 4522 that enables Video Wall functionality of the display matrix (e.g., to facilitating displaying together one media by all display constructs of the matrix in a coordinated fashion). Other possible additional options for Video Wall icon 4522 may include (I) a Video Wall Off option wherein each display in the display wall displays its own content without coordination with other displays in the display wall, and/or (II) a Duplicate option, where each display screens in the matrix displays the same content at the same time (e.g., in a coordinated fashion). Enabling of a video wall function may result in (e.g., automatically) navigating or being directed to a submenu for specifying gap distances between every two immediately adjacent display constructs of the matrix. A Bezel Adjust icon 4526 may be used to access a gap distance submenu directly.

In the example shown in FIG. 45, Set IDs can be selected for adjustment by tapping (e.g., highlighting) corresponding display icons 4510 individually. A check field (e.g., icon) 4528 may be selected in order to activate all display icons 4510 simultaneously. Navigation from main screen 4500 to a remote menu screen and/or other configuration screens may be obtained using a menu (e.g., pulldown, or popup) icon 4530.

FIG. 46 shows an example of a remote control style menu 4600 which may be accessed from the main screen using a menu pulldown/popup. The remote control interface may include a remote control keypad simulation area 4602 with up/down/left/right directional buttons 4604, an exit button 4608 and a menu button 4610. Buttons 4604, 4606, 4608, and 4610 can be used to perform corresponding actions on a target display construct for which the corresponding display icon 4612 has been highlighted, for example. Remote menu 4600 has a menu pulldown/popup icon 4620 having actions (not shown) such as navigate to the main screen, navigate to a display configuration, and/or cancel current selection. The user interface may provide help messages when improper or incomplete commands are entered. For example, a screenshot 4628 shows an error message 4630 resulting from manipulation of the simulated remote control buttons when a Set ID has not first been selected. An OK button 4632 can be activated to dismiss message 4630. Remote menu 4600 indicates the communication status in field (e.g., rectangle) 4611, e.g., using a color code (e.g., green for good communication, yellow or orange for poor communication, and red for no communication). Remote menu 4600 facilitate selection of all display constructs in the matrix (here a 2 column, 1 row matrix of two display constructs having Set ID 1 and 2), by toggling selection of icon 4621.

FIG. 47 shows an example of a screenshot 4700 for a gap distance setting screen, having a text instruction field (e.g., rectangle) 4702 reminding a user of the process for entering horizontal and vertical gap adjustments in input field areas (e.g., rectangles) 4704 and 4708, which gap is between two immediately adjacent display constructs in a matrix of display constructs. Display constructs in the matrix (e.g., that may function as a video wall) are selected using display icons 4712a and 4712b. In this example, icon 4712a is selected and marked by a shaded square having SetID=1. A configuration image (e.g., containing continuous features such as a sloped and/or straight features such as lines, and spanning multiple display constructs) is shown on the physical display matrix (functioning as a video wall). Graphic thumbnails or reference pictures 4706 and 4710 are shown in association with input field areas (e.g., rectangles) 4704 and 4708 to illustrate the possible gap locations. The width of the gaps entered by the user in input field areas (e.g., rectangles) 4704 and 4708 is indicated in millimeters (mm). A screenshot 4730 shows a popup error message 4732 which may occur when a gap size over a predetermined threshold is entered, e.g., in order to prevent excessive shifting of a displayed image, or an inadvertent erroneous entry by the user. The gap setting screen can include a menu pulldown icon having actions such as navigate to the main screen, navigate to remote control screen, and/or cancel a current selection. Progress arrows, such as a back arrow 4722, can be used to navigate between screens in the user interface in an ordered manner. The screen includes a status indicator 4720 indicating correct completion of the entry by the user. During gap distance adjustments, display icons 4712 may show any currently entered gap distances for displays in the corresponding icons 4712a and 4712b. A communication status field (e.g., rectangle) 4714 can used two different shades, hues, and/or colors in order to display a communication status for a selected display construct, e.g., as disclosed herein. The Select All icon 4715 facilitates selection all icons representing the display constructs in the matrix. In the example shown in FIG. 47, two display construct icons are visible in a display matrix that includes six display constructs. In some embodiments, when a certain display construct is selected (e.g., having SetID=1 (4712a), it is emphasized in the visual of the display construct matrix 4706 and/or 4710. The emphasis can be by a visual variation such as using a framing, coloring, embossing, or otherwise visible differentiating it from the other display constructs in the matrix.

Figure 48:
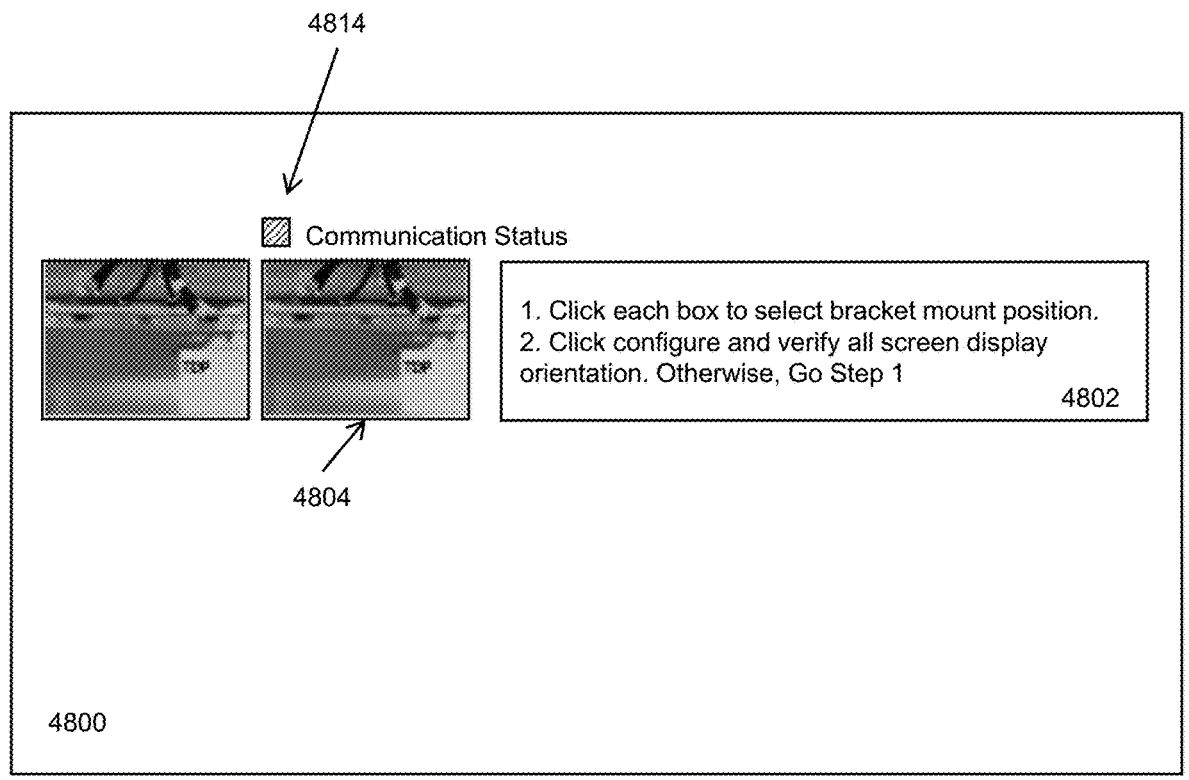
FIG. 48 schematically shows a user interface screen of an APP.

In some embodiments, in order to operate display constructs to give a proper orientation of the displayed images, it is useful to record for each display construct the position (e.g., top, bottom, left side, or right side) of its fastening edge (e.g., edge carrying a fastener such as a mounting bracket such as the one disclosed herein). The wiring of a pixel matrix within a display construct may follow a default image scanning pattern according to electrical or electronic features associated with the fastening edge. For example, an E-Box for driving a display construct may be mounted within a fastening edge (e.g., fastener) such as a mounting bracket. By specifying a fastening edge, a display interface can control orientation of a displayed image with respect to actual up/down and left/right directions. FIG. 48 shows an example of a fastening edge selection screenshot 4800 having a text instruction filed (e.g., rectangle) 4802. Display icons 4804 may have selection regions (e.g., edges of the rectangular icon 4804) to be activated by the user. The selection region corresponds to the closest edge of the icon. An overlay (not shown) can be added onto each display icon at the corresponding edge once the fastening edge has been selected. In some embodiments, the fastener (e.g., mounting bracket) can be depicted as a side addition to the rectangular icon of the display construct. In some embodiments, the fastener (e.g., mounting bracket) can be depicted as an arrow pointing to a side of the rectangular icon of the display construct that corresponds to the real (e.g., physical) display construct having the side fastener (e.g., mounting bracket). FIG. 48 shows a communication status icon 4814, e.g., using a color code (e.g., green for good communication, yellow or orange for poor communication, and red for no communication), or as otherwise disclosed herein.

Figure 49:
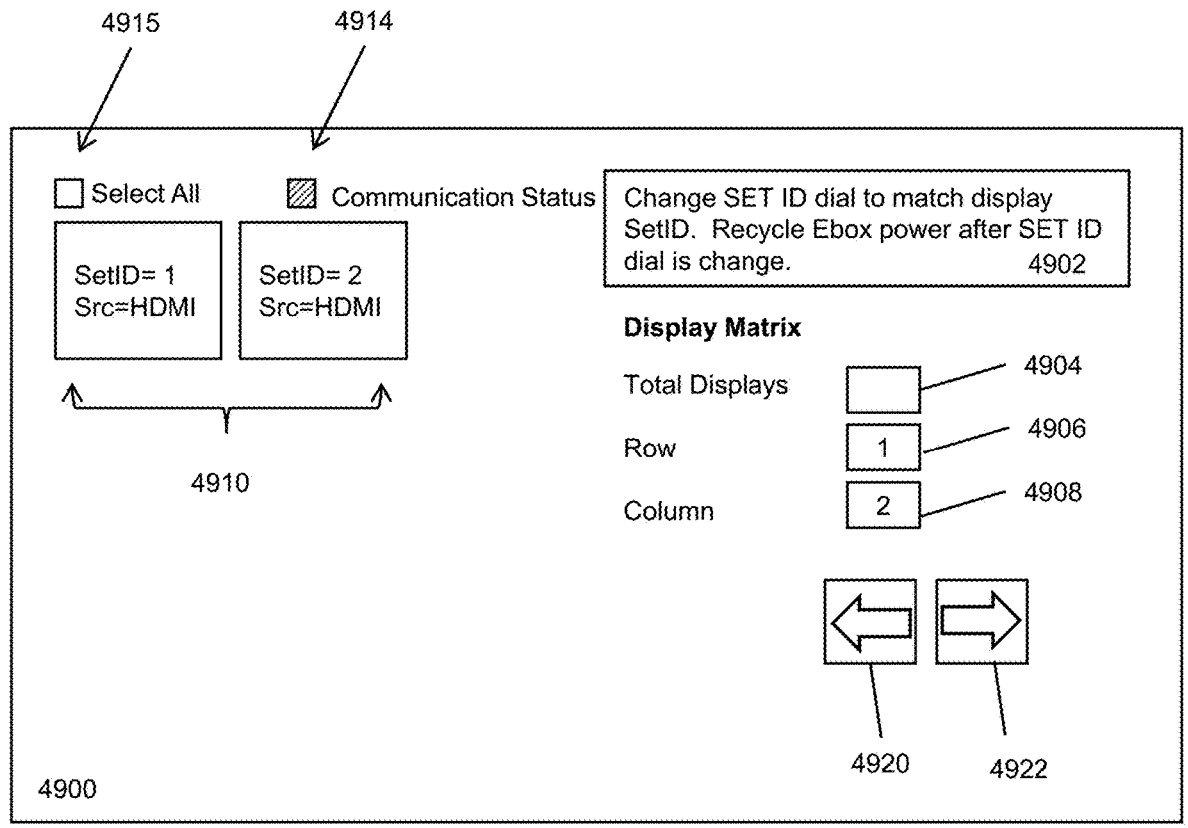
FIG. 49 schematically shows a user interface screen of an APP.

FIG. 49 shows an example of a first screenshot 4900 of a Set ID Adjustment screen having a text instruction field area (e.g., rectangle) 4902. Screen 4900 includes display matrix confirmation fields for showing the total number of displays in input field area (e.g., rectangle) 4904, the number of rows in input field area (e.g., rectangle) 4906, and the number of columns in input field area (e.g., rectangle) 4908. A matrix representation is shown by an arrangement of display icons 4910. A Back button 4920 and a Forward button 4922 facilitates progression through a menu sequence in which a following screenshot 5000 may be reached, e.g., by activating Forward button 4922. Icon 4914 indicates the communication status of the APP to the network (e.g., as disclosed herein). Icon 4915 facilitates selection of all icons representing the display constructs in the matrix (here, all icons 4910).

Figure 50:
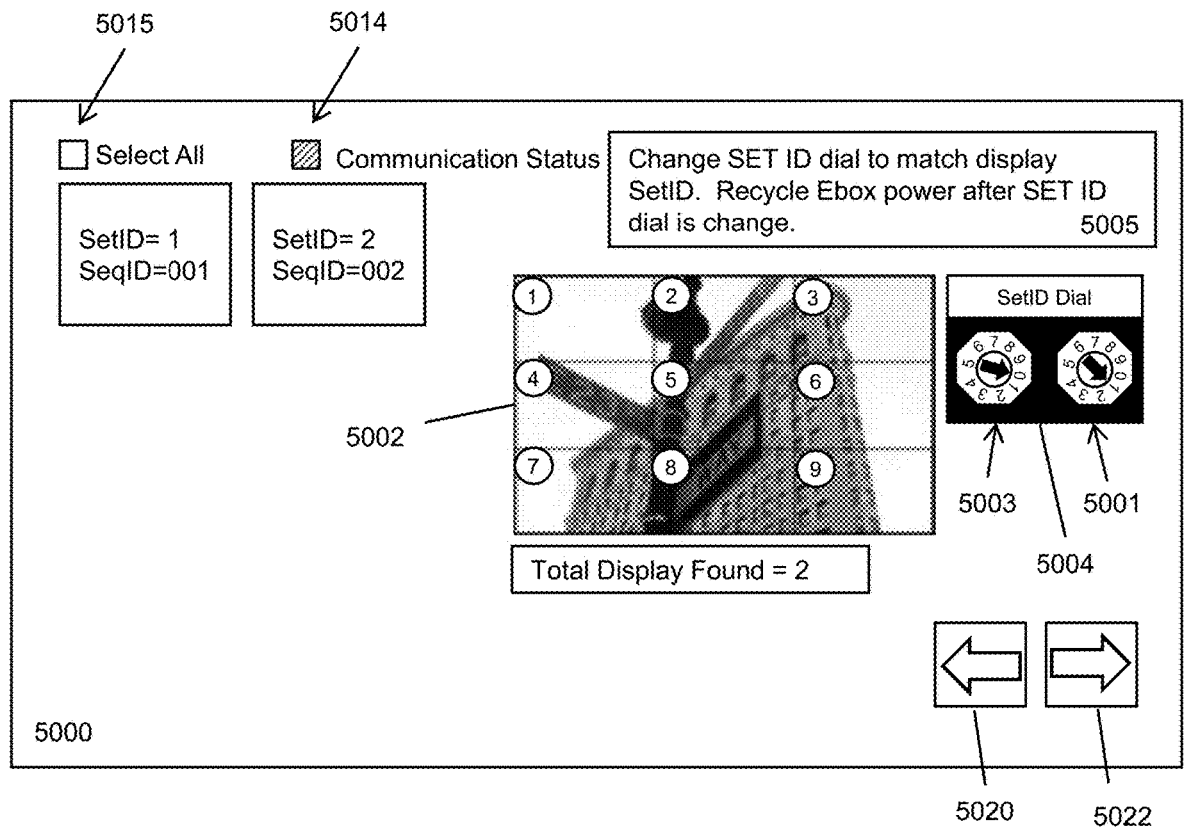
FIG. 50 schematically shows a user interface screen of an APP.

During or after Set ID assignment, the display constructs in the display matrix (acting as a video wall) may reproduce a combined image upon which a respective Set ID is overlaid upon the image from each display. FIG. 50 shows an example of a screen of the APP. A graphic element 5002 is shown in screenshot 5000 to depict the Set IDs as configured within the installation application, e.g., to assist the user with confirmation or correction of Set IDs assigned to display construct(s) in the matrix. A Dial Window 5004 includes a pair of digit setting wheels which can be adjusted by the user to enter a desired Set ID for a selected (e.g., highlighted) display position in the matrix. Icon 5001 indicates the ones digits options, and icon 5003 indicates the tenths digit options. Arrows in icons 5001 and 5003 point towards the selection made, which in the example shown in FIG. 50 if of the display ID number 01. The dial window can have a plurality of digit icons (e.g., for ones, tenths, hundredths, and thousands digits). The dial window can have at least one, two, three, or four dial icons such as icon 5001. The set ID can be elected by any other number selection methodology (e.g., other than the dial window). For example, the set ID can be selected and/or entered using an input field, e.g., that accepts numbers and/or letters (e.g., having an upper threshold value). Toggling field 5015 facilitates selection of all display constructs in the matrix, and/or all display constructs in the matrix that are available for selection. Field 5014 indicates the communication status of the APP (e.g., between the APP and the network and/or the physical display constructs in the matrix), e.g., as disclosed herein. Arrows 5020 and 5022 facilitate back and forth navigation by the user between the APP screens.

Figure 51:
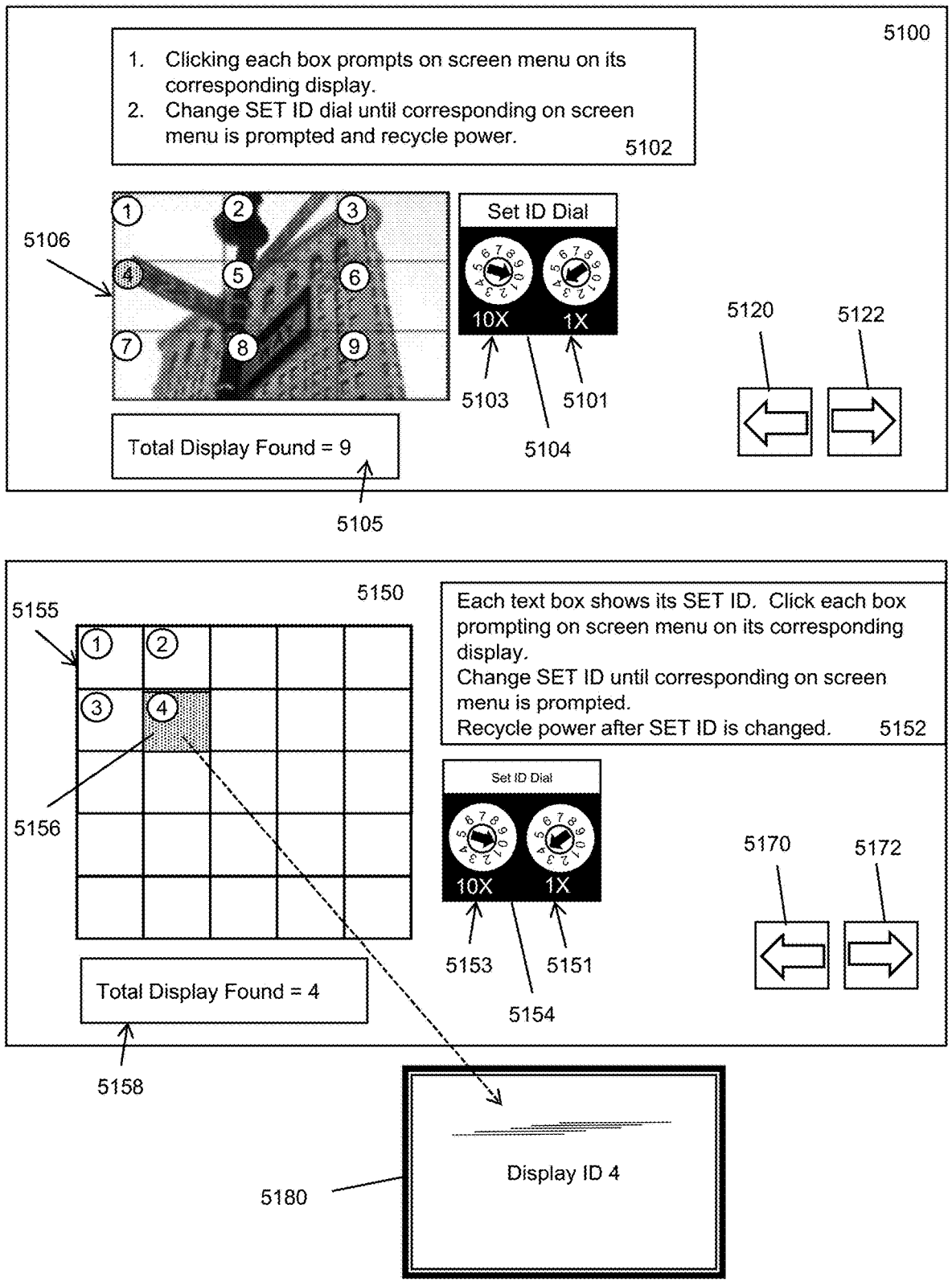
FIG. 51 schematically shows a pair of user interface screens of an APP and a physical display construct scheme.

FIG. 51 shows an example of screenshot 5100 in which a 3×3 display matrix is being configured, which includes nine display constructs as indicated in filed 5015. Each display construct in the matrix has a consecutive set ID indicated in this example by a single digit number in a circle depicted on a virtual image of the display construct (e.g., 5106). Display construct 5106 having a set ID 04 is being configured by set ID dial 5104 having a single digit dial 5101 indicating by an arrow the single digit 4, and a tenth digit 5103 indicating by an arrow the tenth digit 0. Field 5102 indicates a prompt to the user of suggested operations that facilitate configuration and/or adjustment of the set ID for a display construct in the matrix. The display construct in the matrix may be selected for configuration/adjustment of set ID, e.g., by tapping the virtual image (e.g., 5106) of the display construct in the matrix. The selected screen can be visibly indicated, e.g., by altering the visual of the set ID area (e.g., having another color, shade, and/or hue), as shown in the example of the set ID icon of 5106. Arrows 5120 and 5122 facilitate back and forth navigation by the user between the APP screens.

FIG. 51 shows an example of screenshot 5150 shows an example which displays Set IDs for detected display constructs in a 2×2 display construct matrix disposed within a maximum fixed-size display matrix 5155 (e.g., a 5×5 matrix). A field (e.g., popup icon) 5158 can be used to provide increased screen space to represent and/or adjust various parameters associated with a detected display, such as the Set ID. In this example, the field indicates the number of physical displays found in the matrix by the APP, which is 4. Each display construct in the matrix has a consecutive set ID indicated in this example by a single digit number in a circle depicted on a virtual image of the display construct (e.g., 5156). Display construct 5156 having a set ID 04 is being configured by set ID dial 5154 having a single digit dial 5151 indicating by an arrow the single digit 4, and a tenth digit 5153 indicating by an arrow the tenth digit 0.

Field 5152 indicates a prompt to the user of suggested operations that facilitate configuration and/or adjustment of the set ID for a display construct in the matrix. The display construct in the matrix may be selected for configuration/adjustment of set ID, e.g., by tapping the virtual image (e.g., 5156) of the display construct in the matrix. The selected screen can be visibly indicated, e.g., by altering the visual of the display construct icon area (e.g., having another color, shade, and/or hue), as shown in the example of the icon of display construct 5156. The selected display construct icon 5156 corresponds to a physical display construct 5180 is disposed. The physical display construct 5180 may or may not display images in connection with the APP. For example, the physical (e.g., real) display construct may display the words "Display ID 4" as shown in the example of FIG. 51. Such display may allow the user to ascertain that the display is configured properly to display a logical image. The Arrows 5170 and 5172 facilitate back and forth navigation by the user between the APP screens. The screen can further include an icon indicating the communication status between the APP, the network, and/or the respective physical display constructs (not shown), e.g., as disclosed herein.

Figure 52:
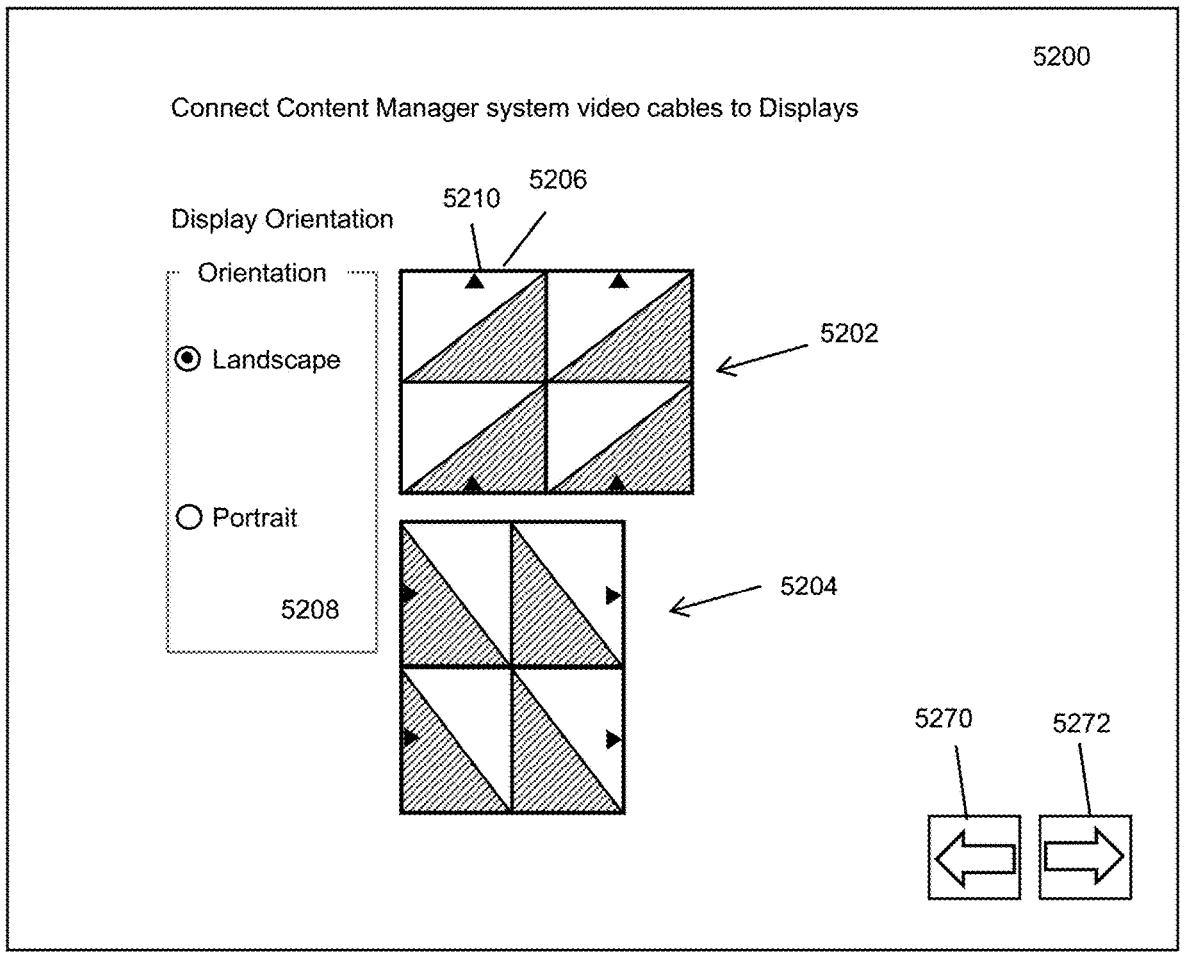
FIG. 52 schematically shows a user interface screen of an APP.

FIG. 52 shows an example of a fastening edge selection screen 5200. Groups of display matrix options 5202 and 5204 correspond to the matrix size of a plurality of display constructs being configured, disposed in landscape 5202 or portrait 5204 orientations. The user indicates if the display constructs in the display matrix are disposed in a landscape or portrait form using toggle icons (e.g., radio buttons) in field 5208. The user may select a display construct in the matrix for configuration, e.g., by tapping its virtual image representation in the APP (e.g., by selecting 5206). For a selected display icon (e.g., 5206) corresponding to one of the display constructs in the landscape matrix 5202, the user may indicate a position of a fastener (e.g., mounting packet) attached to its side. A current orientation setting of the fastener for each display construct can be represented in the groups of display icons 5202 and 5204 using overlay flags (e.g., the position of the fastener being indicated using the black triangles in FIG. 52) pointing to the fastening edge (e.g., edge 5210). Arrows 5270 and 5272 facilitate back and forth navigation by the user between the APP screens. The screen can further include an icon indicating the communication status between the APP, the network, and/or the respective physical display constructs (not shown), e.g., as disclosed herein.

Figure 53:
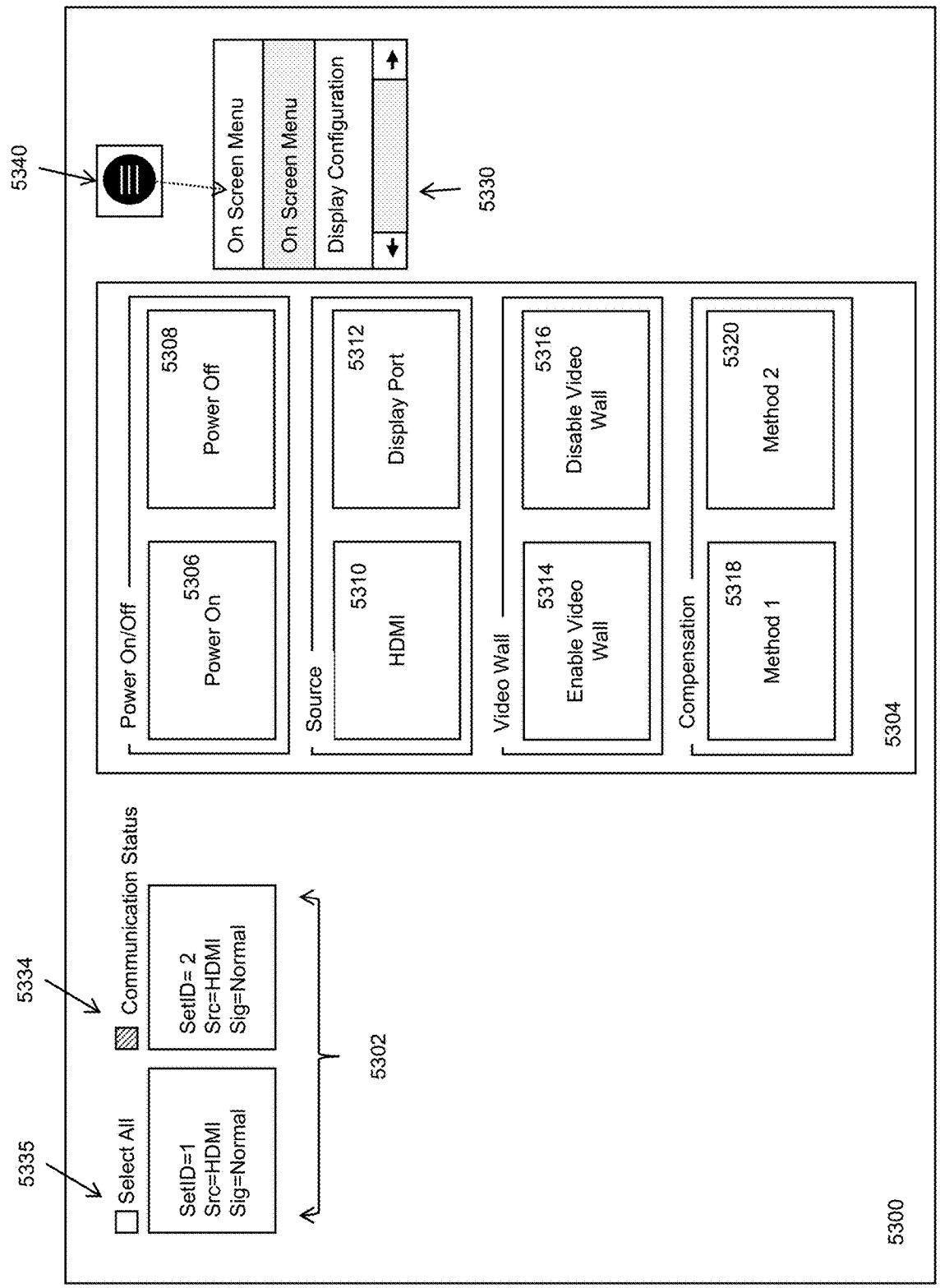
FIG. 53 schematically shows a user interface screen of an APP.

FIG. 53 shows an example of a screenshot 5300 for a user interface facilitating control and configuration of display constructs of a display matrix. A group of display icons 5302 are arranged according to the rows, columns (here, a one row, two column matrix, 1X2). Each of the display icons indicate the display's Set ID (e.g., SetID=1 or 2), Source (Src=HDMI), and Signal compensation (Sig=Normal indicating that no signal compensation method is utilized). An action filed 5304 presents a plurality of selector fields (e.g., icons) usable for activating and configuring a display construct that is first selected using display icons 5302. The selection fields in 5304 are grouped into four groups that include (i) Power on/off indicating if the display is connecter or disconnected to an electrical power source, (ii) Source indicating the media data source, (iii) Video Wall indicating usage of the display matrix as a Video Wall, and (iv) Compensation indicating whether any signal compensation of the display (e.g., signal compensation for any deteriorating pixel of the display, e.g., a TOLED pixel) is utilized. Power can be turned on and off to the selected display using a Power On icon 5306 and a Power Off icon 5308. For a display icon having multiple source inputs (e.g., having capability to receive and process video signals in multiple formats), source selection fields (e.g., buttons) are provided including for example an HDMI selection icon 5310 and a Display Port selection icon 5312. When other formats are available, additional selection field can be added respectively (not shown). For any arbitrary matrix arrangement of display constructs, all or a portion of the displays may be designated as a video wall using a Video Wall Enable icon 5314. Disabling the video wall function can be done by selecting the Video Wall Disable icon 5316. In the example shown in FIG. 53, the Video Wall selection field allows all display constructs 5302 to function as a Video Wall, or not, depending on the user selection of icons 5314 or 5316. In other examples (not shown), a user may first select a portion of the display constructs in the matrix to function as a first Video Wall, while others (not included in the first selection) may display differently (e.g., projection of the same media as duplicates, transmission of different medias, or projection of a second media in a second Video wall). Other display performance settings may be made available for configuration. For example, when using (e.g., LED) display technology compensations may be available to reduce image retention and/or burn-in of pixels, e.g., as disclosed herein. A selector icon 5318 may toggle a function that initiates a first compensation method (Method 1). A selector icon 5320 may toggle a function that initiates a second compensation method (Method 2). In some embodiments, one compensation method may be available. In some embodiments, more than two compensation methods may be available. In some embodiments, usage of a compensation method (e.g., initiation of compensation and/or selection of a particular compensation method) may be triggered automatically, e.g., by one or more controllers (e.g., as part of a control system). In some embodiments, initiation and/or selection of a compensation method may be unavailable to the user (e.g., by the APP). As shown in FIG. 53, display icons 5302 may include textual details for the source settings and signal compensation settings or each respective display construct. Toggling field 5335 facilitates selection of all display constructs in the matrix, and/or all display constructs in the matrix that are available for selection. Field 5334 indicates the communication status of the APP (e.g., between the APP and the network and/or the physical display constructs in the matrix), e.g., as disclosed herein. Screen 5300 depicts a selectin field 5340 for a dropdown menu 5330 to toggle between various screens of the APP. The screen may further include Arrows that facilitate back and forth navigation by the user between the APP screens (not shown).

Figure 54:
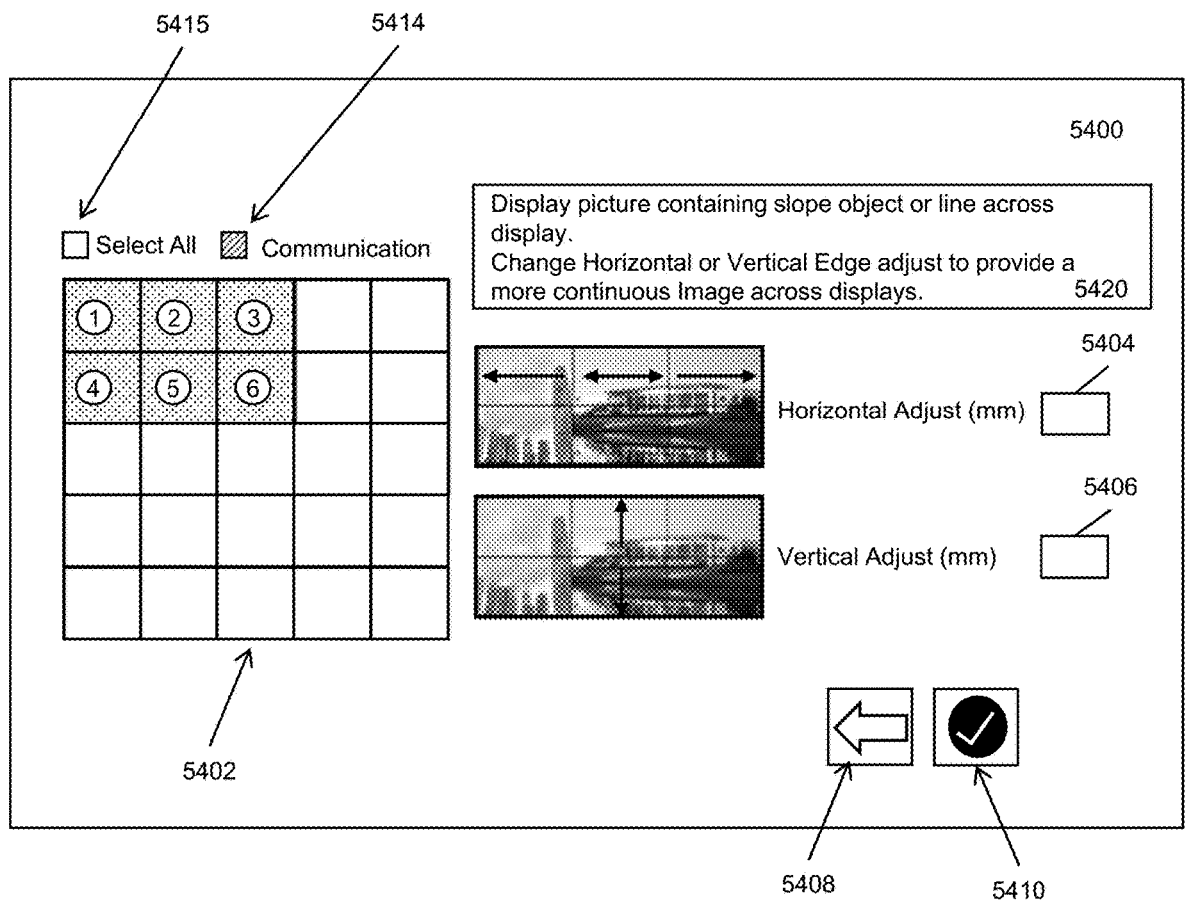
FIG. 54 schematically shows a user interface screen of an APP.

FIG. 54 shows screenshot 5400 for an example of a gap distance adjustment screen for a display construct matrix. A display icon grid 5402 has cells numbered 1 to 6 corresponding to display constructs of a display construct matrix, which cells are populated with data according to the display constructs of the matrix. In the example shown in FIG. 54, the cells are populated by Set ID data. Cells not needed to represent a particular display construct are left blank. Cells not needed to represent a particular display construct may alternatively indicate an absence of display construct (e.g., by displaying "n/a", "none," "no connection found," or any similar phrase. After selecting individual cells that correspond to real display constructs of a display matrix, a horizontal gap distance can be entered in an input box 5404, and a vertical gap distance can be entered in an input box 5406. A return icon 5408 is provided for returning to a prior screen of the user interface. A finished icon 5410 is provided for exiting to a different section of the user interface, such as a main screen. Toggling field 5415 facilitates selection of all display constructs in the matrix, and/or all display constructs in the matrix that are available for selection. Field 5414 indicates the communication status of the APP (e.g., between the APP and the network and/or the physical display constructs in the matrix), e.g., as disclosed herein. Field 5420 depicts explanations and/or instructions to a user.

Figure 55:
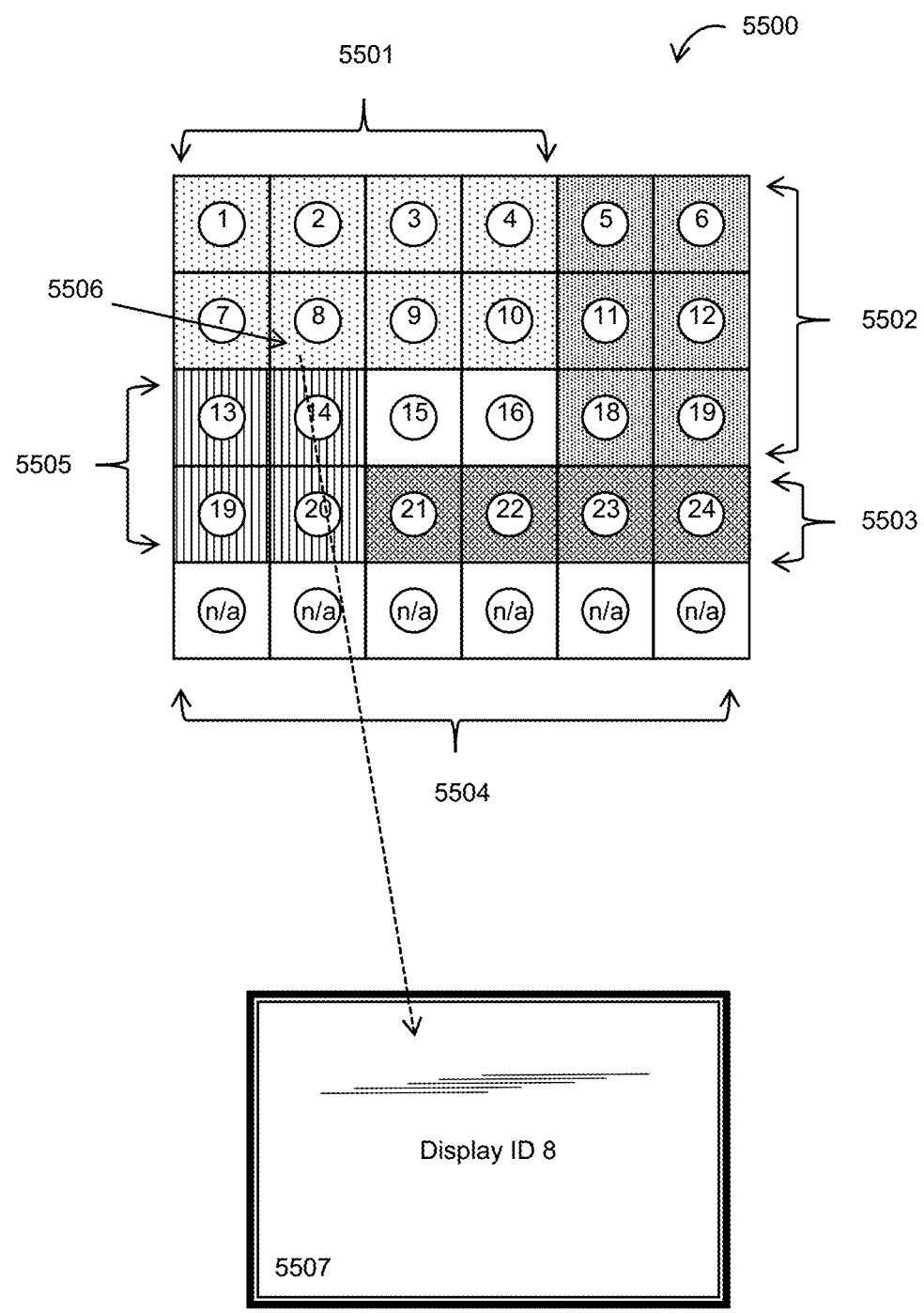
FIG. 55 schematically shows virtual representation of display constructs and a physical display construct.

In some embodiments, a matrix of display constructs includes groups of displays that display media in different manners. In some embodiments, displays in a facility are grouped to display media in different manners. The display constructs can be represented in the APP as virtual icons. For example, icon 5506 is a virtual representation of physical (e.g., real) display construct 5507 having Set ID 8, which is displayed as writing "Display ID 8" projected on the physical display construct 5507. At least some of the icons may correspond to a physical (e.g., real) display construct. FIG. 55 shows an example of various display construct grouping. Rectangle 5500 includes icons that may represent physical display construct, which icons form a six column by five row matrix (6×5). The physical displays corresponding to the matrix icons 5500 can be disposed as a matrix of physical display construct, as several matrices of physical display construct, as individually disposed in the facility, or any combination thereof. A first group of display constructs having SetIDs 1, 2, 3, 4, 7, 8, 9, 10, that are designated as group 5501 can form one matrix that displays a first media as a video wall in which each of the physical display constructs projects a portion of an image collectively displayed by group 5501. A second group of display constructs having SetIDs 5, 6, 11, 12, 18, and 19, that are designated as group 5502, can form a second matrix that displays a second media as a video wall in which each of the physical display constructs projects a portion of an image collectively displayed by group 5502. The first media may be the same or different from the second media. Projection of the first media may or may not be coordinated with projection of the second media. The first group of display constructs 5501 may be disposed adjacent to or at a distance from the second group of display construct 5502. For example, the first group can be part of a matrix of display construct that includes the second group. For example, the first group can be a first matrix of display constructs disposed in a location in the facility and the second group can be a second matrix of display constructs disposed in another location (e.g., another floor, or another room of) the facility. A third group of display constructs having SetIDs 21, 22, 23, and 24, that are designated as group 5503, can form a third matrix that displays a third media in duplication mode in which each of the physical display constructs projects a duplicate of the same media (e.g., in a time-synchronized manner). A fourth group of display constructs having SetIDs 13, 14, 19, and 20, that are designated as group 5505, can form a fourth matrix in which each display construct projects a different changing media in a non-synchronized manner. A fifth group of display constructs having SetIDs 15 and 16 may projects a static media (weather synchronized as a video wall, synchronized duplicate projection, or non-synchronized projection). The group of icons 5504 corresponds to icons not associated with any display construct. Icons in group 5504 have a "n/a" designation abbreviating "not applicable," indicating that they are not associated with any display construct having a Set ID. They may also designate the number of display constructs possible to add to the facility and/or display matrix. Any one of these groups can be a first matrix of display constructs disposed in a location in the facility and the any other of these groups can be a second matrix of display constructs disposed in another location (e.g., another floor, or another room of) the facility. Any one of these groups can be part of a matrix of display construct that includes the other of these groups. At least two of the first, second, and third media may be the same. At least two of the first, second, and third media may be different. The APP may facilitate coordination of the display constructs or lack thereof.

Figure 56:
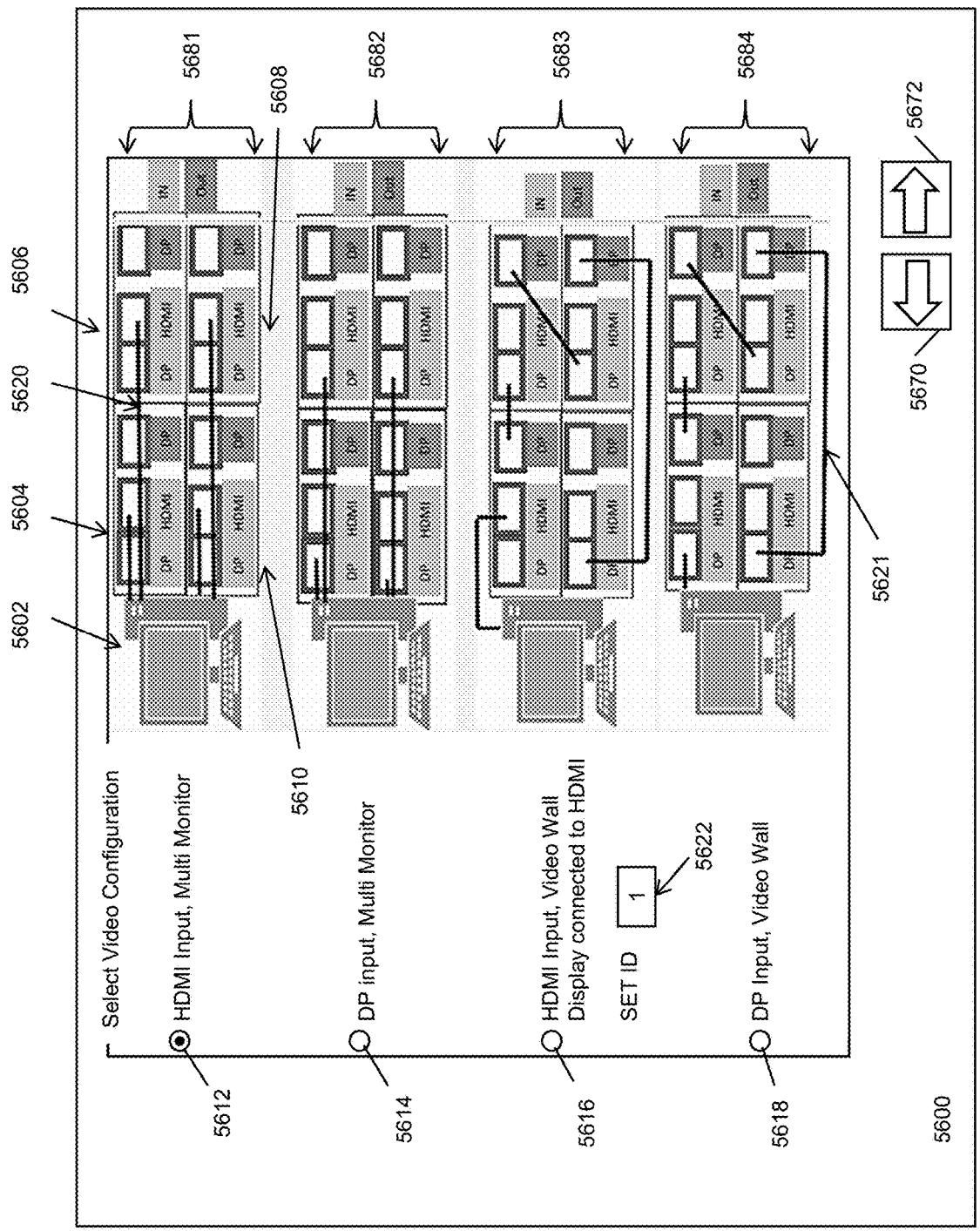
FIG. 56 schematically shows a user interface screen of an APP.

FIG. 56 depicts a screenshot 5600 for inputting a video connection configuration based at least in part on graphical depictions of possible types of interconnections. The graphical depictions represent a video source 5602 (e.g., a set-top box (STB) or a streaming server) and a virtual representation of a plurality of display constructs 5604, 5606, 5608, and 5610 that correspond to a physical 2×2 display construct matrix. Each of the display representations 5604, 5606, 5608, and 5610 has an HDMI input, a Display Port (DP) input, and a DP output. The user may select inter connectivity configuration among the display constructs and the server from various available options 5681-5684, and input type using toggle fields. Each of the toggle fields is followed by a description and depiction including a representation of the interconnectivity (e.g., wiring scheme) of display constructs, the display constructs, and the media type. Each toggle field (e.g., radio button) is shown alongside the respective graphical depiction that defines the connection type using connection lines such as 5620 or 5621. A selector button 5612 corresponds to an HDMI Input, Multi-Monitor configuration which uses a separate, direct connection from video source 5602 to an HDMI input of each display construct. A selector button 5614 corresponds to a DP Input, Multi-Monitor configuration which uses a separate, direct connection from video source 5602 to a DP input of each display construct in the matrix. In some embodiments, video signals to the display constructs are wired in a wiring scheme in which multiple devices are wired together sequentially (a.k.a., daisy chained) from one to another, e.g., using a DP output port. A sequentially (e.g., daisy) chained configuration may provide coordinated operation in order to implement a video wall, for example. A selector button 5616 corresponds to an HDMI Input Video Wall configuration in which an original video signal is passed to a first display construct using an HDMI connection and other display constructs in the chain are connected using respective DP output ports and input ports. A selector button 5618 corresponds to an DP Input Video Wall configuration in which an original video signal is passed to a first display construct using a DP connection and other display constructs in the chain are connected using respective DP output ports and input ports. For a video wall with a serial (e.g., daisy chain) interconnection of displays, a Set ID corresponding to a first display that directly receives the input video signals can be configured by entering by the user a Set ID in an input box 5622. Fields 5670 and 5672 facilitates back and forth navigation between screen APPs.

In some embodiments, the graphical user interface provides a tool for use by a user (e.g., an installation technician) that provides an accurate and/or efficient manner for configuring (e.g., large) groups of display constructs. An installation application incorporating the user interface may be executed on a portable device which is linked to a control network in a facility (e.g., building). The control network can couple with the electronic components of a display system (e.g., display constructs, display interfaces, E-Boxes, STBs, and/or streaming servers). The user may select a display matrix or other group of displays to be configured and specifies their number and their spatial arrangement (e.g., rows and columns). For a display construct, the orientation may be entered as being landscape or portrait so that a video source is able to provide a correct format for displayed images. For addressing each separate display construct within a local matrix or group, a Set ID may be assigned to the display construct (e.g., by associating a network address of a corresponding E-Box with a serial number (e.g., from 01 to 99) for display constructs according to their positions (e.g., in a display wall). A media configuration (e.g., video format such as HDMI or DP and/or a signal routing scheme such as serial or parallel) can be input to the configuration tool. The user may enter a fastener orientation for the display construct. A fastener orientation may specify an edge (e.g., top, bottom, left side, or right side) containing a mounting bracket. The mounting bracket may house an E-Box, a controller, wiring, and/or circuitry, e.g., as disclosed herein. The APP may prompt the user to indicate whether the group of displays will be used for coordinated streaming of video content. If there is going to be coordination, then the installation application may prompt for an entry on whether a video wall (in which coordinated displays each projects a portion of an overall image) will be used, and/or which display constructs of the matrix will participate in the Video Wall function. If there is going to be coordination, then the installation application may prompt for an entry on whether parallel streaming (in which coordinated displays each projects the same image) will be used, and/or which display constructs of the matrix will participate in the parallel streaming function. The user may enter gap widths or otherwise adjust offsets for shifting images such that the gaps between adjacent display constructs does not distort the appearance of the images. Gap entry may be prompted on selection of the video wall option. The user may select inter-connectivity of at least a portion (e.g., all) the displays in the matrix and/or to the streaming source (e.g., server or STB) from available options (including parallel and serial wiring configurations). At least two of the displays in the matrix may be connected via parallel connective wiring. At least two of the displays in the matrix may be connected via serial (e.g., daisy chain) connective wiring. The user may select between digital (e.g., video-audio) interfaces. The digital interfaces may comprise HDMI, Digital Visual Interface (DVI), DisplayPort (DP) or Serial digital interface (SDI). The digital interface may stream compressed or uncompressed (e.g., Moving Picture Experts Group (MPEG) or Advanced Video Coding (AVC, a.k.a., H.264)) digital media streams.

In some embodiments, one or more test images presented on the physical display constructs by the APP are streamed to the display constructs of the matrix individually or simultaneously, e.g., to verify each of the configuration settings. If the user detects any aspects of the text images indicative of an erroneous configuration setting of a display construct, the user may navigate within the APP to revise settings as necessary (e.g., as disclosed herein). If the images appear correctly (e.g., logically), then the user can provide an indication of success (e.g., as in 5410) and the installation tool may finalize and save the configured settings, e.g., across all the networked devices to which they pertain and/or across the network of the facility.

In some embodiments, the APP (e.g., utilized as an installation software tool) uses a graphical user interface with a main screen, submenu screens (e.g., for adjusting specific parameters), and/or one or more "Wizards" (e.g., for interactive entry of parameters according to properties of the display constructs as configured and/or physically installed). A remote menu may be provided, which may operation of an infrared remote used with a display or display interface making up the display matrix. The Wizards may include a Display Wall Configuration Wizard in which the user is able chooses a number of rows and columns of a matrix of display construct and/or specify display orientations. Upon entry of the matrix details, the APP may (1) check that the details represented in the APP conform to a total number of displays the APP is able to detect via the network connection, and/or (2) generate an on-screen display of display icons corresponding to the layout of the matrix of display constructs to be used in the user interface, e.g., for selecting one or more of the displays to be targeted for adjustment(s) by the APP. The user may validate individual display Set IDs in the APP, e.g., by selecting (e.g., clicking on) display icons corresponding to the physical display constructs. An on-screen menu for related settings may be (e.g., automatically) shown on the corresponding physical display construct(s), e.g., as a result of command(s) relayed over the network connection, e.g., as disclosed herein. The user may choose position of a fastener (e.g., bracket mount) with respect to the display construct, e.g., by selecting the corresponding display icon or choose a left/right/bottom/top bracket mount for a virtual image corresponding to a physical display construct (e.g., having a Set ID), or for a selected group of display construct. A user can adjust media transmission (e.g., to save the emitting pixels of the display construct) with the APP. A user can adjust distance between two immediately adjacent display constructs of a display matrix. In some embodiments, configurable settings for individual display constructs are accessed after selecting individual displays, e.g., by selecting (e.g., touching or clicking on) corresponding display icons to activate/highlight them. A "Select All" icon can be touched to highlight all displays. To revert to a single selection, the Select All icon may be toggled (e.g., selected again) to deselect all displays followed, e.g., by selecting a specific display icon corresponding to a physical display construct. Upon completion, adjusted values are recorded and/or implemented according to the user's entry and/or adjustments.

Figure 57:
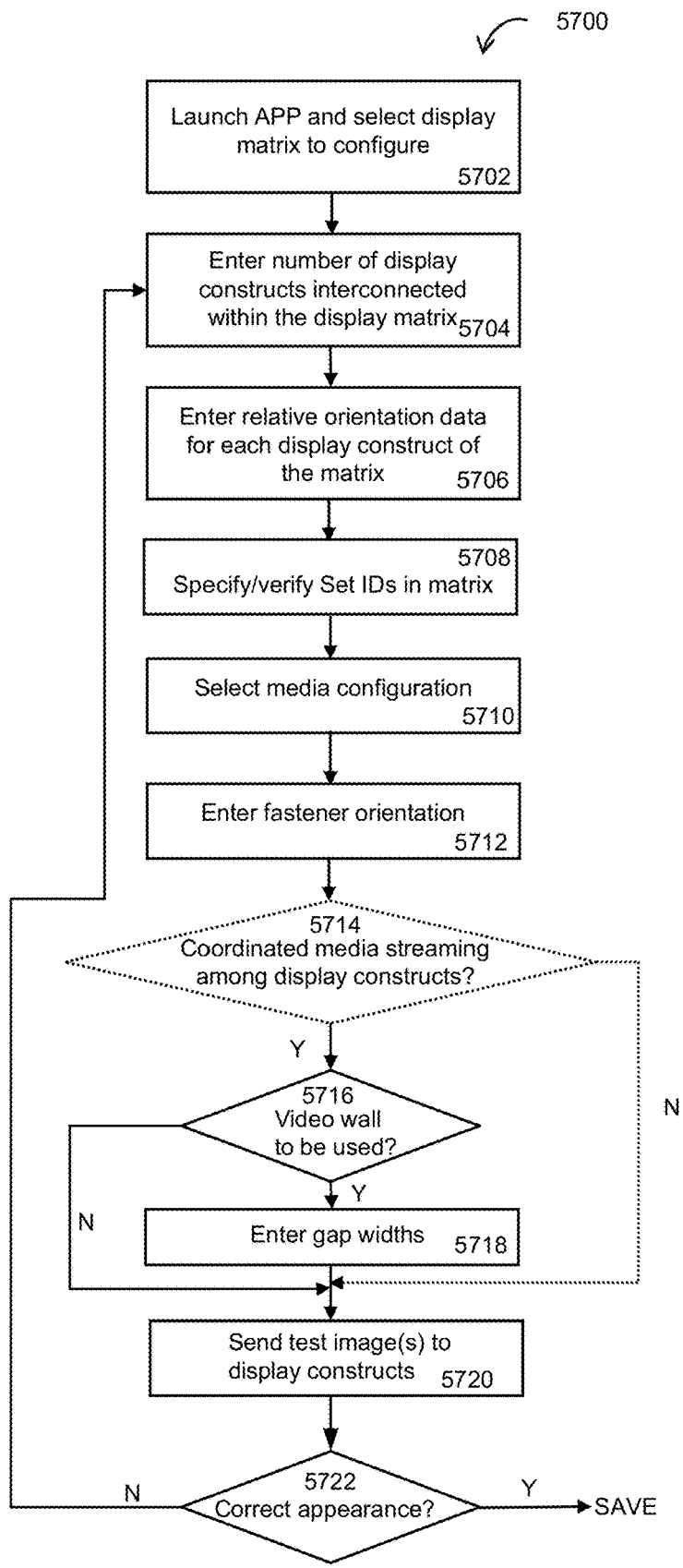
FIG. 57 shows a flowchart of operations for configuring and/or reconfiguring display constructs.

FIG. 57 shows an example of a method 5700 for configuring or reconfiguring display constructs for use within a facility. The method 5700 suggest one of various possible sequences of operations. The facility may be served by a control network, e.g., as disclosed herein. At 5702, an APP (e.g., installation application software tool) is launched. The APP may have a link to the control network. The control network may be limited to control of the display constructs, or may be a control network that controls at least one other portion of the facility (e.g., the entire facility). The control network may link to the matrix of display constructs to be configured. At 5704, the user enters a number and arrangement (e.g., rows and columns) of display constructs in a targeted display matrix, for example. Set IDs associated with at least one (e.g., each) display construct (e.g., as used by a display interface to locally address the displays) are specified and/or verified at 5708. At 5710, the user may enter one or more configuration details relating to media (e.g., HDMI or DP) format and/or a type of signal routing within the group (e.g., connectivity and/or wiring configuration). Orientation of a fastener relative to a display construct is entered in 5712 by the user. At 5714, the user may be prompted to designate whether the display constructs will be provided with streaming of coordinated or uncoordinated media. The user may further be prompted to select the manner of coordination, e.g., video wall or duplicate streaming at 5716. If video wall option is selected, then the user may be prompted to enter gap width distances at 5718. In other embodiments, the user may be prompted to enter the gap regardless of coordination between display constructs in the matrix. Test images may be sent to one or more of the display constructs at 5720. The test images may be selected according to appropriate checks for the configuration settings (e.g., a video wall image). If the appearance of the test images is incorrect (e.g., is illogical), then the user may return to a previous portion of the user interface to apply corrected settings. When the appearance is correct then the configured settings are stored and/or put into place within the display system. Test images may be sent at various other portions of the settings to ensure synchronization between the data entered to the APP and the physical configuration of the physical display construct, e.g., (i) to ensure that the display orientation (e.g., landscape/portrait, up/down, left/right) is correctly synchronized with the APP, and is logically projected, (ii) to ensure sufficient correction of pixels to display the intended image at the intended intensity, and/or (iii) that the media is correctly configured. Other operations may be added to the method shown in FIG. 57, e.g., selection of correction methodology for projection of media by the display construct. Such correction may be of interest when the display constructs function as a video wall, e.g., to facilitate projecting the same (or similar) brightness and/or color of the image by the different display constructs of the matrix of display constructs.

In some embodiments, the APP is utilized to configure or reconfigure at least two constructs that are disposed in a matrix of display constructs (e.g., in a location of a facility. In some embodiments, the APP is utilized to configure or reconfigure at least two constructs that are disposed in different location of a facility. The at least two display constructs may be parts of two or more display matrices, may be individually disposed in different locations of the facility, or any combination thereof. For example, the APP may present a matrix such as 5500 and prompt the user to configure or reconfigure all corresponding displays of the matrix 5500 that may be all display constructs of a facility and/or all display constructs connected to the local network. For example, the APP may present the display construct matrices individually (e.g., one target display matrix at a time) and prompt the user to configure or reconfigure all corresponding displays of a target display construct that may be all display constructs of a facility and/or all display constructs connected to the local network.

In some embodiments, a touch screen comprises a sensor-emitter array that borders one or more media displays. The media displays may be arranged as a matrix of media displays. The associated touch screen functionality (e.g., sensor-emitter) arrays of the matrix of media displays may be arranged as a touch screen display matrix. The matrix of media displays may function as a video wall, e.g., with each media display displaying a portion of an image that is displayed by the matrix of media displays. The associated touch screens of the media display matrix may be configured to accurately recognize contact (e.g., touch) in one of the media display, and display any output associated with that touch accurately on the media display being touched. The media displays of the matrix may or may not function as a video wall. For example, at least two of the media displays in the matrix of media displays may project different media. The media displays of the matrix may operate (e.g., as a video wall or not as a video wall) with touch screen capability. For example, at least two (e.g., all) the media displays of the matrix may display together a combined image, upon which a respective touch screen functionality is overlaid upon the image from each display of the matrix.

The touch screen functionality may comprise the touch screen functionality array and an associated output responsive to the touch. The associated output may comprise an image that is presented (e.g., drawing, stills, or video), a file that has been opened, or any other action that has been executed, responsive to the touch. A user interface may be provided to set up and/or operate the media display matrix with an associated touch screen capability. A touch screen adjustment software for a display matrix may be separate from adjustment software accounting for offset adjustments for the media displays in a display matrix. A touch screen configuration (e.g., adjustment) software for a video wall may be at least partially (e.g., fully) integrated into the media display configuration (e.g., offset adjustment) software for the media displays in a display matrix. A touch screen configuration (e.g., adjustment) software for a video wall may be integrated into the media display configuration (e.g., offset adjustment) software for the media displays in a display matrix. A user interface may provide for user input to a controller indicating (i) a touch screen set identification (ID) for each touch screen associated with a media display in the touch screen display matrix, (ii) a number, location and orientation of the touch screens corresponding to the media displays to which it is coupled, and (iii) the gap distances (bezel width) both vertically and horizontally between adjacent touch screens in the touch screen display matrix. The controller may be operatively coupled to, or be part of, the control system of the facility of the media display matrix. A gap distance (e.g., bezel width) may be a distance (e.g., in millimeters) between the edge of a media display and an edge of an adjacent media display. The gap distance (e.g., bezel width) may account for no image being projected between the edges of adjacent media displays. A coordinate system may be defined for each touch screen, based at least in part on user input(s). The coordinate system may utilize parceling the resolution of a single screen with respect to the number and arrangement of screens that make up the touch screen display matrix, e.g., in each axis. For example, the vertical resolution of a display in the matrix may be divided by the number of display screen rows in the matrix. For example, the horizontal resolution of a display in the matrix may be divided by the number of display screen columns in the matrix. The display matrix may have (e.g., substantially) identical media displays that make up the matrix of media displays. The display matrix may have (e.g., substantially) identical touch screens. The defined coordinate system may be used to translate a physical touch location (as detected by a touch sensor-emitter array) on one of the media displays to the corresponding touch location in the media being displayed on the display matrix (e.g., when it functions as a video wall or otherwise).

Figure 58:
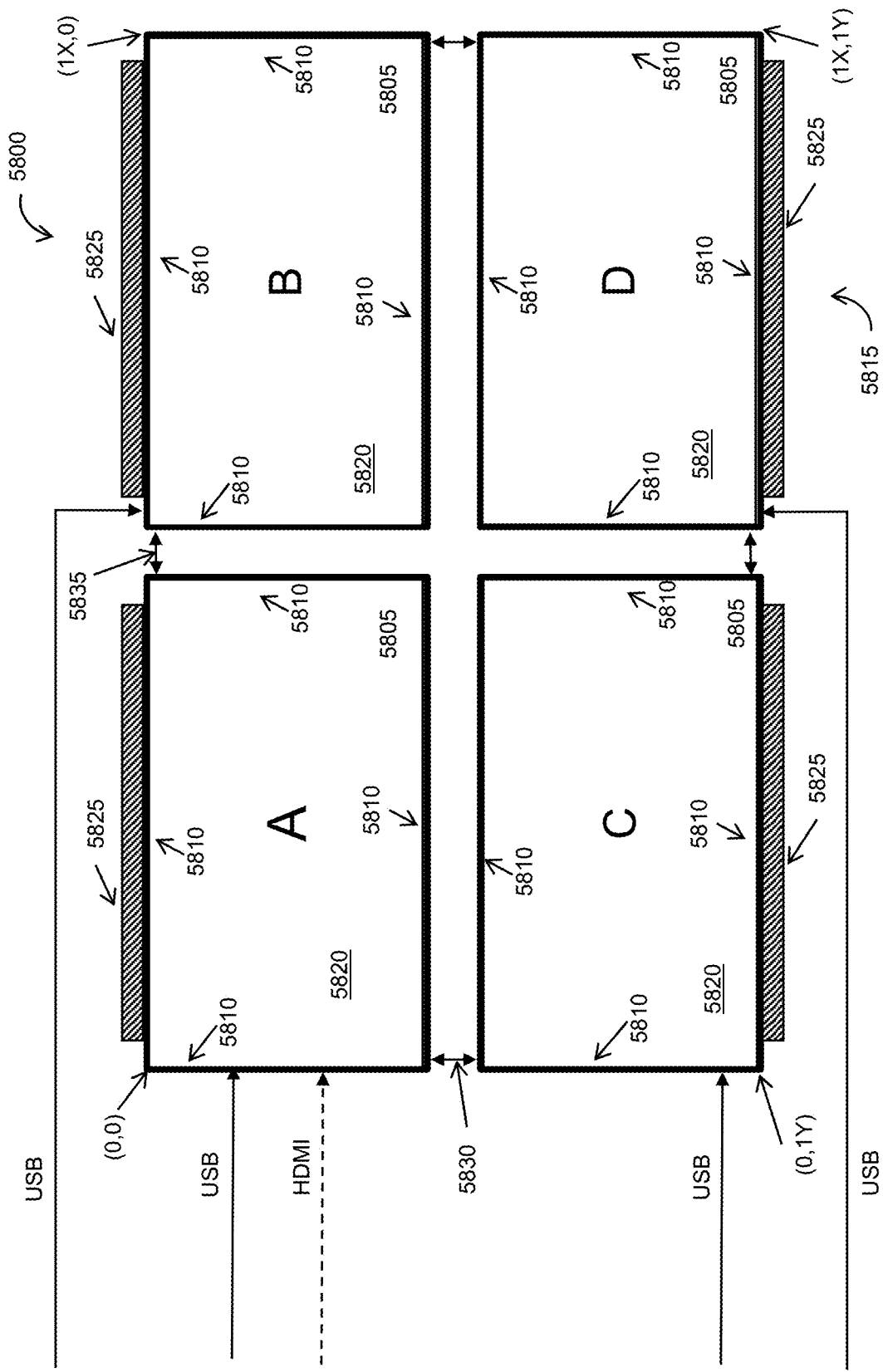
FIG. 58 schematically shows a matrix of media displays.

FIG. 58 shows an example of display matrix 5800. The display matrix 5800 may comprise multiple media displays 5805 (in the example of FIG. 58, four media displays arranged in a 2×2 matrix, of media displays 5805 A, B, C, and D). Touch functionality arrays 5810 may be coupled to the media displays 5805, defining a touch functionality (e.g., sensor-emitter) array 5815. The touch functionality arrays comprise sensors and emitters (e.g., sensor-emitter panel array). A similar arrangement of touch screens in a media display matrix is provided in FIG. 31A. Examples of screen functionality is also provided in FIG. 29 2910, and FIG. 39, 3980. The media displays 5805 and the touch functionality (e.g., sensor-emitter) array 5810 may be in communication with a network via wireless and/or wired (e.g., HDMI, USB) connections. The network may provide multimedia to the media displays 5805 that is projected from the screens 5820 of the media displays 5805. The media projected by at least two (e.g., by each) media display 5805 may be different. The media may be projected across the multiple media displays 5805 (when the matrix of display assumes a video wall functionality). The media displays 5805 and touch functionality arrays 5810 are included in the display matrix 5800. The media displays 5805 is mounted such that gaps (vertical 5830 and horizontal 5835) exist between the screens 5820 of adjacent media displays 5805. The gaps 5830 and 5835 may be due to bezels extending between the screens 5820 of each media display 5805 (bezels are not shown). The bezels may constitute an internal framing of the media displays in the display matrix. In addition to an optional internal framing, the display matrix may have an external framing (not shown). The gaps 5830 and 5835 may be due to spacing between adjacent media displays 5805 (e.g., aesthetic spacing). The gaps 5830 and 5835 may be due to a combination of bezels 5825 and spacing apart of media displays 5805. The vertical gaps 5830 and the horizontal gaps 5835 between adjacent media displays 5805 may be measured and input (e.g., as part of user input) for an application that defines the geometric setup (e.g., defining a coordinate system, shown as (0,0), (1X,0), (0,1Y) and (1X,1Y) in the example of FIG. 58) of a touch screen display matrix 5800. The media display matrix 5800 incorporates media displays 5805 that are (e.g., substantially) identical, and all in landscape orientation. Each of media displays 5805 comprises a fastener 5825 configured to couple the media display to a fixture, e.g., as disclosed herein. The fastener 5825 of media displays 5805A and 5805B is each disposed at a first side of the display matrix 5800, while fasteners 5825 of each of displays 5805C and 5805D is each disposed at a second side of the display matrix 5800 opposite to the first side. For example, the first side can be top, and the second side can be button, when compared to a gravitational center, and/or to the floor of the facility in which the display matrix is disposed.

In some embodiments, a group of media displays is assembled into a display matrix. Each media display of the display matrix may comprise a touch screen functionality array (e.g., an array of sensors and emitters that facilitate the touch screen functionality). In some embodiments, a user input for geometric setup of touch screens of a group of displays of a display matrix is provide, using an interface for entering input to a controller. Input to the controller may be through a graphical user interface (GUI). While the input is utilized to align the touch screens of the display matrix, the user input may be provided in terms of information related to the media display to which the touch screen is associated with. For example, to determine the orientation of a first touch screen assembly associated with a first display (e.g., a touch screen assembly that is physically coupled to the first display), the user may provide information related to placement and/or orientation of that first media display and/or a first fastener attached to that first media display. The user input may include a number of rows and/or number of columns of displays in the display matrix. The user input may include orientation of each of the media displays in the display matrix. The user input may include entering set IDs for a location of each touch screen assembly associated with each media display of the display matrix. Gap distances for horizontal and/or vertical gaps between each immediately adjacent media display in the display matrix may be entered. A fastening edge, which may be used to ascertain an orientation of a touch screen corresponding to each media display of the matrix, may be entered for each media display in the display matrix.

FIG. 59 shows an example of a main screen (e.g., home screen) 5900 for a graphical user interface (GUI) of an application, e.g., the APP disclosed herein. When a touch screen Display Matrix icon 5902 is selected, it enables entry of a number of rows and a number of columns in a target matrix of display constructs having touch screen capability, using input field areas (e.g., rectangles) 5904 and 5906 respectively. Depending on the number of media displays (e.g., display constructs) that make up the matrix having the touch screen capability, the GUI may be configured to show display icons 5910 with an icon representing each display construct in the matrix having touch screen capability at its position with respect to the other display constructs of the touch screen display matrix. For example, in display matrix 5902, there are two rows of display matrices as indicated by 9504, and two columns of display matrices as indicted in 5906. Thus, 5910 includes four fields for four set IDs, one of each of the displays of the 2×2 display matrix. By activating (e.g., highlighting) a virtual display icon of 5910, the user may configure the display orientation (e.g., landscape or portrait) information corresponding to the respective real display construct that employs the touch screen capability, by selecting orientations of orientation icon 5907 (e.g., by toggling or selecting from a dropdown menu, not shown). Display icons 5910 may be displayed with a corresponding landscape or portrait shape or aspect to match (not shown). In the example shown in FIG. 59, display icons 5910 provide an indication of the touch screen Set ID currently assigned to each display construct in the touch screen display matrix. A Validate touch screen Set ID icon 5912 can be activated by the user. Selecting the touch screen Set ID icon may initiate network messages that cause each corresponding real display construct to display the touch screen Set ID currently set in its configuration in the APP. A (e.g., pop-up) message 5914 may be displayed to allow the user to select an OK icon 5916 to indicate correct touch screen Set ID assignments, or to select a Cancel icon 5918 (e.g., to configure reassignment of one or more touch screen Set IDs, e.g., as described herein). Message 5914 may be cleared, and the main screen may return to its default content at main screen 5920.

In the example shown in FIG. 59, video wall touch screen functionality of the display matrix (e.g., to facilitate displaying together and recognizing touch location for one media by all display constructs of the touch screen matrix in a coordinated fashion) may result in (e.g., automatically) navigating, or being directed, to a submenu for specifying bezel distances between every two immediately adjacent display constructs of the touch screen display matrix for the touch screen capability. A Bezel distance icon 5922 may be used to access a bezel distance submenu directly. The Bezel may be substituted by any other gap between immediately adjacent media displays in the display matrix.

In the example shown in FIG. 59, touch screen Set IDs can be selected for adjustment by tapping (e.g., highlighting) corresponding display icons 5910 individually. A check field (e.g., icon) 5928 may be selected in order to activate all display icons 5910 simultaneously. Navigation from main screen 5900 to a remote menu screen and/or other configuration screens may be obtained using a menu (e.g., pulldown, or popup) icon 5930.

FIG. 60 shows an example of a screenshot 6000 for a gap distance setting screen, having a text instruction field (e.g., rectangle) 6002 reminding a user of the process for entering horizontal and vertical gap distance (bezel width) adjustments in input field areas (e.g., rectangles) 6004 and 6008, which gap distance (bezel width) is between two immediately adjacent display constructs having touch screen functionality in a display matrix. Display constructs having touch screen functionality in the display matrix (e.g., that may function as a video wall) are selected using display icons 6012a and 6012b. In this example, icon 6012a is selected and marked by a shaded square having touch screen SetID=1. Graphic thumbnails or reference pictures 6006 and 6010 are shown in association with input field areas (e.g., rectangles) 6004 and 6008 to illustrate the possible gap locations. The width of the gaps entered by the user in input field areas (e.g., rectangles) 6004 and 6008 is indicated in millimeters (mm). However, any other distance measuring method can be substituted (e.g., using Metric or Imperial system). A screenshot 6050 shows a popup error message 6052 which may occur when a gap size over a predetermined threshold is entered (input field areas 6054 and 6058), e.g., in order to prevent excessive shifting of a coordinate transformation, or an inadvertent erroneous entry by the user for particular touch screen set IDs 6052a and 6052b associated with graphic thumbnails 6056 and 6060. The gap setting screen can include a menu pulldown icon having actions such as navigate to the main screen, navigate to remote control screen, and/or cancel a current selection. Progress arrows, such as a back arrow 6022 and 6072, can be used to navigate between screens in the user interface in an ordered manner. The screens include status indicators 6020 and 6070 indicating correct completion of the entry by the user. During gap distance (e.g., bezel width) adjustments, display icons 6012 may show any currently entered gap distances (e.g., bezel widths) for displays having touch screen functionality, in the corresponding icons 6012a and 6012b. A communication status field (e.g., rectangle) 6014 can used two different shades, hues, and/or colors in order to display a communication status for a selected display construct of a touch screen display matrix, e.g., as disclosed herein. The "Select All" icon 6015 facilitates selection all icons representing the display constructs having touch screen functionality in the display matrix. In the example shown in FIG. 60, two display construct icons having touch screen functionality are visible in a display matrix that includes four display constructs. In some embodiments, when a certain display construct is selected (e.g., having touch screen SetID=1 (6012a), it is emphasized in the visual of the touch screen display matrix 6006 and/or 6010. The emphasis can be by a visual variation such as using a framing, coloring, embossing, or otherwise visible differentiating it from the other display constructs having touch screen functionality in the display matrix.

Figure 61:
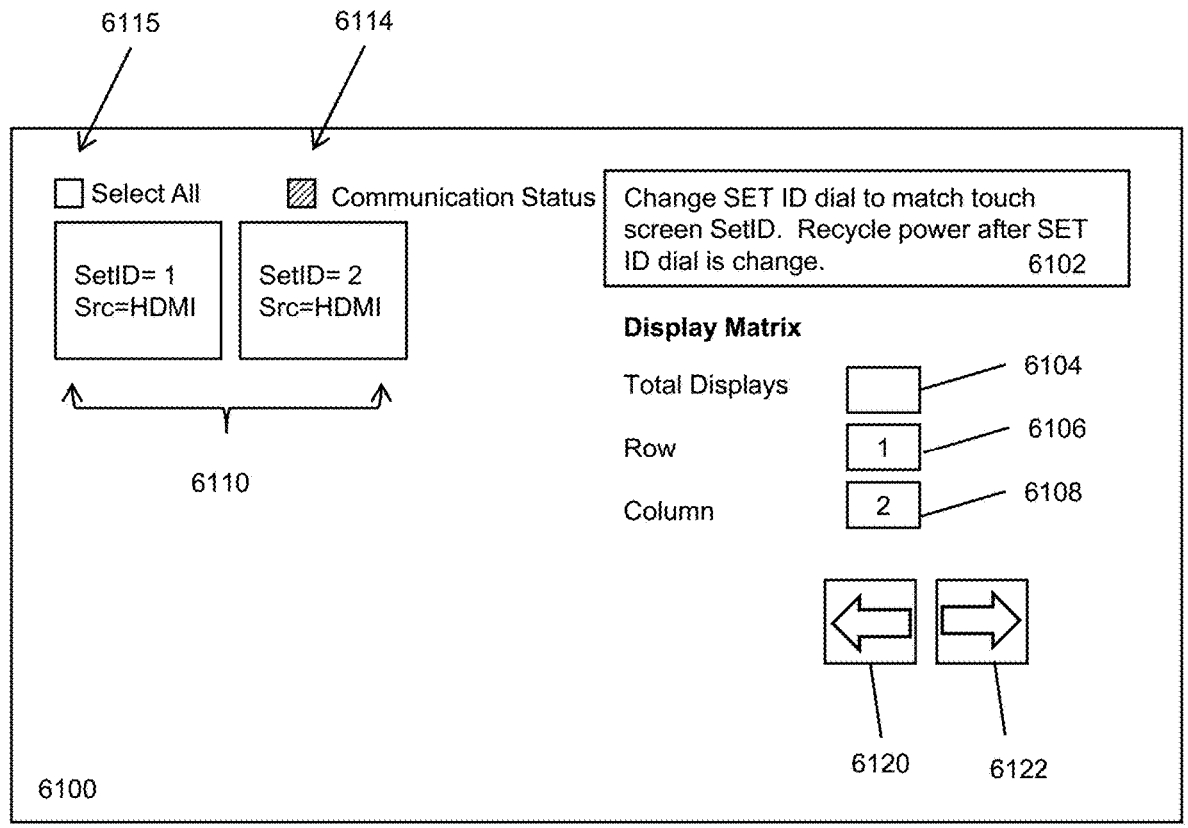
FIG. 61 schematically shows a user interface screen of an APP.

FIG. 61 shows an example of a first screenshot 6100 of a touch screen Set ID Adjustment screen having a text instruction field area (e.g., rectangle) 6102. Screen 6100 includes display matrix confirmation fields for showing the total number of displays having touch screen functionality in input field area (e.g., rectangle) 6104, the number of rows in input field area (e.g., rectangle) 6106, and the number of columns in input field area (e.g., rectangle) 6108. A display matrix representation is shown by an arrangement of touch screen display icons 6110. A Back button 6120 and a Forward button 6122 facilitates progression through a menu sequence in which a following screenshot 6200 may be reached, e.g., by activating Forward button 6122. Icon 6114 indicates the communication status of the APP to the network (e.g., as disclosed herein). Icon 6115 facilitates selection of all icons representing the touch screen display constructs in the touch screen display matrix (here, all icons 6110).

In some embodiments, during or after touch screen Set ID assignment, the display constructs having touch screen functionality of the display matrix (e.g., acting as a video wall with touch screen capability) reproduces a combined image upon which a respective touch screen Set ID is overlaid upon the image from each display.

Figure 62:
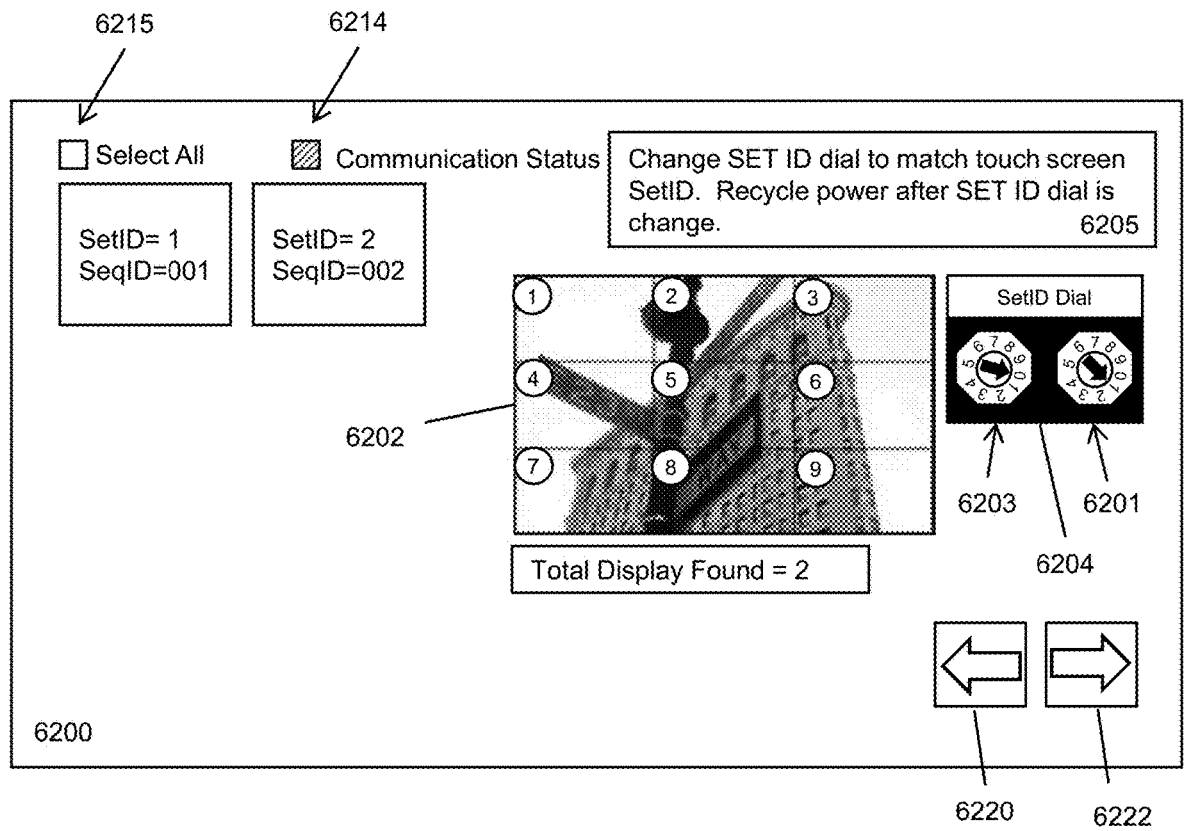
FIG. 62 schematically shows a user interface screen of an APP.

FIG. 62 shows an example of a screen of the APP. A graphic element 6202 is shown in screenshot 6200 to depict the touch screen Set IDs as configured within the installation application, e.g., to assist the user with confirmation or correction of touch screen Set IDs assigned to display construct(s) of the display matrix shown in 6202 having nine displays arranged in a 3×3 matrix arrangement. A Dial Window 6204 includes a pair of digit setting wheels which can be adjusted by the user to enter a desired touch screen Set ID for a selected (e.g., highlighted) display position in the display matrix. Icon 6201 indicates the ones digits options, and icon 6203 indicates the tenths digit options. Arrows in icons 6201 and 6203 point towards the selection made, which in the example shown in FIG. 62 is of the touch screen display ID number 01. The dial window can have a plurality of digit icons (e.g., for ones, tenths, hundredths, and thousands digits). The dial window can have at least one, two, three, or four dial icons such as icon 6201. The touch screen set ID can be elected by any other number selection methodology (e.g., other than the dial window). For example, the touch screen set ID can be selected and/or entered using an input field, e.g., that accepts numbers and/or letters (e.g., having an upper threshold value). Toggling field 6215 facilitates selection of all display constructs having touch screen functionality in the display matrix, and/or all display constructs having touch screen functionality in the display matrix and that are available for selection. Field 6214 indicates the communication status of the APP (e.g., between the APP and the network and/or the physical display constructs in the touch screen display matrix), e.g., as disclosed herein. Arrows 6220 and 6222 facilitate back and forth navigation by the user between the APP screens.

FIG. 63 shows an example of screenshot 6300 in which a 3×3 display matrix is being configured, which includes nine display constructs having touch screen functionality, as indicated in filed 6315. Each display construct in the touch screen display matrix has a consecutive touch screen set ID indicated in this example by a single digit number in a circle depicted on a virtual image of the display construct (e.g., 6306). Display construct 6306 having a touch screen set ID 04 is being configured by touch screen set ID dial 6304 having a single digit dial 6301 indicating by an arrow the single digit 4, and a tenth digit 6303 indicating by an arrow the tenth digit 0. Field 6302 indicates a prompt to the user of suggested operations that facilitate configuration and/or adjustment of the touch screen set ID for a display construct in the touch screen display matrix. The display construct in the touch screen display matrix may be selected for configuration/adjustment of touch screen set ID, e.g., by tapping the virtual image (e.g., 6306) of the display construct in the touch screen display matrix. The selected screen can be visibly indicated, e.g., by altering the visual of the touch screen set ID area (e.g., having another color, shade, and/or hue), as shown in the example of the touch screen set ID icon of 6306. Arrows 6320 and 6322 facilitate back and forth navigation by the user between the APP screens.

FIG. 63 shows an example of screenshot 6350 which displays touch screen Set IDs for detected display constructs having touch screen functionality in a 2×2 display matrix disposed within a maximum fixed-size display matrix 6355 (e.g., a 5×5 matrix). A field (e.g., popup icon) 6358 can be used to provide increased screen space to represent and/or adjust various parameters associated with a detected display, such as the touch screen Set ID. In this example, the field indicates the number of physical displays having touch screen functionality found in the display matrix by the APP, which is 4. Each display construct having touch screen functionality in the display matrix has a consecutive touch screen set ID indicated in this example by a single digit number in a circle depicted on a virtual image of the display construct (e.g., 6356). Display construct 6356 having a touch screen set ID 04 is being configured by touch screen set ID dial 6354 having a single digit dial 6351 indicating by an arrow the single digit 4, and a tenth digit 6353 indicating by an arrow the tenth digit 0. Field 6352 indicates a prompt to the user of suggested operations that facilitate configuration and/or adjustment of the touch screen set ID for a display construct having touch screen functionality in the display matrix. The display construct having touch screen functionality in the display matrix may be selected for configuration and/or adjustment of touch screen set ID, e.g., by tapping the virtual image (e.g., 6356) of the display construct in the touch screen display matrix. The selected screen can be visibly indicated, e.g., by altering the visual of the display construct icon area (e.g., having another color, shade, and/or hue), as shown in the example of the icon of display construct 6356. The selected display construct icon 6356 corresponds to where a physical display construct 6380 is disposed in the touch screen display matrix. The physical display construct 6380 may or may not display images in connection with the APP. For example, the physical (e.g., real) display construct may display the words "Touch screen ID 4" as shown in the example of FIG. 63. Such display may allow the user to ascertain that the display is configured properly to display a logical image and recognize the correct touch location. The Arrows 6370 and 6372 facilitate back and forth navigation by the user between the APP screens. The screen can further include an icon indicating the communication status between the APP, the network, and/or the respective physical display constructs in the touch screen display matrix (not shown), e.g., as disclosed herein.

Figure 64:
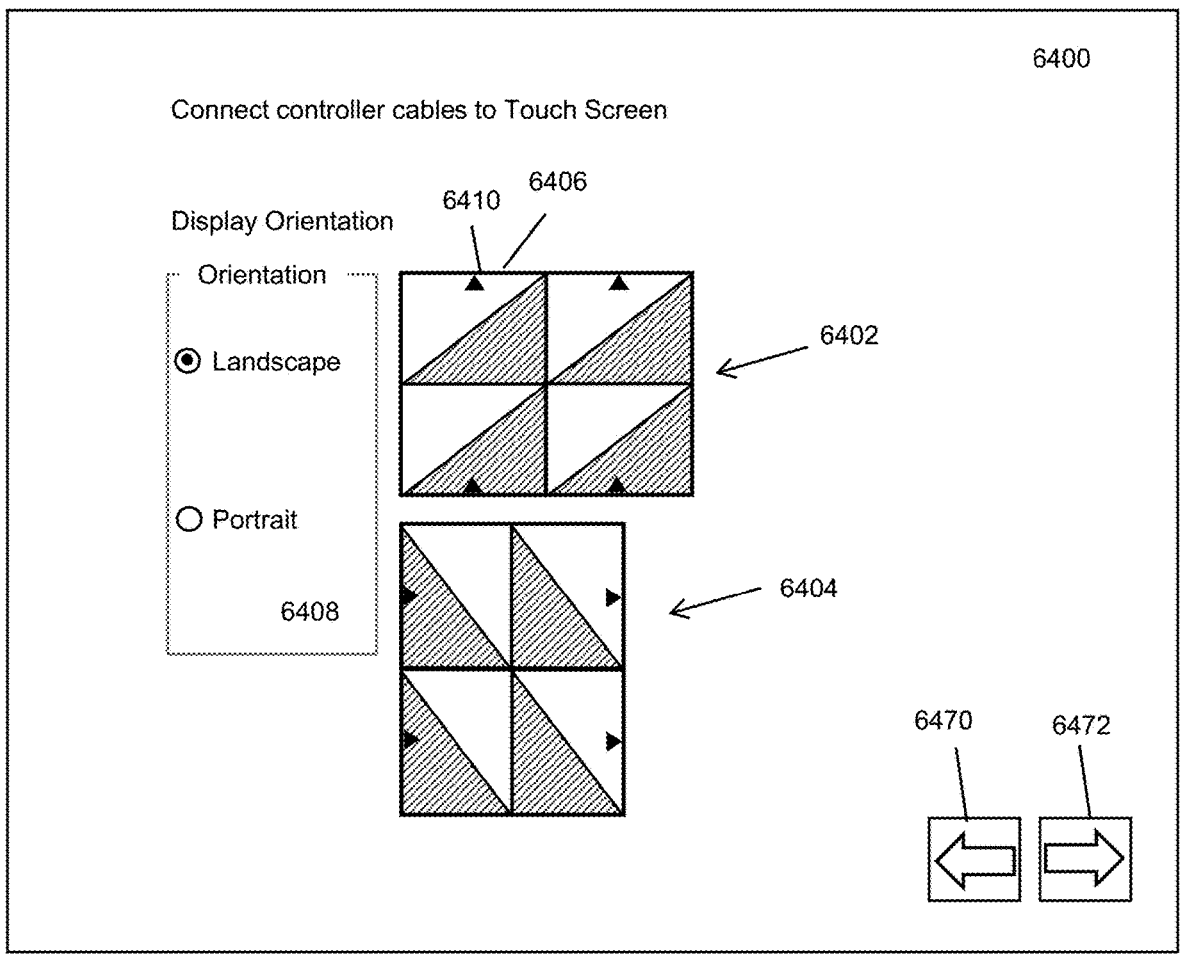
FIG. 64 schematically shows a user interface screen of an APP.

FIG. 64 shows an example of a fastening edge selection screen 6400. Groups of display matrix options 6402 and 6404 correspond to a plurality of display constructs having touch screen functionality being configured, disposed in landscape 6402 or portrait 6404 orientations. The user indicates if the display constructs in the touch screen display matrix are (e.g., all) disposed in a landscape or portrait form using toggle icons (e.g., radio buttons) in field 6408. The user may select a display construct in the touch screen display matrix for configuration, e.g., by tapping its virtual image representation in the APP (e.g., by selecting 6406). For a selected display icon (e.g., 6406) corresponding to one of the display constructs in the landscape touch screen display matrix 6402, the user may indicate a position of a fastener (e.g., mounting packet) attached to its side. A current orientation setting of the fastener for each display construct can be represented in the groups of display icons 6402 and 6404 using overlay flags (e.g., the position of the fastener being indicated using the black triangles in FIG. 64) pointing to the fastening edge (e.g., edge 6410). Arrows 6470 and 6472 facilitate back and forth navigation by the user between the APP screens. The screen can further include an icon indicating the communication status between the APP, the network, and/or the respective physical display constructs (not shown) of the touch screen display matrix, e.g., as disclosed herein.

In some embodiments, a coordinate system, based at least in part on user input, is generated for each touch screen in the touch screen display matrix. A coordinate system may be based on a ratio (e.g., percentage) of resolution of a single display (horizontal and vertical pixels of a single display) parceled with respect to the number of (e.g., identical or substantially identical) displays having touch screen functionality, that form the display matrix (e.g., while accounting for any gaps between adjacent media displays). A coordinate system may be based at least in part on a ratio of (I) resolution based on a number of horizontal and vertical pixels forming the displaying entities in a single media display, and (II) the number of columns and rows in the display matrix. For example, the vertical coordinate may be based at least in part on a ratio of (I) vertical resolution based on a number of vertical pixels forming the displaying entities in a single media display, divided by (II) the number of rows of media displays in the display matrix. For example, the horizontal coordinate may be based at least in part on a ratio of (I) horizontal resolution based on a number of horizontal pixels forming the displaying entities in a single media display, divided by (II) the number of columns of media displays in the display matrix The coordinate system may translate gap distances (between adjacent media displays) to pixel unit equivalents. The resulting pixels on each of the touch screens in the video wall may be translated to distance measurements to accurately account for any gaps between immediately adjacent media displays (and associated touch screens) of the matrix. The defined coordinate system may translate a physical touch location (as detected by touch functionality arrays) on one of the media displays to a touch location on the media being displayed by the matrix of media displays.

In some embodiments, a touch screen associated control system (e.g., built in control system) is designed to operate with a single media display. The touch screen functionality considers the number of horizontal and vertical pixels of the media display and/or of the touch screen sensor-emitter array. For example, the touch screen functionality may consider the number of horizontal and vertical pixels of the media display with which it is associated. For example, the touch screen functionality may consider the number of horizontal and vertical pixels of the sensor-emitter array that form the touch screen functionality. When the touch screen functionality considers the number of horizontal and vertical pixels of the media display with which it is associated, and the media display is part of a display matrix that aims to function as a video wall with respective touch screen functionality, the touch screen controller software may be adjusted such that the resolution of the display matrix appears to emulate the display matrix as it if is a single media display. The coordinates of each of the touch screens in the matrix should thus be adjusted. The adjustment can be according to (i) a single display coordination adjustment or (ii) a matrix coordination adjustment.

In some embodiments, the coordinate system corresponding to each of the touch screens is adjusted according to (e.g., per) a single display coordinate adjustment. When the touch screen functionality considers the number of horizontal and vertical pixels of the media display with which it is associated, and the media display is part of a display matrix that aims to function as a video wall with respective touch screen functionality, the touch screen controller software may be adjusted such that the resolution of the display matrix appears to emulate a resolution of a single media display of the display matrix (e.g., that includes other similar displays). Even though each display in the matrix has the same first resolution, the touch screen controller is provided touch screen coordinates to imitate a virtual situation in which the entire matrix has the same first resolution (thus resulting in a virtual situation in which each of the touch screens operates on a resolution that is a fraction of the first resolution, depending on the number of displays in the matrix, their arrangements, and any gaps in the matrix). The coordinates for each touch screen functionality for the touch screen controller may consider: (i) maximum horizontal pixels of a single display in a matrix=H, (ii) maximum vertical pixels of a single display in a matrix=V, (iii) number of display rows=R, (iv) number of display columns=C, (iv) vertical distances=DV1 . . . n between immediately adjacent displays (with n being C-1), and (v) horizontal distances=Dh1 . . . m between immediately adjacent displays (with n being R-1). For example, the virtual coordinates may abide by $C*W+Dh1 \ldots m=H$ and $R*L+Dv1 \ldots n=V$, where W is a constant representing the horizontal width of each of the (e.g., substantially) identical displays in the matrix, and where L is a constant representing the vertical length of each of the (e.g., substantially) identical displays in the matrix. The single media display may have a resolution of 1920=H by 1080=V, while a media display matrix having 2×2 display arrangement may have a total real pixel resolution of 3840 by 2160. The display of the images by the media displays will use the real pixel resolution, while the controller of the touch screen will use an adjusted coordinate system using virtual coordinates based at least in part on resolution of a single media display of the display matrix having a plurality of media displays. The virtual coordinate system of the touch screen controller does not affect the resolution of the media displayed by the display screen. The virtual coordinate system of the touch screen controller is used merely as a convenient convention to allow more accurate registry and output of reactions associated with the touch screens (and not associated with the resolution of any media displayed by the media displays). As a non-limiting illustrative example, a video wall may have four (e.g., substantially) identical media displays arranged as 2×2 matrix (e.g., arranged as two rows and two columns). Each of the media displays of the matrix comprises a touch screen functionality. The touch screen functionality is operatively (and directly) coupled to a controller that is configured to report physical and logical coordinate from (0,0) to (1920, 1080), with the media display having a resolution of 1920 pixels by 1080 pixels respectively. In some embodiments, the directly coupled controller is a touch screen dedicated controller. The touch screen dedicated controller may be assuming that both physical and logical coordinates that are mapped to the display screen having the resolution of 1920×1080 pixels. When the touch screens are integrated to the display matrix, they may be all operatively coupled to one controller. Each of the touch screen may or may not additionally retain connectivity to the touch screen dedicated controller. When the touch screens are integrated to the display matrix, they may be all operatively coupled to one touch screen dedicated controller. For example, when four media displays are forming a display matrix, each display having a touch screen functionality with its own touch screen dedicated controller; then three of the dedicated touch screen controllers may be disabled, and the one remaining touch screen dedicated controller may server all touch screens of the display matrix. The media display matrix may assume a functionality of a video wall, and the touch screens of each of the media displays of the matrix may respectively assume touch screen functionality as part of a video wall function in correspondence with the video wall function displayed by the media displays of the matrix. To accurately account for all the touch screens in their accurate disposition along the display matrix, the controller may be provided a coordinate (x, y) offset to each touch screen control board (e.g., with a similar mechanism defining touch screen orientation by rotating coordinates). Each touch screen may report (e.g., through a circuitry), its physical and logical coordinate (x,y)+offset (x,y). Offset (x,y) may represent where the touch screen is located within the display matrix. In a 2×2 display matrix comprising four media displays having a resolution of 1920 by 1080 pixels, in which the touch screens and associated media displays have no gaps in the display matrix, then the touch screen controller may assume the following virtual coordinate system: (A) an initial coordinate of the top right touch screen associated with the top right media display (e.g., FIG. 31A, 3101a) will be assigned the coordinate (0,0), (B) an initial coordinate of the top left touch screen associated with the top left media display (e.g., FIG. 31A, 3101b) will be assigned the coordinate (959,0), (C) an initial coordinate of the bottom right touch screen associated with the bottom right media display (e.g., FIG. 31A, 3101c) will be assigned the coordinate (0,539), and (4) an initial coordinate of the bottom left touch screen associated with the bottom left media display (e.g., FIG. 31A, 3101d) will be assigned the coordinate (960,540). The initial coordinate will be the top right coordinate in each of the touch screens. Thus, the last coordinate of the entire touch screen matrix will be (1920, 1080).

In some embodiments, the coordinate system corresponding to each of the touch screens is adjusted according to (e.g., per) a matrix coordinate adjustment. When the touch screen functionality considers the number of horizontal and vertical pixels of the media display with which it is associated, and the media display is part of a display matrix that aims to function as a video wall with respective touch screen functionality, the touch screen controller software may be adjusted such that the resolution of the display matrix appears to emulate a resolution of all accumulated media displays of the display matrix (e.g., that includes other similar displays, e.g., according to their arrangement in the matrix). The touch screen controller is provided touch screen coordinates to imitate a virtual situation in which the entire matrix has a cumulative resolution of all screens in the matrix. However, instead of each touch screen starting at a position (0,0), the touch screen controller will adjust its virtual coordinate system based at least in part on (i) the cumulative resolution of the display matrix, (ii) position of the touch screen (and associated media display) in the matrix, and (iii) any gaps between immediately adjacent displays of the matrix. The coordinates for each touch screen functionality for the touch screen controller may consider: (i) combined horizontal pixels of all displays in a matrix=H, (ii) combined vertical pixels of all displays in a matrix=V, (iii) number of display rows=R, (iv) number of display columns=C, (iv) vertical distances=$DV_{1..n}$ between immediately adjacent displays (with n being C-1), and (v) horizontal distances=Dh1 . . . m between immediately adjacent displays (with n being R-1). For example, the virtual coordinates may abide by $C*W+Dh_{1..m}=H$ and $R*L+Dv_{1..n}=V$, where W is a constant representing the horizontal width of each of the (e.g., substantially) identical displays in the matrix, and where L is a constant representing the vertical length of each of the (e.g., substantially) identical displays in the matrix. The single media display may have a resolution of 1920=H by 1080=V, while a media display matrix having 2×2 display arrangement may have a total real pixel resolution of 3840 by 2160. The display of the images by the media displays will use the real pixel resolution, and the controller of the touch screen will use an adjusted coordinate system using virtual coordinates based at least in part on a cumulative resolution of all media displays of the display matrix. The virtual coordinate system of the touch screen controller does not affect the resolution of the media displayed by the display screen. The virtual coordinate system of the touch screen controller is used merely as a convenient convention to allow more accurate registry and output of reactions associated with the touch screens (and not associated with the resolution of any media displayed by the media displays). To accurately account for all the touch screens in their accurate disposition along the display matrix, the controller may be provided a coordinate (x, y) offset to each touch screen control board (e.g., with a similar mechanism defining touch screen orientation by rotating coordinates). Each touch screen may report (e.g., through a circuitry), its physical and logical coordinate (x,y)+offset (x,y). Offset (x,y) may represent where the touch screen is located within the display matrix. In a 2×2 display matrix comprising four media displays having a resolution of 1920 by 1080 pixels, in which the touch screens and associated media displays have no gaps in the display matrix, then the touch screen controller may assume the following virtual coordinate system: (A) an initial coordinate of the top right touch screen associated with the top right media display (e.g., FIG. 31A, 3101a) will be assigned the coordinate (0,0), (B) an initial coordinate of the top left touch screen associated with the top left media display (e.g., FIG. 31A, 3101b) will be assigned the coordinate (1919,0), (C) an initial coordinate of the bottom right touch screen associated with the bottom right media display (e.g., FIG. 31A, 3101c) will be assigned the coordinate (0,1079), and (4) an initial coordinate of the bottom left touch screen associated with the bottom left media display (e.g., FIG. 31A, 3101d) will be assigned the coordinate (1920, 1080). The initial coordinate will be the top right coordinate in each of the touch screens. Thus, the last coordinate of the entire touch screen matrix will be (3840, 2160).

Figure 65:
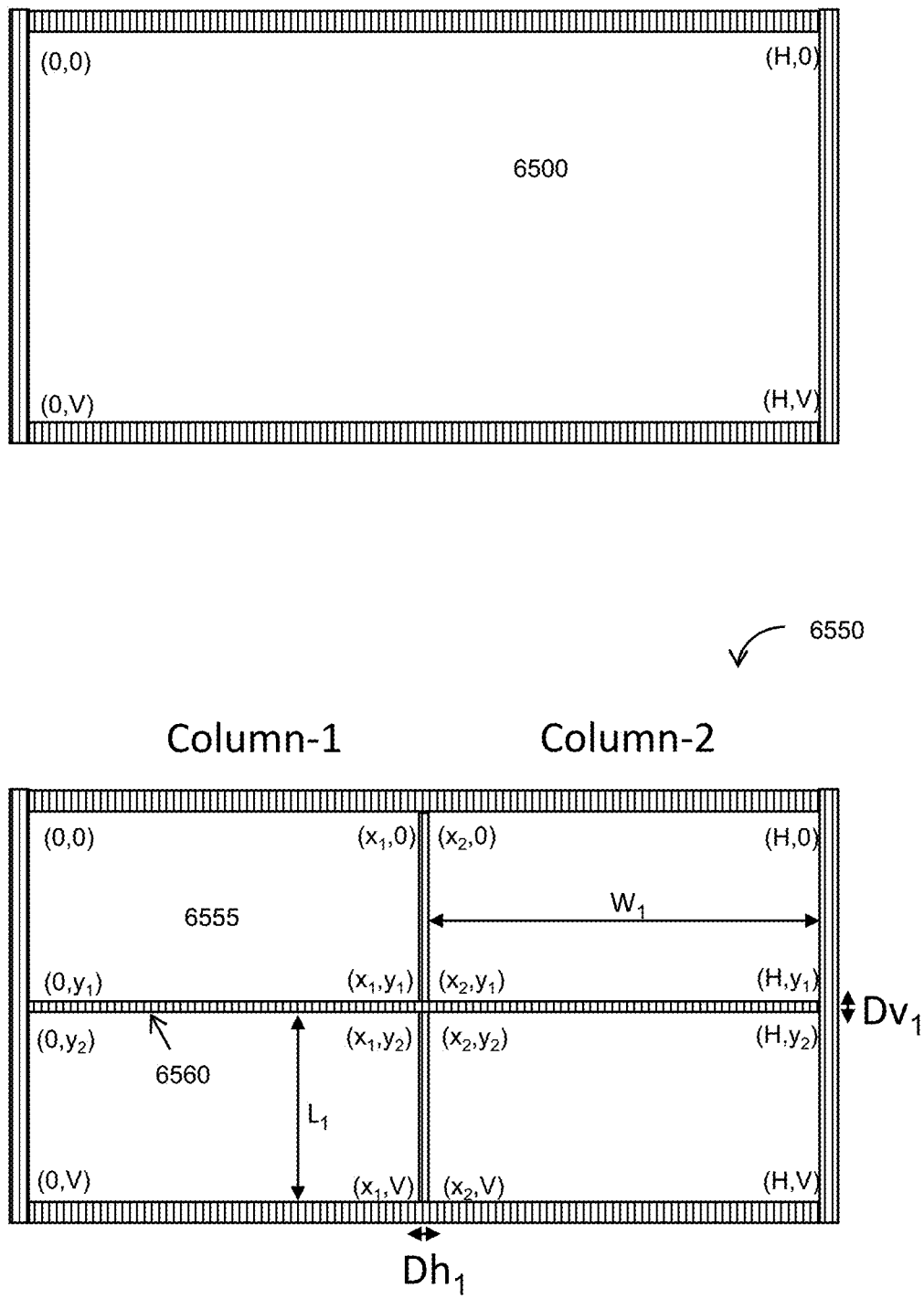
FIG. 65 schematically shows various media displays and an associated coordinate system.

FIG. 65 shows an example of generating a virtual coordinate system for each touch screen in a touch screen display matrix, such that the touch screen controller can accurately identify location of the touch screen on the matrix and/or display output associated with the touch in a logical manner. For a single media display 6500, a number of horizontal and vertical pixels may be translated to coordinates (e.g., (H, 0) represents a maximum number of horizontal pixels representing an upper right corner of an image such as (1920,0), (0, V) represents a maximum number of vertical pixels representing a lower left corner of an image such as (0,1080), and (H, V) represents a maximum number of horizontal and vertical pixels representing a lower right corner of an image such as (1920,1080)). The display matrix 6550 includes a 2×2 matrix of four displays (e.g., substantially) identical to display 6500. For a display matrix (e.g., functioning as a video wall with touch capability) 6550, a virtual coordinate system is generated based at least in part on (i) the maximum number of vertical (V) and horizontal (H) emitting entities (e.g., pixels) of the single media display 6500, or (ii) the maximum number of accumulated vertical (V) and horizontal (H) emitting entities (e.g., pixels) of the media displays of the display matrix, depending on the methodology utilized. The coordinate system is generated for each of the touch screens in the touch screen display matrix 6550: (0,0), (H,0), (H, V), and (0, V). The coordinate system for each touch screen may be based at least in part on a proportional ratio of resolution and/or an offset on each touch screen associated with a particular media display 6555 (four shown in the display matrix of FIG. 65). The touch screen coordinates accounts for horizontal and vertical gaps 6560 between adjacent displays. The coordinate system for the touch screens, is based at least in part on the number of horizontal and vertical pixels to be displayed on a media display 6500, the number of virtual pixels representing each gap such as 6560, and the number of horizontal and vertical displays (e.g., number of rows and columns of displays) in the matrix. The difference between X2 and X1 represents the horizontal distance of a gap between the media displays translated to units of virtual pixels. The different between Y2 and Y1 represents the vertical distance of a gap between the media displays translated to units of virtual pixels. The coordinate (H, V) represents (i) the horizontal and vertical resolution of one display 6555 (that is similar to 6500), or (ii) cumulative horizontal and vertical resolution of all displays in the matrix 6550, depending on the coordinate methodology utilized. In the example shown in FIG. 65, the coordinates for each touch screen functionality for the touch screen controller may consider: (i) when a per single display coordinate adjustment is used: the maximum horizontal pixels of a single display in a matrix=H (e.g., 1920 pixels along $W_1$), or when a per matrix coordinate adjustment is used: the cumulative horizontal pixels of all displays in a matrix in a single row=H (e.g., 2×1920=3840 pixels along $W_2$), (ii) when a per single display coordination adjustment is used: maximum vertical pixels of a single display in a matrix=V (e.g., 1080 pixels along $L_1$) or when a per matrix coordinate adjustment is used: the cumulative vertical pixels of all displays in a matrix in a single column=V (e.g., 2×1080=2160 pixels along $W_2$), (iii) number of display rows=R is 2 accounting for row 1 and row 2, (iv) number of display columns=C is 2 accounting for column 1 and column 2, (iv) vertical distances=$DV_1$ . . . n between immediately adjacent displays is $DV_1$ that is the different between $Y_2$ and $Y_1$, and (v) horizontal distances=$Dh_1$ . . . m between immediately adjacent displays is $Dh_1$ that is the different between $X_2$ and $X_1$. The virtual coordinates utilized by the touch screen controller may abide by $2*W_1+Dh_1=H$ and $2*L_1+DV_1=V$, where $W_1$ represents the horizontal width of each of the (e.g., substantially) identical displays in the matrix that in this case is equal to the length of $X_1$ in pixel units, and where $L_1$ represents the vertical length of each of the (e.g., substantially) identical displays in the matrix that in this case is equal to $Y_1$ in pixel units. When a per single display coordinate adjustment is used: if each screen in the display matrix 6550 would have 1920=H by 1080=V, the controller will user the virtual coordinates with the lower right corner coordinate (H, V) being (1920, 1080), although the real resolution of the entire display matrix that would be 3840 by 2160. When a per matrix coordinate adjustment is used: if each screen in the display matrix 6550 would have 1920=H by 1080=V, the controller will user the virtual coordinates with the lower right corner coordinate (H, V) being (3840, 2160), matching the real resolution of the entire display matrix that that would be 3840 by 2160. The media displayed by the media displayed retains the real resolution of each of the media displays, while the touch screen functionality utilizes the virtual coordinate system assigned to the touch screen controller either in the per display virtual coordinate adjustment or per matrix virtual coordinate adjustment, of the touch screen controller.

Figure 66:
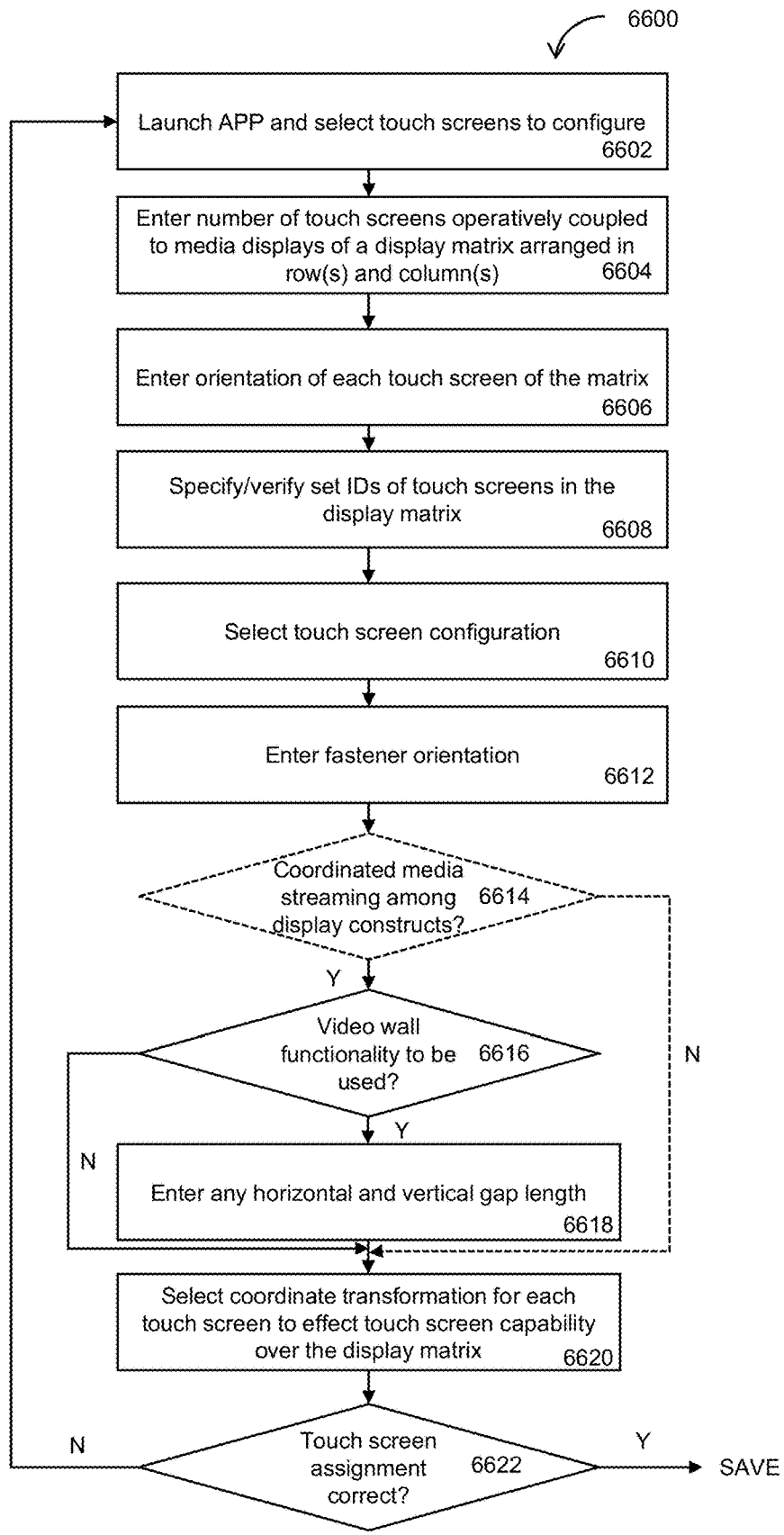
FIG. 66 shows a flowchart of operations for configuring and/or reconfiguring touch screens.

FIG. 66 shows an example of a method 6600 for configuring or reconfiguring display constructs having touch screen capability for use within a facility. The method 6600 suggest one of various possible sequences of operations. The facility may be served by a control network, e.g., as disclosed herein. At operation 6602, an APP (e.g., installation application software tool) is launched. The APP may have a link to the control network. The control network may be limited to control of the display constructs, or may be a control network that controls at least one other portion of the facility (e.g., the entire facility). The control network may link to the touch screen display matrix of display constructs having associated touch screen functionality to be configured. At 6604, the user enters a number and arrangement (e.g., rows and columns, 6606) of touch screens operatively coupled to display constructs in a targeted touch screen display matrix, for example. Touch screen Set IDs associated with at least one (e.g., each) touch screen (e.g., as used by a display interface to locally address the touch screen operatively coupled to media displays) in the touch screen display matrix are specified and/or verified at 6608. At 6610, the user may enter one or more configuration details relating to touch screen configuration. Orientation of a fastener relative to a display construct(s) in the touch screen display matrix is entered in 6612 by the user. At 6614, the user may be prompted to designate whether the display constructs of the touch screen display matrix will be provided with streaming of coordinated or uncoordinated media. The user may be prompted to select the manner of coordination, e.g., video wall or duplicate streaming at 6616. If video wall option is selected, then the user may be prompted to enter horizontal and vertical gap width (e.g., bezel) distances (widths) at 6618. In other embodiments, the user may be prompted to enter the gap (e.g., bezel) distances regardless of coordination between display constructs in the touch screen display matrix. Coordinate transformation for each touch screen to effect touch screen capability over the touch screen display matrix may be selected, at 6620. If the touch screen assignment (coordinate transformation, locations of touch screens in touch screen display matrix) is incorrect, then the user may return to a previous portion of the user interface to apply corrected settings, 6622. When the touch screen assignment is correct then the configured settings are stored and/or put into place within the display system. Test images may be sent at various other portions of the settings to ensure synchronization between the data entered to the APP and the physical configuration of the physical display construct, e.g., (i) to ensure that the display orientation (e.g., landscape/portrait, up/down, left/right) is correctly synchronized with the APP, and is logically projected, (ii) to ensure sufficient correction of pixels to provide touch capability to the intended image location, and/or (iii) that the media displays in the touch screen display matrix are correctly configured. Other operations may be added to the method shown in FIG. 66, e.g., selection of correction methodology for touch screen location relative to media being displayed. Such correction may be of interest when the display constructs function as a video wall, e.g., to facilitate correct touch location by the different display constructs of the touch screen display matrix. In some embodiments, a plurality of devices may be operatively (e.g., communicatively) coupled to the control system. The plurality of devices may be disposed in a facility (e.g., including a building and/or room). The control system may comprise the hierarchy of controllers. The devices may comprise an emitter, a sensor, or a window (e.g., IGU). The device may be any device as disclosed herein (e.g., a media display or a touch screen). At least two of the plurality of devices may be of the same type. For example, two or more IGUs may be coupled to the control system. At least two of the plurality of devices may be of different types. For example, a sensor and an emitter may be coupled to the control system. At times the plurality of devices may comprise at least 20, 50, 100, 500, 1000, 2500, 5000, 7500, 10000, 50000, 100000, or 500000 devices. The plurality of devices may be of any number between the aforementioned numbers (e.g., from 20 devices to 500000 devices, from 20 devices to 50 devices, from 50 devices to 500 devices, from 500 devices to 2500 devices, from 1000 devices to 5000 devices, from 5000 devices to 10000 devices, from 10000 devices to 100000 devices, or from 100000 devices to 500000 devices). For example, the number of windows in a floor may be at least 5, 10, 15, 20, 25, 30, 40, or 50. The number of windows in a floor can be any number between the aforementioned numbers (e.g., from 5 to 50, from 5 to 25, or from 25 to 50). At times the devices may be in a multi-story building. At least a portion of the floors of the multi-story building may have devices controlled by the control system (e.g., at least a portion of the floors of the multi-story building may be controlled by the control system). For example, the multi-story building may have at least 2, 8, 10, 25, 50, 80, 100, 120, 140, or 160 floors that are controlled by the control system. The number of floors (e.g., devices therein) controlled by the control system may be any number between the aforementioned numbers (e.g., from 2 to 50, from 25 to 100, or from 80 to 160). The floor may be of an area of at least about 150 $m^2$, 250 $m^2$, 500 $m^2$, 1000 $m^2$, 1500 $m^2$, or 2000 square meters ($m^2$). The floor may have an area between any of the aforementioned floor area values (e.g., from about 150 $m^2$ to about 2000 $m^2$, from about 150 $m^2$ to about 500 $m^2$, from about 250 $m^2$ to about 1000 $m^2$, or from about 1000 $m^2$ to about 2000 $m^2$). The building may comprise an area of at least about 1000 square feet (sqft), 2000 sqft, 5000 sqft, 10000 sqft, 100000 sqft, 150000 sqft, 200000 sqft, or 500000 sqft. The building may comprise an area between any of the above mentioned areas (e.g., from about 1000 sqft to about 5000 sqft, from about 5000 sqft to about 500000 sqft, or from about 1000 sqft to about 500000 sqft). The building may comprise an area of at least about 100 $m^2$, 200 $m^2$, 500 $m^2$, 1000 $m^2$, 5000 $m^2$, 10000 $m^2$, 25000 $m^2$, or 50000 $m^2$. The building may comprise an area between any of the above mentioned areas (e.g., from about 100 $m^2$ to about 1000 $m^2$, from about 500 $m^2$ to about 25000 $m^2$, from about 100 $m^2$ to about 50000 $m^2$). The facility may comprise a commercial or a residential building. The commercial building may include tenant(s) and/or owner(s). The residential facility may comprise a multi or a single family building. The residential facility may comprise an apartment complex. The residential facility may comprise a single family home. The residential facility may comprise multi-family homes (e.g., apartments). The residential facility may comprise townhouses. The facility may comprise residential and commercial portions. The facility may comprise at least about 1, 2, 5, 10, 50, 100, 150, 200, 250, 300, 350, 400, 420, 450, 500, or 550 windows (e.g., tintable windows). The windows may be divided into zones (e.g., based at least in part on the location, façade, floor, ownership, utilization of the enclosure (e.g., room) in which they are disposed, any other assignment metric, random assignment, or any combination thereof. Allocation of windows to the zone may be static or dynamic (e.g., based on a heuristic). There may be at least about 2, 5, 10, 12, 15, 30, 40, or 46 windows per zone.

While preferred embodiments of the present invention have been shown, and described herein, it will be obvious to those skilled in the art that such embodiments are provided by way of example only. It is not intended that the invention be limited by the specific examples provided within the specification. While the invention has been described with reference to the afore-mentioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations, or relative proportions set forth herein which depend upon a variety of conditions and variables. It should be understood that various alternatives to the embodiments of the invention described herein might be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

What is claimed is:

1. An apparatus for controlling one or more media displays, comprising at least one controller comprising a first circuitry, which at least one controller is configured to:
   (a) operatively couple to one or more display constructs and to a second circuitry configured to accept user input; and
   (b) align, or direct alignment of, a real configuration of the one or more display constructs with a virtual setting of the one or more display constructs at least in part by being configured to: (A) receive from the second circuitry a user input of one or more real characteristics of the one or more display constructs that pertain to the real configuration, and (B) update, or direct update of, the virtual settings to facilitate control of the one or more display constructs, wherein a display construct of the one or more display constructs is operatively coupled to a tintable window.

2. The apparatus of claim 1, wherein the at least one controller is (I) included in a control system configured to control at least one device of other than the one or more display constructs in a building in which the display constructs are disposed, (II) operatively coupled to a network disposed at least in part in an envelope of the building and/or (III) operatively coupled to a network configured for transmission of power and communication on a cable.

3. The apparatus of claim 1, wherein the at least one controller is configured to align, or direct alignment of, the one or more real characteristics as (I) vertical or horizontal placement of a fundamental length scale of a display construct of the one or more display constructs, (II) alignment of projected media by the display construct relative to the horizon and/or to a gravitational center, (III) identification of a fastener of a display construct of the one or more display constructs, or (IV) identification number of the display construct.

4. The apparatus of claim 3, wherein the identification number is comprised of a network address recognized by a control system that includes, or is operatively coupled to, the at least one controller.

5. The apparatus of claim 1, wherein the at least one controller is operatively coupled to, or is included in, a control system configured to control a facility in which the one or more display constructs are disposed.

6. The apparatus of claim 1, wherein the at least one controller is configured to receive the user input through an application disposed on a mobile circuitry.

7. The apparatus of claim 1, wherein the one or more display constructs comprises a matrix of display constructs, and wherein the at least one controller is configured to align, or direct alignment of, the one or more real characteristics as comprising (I) a distance between two immediately adjacent display constructs in the display matrix, or (II) a manner of any coordination of media displayed by the matrix of display constructs.

8. An apparatus for controlling media display touch screens, comprising at least one controller, which at least one controller is configured to:
(a) operatively couple to touch screen sensor and emitter arrays of a display matrix;
(b) configure, or direct configuration of, the touch screen sensor and emitter arrays having virtual coordinates, each of the touch screen sensor and emitter arrays associated with each media display in the display matrix having media displays of (i) similar dimensions and (ii) similar array of emitting entities, the media displays arranged in one or more rows and in one or more columns to form the display matrix, the at least one controller configured to configure, or direct configuration of, the touch screen sensor and emitter arrays at least in part by the at least one controller being configured to:
(A) divide, or direct division of, a vertical component of the array of the emitting entities, by a vertical number of the one or more rows of the media displays in the display matrix, to obtain a vertical division product, wherein the vertical component of the array of the emitting entities is of (I) all media displays in a column of media displays in the display matrix;
(B) divide, or direct division of, a horizontal component of the array of the emitting entities, by a horizontal number of the one or more columns of the media displays in the display matrix, to obtain a horizontal division product, wherein the horizontal component of the array of the emitting entities is of all media displays in a row of media displays in the display matrix; and
(C) assign, or direct assignment of, a virtual coordinate of the virtual coordinates at least in part by including the vertical division product and/or the horizontal division product.

9. The apparatus of claim 8, wherein the at least one controller is configured to include, or direct inclusion of, the vertical division product in the assignment, or directing assignment of, the virtual coordinate of the virtual coordinates when the display matrix comprises more than one row of media displays.

10. The apparatus of claim 8, wherein the at least one controller is configured to (A) divide, or direct division of, a vertical component of the array of the emitting entities, by a vertical number of the one or more rows of the media displays in the display matrix, to obtain a vertical division product, wherein the vertical component of the array of the emitting entities is of (I) a single media display; and (B) divide, or direct division of, a horizontal component of the array of the emitting entities, by a horizontal number of the one or more columns of the media displays in the display matrix, to obtain a horizontal division product, wherein the horizontal component of the array of the emitting entities is of (III) a single media display.

11. The apparatus of claim 8, wherein configured to comprises designed, arranged, built, shaped, or structured.

12. The apparatus of claim 8, wherein the at least one controller comprises circuitry, and optionally wherein the circuitry is included in one or more processors.

13. An apparatus for controlling media display touch screens, the apparatus comprising: at least one controller configured to:
(a) operatively couple to touch screen sensor and emitter arrays of media displays that form a display matrix;
(b) detect, or direct detection of, a location of a user stimulation of one or more of the touch screen sensor and emitter arrays, which location of stimulation of the one or more of the touch screen sensor and emitter arrays is (i) at least partially based on a defined coordinate system for the touch screen sensor and emitter arrays that is derived at least in part by aligning a real configuration of each of the media displays each having a touch screen sensor and emitter array of the touch screen sensor and emitter arrays, with a virtual setting of each of the touch screen sensor and emitter arrays, and (ii) is at least partially based on each of the media displays displaying a portion of a media such that the display matrix displays an entire depiction of the media; and
(c) use, or direct usage of, the defined coordinate system to translate the location of the user stimulation to a touch location in the media being displayed on the display matrix of the media displays, wherein the at least one controller is configured to receive through an input of a user a number of (a) columns of the media displays in the display matrix and/or (b) rows of the media displays in the display matrix.

14. The apparatus of claim 13, wherein the at least one controller is configured to (A) divide, or direct division of, a vertical component of an array of one media display of the media displays, by a vertical number of one or more rows of the media displays in the display matrix, to obtain a vertical division product; and (B) assign, or direct assignment of, a virtual coordinate of the defined coordinate system at least in part by including the vertical division product.

15. The apparatus of claim 14, wherein the at least one controller is configured to adjust, or direct adjustment of, the vertical division product based at least in part on vertical gap distances between immediately adjacent rows of the one or more rows of the media displays in the display matrix.

16. The apparatus of claim 15, wherein the at least one controller is configured to (A) divide, or direct division of, a horizontal component of an array of one media display of the media displays, by a horizontal number of one or more columns of the media displays in the display matrix, to obtain a horizontal division product; and (B) assign, or direct assignment of, a virtual coordinate of the defined coordinate system at least in part by including the horizontal division product.

17. The apparatus of claim 16, wherein the at least one controller is configured to adjust, or direct adjustment of, the horizontal division product based at least in part on horizontal gap distances between immediately adjacent touch screen sensor and emitter arrays and to translate, or direct translation of, the horizontal gap distances of the immediately adjacent touch screen sensor and emitter arrays into virtual emitting entities units, which virtual emitting entities units are used to adjust the horizontal division product.

\* \* \* \* \*